(12) United States Patent
Seo et al.

(10) Patent No.: US 11,974,445 B2
(45) Date of Patent: Apr. 30, 2024

(54) LIGHT-EMITTING ELEMENT, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Tatsuyoshi Takahashi, Kanagawa (JP); Takeyoshi Watabe, Kanagawa (JP); Satomi Mitsumori, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 940 days.

(21) Appl. No.: 15/212,842

(22) Filed: Jul. 18, 2016

(65) Prior Publication Data

US 2017/0025630 A1 Jan. 26, 2017

(30) Foreign Application Priority Data

Jul. 23, 2015 (JP) .................... 2015-145443
Nov. 30, 2015 (JP) .................... 2015-233299
Mar. 15, 2016 (JP) .................... 2016-051351

(51) Int. Cl.
*H01L 51/50* (2006.01)
*C07F 15/00* (2006.01)
(Continued)

(52) U.S. Cl.
CPC ....... *H10K 50/121* (2023.02); *C07F 15/0033* (2013.01); *C09K 11/06* (2013.01);
(Continued)

(58) Field of Classification Search
None
See application file for complete search history.

(56) References Cited

U.S. PATENT DOCUMENTS 7,175,922 B2  2/2007  Jarikov et al.
7,183,010 B2  2/2007  Jarikov
(Continued)

FOREIGN PATENT DOCUMENTS

CN    102856350 A    1/2013
CN    104247076 A    12/2014
(Continued)

OTHER PUBLICATIONS

Machine English translation of Otsu et al. (JP 2014-152151 A). Nov. 8, 2018.*

(Continued)

*Primary Examiner* — Jay Yang
(74) *Attorney, Agent, or Firm* — Husch Blackwell LLP

(57) ABSTRACT

A light-emitting element with high emission efficiency. The light-emitting element includes a first organic compound, a second organic compound, and a guest material. The LUMO level of the first organic compound is lower than the LUMO level of the second organic compound. The HOMO level of the first organic compound is lower than the HOMO level of the second organic compound. The HOMO level of the guest material is higher than the HOMO level of the second organic compound. The energy difference between the LUMO level of the guest material and the HOMO level of the guest material is larger than the energy difference between the LUMO level of the first organic compound and the HOMO level of the second organic compound. The guest material has a function of converting triplet excitation energy into light emission. The first organic compound and the second organic compound form an exciplex.

27 Claims, 77 Drawing Sheets

(51) Int. Cl.

| | | |
|---|---|---|
| *C09K 11/06* | (2006.01) | |
| *H01L 27/32* | (2006.01) | |
| *H10K 50/11* | (2023.01) | |
| *H10K 50/12* | (2023.01) | |
| *H10K 50/15* | (2023.01) | |
| *H10K 50/16* | (2023.01) | |
| *H10K 59/12* | (2023.01) | |
| *H10K 59/38* | (2023.01) | |
| *H10K 59/40* | (2023.01) | |
| *H10K 85/30* | (2023.01) | |
| *H10K 85/60* | (2023.01) | |
| *H10K 101/00* | (2023.01) | |
| *H10K 101/10* | (2023.01) | |
| *H10K 101/30* | (2023.01) | |
| *H10K 101/40* | (2023.01) | |

(52) U.S. Cl.
CPC ............. *H10K 50/11* (2023.02); *H10K 50/15* (2023.02); *H10K 50/16* (2023.02); *H10K 59/12* (2023.02); *H10K 59/38* (2023.02); *H10K 59/40* (2023.02); *C09K 2211/1007* (2013.01); *C09K 2211/1011* (2013.01); *C09K 2211/1059* (2013.01); *C09K 2211/185* (2013.01); *H10K 85/342* (2023.02); *H10K 85/615* (2023.02); *H10K 85/633* (2023.02); *H10K 85/636* (2023.02); *H10K 85/654* (2023.02); *H10K 85/657* (2023.02); *H10K 85/6572* (2023.02); *H10K 85/6576* (2023.02); *H10K 2101/10* (2023.02); *H10K 2101/30* (2023.02); *H10K 2101/40* (2023.02); *H10K 2101/80* (2023.02); *H10K 2101/90* (2023.02)

(56) References Cited

U.S. PATENT DOCUMENTS

| | | |
|---|---|---|
| 7,332,857 B2 | 2/2008 | Seo et al. |
| 7,597,967 B2 | 10/2009 | Kondakova et al. |
| 7,906,226 B2 | 3/2011 | Matsuura et al. |
| 7,993,760 B2 | 8/2011 | Komori et al. |
| 8,034,465 B2 | 10/2011 | Liao et al. |
| 8,105,701 B2 | 1/2012 | Matsuura et al. |
| 8,274,214 B2 | 9/2012 | Ikeda et al. |
| 8,470,455 B2 | 6/2013 | Matsuura et al. |
| 8,736,157 B2 | 5/2014 | Seo et al. |
| 8,795,851 B2 | 8/2014 | Inoue et al. |
| 8,853,680 B2 | 10/2014 | Yamazaki et al. |
| 8,889,858 B2 | 11/2014 | Inoue et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,263 B2 | 3/2015 | Shitagaki et al. |
| 9,054,317 B2 | 6/2015 | Monkman et al. |
| 9,059,414 B2 | 6/2015 | Inoue et al. |
| 9,123,907 B2 | 9/2015 | Seo et al. |
| 9,130,184 B2 | 9/2015 | Seo et al. |
| 9,159,942 B2 | 10/2015 | Seo et al. |
| 9,175,213 B2 | 11/2015 | Seo et al. |
| 9,273,079 B2 | 3/2016 | Inoue et al. |
| 9,309,458 B2 | 4/2016 | Inoue et al. |
| 9,356,250 B2 | 5/2016 | Ohsawa et al. |
| 9,394,280 B2 | 7/2016 | Seo et al. |
| 9,604,928 B2 | 3/2017 | Shitagaki et al. |
| 9,663,711 B2 | 5/2017 | Takeda et al. |
| 10,096,658 B2 | 10/2018 | Watabe et al. |
| 10,141,524 B2 | 11/2018 | Inoue et al. |
| 10,556,864 B2 | 2/2020 | Nomura et al. |
| 10,573,829 B2 | 2/2020 | Shitagaki et al. |
| 10,586,934 B2 | 3/2020 | Shitagaki et al. |
| 10,593,895 B2 | 3/2020 | Shitagaki et al. |
| 11,008,510 B2 | 5/2021 | Takeda et al. |
| 11,773,321 B2 | 10/2023 | Takeda et al. |
| 2003/0175553 A1 | 9/2003 | Thompson et al. |
| 2005/0048310 A1 | 3/2005 | Cocchi et al. |
| 2005/0221116 A1 | 10/2005 | Cocchi et al. |
| 2005/0230665 A1 | 10/2005 | Thompson |
| 2006/0134464 A1 | 6/2006 | Nariyuki |
| 2007/0090756 A1 | 4/2007 | Okada et al. |
| 2009/0160323 A1 | 6/2009 | Nomura et al. |
| 2011/0198988 A1 | 8/2011 | Inoue et al. |
| 2012/0133273 A1 | 5/2012 | Inoue et al. |
| 2012/0217487 A1 | 8/2012 | Yamazaki et al. |
| 2012/0305896 A1 | 12/2012 | Inoue et al. |
| 2013/0270531 A1 | 10/2013 | Seo et al. |
| 2013/0277656 A1 | 10/2013 | Seo et al. |
| 2013/0292656 A1* | 11/2013 | Seo .................. H05B 33/14 257/40 |
| 2014/0034931 A1 | 2/2014 | Inoue et al. |
| 2014/0291643 A1 | 10/2014 | Ogita et al. |
| 2015/0053958 A1 | 2/2015 | Ishisone et al. |
| 2015/0069352 A1 | 3/2015 | Kim et al. |
| 2015/0155511 A1 | 6/2015 | Ohsawa et al. |
| 2015/0236278 A1 | 8/2015 | Bryman et al. |
| 2015/0270505 A1 | 9/2015 | Seo et al. |
| 2016/0315270 A1 | 10/2016 | Seo et al. |
| 2016/0372688 A1 | 12/2016 | Seo et al. |
| 2017/0025615 A1 | 1/2017 | Seo et al. |
| 2017/0092890 A1 | 3/2017 | Seo et al. |
| 2017/0253796 A1 | 9/2017 | Takeda et al. |
| 2018/0009751 A1 | 1/2018 | Nomura et al. |
| 2019/0027542 A1 | 1/2019 | Watabe et al. |
| 2020/0148640 A1 | 5/2020 | Nomura et al. |
| 2020/0194692 A1 | 6/2020 | Shitagaki et al. |

FOREIGN PATENT DOCUMENTS

| | | |
|---|---|---|
| EP | 1 202 608 A2 | 5/2002 |
| EP | 2 757 094 A1 | 7/2014 |
| JP | 2005-154396 A | 6/2005 |
| JP | 2008-069221 A | 3/2008 |
| JP | 2008-210941 A | 9/2008 |
| JP | 2008-288344 A | 11/2008 |
| JP | 2009-298767 A | 12/2009 |
| JP | 2010-182699 A | 8/2010 |
| JP | 2010-195708 A | 9/2010 |
| JP | 2012-186461 A | 9/2012 |
| JP | 2012-212879 A | 11/2012 |
| JP | 2012-238854 A | 12/2012 |
| JP | 2013-199473 A | 10/2013 |
| JP | 2013-237662 A | 11/2013 |
| JP | 2013-239703 A | 11/2013 |
| JP | 2014-029971 A | 2/2014 |
| JP | 2014-045176 A | 3/2014 |
| JP | 2014-096557 A | 5/2014 |
| JP | 2014152151 A * | 8/2014 |
| JP | 2014-208621 A | 11/2014 |
| JP | 2015-124206 A | 7/2015 |
| JP | 2016-006758 A | 1/2016 |
| JP | 2016-058404 A | 4/2016 |
| JP | 2017-028283 A | 2/2017 |
| JP | 2017-199903 A | 11/2017 |
| JP | 2020-061584 A | 4/2020 |
| JP | 6817474 B2 | 1/2021 |
| KR | 2014-0018121 A | 2/2014 |
| KR | 2015-0135289 A | 12/2015 |
| TW | 201244212 | 11/2012 |
| TW | 201311650 | 3/2013 |
| TW | 201321374 | 6/2013 |
| TW | 201504219 | 2/2015 |
| WO | WO 2009/072587 A1 | 6/2009 |
| WO | WO 2012/111579 A1 | 8/2012 |
| WO | WO 2012/137693 A1 | 10/2012 |
| WO | WO 2013/027846 A1 | 2/2013 |
| WO | WO 2013/157591 A1 | 10/2013 |
| WO | WO 2014/085296 A1 | 6/2014 |
| WO | WO 2014/157018 A1 | 10/2014 |
| WO | WO 2015/029808 A1 | 3/2015 |

(56) References Cited

FOREIGN PATENT DOCUMENTS

WO  WO 2017/013526 A1  1/2017
WO  WO 2017/013534 A1  1/2017

OTHER PUBLICATIONS

International Search Report re Application No. PCT/IB2016/054163, dated Nov. 15, 2016.
Written Opinion re Application No. PCT/IB2016/054163, dated Nov. 15, 2016.
Yersin, H. et al., *Highly Efficient OLEDs with Phosphorescent Materials*, 2008, pp. 1-97,283-309, Wiley-VCH Verlag Gmbh & Co.
Tokito, S. et al., "Improvement in Performance by Doping," Organic EL Display, Aug. 20, 2004, pp. 67-99, Ohmsha.
Jeon, W.S. et al., "Ideal Host and Guest System in Phosphorescent OLEDs," Organic Electronics, 2009, vol. 10, pp. 240-246, Elsevier.
Su, S-J et al., "RGB Phosphorescent Organic Light-Emitting Diodes by Using Host Materials with Heterocyclic Cores:Effect of Nitrogen Atom Orientations," Chemistry of Materials, 2011, vol. 23, No. 2, pp. 274-284.
Rausch, A.F. et al., "Matrix Effects on the Triplet State of the OLED Emitter Ir(4,6-dFppy)2(pic)(FIrpic): Investigations by High-Resolution Optical Spectroscopy," Inorganic Chemistry, 2009, vol. 48, No. 5, pp. 1928-1937.
Gong, X. et al., "Phosphorescence from Iridium Complexes Doped into Polymer Blends," Journal of Applied Physics, Feb. 1, 2004, vol. 95, No. 3, pp. 948-953.
Zhao, Q. et al., "Synthesis and Photophysical, Electrochemical, and Electrophosphorescent Properties of a Series of Iridium(III) Complexes Based on Quinoline Derivatives and Different β-Diketonate Ligands," Organometallics, Jun. 14, 2006, vol. 25, No. 15, pp. 3631-3638.
Hino, Y. et al., "Red Phosphorescent Organic Light-Emitting Diodes Using Mixture System of Small-Molecule and Polymer Host," Japanese Journal of Applied Physics, Apr. 21, 2005, vol. 44, No. 4B, pp. 2790-2794.
Tsuboyama, A. et al., "Homoleptic Cyclometalated Iridium Complexes with Highly Efficient Red Phosphorescence and Application to Organic Light-Emitting Diode," Journal of the American Chemical Society, 2003, vol. 125, No. 42, pp. 12971-12979.
Kondakova, M.E. et al., "High-Efficiency, Low-Voltage Phosphorescent Organic Light-Emitting Diode Devices with Mixed Host," Journal of Applied Physics, Nov. 4, 2008, vol. 104, pp. 094501-1-094501-17.
Chen, F-C. et al., "Triplet Exciton Confinement in Phosphorescent Polymer Light-Emitting Diodes," Applied Physics Letters, Feb. 17, 2003, vol. 82, No. 7, pp. 1006-1008.
Lee, J.Y. et al., "Stabilizing the Efficiency of Phosphorescent Organic Light-Emitting Diodes," SPIE Newsroom, Apr. 21, 2008, pp. 1-3.
Tokito, S. et al., "Confinement of Triplet Energy on Phosphorescent Molecules for Highly-Efficient Organic Blue-Light-Emitting Devices," Applied Physics Letters, Jul. 21, 2003, vol. 83, No. 3, pp. 569-571.
Endo, A. et al., "Efficient Up-Conversion of Triplet Excitons Into a Singlet State and Its Application for Organic Light Emitting Diodes," Applied Physics Letters, Feb. 24, 2011, vol. 98, No. 8, pp. 083302-1-083302-3.
Itano, K. et al., "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Low Ionization Potentials," Applied Physics Letters, Feb. 9, 1998, vol. 72, No. 6, pp. 636-638.
Park, Y-S. et al., "Efficient Triplet Harvesting by Fluorescent Molecules Through Exciplexes for High Efficiency Organic Light-Emitting Diodes," Applied Physics Letters, Apr. 18, 2013, vol. 102, No. 15, pp. 153306-1-153306-5.
Lee, J-H. et al., "An Exciplex Forming Host for Highly Efficient Blue Organic Light Emitting Diodes with Low Driving Voltage," Advanced Functional Materials, Oct. 22, 2014, vol. 25, No. 3, pp. 361-366.
Baranoff, E. et al., "FIrpic: Archetypal Blue Phosphorescent Emitter for Electroluminescence," Dalton Transactions, 2015, vol. 44, pp. 8318-8329, Royal Society of Chemistry.
Chinese Office Action re Application No. CN 201680042978.1, dated Mar. 29, 2019.
Taiwanese Office Action (Application No. 105122077) dated May 6, 2020.
Zhou, D. et al., "Host to Guest Energy Transfer Mechanism in Phosphorescent and Fluorescent Organic Light-Emitting Devices Utilizing Exciplex-Forming Hosts," The Journal of Physical Chemistry C, Sep. 24, 2014, vol. 118, No. 41, pp. 24006-24012, American Chemical Society.
German Office Action (Application No. 112016007600.2) dated Feb. 23, 2022.
German Office Action (Application No. 112016003313.3) dated Feb. 24, 2022.
Wang, Q. et al., "High-efficiency organic light-emitting diodes with exciplex hosts," J. Mater. Chem. C (Journal of Materials Chemistry C), Aug. 6, 2019, vol. 7, No. 37, pp. 11329-11360.
Swayamprabha, S. et al., "Approaches for Long Lifetime Organic Light Emitting Diodes," Adv. Sci. (Advanced Science), Nov. 12, 2020, vol. 8, No. 1, pp. 2002254-1-2002254-29.
Seo, S. et al., "Exciplex-triplet energy transfer: A new method to achieve extremely efficient organic light-emitting diode with external quantum efficiency over 30% and drive voltage below 3V," Jpn. J. Appl. Phys. (Japanese Journal of Applied Physics) , Mar. 17, 2014, vol. 53, No. 4, pp. 042102-1-042102-8.
Seo, S. et al., "High Performance Organic Light-Emitting Diode Using Exciplex-Triplet Energy Transfer Technology and Its Application," IDW'17: Proceedings of the 24th International Display Workshops, Dec. 6, 2017, pp. 681-684.
Seo, S. et al., "Recent development of organic light-emitting diode utilizing energy transfer from exciplex to phosphorescent emitter," Proceedings of SPIE, Aug. 28, 2016, vol. 9941, pp. 99410J-1-99410J-17.
Tsuboi, T. et al., "Optical Characteristics of PtOEP and Ir(ppy)3 Triplet-Exciton Materials for Organic Electroluminescence Devices," Thin Solid Films, Aug. 1, 2003, vol. 438-439, pp. 301-307.
Tao, Y. et al., "Organic Host Materials for Phosphorescent Organic Light-Emitting Diodes," Chem. Soc. Rev. (Chemical Society Reviews), Mar. 3, 2011, vol. 40, No. 5, pp. 2943-2970.
Costa, J. et al., "Optical Band Gaps of Organic Semiconductor Materials," Optical Materials, May 18, 2016, vol. 58, pp. 51-60.
Taiwanese Office Action (Application No. 111148867) Dated Oct. 13, 2023.

* cited by examiner

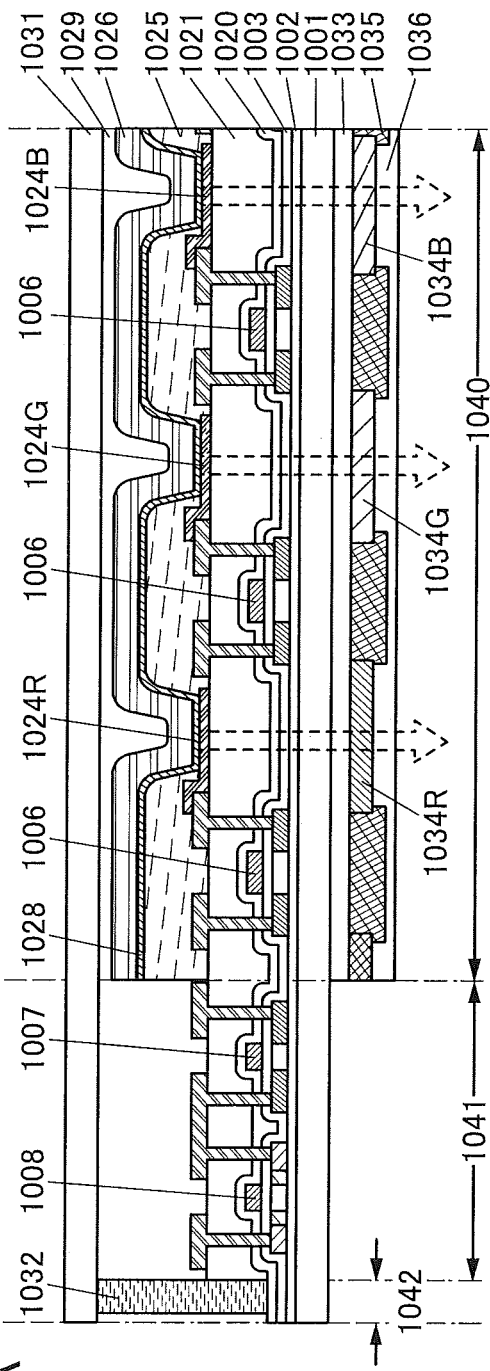
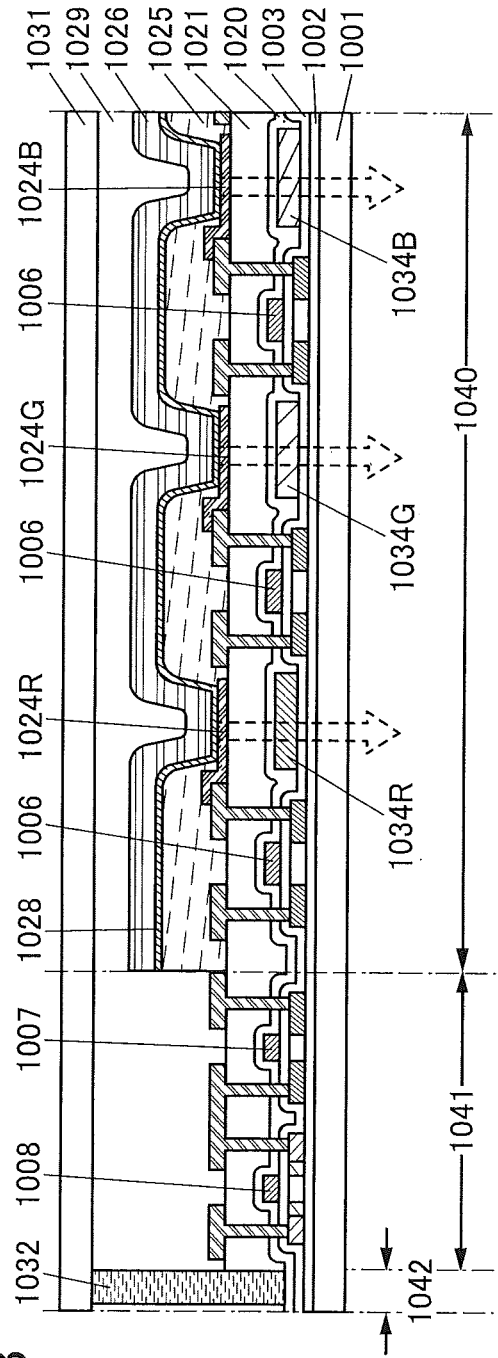

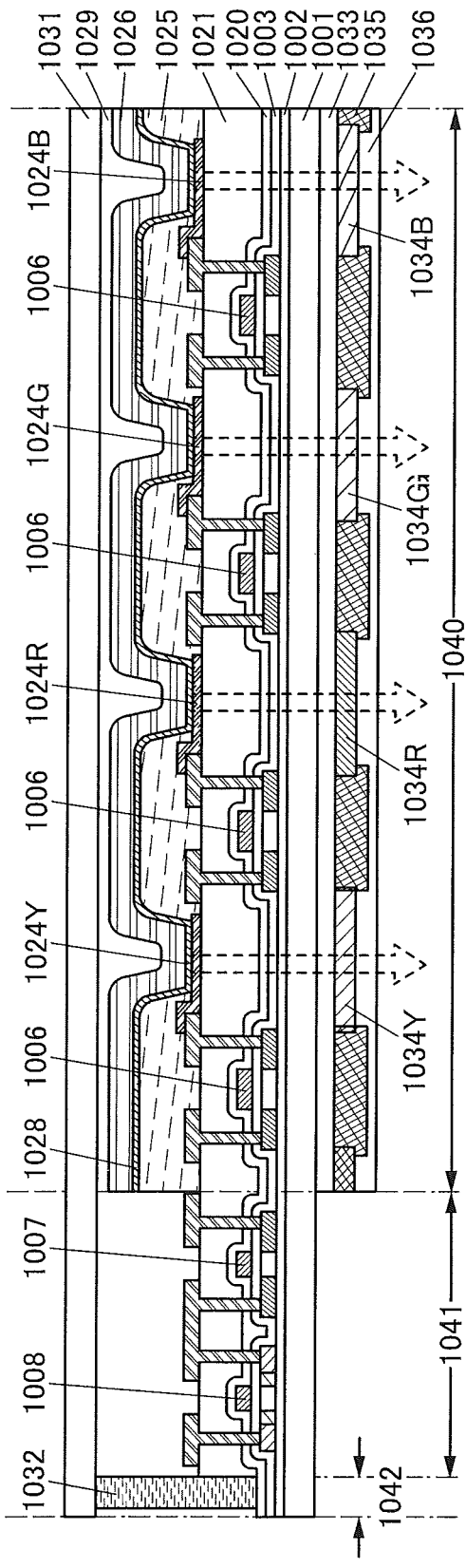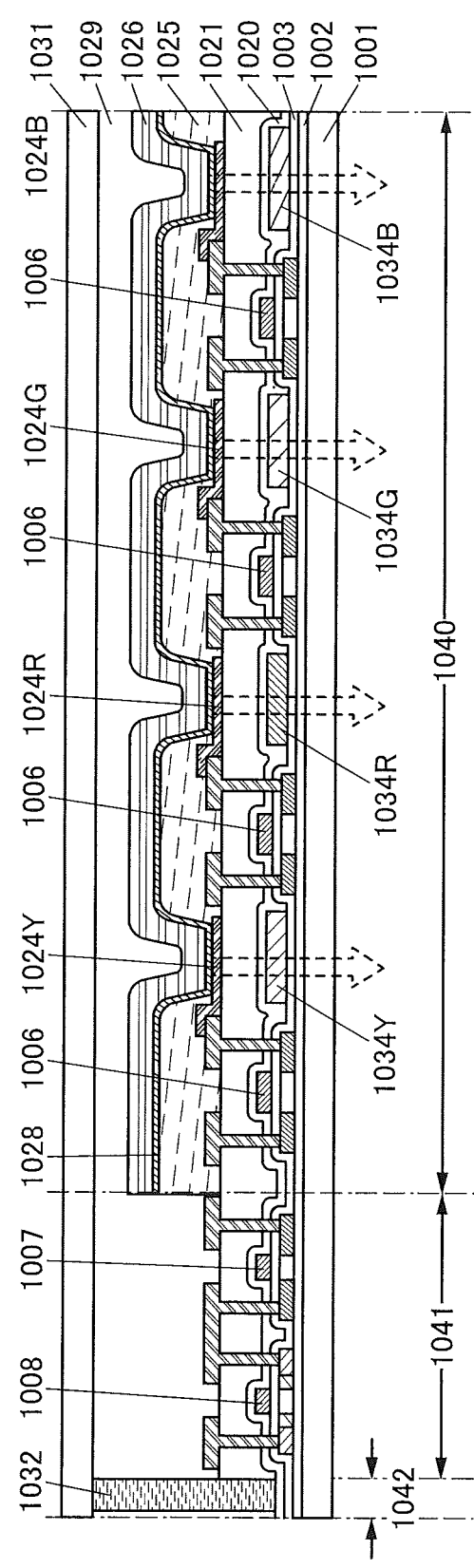

LIGHT-EMITTING ELEMENT, DISPLAY DEVICE, ELECTRONIC DEVICE, AND LIGHTING DEVICE

TECHNICAL FIELD

One embodiment of the present invention relates to a light-emitting element, or a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

In recent years, research and development have been extensively conducted on light-emitting elements using electroluminescence (EL). In a basic structure of such a light-emitting element, a layer containing a light-emitting material (an EL layer) is interposed between a pair of electrodes. By applying a voltage between the pair of electrodes of this element, light emission from the light-emitting material can be obtained.

Since the above light-emitting element is of a self-luminous type, a display device using this light-emitting element has advantages such as high visibility, no necessity of a backlight, low power consumption, and the like. Further, the display device also has advantages in that it can be formed to be thin and lightweight, and has high response speed.

In a light-emitting element (e.g., an organic EL element) whose EL layer contains an organic material as a light-emitting material and is provided between a pair of electrodes, application of a voltage between the pair of electrodes causes injection of electrons from a cathode and holes from an anode into the EL layer having a light-emitting property and thus a current flows. By recombination of the injected electrons and holes, the organic material having a light-emitting property is brought into an excited state to provide light emission.

Note that an excited state formed by an organic material can be a singlet excited state (S*) or a triplet excited state (T*). Light emission from the singlet excited state is referred to as fluorescence, and light emission from the triplet excited state is referred to as phosphorescence. The formation ratio of S* to T* in the light-emitting element is 1:3. In other words, a light-emitting element containing a material emitting phosphorescence (phosphorescent material) has higher light emission efficiency than a light-emitting element containing a material emitting fluorescence (fluorescent material). Therefore, light-emitting elements containing phosphorescent materials capable of converting triplet excitation energy into light emission has been actively developed in recent years (e.g., see Patent Document 1).

Energy for exciting an organic material depends on an energy difference between the LUMO (lowest unoccupied molecular orbital) level and the HOMO (highest occupied molecular orbital) level of the organic material. The energy difference approximately corresponds to singlet excitation energy. In a light-emitting element including an organic material emitting phosphorescence, triplet excitation energy is converted into light emission energy. Accordingly, when the organic material has a large difference between the singlet excitation energy and the triplet excitation energy, the energy for exciting the organic material is higher than the light emission energy by the energy difference. The difference between the energy for exciting the organic material and the light emission energy affects element characteristics of a light-emitting element: the driving voltage of the light-emitting element increases. An approach for inhibiting such increase in driving voltage is under development (see Patent Document 2).

Among light-emitting elements including phosphorescent materials, a light-emitting element that emits blue light has not been put into practical use yet because it is difficult to develop a stable compound having a high triplet excitation energy level. Accordingly, development of a stable phosphorescent material with high emission efficiency and a highly reliable phosphorescent light-emitting element with high emission efficiency is required.

REFERENCE

Patent Document

[Patent Document 1] Japanese Published Patent Application No. 2010-182699
[Patent Document 2] Japanese Published Patent Application No. 2012-212879

DISCLOSURE OF INVENTION

An iridium complex is known as a phosphorescent material with high emission efficiency. An iridium complex including a pyridine skeleton or a nitrogen-containing five-membered heterocyclic skeleton in a ligand is known as an iridium complex with high light emission energy. Although the pyridine skeleton and the nitrogen-containing five-membered heterocyclic skeleton have high triplet excitation energy, they have poor electron-accepting property. Accordingly, the HOMO level and LUMO level of the iridium complex having the skeleton in a ligand are high, and hole carriers are easily injected to the iridium complex, while electron carriers are not. As a result, when an iridium complex with a high light emission energy is used, excitation through direct recombination of carriers or efficient light emission by a light-emitting element is difficult in some cases.

In view of the above, an object of one embodiment of the present invention is to provide a light-emitting element that contains a phosphorescent material and has high emission efficiency. Another object of one embodiment of the present invention is to provide a light-emitting element with reduced power consumption. Another object of one embodiment of the present invention is to provide a light-emitting element with high reliability. Another object of one embodiment of the present invention is to provide a novel light-emitting element. Another object of one embodiment of the present invention is to provide a novel light-emitting device. Another object of one embodiment of the present invention is to provide a novel display device.

Note that the description of these objects does not disturb the existence of other objects. In one embodiment of the present invention, there is no need to achieve all the objects. Other objects will be apparent from and can be derived from the description of the specification and the like.

One embodiment of the present invention is a light-emitting element including an exciplex that can excite a phosphorescent material efficiently.

Therefore, one embodiment of the present invention is a light-emitting element including a first organic compound, a second organic compound, and a guest material. The LUMO level of the first organic compound is lower than that of the second organic compound. The HOMO level of the first organic compound is lower than that of the second organic compound. The HOMO level of the guest material is higher than that of the second organic compound. An energy difference between the LUMO level of the guest material and the HOMO level of the guest material is larger than an energy difference between the LUMO level of the first organic compound and the HOMO level of the second organic compound. The guest material has a function of converting triplet excitation energy into light emission. A combination of the first organic compound and the second organic compound forms an exciplex.

In the above structure, it is preferable that the energy difference between the LUMO level of the first organic compound and the HOMO level of the second organic compound be larger than or equal to transition energy calculated from an absorption edge of an absorption spectrum of the guest material. It is preferable that the energy difference between the LUMO level of the first organic compound and the HOMO level of the second organic compound be larger than or equal to light emission energy of the guest material.

Another embodiment of the present invention is a light-emitting element including a first organic compound, a second organic compound, and a guest material. The LUMO level of the first organic compound is lower than that of the second organic compound. The HOMO level of the first organic compound is lower than that of the second organic compound. The HOMO level of the guest material is higher than that of the second organic compound. An energy difference between the LUMO level of the guest material and the HOMO level of the guest material is larger than an energy difference between the LUMO level of the first organic compound and the HOMO level of the second organic compound. The guest material has a function of converting triplet excitation energy into light emission. A combination of the first organic compound and the second organic compound forms an exciplex. An energy difference between the LUMO level of the first organic compound and the HOMO level of the guest material is larger than or equal to transition energy calculated from an absorption edge of an absorption spectrum of the guest material.

Another embodiment of the present invention is a light-emitting element including a first organic compound, a second organic compound, and a guest material. The LUMO level of the first organic compound is lower than that of the second organic compound. The HOMO level of the first organic compound is lower than that of the second organic compound. The HOMO level of the guest material is higher than that of the second organic compound. An energy difference between a LUMO level of the guest material and the HOMO level of the guest material is larger than an energy difference between the LUMO level of the first organic compound and the HOMO level of the second organic compound. The guest material has a function of converting triplet excitation energy into light emission. A combination of the first organic compound and the second organic compound forms an exciplex. An energy difference between the LUMO level of the first organic compound and the HOMO level of the guest material is larger than or equal to light emission energy of the guest material.

In each of the above structures, it is preferable that the energy difference between the LUMO level of the guest material and the HOMO level of the guest material be larger than the transition energy calculated from the absorption edge of the absorption spectrum of the guest material by 0.3 eV or more.

In each of the above structures, it is preferable that the energy difference between the LUMO level of the guest material and the HOMO level of the guest material be larger than the light emission energy of the guest material by 0.3 eV or more.

In each of the above structures, it is preferable that the exciplex has a function of transferring excitation energy to the guest material. In addition, it is preferable that an emission spectrum of the exciplex have a region overlapping with an absorption band on the longest wavelength side of the absorption spectrum of the guest material.

In each of the above structures, the guest material preferably includes iridium.

In each of the above structures, it is preferable that the guest material include a ligand coordinated to the iridium, and that the ligand include a cyano group and a nitrogen-containing five-membered heterocyclic skeleton. It is preferable that the ligand include a cyano group and a triazole skeleton.

In each of the above structures, the first organic compound preferably has a function of transporting an electron, and the second organic compound preferably has a function of transporting a hole. The first organic compound preferably includes a π-electron deficient heteroaromatic ring skeleton, and the second organic compound preferably includes at least one of a π-electron rich heteroaromatic ring skeleton and an aromatic amine skeleton.

Another embodiment of the present invention is a display device including the light-emitting element having any of the above-described structures, and at least one of a color filter and a transistor. Another embodiment of the present invention is an electronic device including the above-described display device and at least one of a housing and a touch sensor. Another embodiment of the present invention is a lighting device including the light-emitting element having any of the above-described structures, and at least one of a housing and a touch sensor. The category of one embodiment of the present invention includes not only a light-emitting device including a light-emitting element but also an electronic device including a light-emitting device. The light-emitting device in this specification refers to an image display device and a light source (e.g., a lighting device). A display module in which a connector such as a flexible printed circuit (FPC) or a tape carrier package (TCP) is connected to a light-emitting device, a display module in which a printed wiring board is provided on the tip of a TCP, and a display module in which an integrated circuit (IC) is directly mounted on a light-emitting element by a chip on glass (COG) method are also embodiments of the present invention.

With one embodiment of the present invention, a light-emitting element that contains a phosphorescent material and has high emission efficiency can be provided. With one embodiment of the present invention, a light-emitting element with reduced power consumption can be provided. With one embodiment of the present invention, a light-emitting element with high reliability can be provided. With one embodiment of the present invention, a novel light-emitting element can be provided. With one embodiment of the present invention, a novel light-emitting device can be provided. With one embodiment of the present invention, a novel display device can be provided.

Note that the description of these effects does not disturb the existence of other effects. One embodiment of the present invention does not necessarily have all the effects described above. Other effects will be apparent from and can be derived from the description of the specification, the drawings, the claims, and the like.

BRIEF DESCRIPTION OF DRAWINGS

FIGS. 10A and 10B are schematic cross-sectional views each illustrating a display device of one embodiment of the present invention.

FIGS. 13A and 13B are schematic cross-sectional views each illustrating a display device of one embodiment of the present invention.

BEST MODE FOR CARRYING OUT THE INVENTION

Figure 1A:
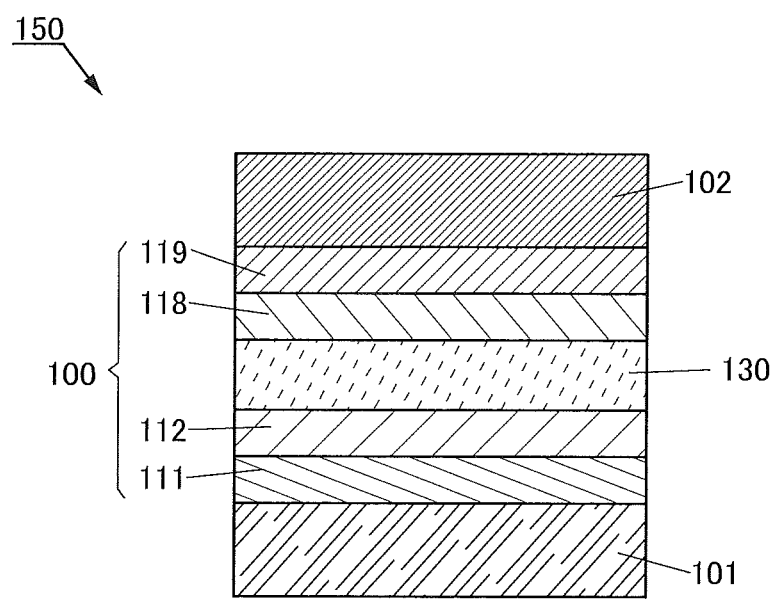
FIGS. 1A and 1B are schematic cross-sectional views of a light-emitting element of one embodiment of the present invention.

Embodiments of the present invention will be described in detail below with reference to the drawings. However, the present invention is not limited to description to be given below, and modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, a singlet excited state (S*) refers to a singlet state having excitation energy. An S1 level means the lowest level of the singlet excitation energy level, that is, the excitation energy level of the lowest singlet excited state. A triplet excited state (T*) refers to a triplet state having excitation energy. A T1 level means the lowest level of the triplet excitation energy level, that is, the excitation energy level of the lowest triplet excited state. Note that in this specification and the like, a singlet excited state and a singlet excitation energy level mean the lowest singlet excited state and the S1 level, respectively, in some cases. A triplet excited state and a triplet excitation energy level mean the lowest triplet excited state and the T1 level, respectively, in some cases.

In this specification and the like, a fluorescent material refers to a material that emits light in the visible light region when the relaxation from the singlet excited state to the ground state occurs. A phosphorescent material refers to a material that emits light in the visible light region at room temperature when the relaxation from the triplet excited state to the ground state occurs. That is, a phosphorescent material refers to a material that can convert triplet excitation energy into visible light.

Phosphorescence emission energy or a triplet excitation energy can be obtained from a wavelength of an emission peak (including a shoulder) on the shortest wavelength side of phosphorescence emission. Note that the phosphorescence emission can be observed by time-resolved photoluminescence in a low-temperature (e.g., 10 K) environment. A thermally activated delayed fluorescence emission energy can be obtained from a wavelength of an emission peak (including a shoulder) on the shortest wavelength side of thermally activated delayed fluorescence.

Note that in this specification and the like, "room temperature" refers to a temperature higher than or equal to 0° C. and lower than or equal to 40° C.

In this specification and the like, a wavelength range of blue refers to a wavelength range of greater than or equal to 400 nm and less than 505 nm, and blue light has at least one peak in that range in an emission spectrum. A wavelength range of green refers to a wavelength range of greater than or equal to 505 nm and less than 580 nm, and green light has at least one peak in that range in an emission spectrum. A wavelength range of red refers to a wavelength range of greater than or equal to 580 nm and less than or equal to 680 nm, and red light has at least one peak in that range in an emission spectrum.

Embodiment 1

In this embodiment, a light-emitting element of one embodiment of the present invention will be described below with reference to FIGS. 1A and 1B and FIGS. 2A and 2B.

<Structure Example of Light-Emitting Element>

First, a structure of the light-emitting element of one embodiment of the present invention will be described with reference to FIGS. 1A and 1B.

FIG. 1A is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1A includes functional layers such as a hole-injection layer 111, a hole-transport layer 112, an electron-transport layer 118, and an electron-injection layer 119, in addition to the light-emitting layer 130.

In this embodiment, although description is given assuming that the electrode 101 and the electrode 102 of the pair of electrodes serve as an anode and a cathode, respectively, they are not limited thereto for the structure of the light-emitting element 150. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. 1A, and a structure including at least one layer selected from the hole-injection layer 111, the hole-transport layer 112, the electron-transport layer 118, and the electron-injection layer 119 may be employed. Alternatively, the EL layer 100 may include a functional layer which is capable of lowering a hole- or electron-injection barrier, improving a hole- or electron-transport property, inhibiting transport of holes or electrons, or suppressing a quenching phenomenon by an electrode, for example. Note that the functional layers may each be a single layer or stacked layers.

Figure 1B:
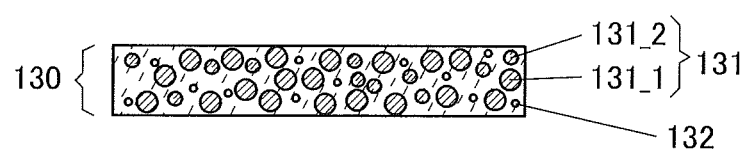

FIG. 1B is a schematic cross-sectional view illustrating an example of the light-emitting layer 130 in FIG. 1A. The light-emitting layer 130 in FIG. 1B includes a host material 131 and a guest material 132. The host material 131 includes an organic compound 131_1 and an organic compound 131_2.

The guest material 132 may be a light-emitting organic material, and the light-emitting organic material is preferably a material capable of emitting phosphorescence (hereinafter also referred to as a phosphorescent material). A structure in which a phosphorescent material is used as the guest material 132 will be described below. The guest material 132 may be rephrased as the phosphorescent material.

<Light Emission Mechanism of Light-Emitting Element>

Next, the light emission mechanism of the light-emitting layer 130 is described below.

The organic compound 131_1 and the organic compound 131_2 included in the host material 131 in the light-emitting layer 130 form an exciplex.

Although it is acceptable as long as the combination of the organic compound 131_1 and the organic compound 131_2 can form an exciplex, it is preferable that one of them be a compound having a function of transporting holes (a hole-transport property) and the other be a compound having a function of transporting electrons (an electron-transport property). In that case, a donor-acceptor exciplex is formed easily; thus, efficient formation of an exciplex is possible.

The combination of the organic compound 131_1 and the organic compound 131_2 is preferably as follows: one has a lower HOMO (highest occupied molecular orbital) level and a lower LUMO (lowest unoccupied molecular orbital) level than the other.

Figure 2A:
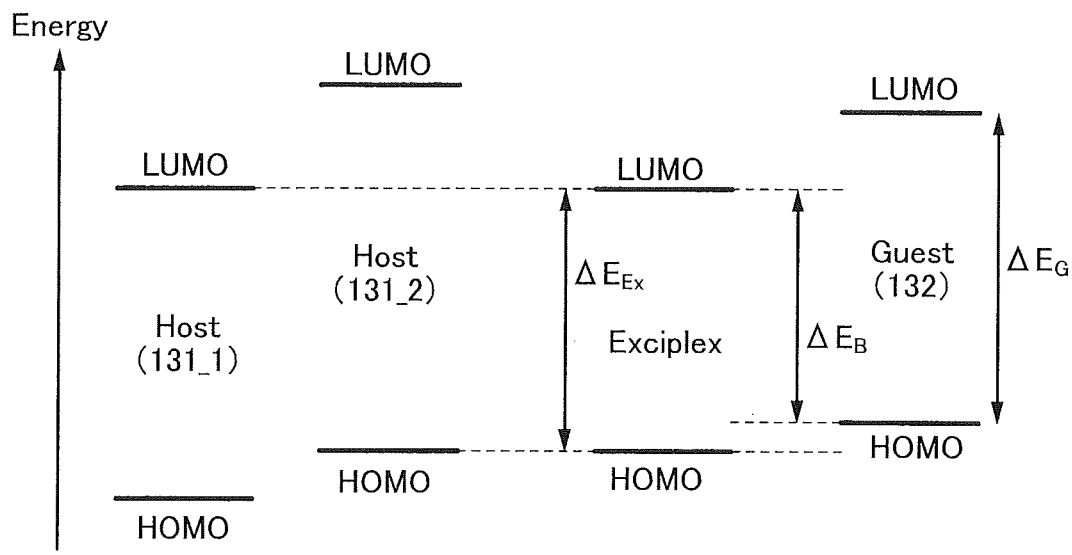
FIGS. 2A and 2B show a correlation of energy bands and a correlation of energy levels in a light-emitting layer of a light-emitting element of one embodiment of the present invention.

For example, in the case where the organic compound 131_1 has an electron-transport property and the organic compound 131_2 has a hole-transport property, it is preferable that the HOMO level of the organic compound 131_1 be lower than that of the organic compound 131_2 and the LUMO level of the organic compound 131_1 be lower than that of the organic compound 131_2 as shown in the energy band diagram in FIG. 2A.

At this time, an exciplex formed by the organic compound 131_1 and the organic compound 131_2 has excitation energy that approximately corresponds to an energy difference ($\Delta E_{Ex}$) between the LUMO level of the organic compound 131_1 and the HOMO level of the organic compound 131_2.

A difference between the HOMO level of the organic compound 131_1 and that of the organic compound 131_2 is preferably greater than or equal to 0.1 eV, and more preferably greater than or equal to 0.2 eV. A difference between the LUMO level of the organic compound 131_1 and that of the organic compound 131_2 is preferably greater than or equal to 0.1 eV, and more preferably greater than or equal to 0.2 eV. The energy difference is preferable because it facilitates injection of electron carriers and hole carriers from the pair of electrodes (the electrode 101 and the electrode 102) to the organic compound 131_1 and the organic compound 131_2.

Note that in FIG. 2A, Host (131_1) represents the organic compound 131_1, Host (131_2) represents the organic compound 131_2, Guest (132) represents the guest material 132, $\Delta E_{Ex}$ represents an energy difference between the LUMO level of the organic compound 131_1 and the HOMO level of the organic compound 131_2, $\Delta E_B$ represents an energy difference between the LUMO level of the guest material 131_1 and the HOMO level of the guest material 132, and $\Delta E_G$ represents an energy difference between the LUMO level and the HOMO level of the guest material 132.

To make the guest material 132 emit light of a short wavelength and with high emission energy, the larger the energy difference ($\Delta E_G$) between the LUMO level and the HOMO level of the guest material 132 is, the better. However, excitation energy in the light-emitting element 150 is preferably as small as possible in order to reduce the driving voltage; thus, the smaller the excitation energy of an exciplex formed by the organic compounds 131_1 and 131_2 is, the better. Therefore, the energy difference ($\Delta E_E$) between the LUMO level of the organic compound 131_1 and the HOMO level of the organic compound 131_2 is preferably small.

The guest material 132 is a phosphorescent light-emitting material and thus has a function of converting triplet excitation energy into light emission. In addition, energy is more stable in a triplet excited state than in a singlet excited state. Thus, the guest material 132 can emit light with energy smaller than the energy difference ($\Delta E_G$) between the LUMO level and the HOMO level of the guest material 132. The present inventors have found out that even in the case where the energy difference ($\Delta E_G$) between the LUMO level and the HOMO level of the guest material 132 is larger than the energy difference ($\Delta E_{Ex}$) between the LUMO level of the organic compound 131_1 and the HOMO level of the organic compound 131_2, excitation energy transfer from an exciplex formed by the organic compound 131_1 and the organic compound 131_2 to the guest material 132 is possible and light emission can be obtained from the guest material 132 as long as light emission energy ($\Delta E_{Em}$) of the guest material 132 or transition energy ($\Delta E_{abs}$) calculated from an absorption edge of an absorption spectrum is smaller than or equal to $\Delta E_{Ex}$. When $\Delta E_G$ of the guest material 132 is larger than energy ($\Delta E_{Em}$) of the light emission by the guest material 132 or the transition energy ($\Delta E_{abs}$) calculated from the absorption edge of the absorption spectrum, high electrical energy that corresponds to $\Delta E_G$ is necessary to directly cause electrical excitation of the guest material 132 and thus the driving voltage of a light-emitting element is increased. However, in one embodiment of the present invention, an exciplex is electrically excited with electrical energy that corresponds to $\Delta E_{Ex}$ (that is smaller than $\Delta E_G$), and the guest material 132 is excited by energy transfer from the exciplex, so that light emission from the guest material 132 can be obtained very efficiently with low driving voltage. That is, one embodiment of the present invention is useful particularly in the case where $\Delta E_G$ is significantly larger than energy ($\Delta E_{Em}$) of the light emission by the guest material 132 or the transition energy ($\Delta E_{abs}$) calculated from the absorption spectrum (for example, in the case where the guest material is a blue light-emitting material).

In the case where the guest material 132 includes a heavy metal, intersystem crossing between a singlet state and a triplet state is promoted by spin-orbit interaction (interaction between spin angular momentum and orbital angular momentum of an electron), and transition between a singlet ground state and a triplet excited state of the guest material 132 is not forbidden in some cases. Therefore, the emission efficiency and the absorption probability which relate to the transition between the singlet ground state and the triplet excited state of the guest material 132 can be increased. Accordingly, the guest material 132 preferably includes a metal element with large spin-orbit interaction, specifically a platinum group element (ruthenium (Ru), rhodium (Rh), palladium (Pd), osmium (Os), iridium (Ir), or platinum (Pt)). In particular, iridium is preferred because the absorption probability that relates to direct transition between a singlet ground state and a triplet excited state can be increased.

In order that the guest material 132 can emit light with a high light emission energy (light of a short wavelength), the lowest triplet excitation energy level of the guest material 132 is preferably high. To make the lowest triplet excitation energy level of the guest material 132 high, the ligand coordinated to the heavy metal atom of the guest material 132 preferably has a high lowest triplet excitation energy level, a low electron-accepting property, and a high LUMO level.

Such a guest material tends to have a molecular structure having a high HOMO level and a high hole-accepting property. When the guest material 132 has a molecular structure having a high hole-accepting property, the HOMO level of the guest material 132 is sometimes higher than that of the organic compound 131_2. In addition, when $\Delta E_G$ is larger than $\Delta E_{Ex}$, the LUMO level of the guest material 132 is higher than the LUMO level of the organic compound 131_1. Note that the energy difference between the LUMO level of the guest material 132 and the LUMO level of the organic compound 131_1 is larger than the energy difference between the HOMO level of the guest material 132 and the HOMO level of the organic compound 131_2.

Here, when the HOMO level of the guest material 132 is higher than that of the organic compound 131_2, and the LUMO level of the guest material 132 is higher than that of the organic compound 131_1, among carriers (holes and electrons) injected from the pair of electrodes (the electrode 101 and the electrode 102), holes injected from the anode are easily injected to the guest material 132 and electrons injected from the cathode are easily injected to the organic compound 131_1 in the light-emitting layer 130. Thus, there is a possibility that the organic compound 131_1 and the guest material 132 form an exciplex when the guest material 132 has the highest HOMO level and the organic compound 131_1 has the lowest LUMO level among the materials of the light-emitting layer 130. Particularly when an energy difference ($\Delta E_B$) between the LUMO level of the organic compound 131_1 and the HOMO level of the guest material 132 becomes smaller than the emission energy of the guest material ($\Delta E_{Em}$), generation of exciplexes formed by the organic compound 131_1 and the guest material 132 becomes predominant. In that case, it is difficult to form an excited state by the guest material 132 alone, which decreases emission efficiency of the light-emitting element.

Note that the reactions described above can be expressed by Formula (G11) or (G12).

$$A^- + G^+ \rightarrow (A \cdot G)^* \quad (G11)$$

$$A + G^* \rightarrow (A \cdot G)^* \quad (G12)$$

Formula (G11) represents a reaction in which the organic compound 131_1 accepts an electron ($A^-$) and the guest material 132 accepts a hole ($G^+$), whereby the organic compound 131_1 and the guest material 132 form an exciplex (($A \cdot G$)*). Formula (G12) represents a reaction in which the guest material 132 ($G^*$) in the excited state interacts with the organic compound 131_1 (A) in the ground state, whereby the organic compound 131_1 and the guest material 132 form an exciplex (($A \cdot G$)*). Formation of the exciplex (($A \cdot G$)*) by the organic compound 131_1 and the guest material 132 makes it difficult to form an excited state (G) of the guest material 132 alone.

An exciplex formed by the organic compound 131_1 and the guest material 132 has excitation energy that approximately corresponds to an energy difference ($\Delta E_B$) between the LUMO level of the organic compound 131_1 and the HOMO level of the guest material 132. The present inventors have found that when the energy difference ($\Delta E_B$) between the LUMO level of the organic compound 131_1 and the HOMO level of the guest material 132 is larger than or equal to an emission energy ($\Delta E_{Em}$) of the guest material 132 or a transition energy ($\Delta E_{abs}$)) calculated from the absorption edge of the absorption spectrum of the guest material 132, the reaction for forming an exciplex by the organic compound 131_1 and the guest material 132 can be inhibited and thus the emission efficiency of the guest material 132 can be high. Because $\Delta E_{abs}$ is smaller than $\Delta E_B$, the guest material 132 easily receives an excitation energy. Excitation of the guest material 132 by reception of the excitation energy needs lower energy and provides a more stable excitation state than formation of an exciplex by the organic compound 131_1 and the guest material 132.

As described above, even when the energy difference ($\Delta E_G$) between the LUMO level and the HOMO level of the guest material 132 is larger than the energy difference ($\Delta E_E$) between the LUMO level of the organic compound 131_1 and the HOMO level of the organic compound 131_2, excitation energy transfers efficiently from an exciplex formed by the organic compound 131_1 and the organic compound 131_2 to the guest material 132 as long as transition energy ($\Delta E_{abs}$) calculated from an absorption edge of an absorption spectrum of the guest material 132 is smaller than or equal to $\Delta E_{Ex}$. As a result, a light-emitting element with high efficiency and low driving voltage can be obtained, which is a feature of one embodiment of the present invention. At this time, the formula $\Delta E_{abs} \leq \Delta E_{Ex} < \Delta E_G$ ($\Delta E_{abs}$ is smaller than or equal to $\Delta E_{Ex}$ and $\Delta E_{Ex}$ is smaller than $\Delta E_G$) is satisfied. Therefore, the mechanism of one embodiment of the present invention is suitable in the case where $\Delta E_{abs}$ is smaller than $\Delta E_G$. In other words, the mechanism of one embodiment of the present invention is suitable in the case where $\Delta E_G$ is larger than $\Delta E_{abs}$. Specifically, the energy difference ($\Delta E_G$) between the LUMO level and the HOMO level of the guest material 132 is preferably larger than the transition energy ($\Delta E_{abs}$) calculated from the absorption edge of the absorption spectrum of the guest material 132 by 0.3 eV or more, further preferably by 0.4 eV or more. Since the light emission energy ($\Delta E_{Em}$) of the guest material 132 is smaller than or equal to $\Delta E_{abs}$, the energy difference ($\Delta E_G$) between the LUMO level and the HOMO level of the guest material 132 is preferably larger than the light emission energy ($\Delta E_{Em}$) of the guest material 132 by 0.3 eV or more, further preferably by 0.4 eV or more. Note that the light emission energy ($\Delta E_{Em}$) can be derived from the wavelength of an emission peak (the maximum value, or including a shoulder) on the shortest wavelength side of the emission spectrum.

It is preferable that $\Delta E_{abs} \leq \Delta E_B$ ($\Delta E_{abs}$ is smaller than or equal to $\Delta E_B$) or $\Delta E_E \leq \Delta E_B$ ($\Delta E_{Em}$ is smaller than or equal to $\Delta E_B$), which is described above, when the HOMO level of the guest material 132 is higher than that of the organic compound 131_2. Therefore, $\Delta E_{abs} \leq \Delta E_B < \Delta E_{Ex} < \Delta E_G$ ($\Delta E_{abs}$ is smaller than or equal to $\Delta E_B$, $\Delta E_B$ is smaller than $\Delta E_{Ex}$, and $\Delta E_{Ex}$ is smaller than $\Delta E_G$) or $\Delta E_E \leq \Delta E_B < \Delta E_{Ex} < \Delta E_G$ ($\Delta E_{Em}$ is smaller than or equal to $\Delta E_B$, $\Delta E_B$ is smaller than $\Delta E_{Ex}$, and $\Delta E_{Ex}$ is smaller than $\Delta E_G$) is preferably satisfied. The above conditions are important discoveries in one embodiment of the present invention.

The shorter the emission wavelength of the guest material 132 is and the higher the light emission energy ($\Delta E_{Em}$) is, the larger the energy difference ($\Delta E_G$) between the LUMO level and the HOMO level of the guest material 132 is, and accordingly, larger energy is needed for electrically exciting the guest material 132. However, when the transition energy ($\Delta E_{abs}$) calculated from the absorption edge of the absorption spectrum of the guest material 132 is smaller than or equal to $\Delta E_{Ex}$, according to one embodiment of the invention, the guest material 132 can be excited with energy as small as $\Delta E_{Ex}$, which is smaller than $\Delta E_G$, whereby the power consumption of the light-emitting element can be reduced. Therefore, the effect of the mechanism of one embodiment of the present invention is brought to the fore in the case where an energy difference between the transition energy ($\Delta E_{abs}$) calculated from the absorption edge of the absorption spectrum of the guest material 132 and the energy difference ($\Delta E_G$) between the LUMO level and the HOMO level of the guest material 132 is large (i.e., particularly in the case where the guest material is a blue light-emitting material).

As the transition energy ($\Delta E_{abs}$) calculated from the absorption edge of the absorption spectrum of the guest material 132 decreases, the light emission energy of the guest material 132 also decreases. In that case, light emission that needs high energy, such as blue light emission, is difficult to obtain. That is, when a difference between $\Delta E_{abs}$ and $\Delta E_G$ is too large, high-energy light emission such as blue light emission is obtained with difficulty.

For these reasons, the energy difference ($\Delta E_G$) between the LUMO level and the HOMO level of the guest material 132 is preferably larger than the transition energy ($\Delta E_{abs}$) calculated from the absorption edge of the absorption spectrum of the guest material 132 by 0.3 eV to 0.8 eV, more preferably by 0.4 eV to 0.8 eV, still more preferably by 0.5 eV to 0.8 eV. Since the light emission energy ($\Delta E_{Em}$) of the guest material 132 is smaller than or equal to $\Delta E_{abs}$, the energy difference ($\Delta E_G$) between the LUMO level and the HOMO level of the guest material 132 is preferably larger than the light emission energy ($\Delta E_{Em}$) of the guest material 132 by 0.3 eV to 0.8 eV, more preferably by 0.4 eV to 0.8 eV, still more preferably by 0.5 eV to 0.8 eV.

A preferable difference between the HOMO level of the guest material 132 and the HOMO level of the organic compound 131_2 is larger than or equal to 0.05 eV and smaller than or equal to 0.4 eV. The reason is that moderate trapping of holes leads to a longer lifetime of a light-emitting element, while too high a HOMO level of the guest material reduces $\Delta E_B$ described above. A difference in LUMO level between the guest material 132 and the organic compound 131_1 is preferably greater than or equal to 0.05 eV, more preferably greater than or equal to 0.1 eV, and still more preferably greater than or equal to 0.2 eV. This is because electron carriers are easily injected to the organic compound 131_1 with such an energy level correlation.

Since the energy difference ($\Delta E_{Ex}$) between the LUMO level of the organic compound 131_1 and the HOMO level of the organic compound 131_2 is smaller than the energy difference between the LUMO level and the HOMO level of the organic compound 131_1 and smaller than the energy difference between the LUMO level and the HOMO level of the organic compound 131_2, formation of an exciplex by the organic compound 131_1 and the organic compound 131_2 is more energetically stable than formation of an excited state only by either the organic compound 131_1 or the organic compound 131_2. Furthermore, when the energy difference ($\Delta E_G$) between the LUMO level and the HOMO level of the guest material 132 is larger than the energy difference ($\Delta E_{Ex}$) between the LUMO level of the organic compound 131_1 and the HOMO level of the organic compound 131_2, formation of an exciplex by the organic compound 131_1 and the organic compound 131_2 is more energetically stable as an excited state formed by recombination of carriers (holes and electrons) injected to the light-emitting layer 130. Therefore, most of excited states generated in the light-emitting layer 130 exist as exciplexes formed by the organic compound 131_1 and the organic compound 131_2. Accordingly, the structure of one embodiment of the present invention facilitates excitation energy transfer from the exciplex to the guest material 132, leading to lower driving voltage of the light-emitting element and higher emission efficiency.

Note that the LUMO level of the guest material 132 may be higher than or lower than the LUMO level of the organic compound 131_2.

In addition, the guest material 132 serves as a hole trap in the light-emitting layer 130 because of its HOMO level higher than the HOMO level of the organic compound 131_1. This is preferable because the carrier balance in the light-emitting layer can be easily controlled owing to the guest material 132 serving as a hole trap, leading to a longer lifetime.

In the case where the combination of the organic compounds 131_1 and 131_2 is a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

The exciplex formed by the organic compound 131_1 and the organic compound 131_2 has HOMO in one of the organic compounds and LUMO in the other of the organic compounds; thus, the overlap between the HOMO and the LUMO is extremely small. That is, in the exciplex, a difference between a singlet excitation energy level and a triplet excitation energy level is small. Thus, the difference between the triplet excitation energy level and the singlet excitation energy level of the exciplex formed by the organic compound 131_1 and the organic compound 131_2 is preferably larger than 0 eV and smaller than or equal to 0.2 eV, more preferably larger than 0 eV and smaller than or equal to 0.1 eV.

Figure 2B:
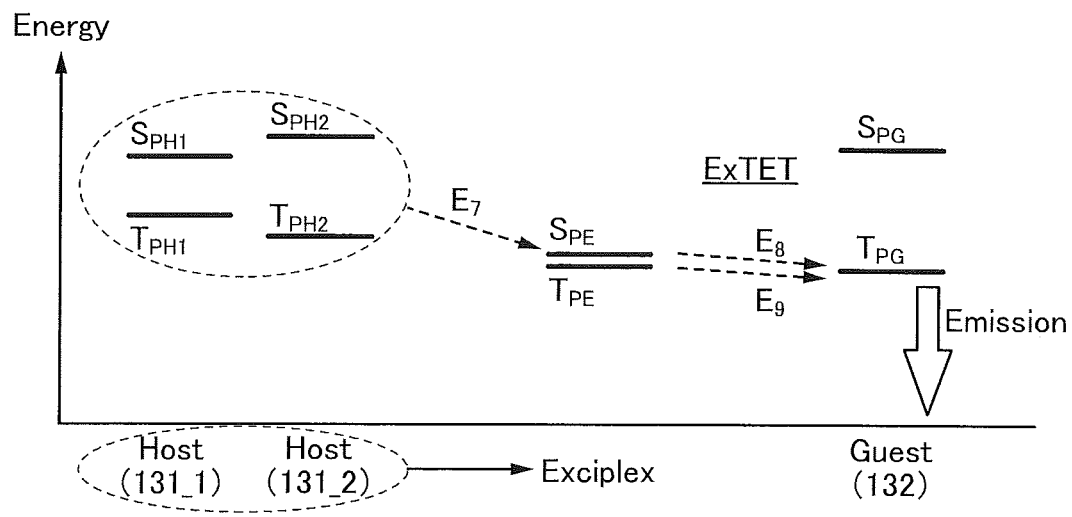

FIG. 2B shows a correlation of energy levels of the organic compound 131_1, the organic compound 131_2, and the guest material 132 in the light-emitting layer 130. The following explains what terms and signs in FIG. 2B represent:

Host (131_1): a host material (the organic compound 131_1);
Host (131_2): a host material (the organic compound 131_2);
Guest (132): the guest material 132 (the phosphorescent material);
Exciplex: an exciplex (the organic compound 131_1 and the organic compound 131_2);
$S_{PH1}$: the S1 level of the host material (the organic compound 131_1);
$T_{PH1}$: the T1 level of the host material (the organic compound 131_1);
$S_{PH2}$: the S1 level of the host material (the organic compound 131_2);
$T_{PH2}$: the T1 level of the host material (the organic compound 131_2);
$S_{PG}$: the S1 level of the guest material 132 (the phosphorescent material);
$T_{PG}$: the T1 level of the guest material 132 (the phosphorescent material);
$S_{PE}$: the S1 level of the exciplex; and
$T_{PE}$: the T1 level of the exciplex.

In the light-emitting element of one embodiment of the present invention, the organic compounds 131_1 and 131_2 included in the light-emitting layer 130 form an exciplex. The S1 level of the exciplex ($S_{PE}$) and the T1 level of the exciplex ($T_{PE}$) are adjacent to each other (see Route $E_7$ in FIG. 2B).

An exciplex is an excited state formed from two kinds of substances. In photoexcitation, the exciplex is formed by interaction between one substance in an excited state and the other substance in a ground state. The two kinds of substances that have formed the exciplex return to a ground state by emitting light and serve as the original two kinds of substances. In electrical excitation, when one substance is brought into an excited state, the one immediately interacts with the other substance to form an exciplex. Alternatively, one substance receives a hole and the other substance receives an electron to readily form an exciplex. In this case, any of the substances can form an exciplex without foliating an excited state by itself and accordingly, most of excited states generated in the light-emitting layer 130 can exist as exciplexes. Because the excitation energy levels ($S_E$ and $T_E$)

of the exciplex are lower than the S1 levels ($S_{PH1}$ and $S_{PH2}$) of the host materials (the organic compound 131_1 and the organic compound 131_2) that form the exciplex, the excited state of the host material 131 can be formed with lower excitation energy. Accordingly, the driving voltage of the light-emitting element 150 can be reduced.

Both energies of $S_{PE}$ and $T_{PE}$ of exciplexes are then transferred to the T1 level ($T_{PG}$) of the guest material 132 (the phosphorescent material); thus, light emission is obtained (see Routes $E_8$ and $E_9$ in FIG. 2B).

Furthermore, the T1 level ($T_{PE}$) of the exciplex is preferably higher than the T1 level ($T_{PG}$) of the guest material 132. When the T1 levels satisfy such a relation, the singlet excitation energy and the triplet excitation energy of the formed exciplex can be transferred from the S1 level ($S_{PE}$) and the T1 level ($T_{PE}$) of the exciplex to the T1 level ($T_{PG}$) of the guest material 132.

When the light-emitting layer 130 has the above-described structure, light emission from the guest material 132 (the phosphorescent material) of the light-emitting layer 130 can be obtained efficiently.

The above-described processes through Routes $E_7$, $E_8$, and $E_9$ may be referred to as exciplex-triplet energy transfer (ExTET) in this specification and the like. In other words, in the light-emitting layer 130, excitation energy is given from the exciplex to the guest material 132. In that case, the reverse intersystem crossing efficiency from $T_{PE}$ to $S_{PE}$ does not need to be high and the emission quantum yield from $S_{PE}$ does not need to be high either, whereby materials can be selected from a wide range of options.

Note that the reactions described above can be expressed by Formulae (G13) to (G15).

$$D^+ + A^- \rightarrow (D \cdot A)^* \quad (G13)$$

$$(D \cdot A)^* + G \rightarrow D + A + G^* \quad (G14)$$

$$G^* \rightarrow G + h\nu \quad (G15)$$

In Formula (G13), one of the organic compound 131_1 and the organic compound 131_2 accepts a hole ($D^+$) and the other accepts an electron (K), whereby the organic compound 131_1 and the organic compound 131_2 form an exciplex (($D \cdot A$)*). In Formula (G14), energy transfers from the exciplex (($D \cdot A$)*) to the guest material 132 (G), whereby an excited state of the guest material 132 ($G^*$) is generated. After that, as expressed by Formula (G15), the guest material 132 in the excited state emits light ($h\nu$).

Note that in order to efficiently transfer excitation energy from the exciplex to the guest material 132, the T1 level ($T_{PE}$) of the exciplex is preferably lower than the T1 levels of the organic compounds (the organic compound 131_1 and the organic compound 131_2) in the host material which form the exciplex. Thus, quenching of the triplet excitation energy of the exciplex due to the organic compounds is less likely to occur, which causes efficient energy transfer to the guest material 132.

When the organic compound 131_2 includes a skeleton having a strong donor property, a hole that has been injected to the light-emitting layer 130 is easily injected in the organic compound 131_2 and easily transported. When the organic compound 131_1 includes a skeleton having a strong acceptor property, an electron that has been injected to the light-emitting layer 130 is easily injected in the organic compound 131_1 and easily transported. When electrons and holes are injected in the organic compound 131_1 and the organic compound 131_2, respectively, the organic compound 131_1 and the organic compound 131_2 easily form an exciplex.

When the light-emitting layer 130 has the above-described structure, light emission from the guest material 132 of the light-emitting layer 130 can be obtained efficiently.

<Energy Transfer Mechanism>

Next, factors controlling the processes of intermolecular energy transfer between the host material 131 and the guest material 132 will be described. As mechanisms of the intermolecular energy transfer, two mechanisms, i.e., Förster mechanism (dipole-dipole interaction) and Dexter mechanism (electron exchange interaction), have been proposed.

Although the intermolecular energy transfer process between the host material 131 and the guest material 132 is described here, the same can apply to a case where the host material 131 is an exciplex.

<<Förster Mechanism>>

In Förster mechanism, energy transfer does not require direct contact between molecules and energy is transferred through a resonant phenomenon of dipolar oscillation between the host material 131 and the guest material 132. By the resonant phenomenon of dipolar oscillation, the host material 131 provides energy to the guest material 132, and thus, the host material 131 in an excited state is brought to a ground state and the guest material 132 in a ground state is brought to an excited state. Note that the rate constant $k_{h^* \rightarrow g}$ of Förster mechanism is expressed by Formula (1).

[Formula 1]

$$k_{h^* \rightarrow g} = \frac{9000c^4 K^2 \phi \ln 10}{128\pi^5 n^4 N \tau R^6} \int \frac{f_h'(\nu)\varepsilon_g(\nu)}{\nu^4} d\nu \quad (1)$$

In Formula (1), $\nu$ denotes a frequency, $f_h'(\nu)$ denotes a normalized emission spectrum of the host material 131 (a fluorescence spectrum in energy transfer from a singlet excited state, and a phosphorescence spectrum in energy transfer from a triplet excited state), $\varepsilon_g(\nu)$ denotes a molar absorption coefficient of the guest material 132, N denotes Avogadro's number, n denotes a refractive index of a medium, R denotes an intermolecular distance between the host material 131 and the guest material 132, $\tau$ denotes a measured lifetime of an excited state (fluorescence lifetime or phosphorescence lifetime), c denotes the speed of light, $\phi$ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) dependent on the orientation of a transition dipole moment of the host material 131 and that of a transition dipole moment of the guest material 132. Note that $K^2$ is 2/3 in random orientation.

<<Dexter Mechanism>>

In Dexter mechanism, the host material 131 and the guest material 132 are within a contact effective range where their orbitals overlap with each other, and the host material 131 in an excited state and the guest material 132 in a ground state exchange their electrons, which leads to energy transfer. Note that the rate constant $k_{h^* \rightarrow g}$ of Dexter mechanism is expressed by Formula (2).

[Formula 2]

$$k_{h^* \rightarrow g} = \left(\frac{2\pi}{h}\right) K^2 \exp\left(-\frac{2R}{L}\right) \int f_h'(\nu)\varepsilon_g'(\nu) d\nu \quad (2)$$

In Formula (2), h denotes a Planck constant, K denotes a constant having an energy dimension, $\nu$ denotes a frequency, f'ₕ(ν) denotes a normalized emission spectrum of the host material 131 (a fluorescence spectrum in energy transfer from a singlet excited state, and a phosphorescence spectrum in energy transfer from a triplet excited state), $\varepsilon'_g(\nu)$ denotes a normalized absorption spectrum of the guest material 132, L denotes an effective molecular radius, and R denotes an intermolecular distance between the host material 131 and the guest material 132.

Here, the efficiency of energy transfer from the host material 131 to the guest material 132 (energy transfer efficiency $\phi_{ET}$) is expressed by Formula (3). In the formula, $k_r$ denotes a rate constant of a light-emission process (fluorescence in energy transfer from a singlet excited state, and phosphorescence in energy transfer from a triplet excited state) of the host material 131, $k_n$ denotes a rate constant of a non-light-emission process (thermal deactivation or intersystem crossing) of the host material 131, and τ denotes a measured lifetime of an excited state of the host material 131.

[Formula 3]

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula (3), it is found that the energy transfer efficiency $\phi_{ET}$ can be increased by increasing the rate constant $k_{h^* \to g}$ of energy transfer so that another competing rate constant $k_r + k_n (=1/\tau)$ becomes relatively small.

<<Concept for Promoting Energy Transfer>>

In energy transfer by Förster mechanism, high energy transfer efficiency $\phi_{ET}$ is obtained when quantum yield φ (a fluorescence quantum yield in the case where energy transfer from a singlet excited state is discussed, and a phosphorescence quantum yield in the case where energy transfer from a triplet excited state is discussed) is high. Furthermore, it is preferable that the emission spectrum (the fluorescence spectrum in the case where energy transfer from the singlet excited state is discussed) of the host material 131 have a large overlap with the absorption spectrum (absorption corresponding to the transition from the singlet ground state to the triplet excited state) of the guest material 132. It is preferable that the molar absorption coefficient of the guest material 132 be also high. This means that the emission spectrum of the host material 131 overlaps with the absorption band of the absorption spectrum of the guest material 132 which is on the longest wavelength side.

In energy transfer by Dexter mechanism, in order to make the rate constant $k_{h^* \to g}$ large, it is preferable that the emission spectrum (a fluorescence spectrum in the case where energy transfer from a singlet excited state is discussed, and a phosphorescence spectrum in the case where energy transfer from a triplet excited state is discussed) of the host material 131 have a large overlap with the absorption spectrum (absorption corresponding to transition from a singlet ground state to a triplet excited state) of the guest material 132. Therefore, the energy transfer efficiency can be optimized by making the emission spectrum of the host material 131 overlap with the absorption band of the absorption spectrum of the guest material 132 which is on the longest wavelength side.

In a manner similar to that of the energy transfer from the host material 131 to the guest material 132, the energy transfer by both Förster mechanism and Dexter mechanism also occurs in the energy transfer process from the exciplex to the guest material 132.

Accordingly, one embodiment of the present invention provides a light-emitting element including, as the host material 131, the organic compound 131_1 and the organic compound 131_2 which form an exciplex in combination with each other that functions as an energy donor capable of efficiently transferring energy to the guest material 132. The excitation energy for forming the exciplex by the organic compound 131_1 and the organic compound 131_2 can be lower than the excitation energy of the organic compound 131_1 in the excited state and lower than the excitation energy of the organic compound 131_2 in the excited state. Therefore, the driving voltage of the light-emitting element 150 can be reduced. Furthermore, in order to facilitate energy transfer from the singlet excitation energy level of the exciplex to the triplet excitation energy level of the guest material 132 having a function of an energy acceptor, it is preferable that the emission spectrum of the exciplex overlap with the absorption band of the absorption spectrum of the guest material 132 which is on the longest wavelength side (low energy side). With such emission and absorption spectra, the efficiency of generating the triplet excited state of the guest material 132 can be increased. The exciplex generated in the light-emitting layer 130 has a feature in that the singlet excitation energy level is close to the triplet excitation energy level. Therefore, by overlapping the emission spectrum of the exciplex and the absorption band of the absorption spectrum of the guest material 132 which is on the longest wavelength side (lowest energy side), energy transfer from the triplet excitation energy level of the exciplex to the triplet excitation energy level of the guest material 132 can be facilitated.

<Material>

Next, components of a light-emitting element of one embodiment of the present invention are described in detail below.

<<Light-Emitting Layer>>

In the light-emitting layer 130, the host material 131 is present in the largest proportion by weight, and the guest material 132 (the phosphorescent material) is dispersed in the host material 131. The T1 level of the host material 131 (the organic compound 131_1 and the organic compound 131_2) in the light-emitting layer 130 is preferably higher than the T1 level of the guest material (the guest material 132) in the light-emitting layer 130.

<<Host Material>>

As the organic compound 131_1, a material having a property of transporting more electrons than holes can be used, and a material having an electron mobility of $1 \times 10^{-6}$ cm²/Vs or higher is preferable. A compound including a π-electron deficient heteroaromatic ring skeleton such as a nitrogen-containing heteroaromatic compound, or a zinc- or aluminum-based metal complex can be used, for example, as the material which easily accepts electrons (the material having an electron-transport property). Specific examples include a metal complex having a quinoline ligand, a benzoquinoline ligand, an oxazole ligand, and a thiazole ligand. In addition, a compound such as an oxadiazole derivative, a triazole derivative, a benzimidazole derivative, a quinoxaline derivative, a dibenzoquinoxaline derivative, a phenanthroline derivative, a pyridine derivative, a bipyridine derivative, a pyrimidine derivative, and a triazine derivative can be given.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolate]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3-(3,9'-bi-9H-carbazol-9-yl)phenyl]dibenzo[f h]quinoxaline (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCzPTzn); heterocyclic compounds having a pyridine skeleton such as 3,5-bis[3-(9H-carbazol-9-yl)phenyl]pyridine (abbreviation: 35DCzPPy); and heteroaromatic compounds such as 4,4'-bis(5-methylbenzoxazol-2-yl)stilbene (abbreviation: BzOs). Among the heterocyclic compounds, the heterocyclic compounds having a triazine skeleton, a diazine (pyrimidine, pyrazine, pyridazine) skeleton, or a pyridine skeleton are highly reliable and stable and are thus preferably used. In addition, the heterocyclic compounds having the skeletons have a high electron-transport property to contribute to a reduction in driving voltage. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ cm$^2$/Vs or higher. Note that other substances may also be used as long as their electron-transport properties are higher than their hole-transport properties.

As the organic compound 131_2, a substance which can form an exciplex together with the organic compound 131_1 is preferably used. Specifically, the organic compound 131_2 preferably includes a skeleton having a high donor property, such as a π-electron rich heteroaromatic ring skeleton or an aromatic amine skeleton. Examples of the compound having a π-electron rich heteroaromatic ring skeleton include heteroaromatic compounds such as a dibenzothiophene derivative, a dibenzofuran derivative, and a carbazole derivative. In that case, it is preferable that the organic compound 131_1, the organic compound 131_2, and the guest material 132 (the phosphorescent material) be selected such that the emission peak of the exciplex formed by the organic compound 131_1 and the organic compound 131_2 overlaps with an absorption band, specifically an absorption band on the longest wavelength side, of a triplet metal to ligand charge transfer (MLCT) transition of the guest material 132 (the phosphorescent material). This makes it possible to provide a light-emitting element with drastically improved emission efficiency. Note that in the case where a thermally activated delayed fluorescence material is used instead of the phosphorescent material, it is preferable that the absorption band on the longest wavelength side be a singlet absorption band.

As the organic compound 131_2, materials having a hole-transport property given below can be used.

A material having a property of transporting more holes than electrons can be used as the hole-transport material, and a material having a hole mobility of $1\times10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

Examples of the aromatic amine compounds that can be used as the material having a high hole-transport property are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-b is (4-methyl-1-naphthypanthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ cm$^2$Ns or higher and having greater than or equal to 14 and less than or equal to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl) methacrylamide] (abbreviation: PTPDMA), and poly[N,N-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1'-TNATA), 4,4',4"-tris(N,N-diphenylamino) triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl] fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds, triphenylene compounds, phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation: Cz2DBT), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in driving voltage.

<<Guest Material>>

As the guest material 132 (phosphorescent material), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

The organic compound 131_1, the organic compound 131_2, and the guest material 132 (phosphorescent material) are preferably selected such that the LUMO level of the guest material 132 (the phosphorescent material) is higher than that of the organic compound 131_1 and the HOMO level of the guest material 132 is higher than that of the organic compound 131_2. With this structure, a light-emitting element with high emission efficiency and low driving voltage can be obtained.

Examples of the substance that has an emission peak in the blue or green wavelength range include organometallic iridium complexes having a 4H-triazole skeleton, such as tris {2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2, 6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N, C$^{2'}$]iridium(III) tetrakis(1-pyrazolyl)borate (abbreviation: FIr6), bis[2-(4',6'-difluorophenyl)pyridinato-N, C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(Ill) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN$^3$]phenyl-κC} iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato) (dipivaloylmethanato)iridium(M) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N, C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and light emission efficiency and are thus particularly preferable. Further, the organometallic iridium complexes having a pyrazine skeleton can provide red light emission with favorable chromaticity.

The above-described organometallic iridium complexes that have a nitrogen-containing five-membered heterocyclic skeleton such as a 4H-triazole skeleton, a 1H-triazole skeleton, and an imidazole skeleton and the above-described iridium complexes that have a pyridine skeleton have ligands with a low electron-accepting property and easily have a high HOMO level; therefore, those complexes are suitable for one embodiment of the present invention.

Among the above organometallic iridium complexes that have a nitrogen-containing five-membered heterocyclic skeleton, at least the iridium complexes that have a substituent including a cyano group can be suitably used for the light-emitting element of one embodiment of the present invention because they have appropriately lowered LUMO and HOMO levels owing to a high electron-withdrawing property of the cyano group. Furthermore, since those iridium complexes have a high triplet excitation energy level, a light-emitting element including any of the iridium complexes can emit blue light with high emission efficiency. Since the iridium complexes are highly resistant to repetition of oxidation and reduction, a light-emitting element including any of the iridium complexes can have a long driving lifetime.

Note that the iridium complex preferably includes a ligand in which an aryl group including a cyano group is bonded to the nitrogen-containing five-membered heterocyclic skeleton, and the number of carbon atoms of the aryl group is preferably 6 to 13 in terms of stability and reliability of the element characteristics. In that case, the iridium complex can be vacuum-evaporated at a relatively low temperature, and accordingly is unlikely to deteriorate due to pyrolysis or the like at evaporation.

The iridium complex including a ligand in which a cyano group is bonded to a nitrogen atom of a nitrogen-containing five-membered heterocyclic skeleton through an arylene group can keep a high triplet excitation energy level, and thus can be favorably used in a light-emitting element emitting high-energy light such as blue light. The light-emitting element including the iridium complex can emit high-energy light such as blue light with higher efficiency than a light-emitting element which does not include a cyano group. Moreover, by bonding a cyano group to a particular site as described above, a highly reliable light-emitting element emitting high-energy light such as blue light can be obtained. Note that it is preferable that the nitrogen-containing five-membered heterocyclic skeleton and the cyano group be bonded through an arylene group such as a phenylene group.

When the number of carbon atoms of the arylene group is 6 to 13, the iridium complex is a compound with a relatively low molecular weight and accordingly suitable for vacuum evaporation (capable of being vacuum-evaporated at a relatively low temperature). In general, a lower molecular weight compound tends to have lower heat resistance after film formation. However, even with a low molecular weight of a ligand, the above iridium complex has an advantage in that sufficient heat resistance can be ensured because the iridium complex includes a plurality of ligands.

That is, the iridium complex has a feature of a high triplet excitation energy level, in addition to the ease of evaporation and electrochemical stability. Therefore, it is preferable to use the iridium complex as a guest material in a light-emitting layer in a light-emitting element of one embodiment of the present invention, particularly in a blue light-emitting element.

<<Example of Iridium Complex>>

This iridium complex is represented by General Formula (G1).

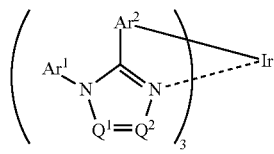

(G1)

In General Formula (G1), each of $Ar^1$ and $Ar^2$ independently represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $Q^1$ and $Q^2$ independently represents N or C—R, and R represents hydrogen, an alkyl group having 1 to 6 carbon atoms, a haloalkyl group having 1 to 6 carbon atoms, or a substituted or unsubstituted aryl group having 6 to 13 carbon atoms. At least one of $Q^1$ and $Q^2$ includes C—R. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of the aryl groups represented by $Ar^1$ and $Ar^2$ and the aryl group represented by R includes a cyano group.

An iridium complex that can be favorably used for a light-emitting element of one embodiment of the present invention is preferably an ortho-metalated complex. This iridium complex is represented by General Formula (G2).

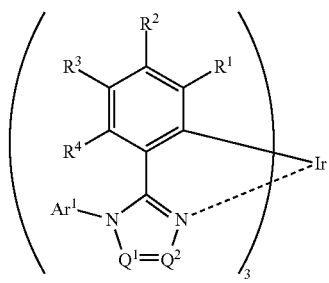

(G2)

In General Formula (G2), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, a substituted or unsubstituted aryl group having 6 to 13 carbon atoms, and a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $Q^1$ and $Q^2$ independently represents N or C—R, and R represents hydrogen, an alkyl group having 1 to 6 carbon atoms, a haloalkyl group having 1 to 6 carbon atoms, or a substituted or unsubstituted aryl group having 6 to 13 carbon atoms. At least one of $Q^1$ and $Q^2$ includes C—R. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^4$ and R includes a cyano group.

An iridium complex that can be favorably used for a light-emitting element of one embodiment of the present invention includes a 4H-triazole skeleton as a ligand, which is preferable because the iridium complex can have a high triplet excitation energy level and can be suitably used in a light-emitting element emitting high-energy light such as blue light. This iridium complex is represented by General Formula (G3).

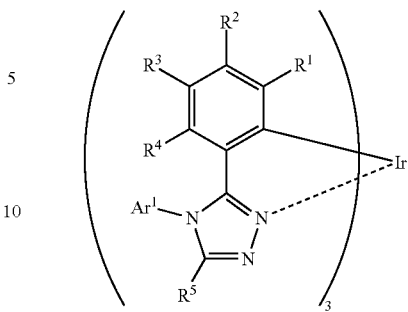

(G3)

In General Formula (G3), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, a substituted or unsubstituted aryl group having 6 to 13 carbon atoms, and a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^5$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the halo alkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^5$ includes a cyano group.

An iridium complex that can be favorably used for a light-emitting element of one embodiment of the present invention includes an imidazole skeleton as a ligand, which is preferable because the iridium complex can have a high triplet excitation energy level and can be suitably used in a light-emitting element emitting high-energy light such as blue light. This iridium complex is represented by General Formula (G4).

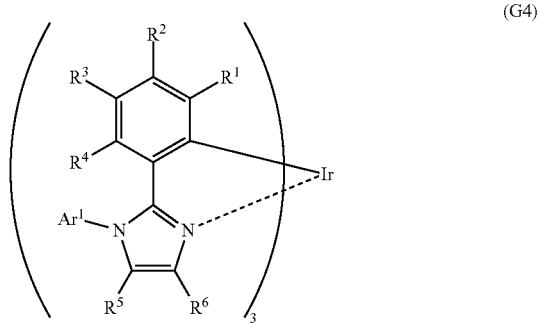

(G4)

In General Formula (G4), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^6$ includes a cyano group.

An iridium complex that can be favorably used for a light-emitting element of one embodiment of the present invention includes a nitrogen-containing five-membered heterocyclic skeleton, and an aryl group bonded to nitrogen of the skeleton is preferably a substituted or unsubstituted phenyl group. In that case, the iridium complex can be vacuum-evaporated at a relatively low temperature and can have a high triplet excitation energy level, and accordingly can be used in a light-emitting element emitting high-energy light such as blue light. The iridium complex is represented by General Formula (G5) or (G6).

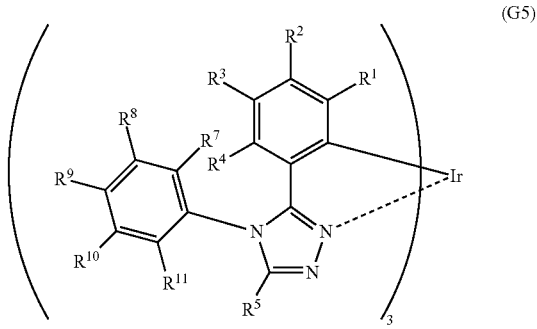

(G5)

In General Formula (G5), each of $R^7$ and $R^{11}$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^5$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

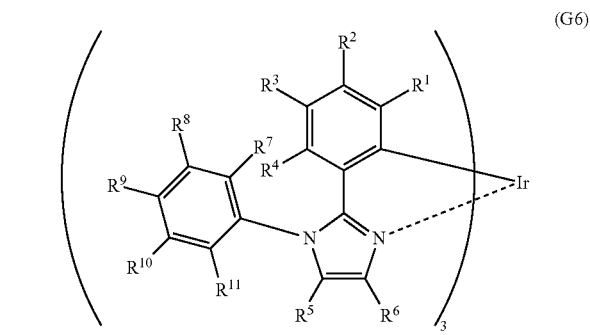

(G6)

In General Formula (G6), each of $R^7$ and $R^{11}$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

An iridium complex that can be favorably used for a light-emitting element of one embodiment of the present invention includes a 1H-triazole skeleton as a ligand, which is preferable because the iridium complex can have a high triplet excitation energy level and can be suitably used in a light-emitting element emitting high-energy light such as blue light. This iridium complex is represented by General Formula (G7) or (G8).

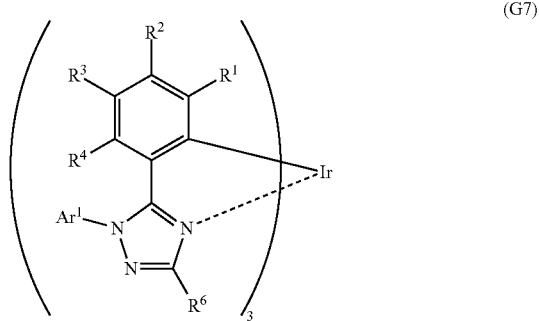

(G7)

In General Formula (G7), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^6$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The halo alkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$, $R^1$ to $R^4$, and $R^6$ includes a cyano group.

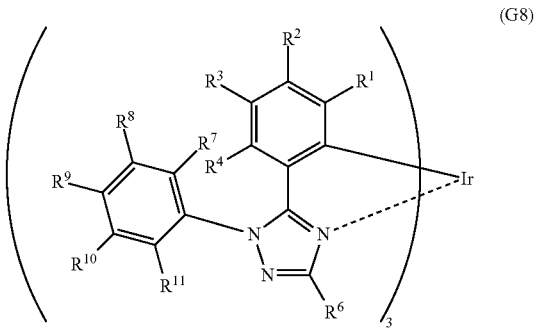

(G8)

In General Formula (G8), each of $R^7$ and $R^{11}$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^6$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

As an alkyl group and an aryl group represented by $R^1$ to $R^4$ in General Formulae (G2) to (G8), for example, groups represented by Structural Formulae (R-1) to (R-29) can be used. Note that groups that can be used as the alkyl group and the aryl group are not limited thereto.

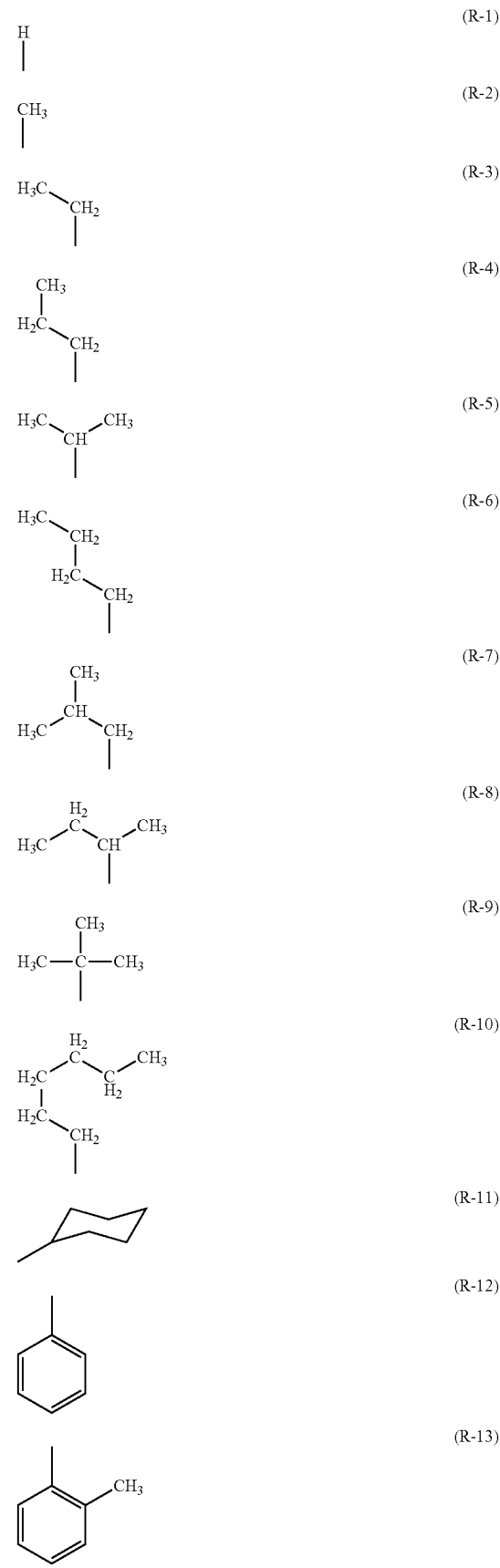

(R-14) 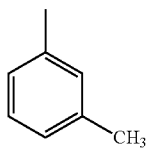
(R-15) 
(R-16) 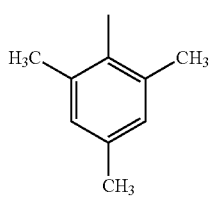
(R-17) 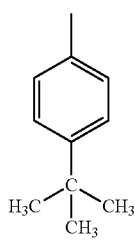
(R-18) 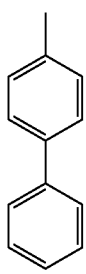
(R-19) 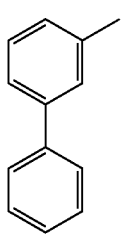
(R-20) 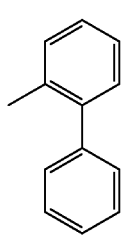
(R-21) 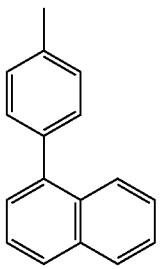
(R-22) 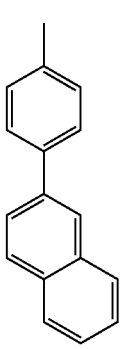
(R-23) 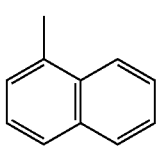
(R-24) 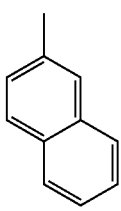
(R-25) 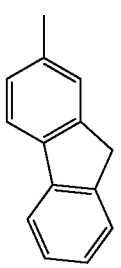
(R-26) 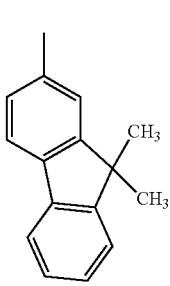

-continued

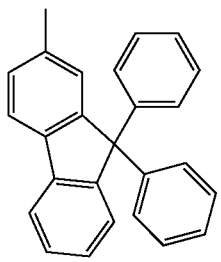
(R-27)

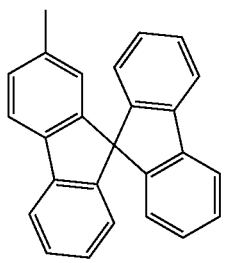
(R-28)

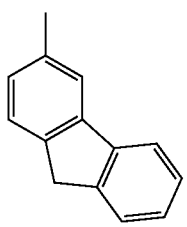
(R-29)

(R-30)
CF$_3$
|
CCl$_3$
|

(R-31)

-continued (R-32)
H$_3$C—CF$_2$
|

(R-33)
H$_3$C—CCl$_2$
|

(R-34)
CH$_3$
|
H$_2$C—CF$_2$
|

(R-35)
H$_3$C   CH$_3$
 \\ /
  CF
  |

(R-36)
CH$_3$
|
CH
H$_3$C/  \\CF$_2$
      |

(R-37)
CF$_3$
|
H$_3$C—C—CH$_3$
|

For example, groups represented by Structural Formulae (R-12) to (R-29) can be used as an aryl group represented by Ar$^1$ in General Formulae (G1) to (G4) and (G7) and an aryl group represented by Ar$^2$ in General Formula (G1). Note that groups that can be used as Ar$^1$ and Ar$^2$ are not limited to these groups.

For example, the groups represented by Structural Formulae (R-1) to (R-10) can be used as alkyl groups represented by R$^7$ and R$^{11}$ in General Formulae (G5), (G6), and (G8). Note that groups that can be used as the alkyl group are not limited to these groups.

As the alkyl group or substituted or unsubstituted phenyl group represented by R$^8$ to R$^{10}$ in General Formulae (G5), (G6), and (G8), groups represented by Structure Formulae (R-1) to (R-22) above can be used, for example. Note that groups which can be used as the alkyl group or the phenyl group are not limited thereto.

For example, groups represented by Structural Formulae (R-1) to (R-29) and Structural Formulae (R-30) to (R-37) can be used as an alkyl group, an aryl group, and a haloalkyl group represented by R$^5$ in General Formulae (G3) to (G6) and R$^6$ in General Formulae (G4) and (G6) to (G8). Note that a group that can be used as the alkyl group, the aryl group, or the haloalkyl group is not limited to these groups.

<<Specific Examples of Iridium Complexes>>

Specific examples of structures of the iridium complexes represented by General Formulae (G1) to (G8) are compounds represented by Structural Formulae (100) to (134). Note that the iridium complexes represented by General Formulae (G1) to (G8) are not limited the examples shown below.

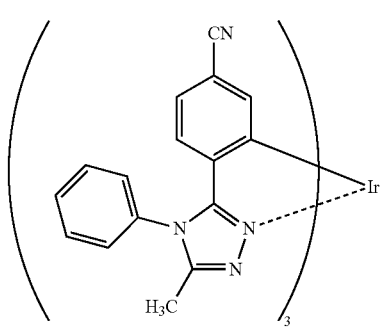
(100)

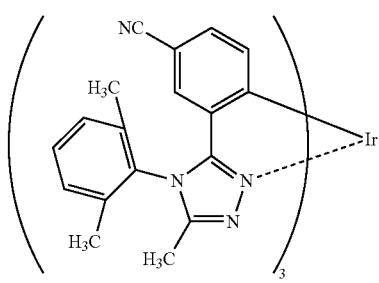
(101)

(102) 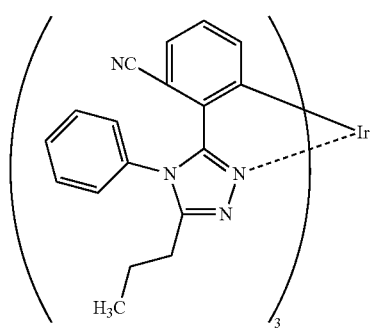
(103) 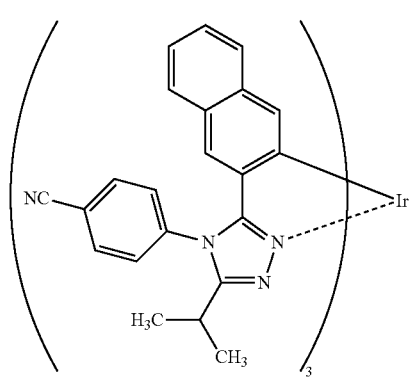
(104) 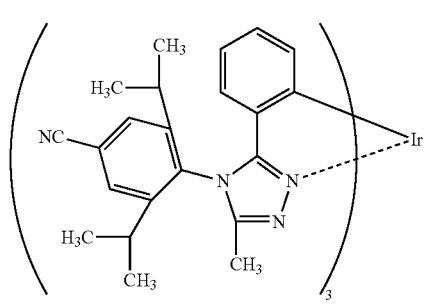
(105) 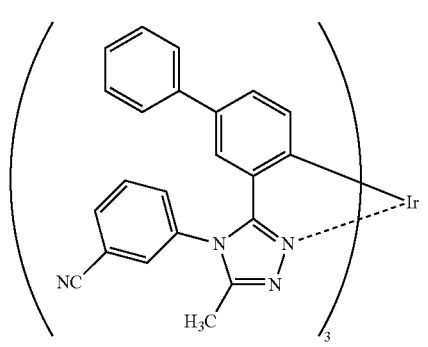
(106) 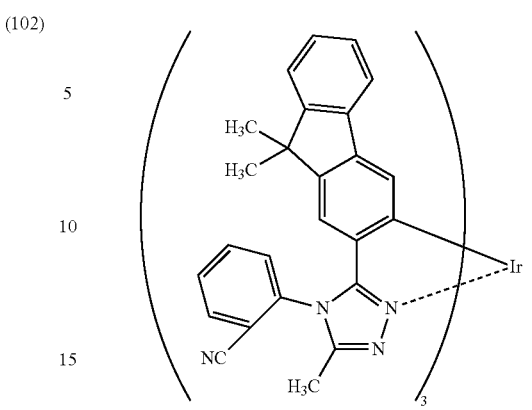
(107) 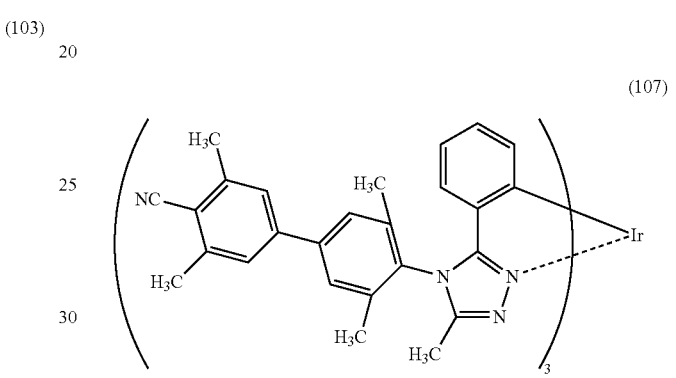
(108) 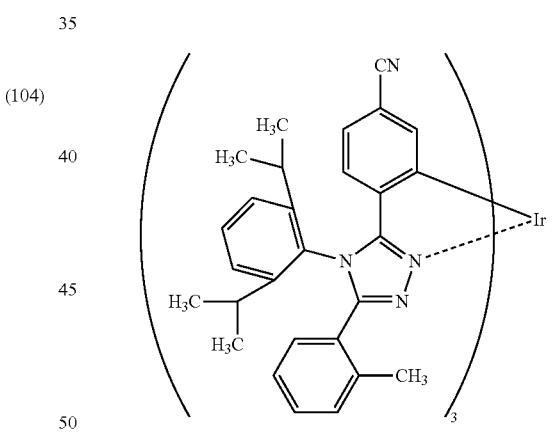
(109) 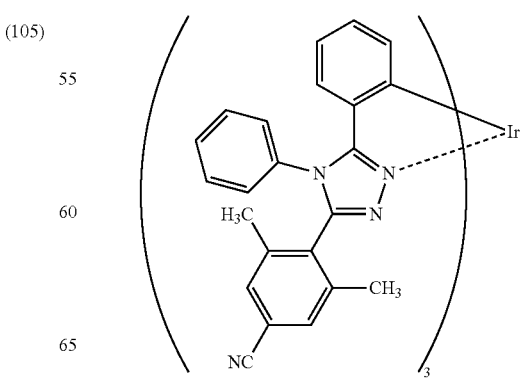

(110) 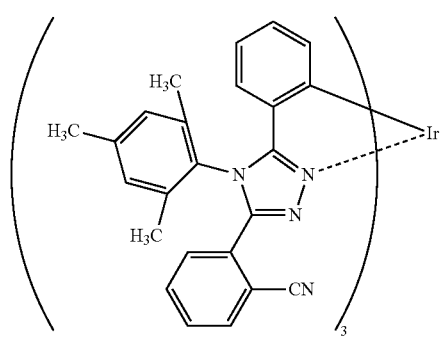
(111) 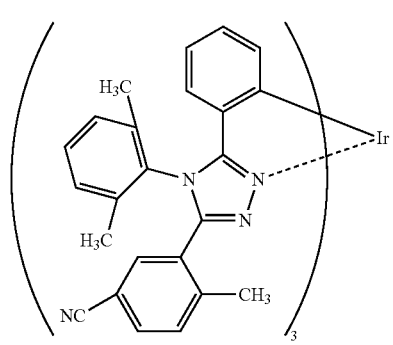
(112) 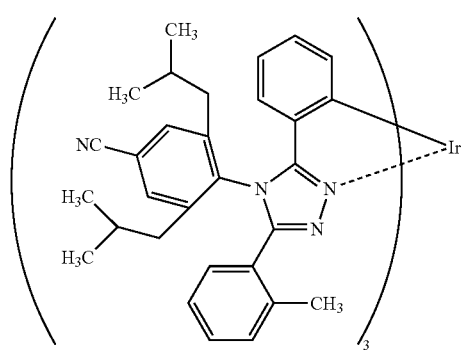
(113) 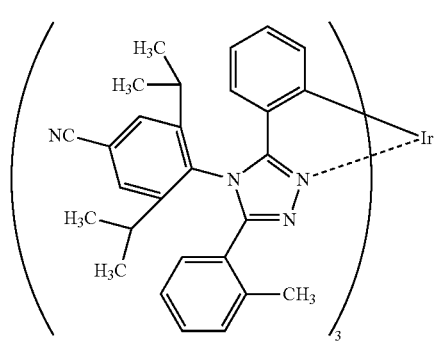
(114) 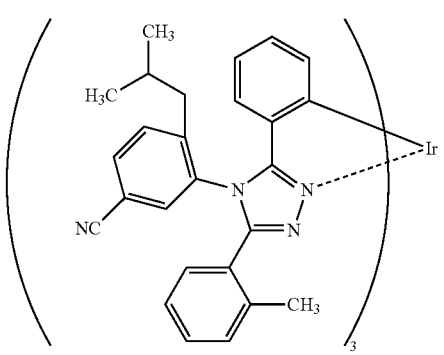
(115) 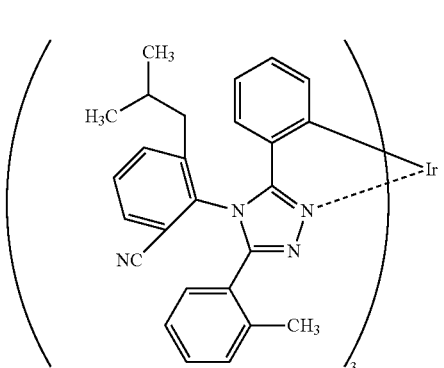
(116) 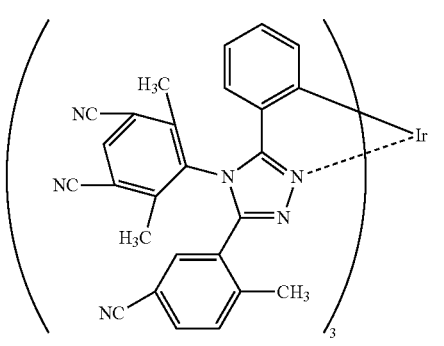
(117) 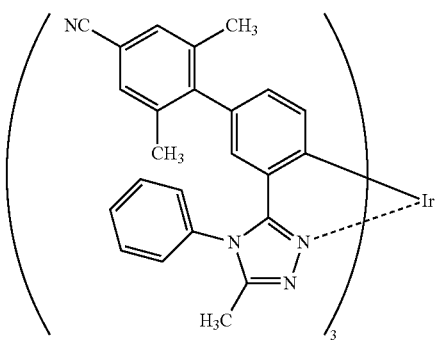

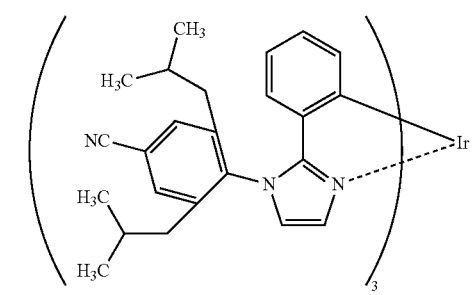 (118)
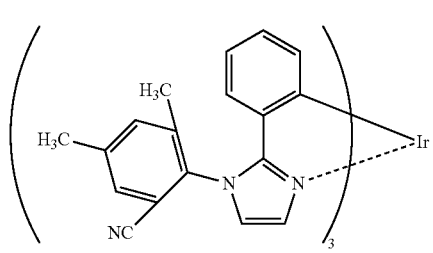 (119)
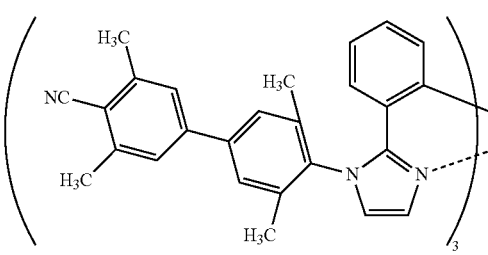 (120)
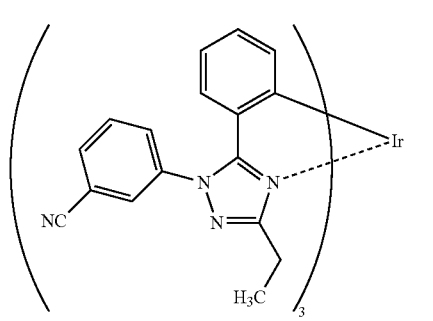 (121)
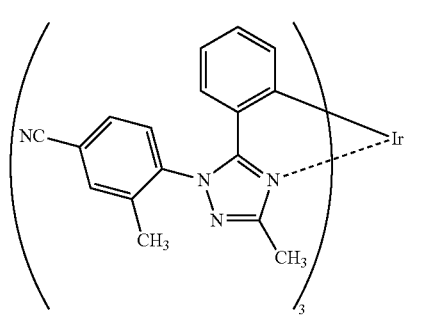 (122)
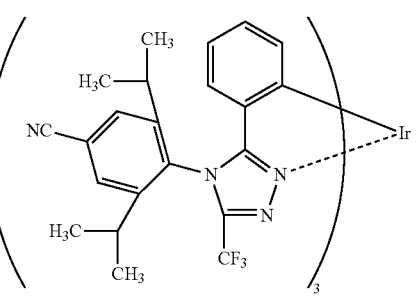 (123)
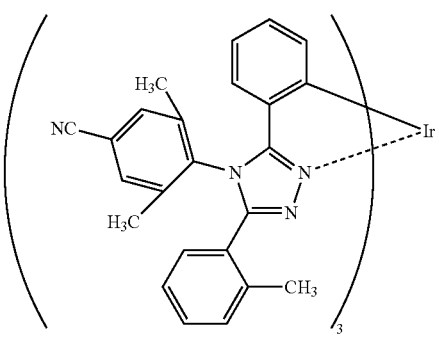 (124)
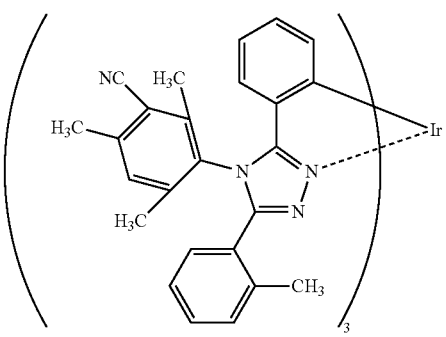 (125)
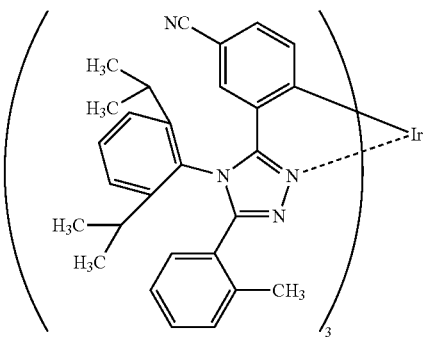 (126)
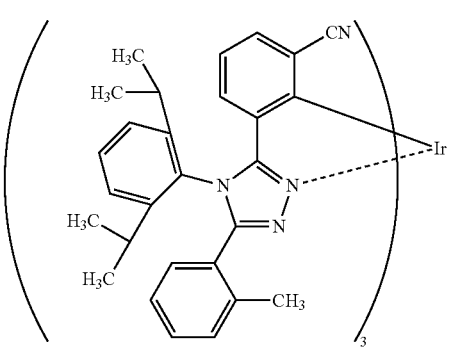 (127)

-continued (128)
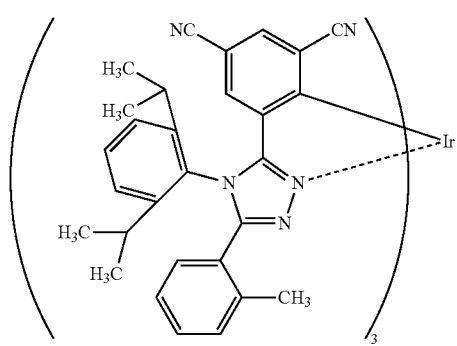

(129)
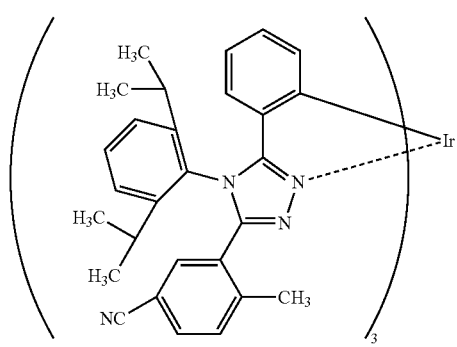

(130)
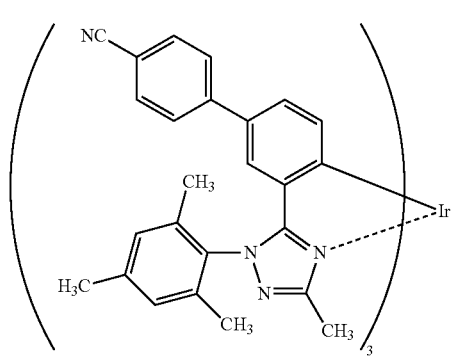

(131)
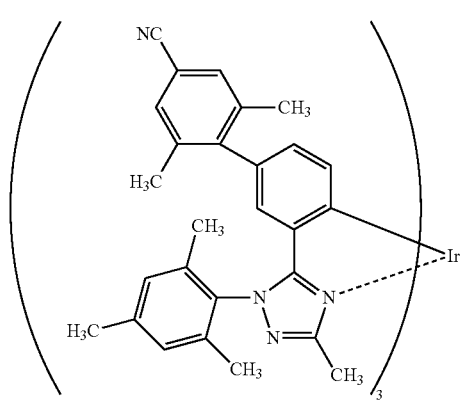

-continued (132)
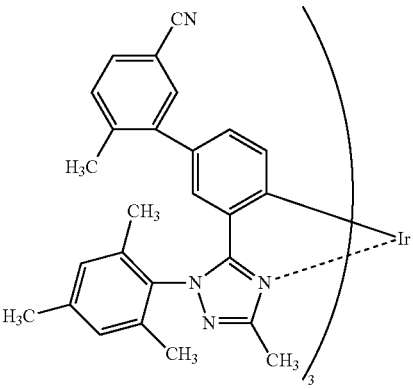

(133)
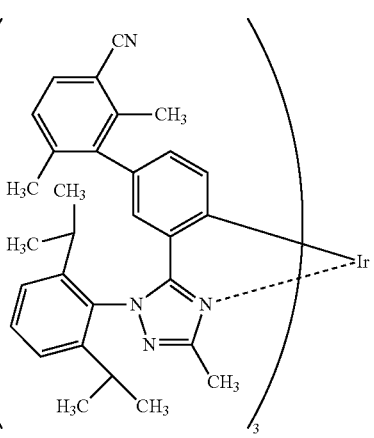

(134)
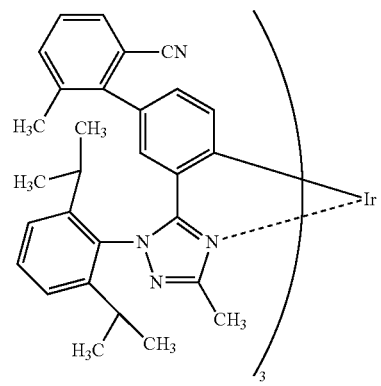

The iridium complexes given above as examples each have relatively low HOMO and LUMO levels as described above, and are accordingly preferred as a guest material of a light-emitting element of one embodiment of the present invention. In that case, the light-emitting element can have high emission efficiency. In addition, the iridium complexes given above as examples each have a high triplet excitation energy level, and are accordingly preferred particularly as a guest material of a blue light-emitting element. In that case, the blue light-emitting element can have high emission efficiency. Moreover, since the iridium complexes given above as examples are each highly resistant to repetition of oxidation and reduction, a light-emitting element including any of the iridium complexes can have a long driving lifetime.

As the light-emitting material included in the light-emitting layer 130, any material can be used as long as the material can convert the triplet excitation energy into light emission. As an example of the material that can convert the triplet excitation energy into light emission, a thermally activated delayed fluorescence (TADF) material can be given in addition to a phosphorescent material. Therefore, it is acceptable that the "phosphorescent material" in the description is replaced with the "thermally activated delayed fluorescence material". Note that the thermally activated delayed fluorescence material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

In the case where the thermally activated delayed fluorescence material is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)).

As the thermally activated delayed fluorescence material composed of one kind of material, a heterocyclic compound including a π-electron rich heteroaromatic ring and a n-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DP S), or 10-phenyl-10H,10'H-spiro[acridin-9,9'-anthracen]-10'-one (abbreviation: ACRSA) can be used. The heterocyclic compound is preferable because of having the π-electron rich heteroaromatic ring and the π-electron deficient heteroaromatic ring, for which the electron-transport property and the hole-transport property are high. Among skeletons having the π-electron deficient heteroaromatic ring, a diazine skeleton (a pyrimidine skeleton, a pyrazine skeleton, or a pyridazine skeleton) and a triazine skeleton have high stability and reliability and are particularly preferable. Among skeletons having the π-electron rich heteroaromatic ring, an acridine skeleton, a phenoxazine skeleton, a thiophene skeleton, a furan skeleton, and a pyrrole skeleton have high stability and reliability; therefore, one or more of these skeletons are preferably included. As the pyrrole skeleton, an indole skeleton, a carbazole skeleton, or a 3-(9-phenyl-9H-carbazol-3-yl)-9H-carbazole skeleton is particularly preferred. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both increased and the difference between the singlet excitation energy level and the triplet excitation energy level becomes small.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. A light-emitting material included in the first light-emitting layer may be the same as or different from a light-emitting material included in the second light-emitting layer. In addition, the materials may have functions of emitting light of the same color or light of different colors. Two kinds of light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

The light-emitting layer 130 may include a material other than the host material 131 and the guest material 132.

Note that the light-emitting layer 130 can be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be comprised in the light-emitting layer 130.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the aromatic amine, carbazole derivative, aromatic hydrocarbon, stilbene derivative, and the like described as examples of the hole-transport material that can be used in the light-emitting layer 130 can be used. Furthermore, the hole-transport material may be a high molecular compound.

<<Hole-Transport Layer>>

The hole-transport layer 112 is a layer containing a hole-transport material and can be formed using any of the hole-transport materials given as examples of the material of the hole-injection layer 111. In order that the hole-transport layer 112 can have a function of transporting holes injected into the hole-injection layer 111 to the light-emitting layer 130, the HOMO level of the hole-transport layer 112 is preferably equal or close to the HOMO level of the hole-injection layer 111.

As the hole-transport material, a substance having a hole mobility of $1\times10^{-6}$ cm$^2$/Ns or higher is preferably used. Note that any substance other than the above substances may be used as long as the hole-transport property is higher than the electron-transport property. The layer including a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As the compound which easily accepts electrons (the material having an electron-transport property), a π-electron deficient heteroaromatic compound such as a nitrogen-containing heteroaromatic compound, a metal complex, or the like can be used, for example. Specifically, a metal complex having a quinoline ligand, a benzoquinoline ligand, an oxazole ligand, or a thiazole ligand, which is described as the electron-transport material that can be used in the light-emitting layer 130, an oxadiazole derivative, a triazole derivative, a benzimidazole derivative, a quinoxaline derivative, a dibenzoquinoxaline derivative, a phenanthroline derivative, a pyridine derivative, a bipyridine derivative, a pyrimidine derivative, and a triazine derivative can be given. A substance having an electron mobility of $1\times10^{-6}$ cm$^2$/Ns or higher is preferable. Note that other than these substances, any substance that has a property of transporting more electrons than holes may be used for the electron-transport layer. The electron-transport layer 118 is not limited to a single layer, and may include stacked two or more layers containing the aforementioned substances.

Between the electron-transport layer 118 and the light-emitting layer 130, a layer that controls transfer of electron carriers may be provided. The layer that controls transfer of electron carriers is a layer formed by addition of a small amount of a substance having a high electron-trapping property to a material having a high electron-transport property described above, and the layer is capable of adjusting carrier balance by suppressing transfer of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, and ytterbium are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

<<Pair of Electrodes>>

The electrodes 101 and 102 function as an anode and a cathode of each light-emitting element. The electrodes 101 and 102 can be formed using a metal, an alloy, or a conductive compound, a mixture or a stack thereof, or the like.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, silver (Ag), an alloy of Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (ft), and gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrode 101 and/or the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used.

The electrodes 101 and 102 may each be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor material) are mixed and a composite material in which an organic compound and an electron acceptor (acceptor material) are mixed. Alternatively, an inorganic carbon-based material such as graphene may be used. The resistivity of the material is preferably lower than or equal to $1\times10^5$ Ω·cm, further preferably lower than or equal to $1\times10^4$ Ω·cm.

Alternatively, the electrode 101 and/or the electrode 102 may be formed by stacking two or more of these materials.

In order to improve the light extraction efficiency, a material whose refractive index is higher than that of an electrode having a function of transmitting light may be formed in contact with the electrode. The material may be electrically conductive or non-conductive as long as it has a function of transmitting visible light. In addition to the oxide conductors described above, an oxide semiconductor and an organic substance are given as the examples of the material. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used. Further alternatively, a plurality of layers each of which is formed using the material having a high refractive index and has a thickness of several nanometers to several tens of nanometers may be stacked.

In the case where the electrode 101 or the electrode 102 functions as the cathode, the electrode preferably contains a material having a low work function (lower than or equal to 3.8 eV). The examples include an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, and the like.

When the electrode 101 or the electrode 102 is used as an anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light of a desired wavelength emitted from each light-emitting layer resonates and is intensified, which is preferable.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Substrate<<

A light-emitting element of one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or an optical element or as long as it has a function of protecting the light-emitting element or an optical element.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Example of the substrate to which the light-emitting element is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like. When such a substrate is used, a light-emitting element with high durability, high heat resistance, reduced weight, or reduced thickness can be formed.

The light-emitting element 150 may be formed over an electrode electrically connected to a field-effect transistor (FET), for example, which is formed over any of the above-described substrates. Accordingly, an active matrix display device in which the FET controls the driving of the light-emitting element 150 can be manufactured.

In this Embodiment, one embodiment of the present invention is described. Other embodiments of the present invention are described in other Embodiments. Note that one embodiment of the present invention is not limited thereto. That is, since various embodiments of the present invention are disclosed in this Embodiment and other Embodiments, one embodiment of the present invention is not limited to a specific embodiment. The example in which one embodiment of the present invention is used in a light-emitting element is described; however, one embodiment of the present invention is not limited thereto. For example, depending on circumstances or conditions, one embodiment of the present invention is not necessarily used in a light-emitting element. One embodiment of the present invention shows, but is not limited to, an example of including a first organic compound, a second organic compound, and a guest material capable of converting triplet excitation energy into light emission, in which the LUMO level of the first organic compound is lower than that of the second organic compound and the HOMO level of the first organic compound is lower than that of the second organic compound. Depending on circumstances or conditions, in one embodiment of the present invention, for example, the LUMO level of the first organic compound is not necessarily lower than that of the second organic compound. Alternatively, the HOMO level of the first organic compound is not necessarily lower than that of the second organic compound. One embodiment of the present invention shows, but is not limited to, an example in which the first organic compound and the second organic compound form an exciplex. Depending on circumstances or conditions, in one embodiment of the present invention, for example, the first organic compound and the second organic compound do not necessarily form an exciplex. One embodiment of the present invention shows, but is not limited to, an example in which the LUMO level of the guest material is higher than that of the first organic compound and the HOMO level of the guest material is higher than that of the second organic compound. Depending on circumstances or conditions, in one embodiment of the present invention, for example, the LUMO level of the guest material is not necessarily higher than that of the first organic compound. Alternatively, the HOMO level of the guest material is not necessarily higher than that of the second organic compound.

The structure described in this embodiment can be used in combination with any of the other embodiments as appropriate.

Embodiment 2

In this embodiment, light-emitting elements each having a structure different from that described in Embodiment 1 are described below with reference to FIGS. 3A to 3C and FIGS. 4A to 4C. In FIGS. 3A to 3C and FIGS. 4A to 4C, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Structure Example 1 of Light-Emitting Element

Figure 3A:
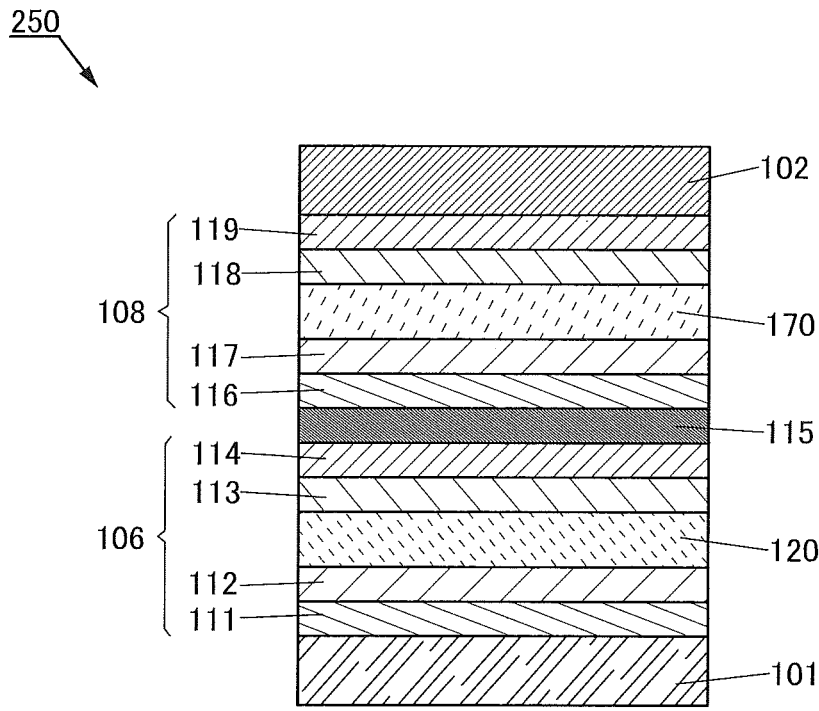
FIGS. 3A to 3C are schematic cross-sectional views of a light-emitting element of one embodiment of the present invention and a diagram showing a correlation of energy levels.

FIG. 3A is a schematic cross-sectional view of a light-emitting element 250.

The light-emitting element 250 illustrated in FIG. 3A includes a plurality of light-emitting units (a light-emitting unit 106 and a light-emitting unit 108 in FIG. 3A) between a pair of electrodes (the electrode 101 and the electrode 102). One of light-emitting units preferably has the same structure as the EL layer 100 illustrated in FIGS. 1A and 1B. That is, it is preferable that the light-emitting element 150 in FIGS. 1A and 1B include one light-emitting unit, while the light-emitting element 250 include a plurality of light-emitting units. Note that the electrode 101 functions as an anode and the electrode 102 functions as a cathode in the following description of the light-emitting element 250; however, the functions may be interchanged in the light-emitting element 250.

In the light-emitting element 250 illustrated in FIG. 3A, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable that the EL layer 100 illustrated in FIGS. 1A and 1B be used in the light-emitting unit 108.

The light-emitting element 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 120. The light-emitting unit 108 includes a hole-injection layer 116, a hole-transport layer 117, an electron-transport layer 118, and an electron-injection layer 119 in addition to the light-emitting layer 170.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. A substance having a hole mobility of $1\times10^{-6}$ cm$^2$/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 115 like the light-emitting unit 108, the charge-generation layer 115 can also serve as a hole-injection layer or a hole-transport layer of the light-emitting unit; thus, a hole-injection layer or a hole-transport layer need not be included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating substances and a compound having a high electron-transport property. Furthermore, the charge-generation layer 115 may be formed using a combination of a layer containing the composite material of an organic compound and an acceptor substance with a layer containing a transparent conductive material.

The charge-generation layer 115 provided between the light-emitting unit 106 and the light-emitting unit 108 may have any structure as long as electrons can be injected to the light-emitting unit on one side and holes can be injected into the light-emitting unit on the other side when a voltage is applied between the electrode 101 and the electrode 102. For example, in FIG. 3A, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance of higher than or equal to 40%). The charge-generation layer 115 functions even if it has lower conductivity than the pair of electrodes (the electrodes 101 and 102).

Note that forming the charge-generation layer 115 by using any of the above materials can suppress an increase in driving voltage caused by the stack of the light-emitting layers.

The light-emitting element having two light-emitting units has been described with reference to FIG. 3A; however, a similar structure can be applied to a light-emitting element in which three or more light-emitting units are stacked. With a plurality of light-emitting units partitioned by the charge-generation layer between a pair of electrodes as in the light-emitting element 250, it is possible to provide a light-emitting element which can emit light with high luminance with the current density kept low and has a long lifetime. A light-emitting element with low power consumption can be provided.

When the structures described in Embodiment 1 is used for at least one of the plurality of units, a light-emitting element with high emission efficiency can be provided.

It is preferable that the light-emitting layer 170 included in the light-emitting unit 108 have a structure similar to that of the light-emitting layer 130 described in Embodiment 1. In that case, the light-emitting element 250 has high emission efficiency.

Figure 3B:
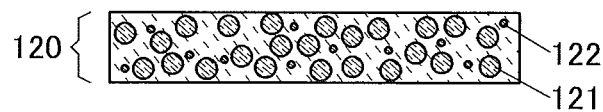

Furthermore, the light-emitting layer 120 included in the light-emitting unit 106 contains a host material 121 and a guest material 122 as illustrated in FIG. 3B. Note that the guest material 122 is described below as a fluorescent material.

<<Light Emission Mechanism of Light-Emitting Layer 120>>

The light emission mechanism of the light-emitting layer 120 is described below.

By recombination of the electrons and holes injected from the pair of electrodes (the electrode 101 and the electrode 102) or the charge-generation layer in the light-emitting layer 120, excitons are formed. Because the amount of the host material 121 is larger than that of the guest material 122, the host material 121 is brought into an excited state by the exciton generation.

Note that the term "exciton" refers to a carrier (electron and hole) pair. Since excitons have energy, a material where excitons are generated is brought into an excited state.

In the case where the formed excited state of the host material 121 is a singlet excited state, singlet excitation energy transfers from the S1 level of the host material 121 to the S1 level of the guest material 122, thereby forming the singlet excited state of the guest material 122.

Since the guest material 122 is a fluorescent material, when a singlet excited state is formed in the guest material 122, the guest material 122 immediately emits light. To obtain high light emission efficiency in this case, the fluorescence quantum yield of the guest material 122 is preferably high. The same can apply to a case where a singlet excited state is formed by recombination of carriers in the guest material 122.

Figure 3C:
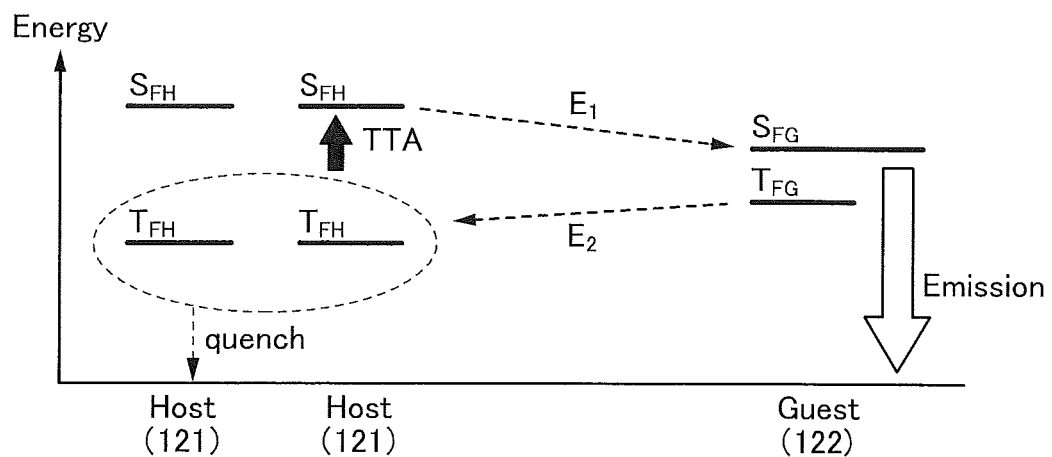

Next, a case where recombination of carriers forms a triplet excited state of the host material 121 is described. The correlation of energy levels of the host material 121 and the guest material 122 in this case is shown in FIG. 3C. The following explains what terms and signs in FIG. 3C represent. Note that because it is preferable that the T1 level of the host material 121 be lower than the T1 level of the guest material 122, FIG. 3C shows this preferable case. However, the T1 level of the host material 121 may be higher than the T1 level of the guest material 122.

Host (121): the host material 121;
Guest (122): the guest material 122 (the fluorescent material);
$S_{FH}$: the S1 level the host material 121;
$T_{FH}$: the T1 level of the host material 121;
$S_{FG}$: the S1 level of the guest material 122 (the fluorescent material); and
$T_{FG}$: the T1 level of the guest material 122 (the fluorescent material).

As illustrated in FIG. 3C, triplet-triplet annihilation (TTA) occurs, that is, triplet excitons formed by carrier recombination interact with each other, and excitation energy is transferred and spin angular momenta are exchanged; as a result, a reaction in which the triplet excitons are converted into singlet excitons having energy of the S1 level of the host material 121 ($S_{FH}$) (see TTA in FIG. 3C). The singlet excitation energy of the host material 121 is transferred from $S_{FH}$ to the S1 level of the guest material 122 ($S_{FG}$) having a lower energy than $S_{FH}$ (see Route $E_1$ in FIG. 3C), and a singlet excited state of the guest material 122 is formed, whereby the guest material 122 emits light.

Note that in the case where the density of triplet excitons in the light-emitting layer 120 is sufficiently high (e.g., $1 \times 10^{-12}$ cm$^{-3}$ or higher), only the reaction of two triplet excitons close to each other can be considered whereas deactivation of a single triplet exciton can be ignored.

In the case where a triplet excited state of the guest material 122 is formed by carrier recombination, the triplet excitation energy of the guest material 122 is thermally deactivated and is difficult to use for light emission. However, in the case where the T1 level of the host material 121 ($T_{FH}$) is lower than the T1 level of the guest material 122 ($T_{FG}$), the triplet excitation energy of the guest material 122 can be transferred from the T1 level of the guest material 122 ($T_{FG}$) to the T1 level of the host material 121 ($T_{FH}$) (see Route $E_2$ in FIG. 3C) and then is utilized for TTA.

In other words, the host material 121 preferably has a function of converting triplet excitation energy into singlet excitation energy by causing TTA, so that the triplet excitation energy generated in the light-emitting layer 120 can be partly converted into singlet excitation energy by TTA in the host material 121. The singlet excitation energy can be transferred to the guest material 122 and extracted as fluorescence. In order to achieve this, the S1 level of the host material 121 ($S_{FH}$) is preferably higher than the S1 level of the guest material 122 ($S_{FG}$). In addition, the T1 level of the host material 121 ($T_{FH}$) is preferably lower than the T1 level of the guest material 122 ($T_{FG}$).

Note that particularly in the case where the T1 level of the guest material 122 ($T_{FG}$) is lower than the T1 level of the host material 121 ($T_{FH}$), the weight ratio of the guest material 122 to the host material 121 is preferably low. Specifically, the weight ratio of the guest material 122 to the host material 121 is preferably greater than 0 and less than or equal to 0.05, in which case the probability of carrier recombination in the guest material 122 can be reduced. In addition, the probability of energy transfer from the T1 level of the host material 121 ($T_{FH}$) to the T1 level of the guest material 122 ($T_{FG}$) can be reduced.

Note that the host material 121 may be composed of a single compound or a plurality of compounds.

Note that in each of the above-described structures, the emission colors of the guest materials used in the light-emitting unit 106 and the light-emitting unit 108 may be the same or different. In the case where the same guest materials emitting light of the same color are used for the light-emitting unit 106 and the light-emitting unit 108, the light-emitting element 250 can exhibit high emission luminance at a small current value, which is preferable. In the case where guest materials emitting light of different colors are used for the light-emitting unit 106 and the light-emitting unit 108, the light-emitting element 250 can exhibit multi-color light emission, which is preferable. In that case, when a plurality of light-emitting materials with different emission wavelengths are used in one or both of the light-emitting layers 120 and 170, the light-emitting element 250 emits light obtained by synthesizing lights with different emission peaks. That is, the emission spectrum of the light-emitting element 250 has at least two peaks.

The above structure is also suitable for obtaining white light emission. When the light-emitting layer 120 and the light-emitting layer 170 emit light of complementary colors, white light emission can be obtained. It is particularly favorable to select the guest materials so that white light emission with high color rendering properties or light emission of at least red, green, and blue can be obtained.

One or both of the light-emitting layers 120 and 170 may be divided into layers and each of the divided layers may contain a different light-emitting material. That is, one or both of the light-emitting layers 120 and 170 may consist of two or more layers. For example, in the case where the light-emitting layer is formed by stacking a first light-emitting layer and a second light-emitting layer in this order from the hole-transport layer side, the first light-emitting layer is faulted using a substance having a hole-transport property as the host material and the second light-emitting layer is formed using a substance having an electron-transport property as the host material. In that case, a light-emitting material included in the first light-emitting layer may be the same as or different from a light-emitting material included in the second light-emitting layer. In addition, the materials may have functions of emitting light of the same color or light of different colors. White light emission with a high color rendering property that is formed of three primary colors or four or more colors can be obtained by using a plurality of light-emitting materials emitting light of different colors.

In the case where the light-emitting units 106 and 108 contain guest materials whose emission colors are different, light emitted from the light-emitting layer 120 preferably has an emission peak on the shorter wavelength side than light emitted from the light-emitting layer 170. Since the luminance of a light-emitting element using a material having a high triplet excitation energy level tends to be degraded quickly, TTA is utilized in the light-emitting layer emitting light of a short wavelength so that a light-emitting element with less degradation of luminance can be provided.

Structure Example 2 of Light-Emitting Element

Next, structure examples different from the light-emitting element illustrated in FIGS. 3A to 3C are described below with reference to FIGS. 4A to 4C.

Figure 4A:
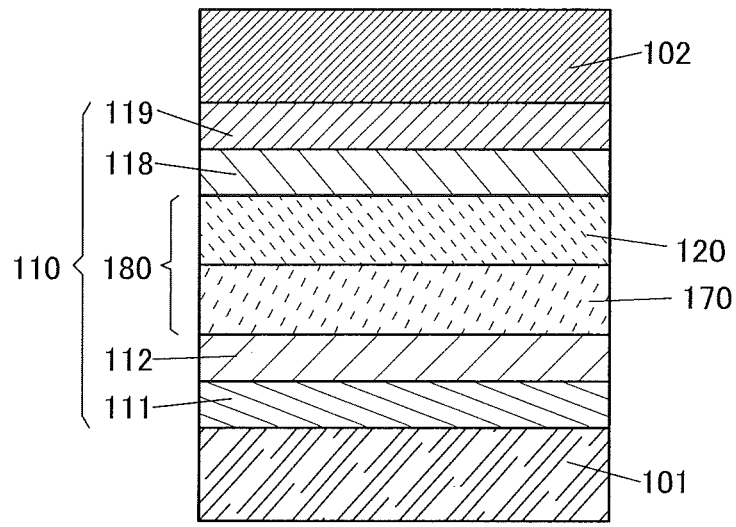
FIGS. 4A to 4C are schematic cross-sectional views of a light-emitting element of one embodiment of the present invention and a diagram showing a correlation of energy levels.

FIG. 4A is a schematic cross-sectional view of a light-emitting element 252.

In the light-emitting element 252 shown in FIG. 4A, an EL layer 110 is between a pair of electrodes (the electrode 101 and the electrode 102). Note that the electrode 101 functions as an anode and the electrode 102 functions as a cathode in the following description of the light-emitting element 252; however, the functions may be interchanged in the light-emitting element 252.

The EL layer 110 includes the light-emitting layer 180. The light-emitting layer 180 includes the light-emitting layer 120 and the light-emitting layer 170. In the light-emitting element 252, as the EL layer 110, the hole-injection layer 111, the hole-transport layer 112, the electron-transport layer 118, and the electron-injection layer 119 are illustrated in addition to the light-emitting layers. However, this stacked structure is an example, and the structure of the EL layer 110 in the light-emitting element 252 is not limited thereto. For example, the stacking order of the above layers of the EL layer 110 may be changed. Alternatively, in the EL layer 110, another functional layer other than the above layers may be provided. The functional layer may have a function of lowering a hole- or electron-injection barrier, a function of improving a hole- or electron-transport property, a function of inhibiting transport of holes or electrons, or a function of generating holes or electrons, for example.

Figure 4B:
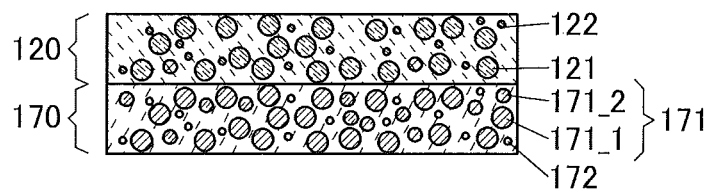

As illustrated in FIG. 4B, the light-emitting layer 120 contains the host material 121 and the guest material 122. The light-emitting layer 170 contains a host material 171 and a guest material 172. The host material 171 includes an organic compound 171_1 and an organic compound 171_2. Note that in the description below, the guest material 122 is a fluorescent material and the guest material 172 is a phosphorescent material.

<<Light Emission Mechanism of Light-Emitting Layer 180>>

The light emission mechanism of the light-emitting layer 120 is similar to that of the light-emitting layer 120 illustrated in FIGS. 3A to 3C. The light emission mechanism of the light-emitting layer 170 is similar to that of the light-emitting layer 130 in Embodiment 1. In other words, the host material 171, the organic compound 171_1, the organic compound 171_2, and the guest material 172 are similar to the host material 131, the organic compound 131_1, the organic compound 131_2, and the guest material 132, respectively.

As in the light-emitting element 252, in the case where the light-emitting layers 120 and 170 are in contact with each other, even when energy is transferred from the exciplex to the host material 121 of the light-emitting layer 120 (in particular, when energy of the triplet excited level is transferred) at an interface between the light-emitting layer 120 and the light-emitting layer 170, triplet excitation energy can be converted into light emission in the light-emitting layer 120.

The T1 level of the host material 121 of the light-emitting layer 120 is preferably lower than the T1 levels of the organic compounds 171_1 and 171_2 of the light-emitting layer 170. In the light-emitting layer 120, the S1 level of the host material 121 is preferably higher than the S1 level of the guest material 122 (the fluorescent material) while the T1 level of the host material 121 is preferably lower than the T1 level of the guest material 122 (the fluorescent material).

Figure 4C:
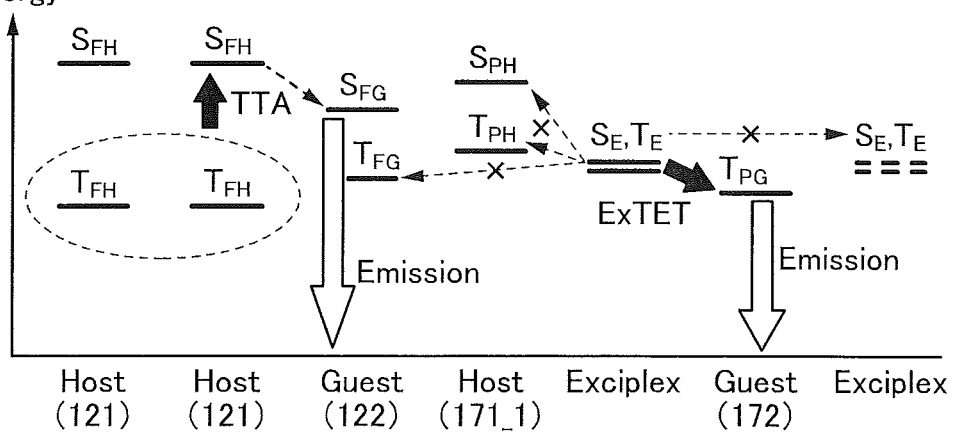

FIG. 4C shows a correlation of energy levels in the case where TTA is utilized in the light-emitting layer 120 and ExTET is utilized in the light-emitting layer 170. The following explains what terms and signs in FIG. 4C represent:

Fluorescence EML (120): the light-emitting layer 120 (the fluorescent light-emitting layer);
Phosphorescence EML (170): the light-emitting layer 170 (the phosphorescent light-emitting layer);
Host (121): the host material 121;
Guest (122): the guest material 122 (the fluorescent material);
Host (171_1): the host material (the organic compound 171_1);
Guest (172): the guest material 172 (the phosphorescent material);
Exciplex: an exciplex (the organic compound 171_1 and the organic compound 171_2);
$S_{FH}$: the S1 level of the host material 121;
$T_{FH}$: the T1 level of the host material 121;
$S_{FG}$: the S1 level of the guest material 122 (the fluorescent material);
$T_{FG}$: the T1 level of the guest material 122 (the fluorescent material);
$S_{PH}$: the S1 level of the host material (the organic compound 171_1);
$T_{PH}$: the T1 level of the host material (the organic compound 171_1);
$T_{PG}$: the T1 level of the guest material 172 (the phosphorescent material);
$S_E$: the S1 level of the exciplex; and
$T_E$: the T1 level of the exciplex.

As shown in FIG. 4C, the exciplex exists only in an excited state; thus, exciton diffusion between the exciplexes is less likely to occur. In addition, because the excitation energy levels ($S_E$ and $T_E$) of the exciplex are lower than the excitation energy levels ($S_{PH}$ and $T_{PE}$) of the organic compound 171_1 (the host material of the phosphorescent material) of the light-emitting layer 170, energy diffusion from the exciplex to the organic compound 171_1 does not occur. That is, the efficiency of the phosphorescent light-emitting layer (the light-emitting layer 170) can be maintained because an exciton diffusion distance of the exciplex is short in the phosphorescent light-emitting layer (the light-emitting layer 170). In addition, even when part of the triplet excitation energy of the exciplex of the phosphorescent light-emitting layer (the light-emitting layer 170) diffuses into the fluorescent light-emitting layer (the light-emitting layer 120) through the interface between the fluorescent light-emitting layer (the light-emitting layer 120) and the phosphorescent light-emitting layer (the light-emitting layer 170), energy loss can be reduced because the triplet excitation energy in the fluorescent light-emitting layer (the light-emitting layer 120) caused by the diffusion is converted into light emission through TTA.

The light-emitting element 252 can have high emission efficiency because ExTET is utilized in the light-emitting layer 170 and TTA is utilized in the light-emitting layer 120 as described above so that energy loss is reduced. As in the light-emitting element 252, in the case where the light-emitting layer 120 and the light-emitting layer 170 are in contact with each other, the number of the EL layers 110 as well as the energy loss can be reduced. Therefore, a light-emitting element with low manufacturing cost can be obtained.

Note that the light-emitting layer 120 and the light-emitting layer 170 are not necessarily in contact with each other. In that case, it is possible to prevent energy transfer by the Dexter mechanism (particularly triplet energy transfer) from the organic compound 171_1 in an excited state, the organic compound 171_2 in an excited state, or the guest material 172 (the phosphorescent material) in an excited state which is generated in the light-emitting layer 170 to the host material 121 or the guest material 122 (the fluorescent material) in the light-emitting layer 120. Therefore, the thickness of a layer provided between the light-emitting layer 120 and the light-emitting layer 170 may be several nanometers. Specifically, the thickness is preferably more than or equal to 1 nm and less than or equal to 5 nm, in which case an increase in driving voltage can be inhibited.

The layer provided between the light-emitting layer 120 and the light-emitting layer 170 may contain a single material or both a hole-transport material and an electron-transport material. In the case of a single material, a bipolar material may be used. The bipolar material here refers to a material in which the ratio between the electron mobility and the hole mobility is 100 or less. Alternatively, the hole-transport material, the electron-transport material, or the like may be used. At least one of materials contained in the layer may be the same as the host material (the organic compound 171_1 or 171_2) of the light-emitting layer 170. This facilitates the manufacture of the light-emitting element and reduces the driving voltage. Furthermore, the hole-transport material and the electron-transport material may form an exciplex, which effectively prevents exciton diffusion. Specifically, it is possible to prevent energy transfer from the host material (the organic compound 171_1 or 171_2) in an excited state or the guest material 172 (the phosphorescent material) in an excited state of the light-emitting layer 170 to the host material 121 or the guest material 122 (the fluorescent material) in the light-emitting layer 120.

In the light-emitting element 252, although the light-emitting layer 170 and the light-emitting layer 120 have been described as being positioned on the hole-transport layer 112 side and the electron-transport layer 118 side, respectively, the light-emitting element of one embodiment of the present invention is not limited to this structure. The light-emitting layer 170 and the light-emitting layer 120 may be positioned on the electron-transport layer 118 side and the hole-transport layer 112 side, respectively.

Note that in the light-emitting element 252, a carrier recombination region is preferably distributed to some extent. Therefore, it is preferable that the light-emitting layer 120 or 170 have an appropriate degree of carrier-trapping property. It is particularly preferable that the guest material 172 (the phosphorescent material) in the light-emitting layer 170 have a hole-trapping property. Thus, the structure of the light-emitting layer 130 in Embodiment 1 is suitable for that of the light-emitting layer 170.

Note that light emitted from the light-emitting layer 120 preferably has an emission peak on the shorter wavelength side than light emitted from the light-emitting layer 170. Since the luminance of a light-emitting element using a phosphorescent material emitting light of a short wavelength tends to be degraded quickly, fluorescence of a short wavelength is employed so that a light-emitting element with less degradation of luminance can be provided.

Furthermore, the light-emitting layer 120 and the light-emitting layer 170 may be made to emit light with different emission wavelengths, so that the light-emitting element can be a multicolor light-emitting element. In that case, the emission spectrum of the light-emitting element is formed by combining light having different emission peaks, and thus has at least two peaks.

The above structure is also suitable for obtaining white light emission. When the light-emitting layer 120 and the light-emitting layer 170 emit light of complementary colors, white light emission can be obtained.

In addition, white light emission with a high color rendering property that is formed of three primary colors or four or more colors can be obtained by using a plurality of light-emitting materials emitting light of different emission wavelengths for one of the light-emitting layers 120 and 170 or both. In that case, the light-emitting layer may be divided into layers and each of the divided layers may contain a light-emitting material different from the others.

<Material that can be Used in Light-Emitting Layers>

Next, materials that can be used in the light-emitting layers 120 and 170 are described.

<<Material that can be Used in Light-Emitting Layer 120>>

In the light-emitting layer 120, the host material 121 is present in the largest proportion by weight, and the guest material 122 (the fluorescent material) is dispersed in the host material 121. The S1 level of the host material 121 is preferably higher than the S1 level of the guest material 122 (the fluorescent material) while the T1 level of the host material 121 is preferably lower than the T1 level of the guest material 122 (the fluorescent material).

In the light-emitting layer 120, the guest material 122 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following materials can be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), NN-diphenyl-N,N'-bis[4-(9-phenyl-9H-fluoren-9-yl)phenyl]pyrene-1,6-diamine (abbreviation: 1,6FLPAPrn), N,N-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBuFLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N''-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N''-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1¹-biphenyl-2-yl)-2-anthryl]-N,9-diphenyl-9H-carbazol-3-amine (abbreviation: 2PCABPhA), N-(9,10-diphenyl-2-anthryl)-N,N',N''-triphenyl-1,4-phenylenediamine (abbreviation: 2DPAPA), N-[9,10-bis(1,1'-biphenyl-2-yl)-2-anthryl]-N,N',N''-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]inquinolizin-9-yl) ethenyl]-4H-pyran-4-ylidene}propanedinitrile (abbreviation: B is DCJTM), and 5,10,15,20-tetraphenylbisbenzo[5,6]indeno[1,2,3-cd:1',2',3'-lm]perylene.

Although there is no particular limitation on a material that can be used as the host material 121 in the light-emitting layer 120, any of the following materials can be used, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(II) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be given, and specific examples are 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryephenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBCl), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), and the like. One or more substances having a wider energy gap than the guest material 122 is preferably selected from these substances and known substances.

The light-emitting layer 120 can have a structure in which two or more layers are stacked. For example, in the case where the light-emitting layer 120 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

In the light-emitting layer 120, the host material 121 may be composed of one kind of compound or a plurality of compounds. Alternatively, the light-emitting layer 120 may contain a material other than the host material 121 and the guest material 122.

<<Material that can be Used in Light-Emitting Layer 170>>

As a material that can be used in the light-emitting layer 170, a material that can be used in the light-emitting layer 130 in Embodiment 1 may be used. Thus, a light-emitting element with high emission efficiency can be fabricated.

There is no limitation on the emission colors of the light-emitting materials contained in the light-emitting layers 120 and 170, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material contained in the light-emitting layer 120 is preferably shorter than that of the light-emitting material contained in the light-emitting layer 170.

Note that the light-emitting units 106 and 108 and the charge-generation layer 115 can be formed by an evaporation method (including a vacuum evaporation method), an inkjet method, a coating method, gravure printing, or the like.

The structure described in this embodiment can be used in combination with any of the structures described in the other embodiments as appropriate.

Embodiment 3

In this embodiment, examples of light-emitting elements having structures different from those described in Embodiments 1 and 2 are described below with reference to FIGS. 5A and 5B, FIGS. 6A and 6B, FIGS. 7A to 7C, and FIGS. 8A to 8C.

Structure Example 1 of Light-Emitting Element

Figure 5A:
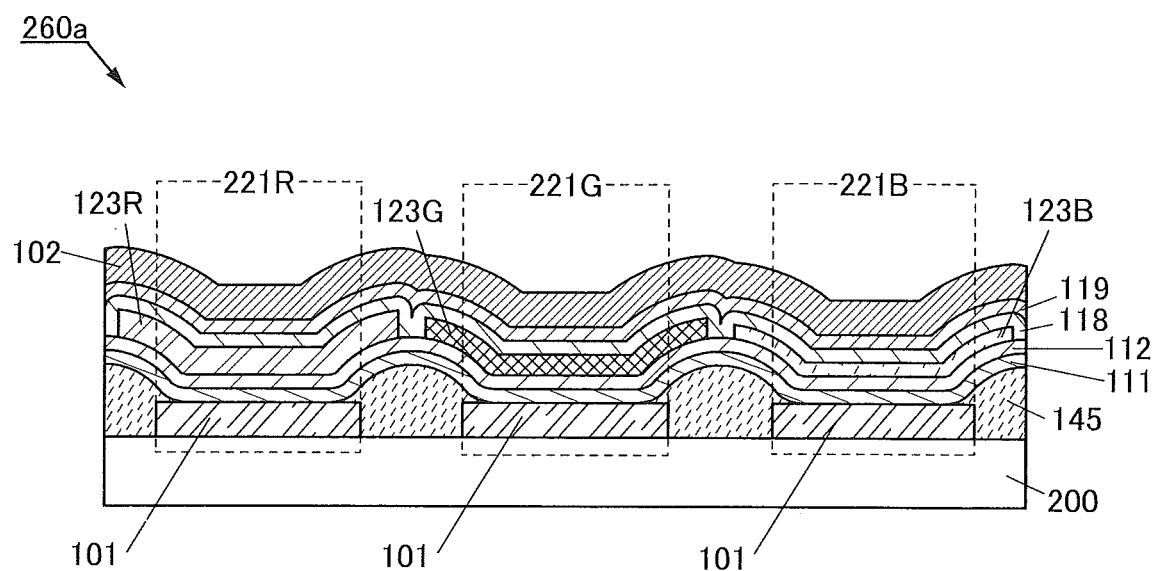
FIGS. 5A and 5B are each a schematic cross-sectional view of a light-emitting element of one embodiment of the present invention.
Figure 5B:
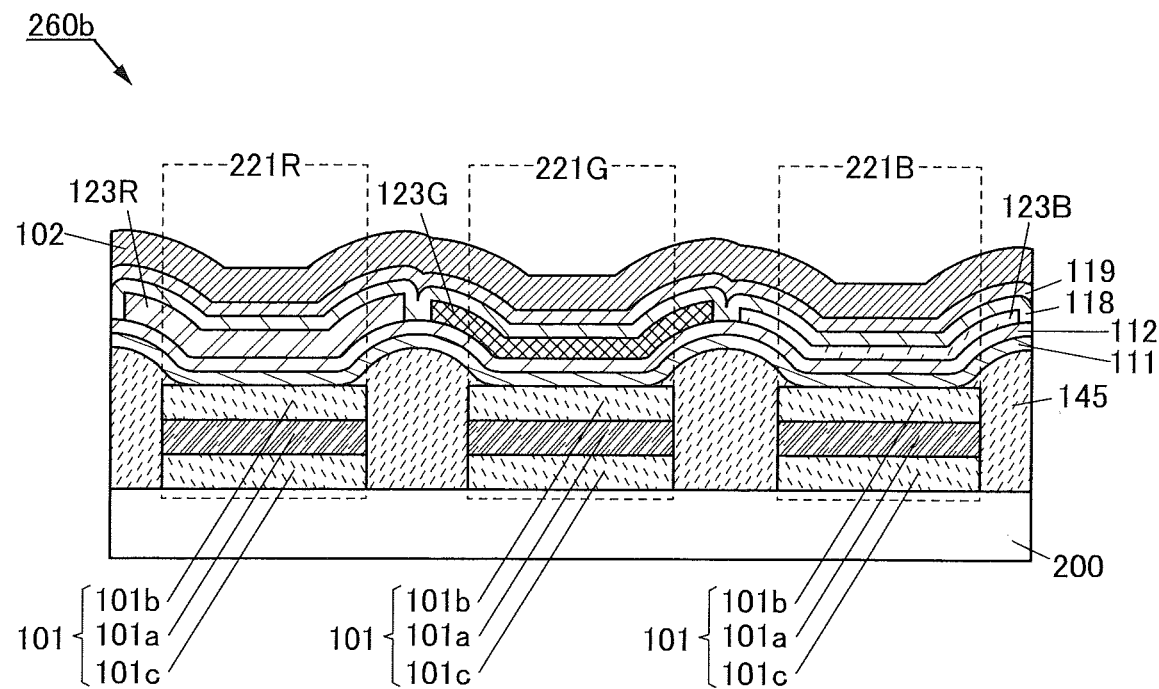

FIGS. 5A and 5B are cross-sectional views each illustrating a light-emitting element of one embodiment of the present invention. In FIGS. 5A and 5B, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Light-emitting elements 260a and 260b in FIGS. 5A and 5B may have a bottom-emission structure in which light is extracted through the substrate 200 or may have a top-emission structure in which light emitted from the light-emitting element is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting elements 260a and 260b each have a bottom emission structure, the electrode 101 preferably has a function of transmitting light and the electrode 102 preferably has a function of reflecting light. Alternatively, in the case where the light-emitting elements 260a and 260b each have a top emission structure, the electrode 101 preferably has a function of reflecting light and the electrode 102 preferably has a function of transmitting light.

The light-emitting elements 260a and 260b each include the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 118, and the electron-injection layer 119 are also provided.

The light-emitting element 260b includes, as part of the electrode 101, a conductive layer 101a, a conductive layer 101b over the conductive layer 101a, and a conductive layer 101c under the conductive layer 101a. In other words, the light-emitting element 260b includes the electrode 101 having a structure in which the conductive layer 101a is sandwiched between the conductive layer 101b and the conductive layer 101c.

In the light-emitting element 260b, the conductive layer 101b and the conductive layer 101c may be formed of different materials or the same material. The electrode 101 preferably has a structure in which the conductive layer 101a is sandwiched by the layers formed of the same conductive material, in which case patterning by etching in the process for forming the electrode 101 can be performed easily.

In the light-emitting element 260b, the electrode 101 may include one of the conductive layer 101b and the conductive layer 101c.

For each of the conductive layers 101a, 101b, and 101c, which are included in the electrode 101, the structure and materials of the electrode 101 or 102 described in Embodiment 1 can be used.

In FIGS. 5A and 5B, a partition wall 145 is provided between a region 221B, a region 221G, and a region 221R, which are sandwiched between the electrode 101 and the electrode 102. The partition wall 145 has an insulating property. The partition wall 145 covers end portions of the electrode 101 and has openings overlapping with the electrode. With the partition wall 145, the electrode 101 provided over the substrate 200 in the regions can be divided into island shapes.

Note that the light-emitting layer 123B and the light-emitting layer 123G may overlap with each other in a region where they overlap with the partition wall 145. The light-emitting layer 123G and the light-emitting layer 123R may overlap with each other in a region where they overlap with the partition wall 145. The light-emitting layer 123R and the light-emitting layer 123B may overlap with each other in a region where they overlap with the partition wall 145.

The partition wall 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The light-emitting layers 123R, 123G, and 123B preferably contain light-emitting materials having functions of emitting light of different colors. For example, when the light-emitting layer 123R contains a light-emitting material having a function of emitting red, the region 221R emits red light. When the light-emitting layer 123G contains a light-emitting material having a function of emitting green, the region 221G emits green light. When the light-emitting layer 123B contains a light-emitting material having a function of emitting blue, the region 221B emits blue light. The light-emitting element 260a or 260b having such a structure is used in a pixel of a display device, whereby a full-color display device can be fabricated. The thicknesses of the light-emitting layers may be the same or different.

One or more of the light-emitting layer 123B, the light-emitting layer 123G, and the light-emitting layer 123R preferably have a structure similar to that of the light-emitting layer 130 described in Embodiment 1. In that case, a light-emitting element with high emission efficiency can be fabricated.

One or more of the light-emitting layers 123B, 123G, and 123R may include two or more stacked layers.

When at least one light-emitting layer has the structure of the light-emitting layer described in Embodiments 1 and 2 as described above and the light-emitting element 260a or 260b including the light-emitting layer is used in pixels in a display device, a display device with high emission efficiency can be fabricated. The display device including the light-emitting element 260a or 260b can thus have reduced power consumption.

By providing an optical element (e.g., a color filter, a polarizing plate, and an anti-reflection film) on the light extraction side of the electrode through which light is extracted, the color purity of each of the light-emitting elements 260a and 260b can be improved. Therefore, the color purity of a display device including the light-emitting element 260a or 260b can be improved. Alternatively, the reflection of external light by each of the light-emitting elements 260a and 260b can be reduced. Therefore, the contrast ratio of a display device including the light-emitting element 260a or 260b can be improved.

For the other components of the light-emitting elements 260a and 260b, the components of the light-emitting element in Embodiments 1 and 2 may be referred to.

Structure Example 2 of Light-Emitting Element

Next, structure examples different from the light-emitting elements illustrated in FIGS. 5A and 5B will be described below with reference to FIGS. 6A and 6B.

Figure 6A:
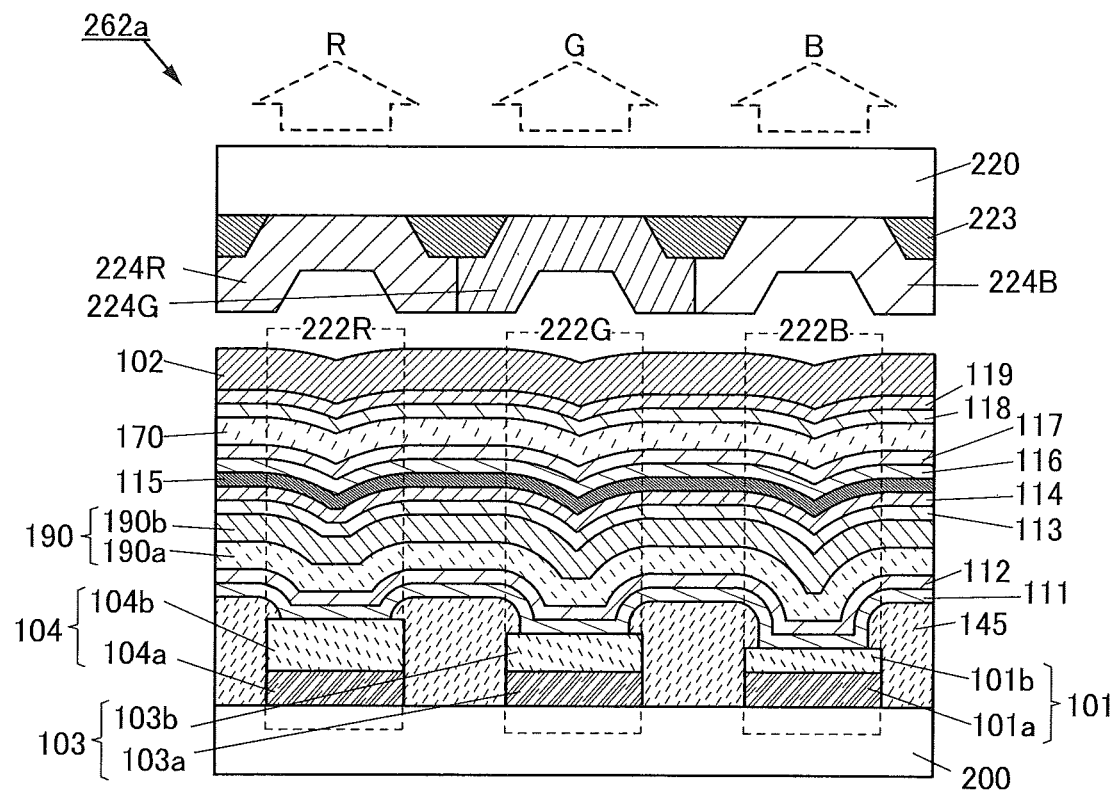
FIGS. 6A and 6B are each a schematic cross-sectional view of a light-emitting element of one embodiment of the present invention.
Figure 6B:
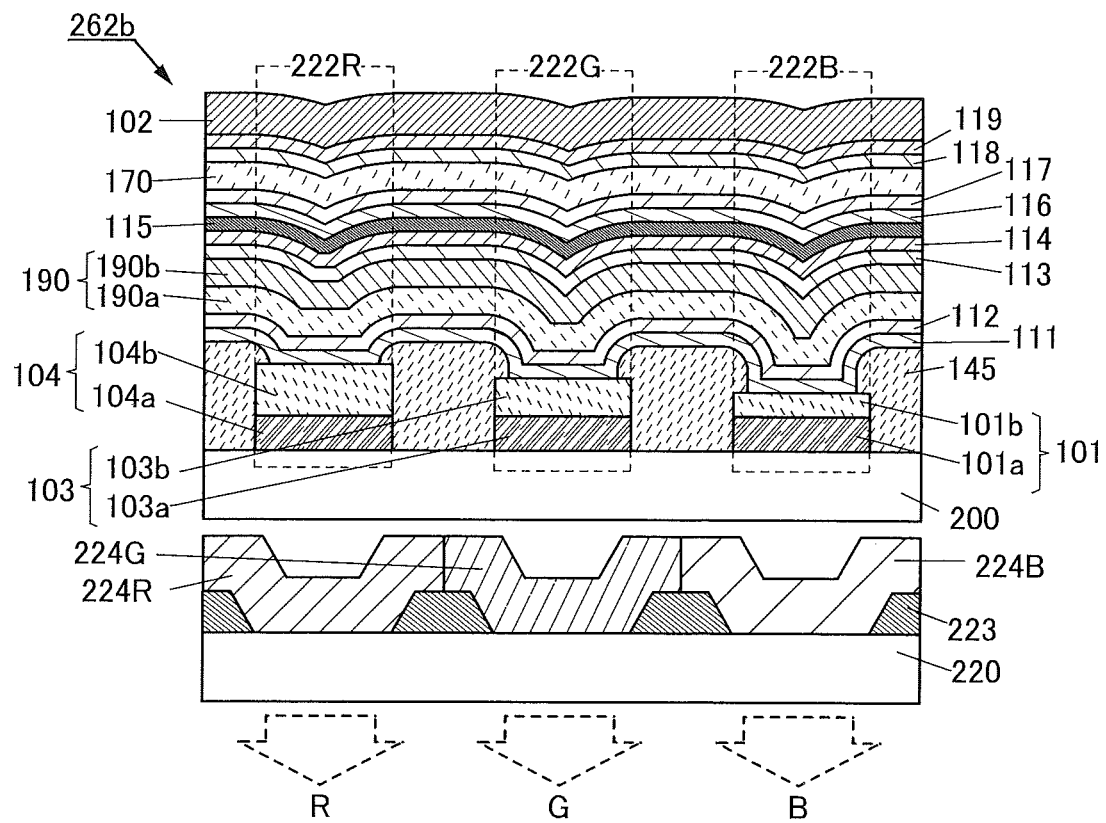

FIGS. 6A and 6B are cross-sectional views of a light-emitting element of one embodiment of the present invention. In FIGS. 6A and 6B, a portion having a function similar to that in FIGS. 5A and 5B is represented by the same hatch pattern as in FIGS. 5A and 5B and not especially denoted by a reference numeral in some cases. In addition, common reference numerals are used for portions having similar functions, and a detailed description of such portions is not repeated in some cases.

FIGS. 6A and 6B illustrate structure examples of a light-emitting element including the light-emitting layer between a pair of electrodes. A light-emitting element 262a illustrated in FIG. 6A has a top-emission structure in which light is extracted in a direction opposite to the substrate 200, and a light-emitting element 262b illustrated in FIG. 6B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262a and 262b each include the electrode 101, the electrode 102, an electrode 103, and an electrode 104 over the substrate 200. At least a light-emitting layer 170, a light-emitting layer 190, and the charge-generation layer 115 are provided between the electrode 101 and the electrode 102, between the electrode 102 and the electrode 103, and between the electrode 102 and the electrode 104. The hole-injection layer 111, the hole-transport layer 112, the electron-transport layer 113, the electron-injection layer 114, the hole-injection layer 116, the hole-transport layer 117, the electron-transport layer 118, and the electron-injection layer 119 are further provided.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The light-emitting element 262a illustrated in FIG. 6A and the light-emitting element 262b illustrated in FIG. 6B each include a partition wall 145 between a region 222B sandwiched between the electrode 101 and the electrode 102, a region 222G sandwiched between the electrode 102 and the electrode 103, and a region 222R sandwiched between the electrode 102 and the electrode 104. The partition wall 145 has an insulating property. The partition wall 145 covers end portions of the electrodes 101, 103, and 104 and has openings overlapping with the electrodes. With the partition wall 145, the electrodes provided over the substrate 200 in the regions can be divided into island shapes.

The charge-generation layer 115 can be formed with a material obtained by adding an electron acceptor (acceptor) to a hole-transport material or a material obtained by adding an electron donor (donor) to an electron-transport material. Note that when the conductivity of the charge-generation layer 115 is as high as that of the pair of electrodes, carriers generated in the charge-generation layer 115 might transfer to an adjacent pixel and light emission might occur in the pixel. In order to prevent such false light emission from an adjacent pixel, the charge-generation layer 115 is preferably formed with a material whose conductivity is lower than that of the pair of electrodes.

The light-emitting elements 262a and 262b each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum dot can increase color reproducibility of the display device.

One or more optical elements may be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

Note that in FIGS. 6A and 6B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

Note that the optical element 224B and the optical element 224G may overlap with each other in a region where they overlap with the light-blocking layer 223. In addition, the optical element 224G and the optical element 224R may overlap with each other in a region where they overlap with the light-blocking layer 223. In addition, the optical element 224R and the optical element 224B may overlap with each other in a region where they overlap with the light-blocking layer 223.

As for the structures of the substrate 200 and the substrate 220 provided with the optical elements, Embodiment 1 can be referred to.

Furthermore, the light-emitting elements 262a and 262b have a microcavity structure.

<<Microcavity Structure>>

Light emitted from the light-emitting layer 170 and the light-emitting layer 190 resonates between a pair of electrodes (e.g., the electrode 101 and the electrode 102). The light-emitting layer 170 and the light-emitting layer 190 are formed at such a position as to intensify the light of a desired wavelength among light to be emitted. For example, by adjusting the optical length from a reflective region of the electrode 101 to the light-emitting region of the light-emitting layer 170 and the optical length from a reflective region of the electrode 102 to the light-emitting region of the light-emitting layer 170, the light of a desired wavelength among light emitted from the light-emitting layer 170 can be intensified. By adjusting the optical length from the reflective region of the electrode 101 to the light-emitting region of the light-emitting layer 190 and the optical length from the reflective region of the electrode 102 to the light-emitting region of the light-emitting layer 190, the light of a desired wavelength among light emitted from the light-emitting layer 190 can be intensified. In the case of a light-emitting element in which a plurality of light-emitting layers (here, the light-emitting layers 170 and 190) are stacked, the optical lengths of the light-emitting layers 170 and 190 are preferably optimized.

In each of the light-emitting elements 262a and 262b, by adjusting the thicknesses of the conductive layers (the conductive layer 101b, the conductive layer 103b, and the conductive layer 104b) in each region, the light of a desired wavelength among light emitted from the light-emitting layers 170 and 190 can be increased. Note that the thickness of at least one of the hole-injection layer 111 and the hole-transport layer 112 may differ between the regions to increase the light emitted from the light-emitting layers 170 and 190.

For example, in the case where the refractive index of the conductive material having a function of reflecting light in the electrodes 101 to 104 is lower than the refractive index of the light-emitting layer 170 or 190, the thickness of the conductive layer 101b of the electrode 101 is adjusted so that the optical length between the electrode 101 and the electrode 102 is $m_B \lambda_B/2$ ($m_B$ is a natural number and $\lambda_B$ is the wavelength of light intensified in the region 222B). Similarly, the thickness of the conductive layer 103b of the electrode 103 is adjusted so that the optical length between the electrode 103 and the electrode 102 is $M_G \lambda_G/2$ ($m_G$ is a natural number and $\lambda_G$ is the wavelength of light intensified in the region 222G). Furthermore, the thickness of the conductive layer 104b of the electrode 104 is adjusted so that the optical length between the electrode 104 and the electrode 102 is $m_R \lambda_R/2$ ($m_R$ is a natural number and $\lambda_R$ is the wavelength of light intensified in the region 222R).

In the case where it is difficult to precisely determine the reflective regions of the electrodes 101 to 104, the optical length for increasing the intensity of light emitted from the light-emitting layer 170 or the light-emitting layer 190 may be derived on the assumption that certain regions of the electrodes 101 to 104 are the reflective regions. In the case where it is difficult to precisely determine the light-emitting regions of the light-emitting layer 170 and the light-emitting layer 190, the optical length for increasing the intensity of light emitted from the light-emitting layer 170 and the light-emitting layer 190 may be derived on the assumption that certain regions of the light-emitting layer 170 and the light-emitting layer 190 are the light-emitting regions.

In the above manner, with the microcavity structure, in which the optical length between the pair of electrodes in the respective regions is adjusted, scattering and absorption of light in the vicinity of the electrodes can be suppressed, resulting in high light extraction efficiency.

In the above structure, the conductive layers 101b, 103b, and 104b preferably have a function of transmitting light. The materials of the conductive layers 101b, 103b, and 104b may be the same or different. It is preferable to use the same material for the conductive layer 101b, the conductive layer 103b, and the conductive layer 104b because patterning by etching in the formation process of the electrode 101, the electrode 103, and the electrode 104 can be performed easily. Each of the conductive layers 101b, 103b, and 104b may have a stacked structure of two or more layers.

Since the light-emitting element 262a illustrated in FIG. 6A has a top-emission structure, it is preferable that the conductive layer 101a, the conductive layer 103a, and the conductive layer 104a have a function of reflecting light. In addition, it is preferable that the electrode 102 have functions of transmitting light and reflecting light.

Since the light-emitting element 262b illustrated in FIG. 6B has a bottom-emission structure, it is preferable that the conductive layer 101a, the conductive layer 103a, and the conductive layer 104a have functions of transmitting light and reflecting light. In addition, it is preferable that the electrode 102 have a function of reflecting light.

In each of the light-emitting elements 262a and 262b, the conductive layers 101a, 103a, and 104a may be formed of different materials or the same material. When the conductive layers 101a, 103a, and 104a are formed of the same material, manufacturing cost of the light-emitting elements 262*a* and 262*b* can be reduced. Note that each of the conductive layers 101*a*, 103*a*, and 104*a* may have a stacked structure including two or more layers.

At least one of the structures described in Embodiments 1 and 2 is preferably used for at least one of the light-emitting layers 170 and 190 included in the light-emitting elements 262*a* and 262*b*. In this way, the light-emitting elements can have high emission efficiency.

Either or both of the light-emitting layers 170 and 190 may have a stacked structure of two layers like the light-emitting layers 190*a* and 190*b*, for example. The two light-emitting layers each including two kinds of light-emitting materials (a first compound and a second compound) for emitting light of different colors enable emission of light of a plurality of colors. It is particularly preferable to select the light-emitting materials of the light-emitting layers so that white light can be obtained by combining light emissions from the light-emitting layers 170 and 190.

Either or both of the light-emitting layers 170 and 190 may have a stacked structure of three or more layers, in which a layer not including a light-emitting material may be included.

In the above-described manner, by using the light-emitting element 262*a* or 262*b* including at least one of the structures of the light-emitting layers described in Embodiments 1 and 2 in pixels in a display device, a display device with high emission efficiency can be fabricated. Accordingly, the display device including the light-emitting element 262*a* or 262*b* can have reduced power consumption.

For the other components of the light-emitting elements 262*a* and 262*b*, the components of the light-emitting element 260*a* or 260*b* or the light-emitting element in Embodiment 1 or 2 may be referred to.

<Fabrication Method of Light-Emitting Element>

Next, a method for fabricating a light-emitting element of one embodiment of the present invention is described below with reference to FIGS. 7A to 7C and FIGS. 8A to 8C. Here, a method for fabricating the light-emitting element 262*a* illustrated in FIG. 6A is described.

FIGS. 7A to 7C and FIGS. 8A to 8C are cross-sectional views illustrating a method for fabricating the light-emitting element of one embodiment of the present invention.

The method for fabricating the light-emitting element 262*a* described below includes first to seventh steps.

<<First Step>>

Figure 7A:
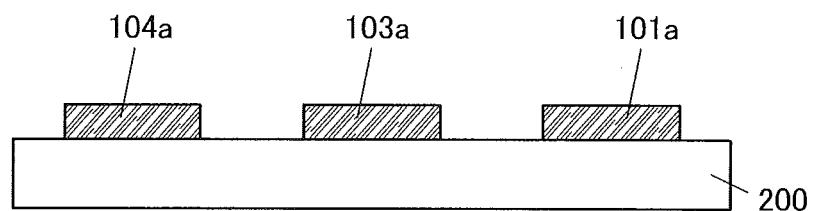
FIGS. 7A to 7C are schematic cross-sectional views illustrating a method for fabricating a light-emitting element of one embodiment of the present invention.

In the first step, the electrodes (specifically the conductive layer 101*a* of the electrode 101, the conductive layer 103*a* of the electrode 103, and the conductive layer 104*a* of the electrode 104) of the light-emitting elements are formed over the substrate 200 (see FIG. 7A).

In this embodiment, a conductive layer having a function of reflecting light is formed over the substrate 200 and processed into a desired shape; whereby the conductive layers 101*a*, 103*a*, and 104*a* are formed. As the conductive layer having a function of reflecting light, an alloy film of silver, palladium, and copper (also referred to as an Ag—Pd—Cu film or APC) is used. The conductive layers 101*a*, 103*a*, and 104*a* are preferably formed through a step of processing the same conductive layer, because the manufacturing cost can be reduced.

Note that a plurality of transistors may be formed over the substrate 200 before the first step. The plurality of transistors may be electrically connected to the conductive layers 101*a*, 103*a*, and 104*a*.

<<Second Step>>

Figure 7B:
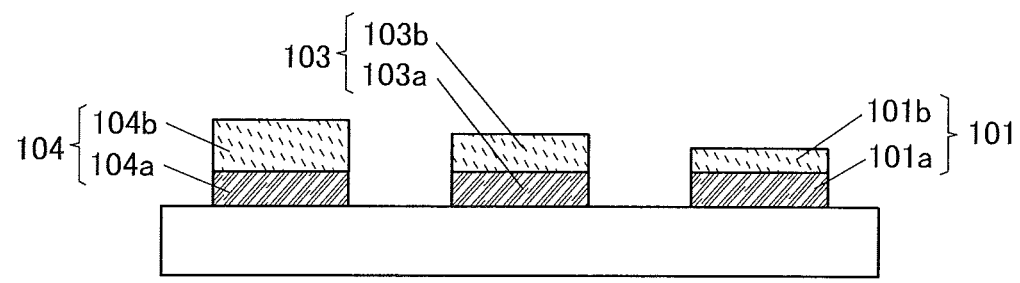

In the second step, the conductive layer 101*b* having a function of transmitting light is formed over the conductive layer 101*a* of the electrode 101, the conductive layer 103*b* having a function of transmitting light is formed over the conductive layer 103*a* of the electrode 103, and the conductive layer 104*b* having a function of transmitting light is formed over the conductive layer 104*a* of the electrode 104 (see FIG. 7B).

In this embodiment, the conductive layers 101*b*, 103*b*, and 104*b* each having a function of transmitting light are formed over the conductive layers 101*a*, 103*a*, and 104*a* each having a function of reflecting light, respectively, whereby the electrode 101, the electrode 103, and the electrode 104 are formed. As the conductive layers 101*b*, 103*b*, and 104*b*, ITSO films are used.

The conductive layers 101*b*, 103*b*, and 104*b* having a function of transmitting light may be formed in a plurality of steps. When the conductive layers 101*b*, 103*b*, and 104*b* having a function of transmitting light are formed in a plurality of steps, they can be formed to have thicknesses which enable microcavity structures appropriate in the respective regions.

<<Third Step>>

Figure 7C:
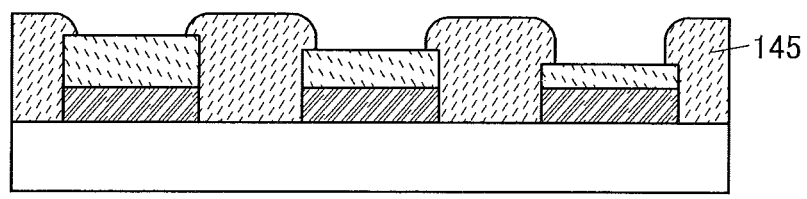

In the third step, the partition wall 145 that covers end portions of the electrodes of the light-emitting element is formed (see FIG. 7C).

The partition wall 145 includes an opening overlapping with the electrode. The conductive film exposed by the opening functions as the anode of the light-emitting element. As the partition wall 145, a polyimide-based resin is used in this embodiment.

In the first to third steps, since there is no possibility of damaging the EL layer (a layer containing an organic compound), a variety of film formation methods and micromachining technologies can be employed. In this embodiment, a reflective conductive layer is formed by a sputtering method, a pattern is formed over the conductive layer by a lithography method, and then the conductive layer is processed into an island shape by a dry etching method or a wet etching method to form the conductive layer 101*a* of the electrode 101, the conductive layer 103*a* of the electrode 103, and the conductive layer 104*a* of the electrode 104. Then, a transparent conductive film is formed by a sputtering method, a pattern is formed over the transparent conductive film by a lithography method, and then the transparent conductive film is processed into island shapes by a wet etching method to form the electrodes 101, 103, and 104.

<<Fourth Step>>

Figure 8A:
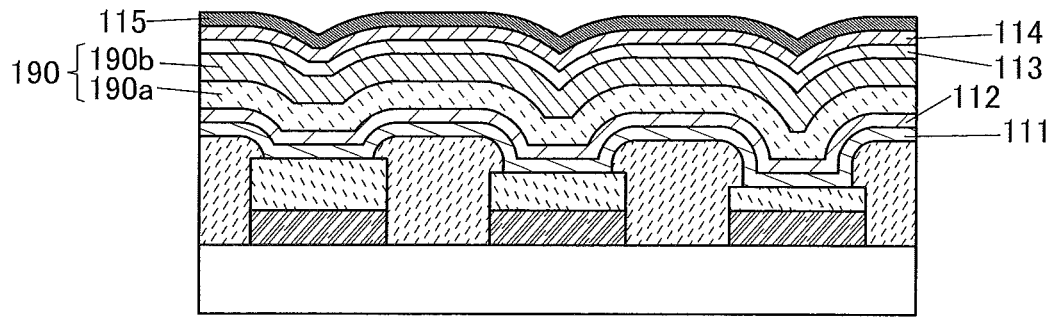
FIGS. 8A to 8C are schematic cross-sectional views illustrating a method for fabricating a light-emitting element of one embodiment of the present invention.

In the fourth step, the hole-injection layer 111, the hole-transport layer 112, the light-emitting layer 190, the electron-transport layer 113, the electron-injection layer 114, and the charge-generation layer 115 are formed (see FIG. 8A).

The hole-injection layer 111 can be formed by co-evaporating a hole-transport material and a material containing an acceptor substance. Note that a co-evaporation method is an evaporation method in which a plurality of different substances are concurrently vaporized from respective different evaporation sources. The hole-transport layer 112 can be formed by evaporating a hole-transport material.

The light-emitting layer 190 can be formed by evaporating a guest material that emits light of at least one color selected from violet, blue, blue green, green, yellow green, yellow, orange, and red. As the guest material, a fluorescent or phosphorescent organic material can be used. The structure of the light-emitting layer described in Embodiment 1 or Embodiment 2 is preferably employed. The light-emitting layer 190 may have a two-layer structure. In such a case, the two light-emitting layers preferably contain light-emitting materials that emit light of different colors.

The electron-transport layer 113 can be formed by evaporating a substance having a high electron-transport property. The electron-injection layer 114 can be formed by evaporating a substance having a high electron-injection property.

The charge-generation layer 115 can be formed by evaporating a material obtained by adding an electron acceptor (acceptor) to a hole-transport material or a material obtained by adding an electron donor (donor) to an electron-transport material.

<<Fifth Step>>

Figure 8B:
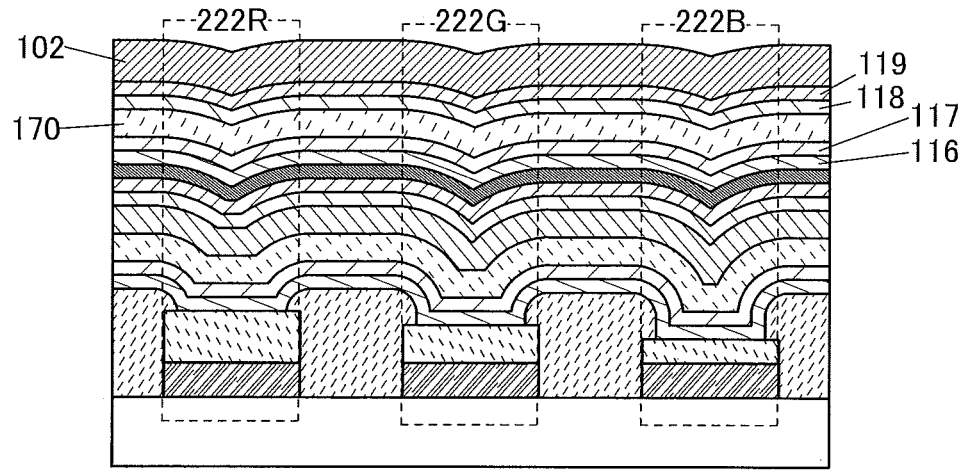

In the fifth step, the hole-injection layer 116, the hole-transport layer 117, the light-emitting layer 170, the electron-transport layer 118, the electron-injection layer 119, and the electrode 102 are formed (see FIG. 8B).

The hole-injection layer 116 can be formed by using a material and a method which are similar to those of the hole-injection layer 111. The hole-transport layer 117 can be formed by using a material and a method which are similar to those of the hole-transport layer 112.

The light-emitting layer 170 can be formed by evaporating a guest material that emits light of at least one color selected from violet, blue, blue green, green, yellow green, yellow, orange, and red. As the guest material, a fluorescent or phosphorescent organic compound can be used. The structure of the light-emitting layer described in Embodiment 1 or Embodiment 2 is preferably employed. Note that at least one of the light-emitting layer 170 and the light-emitting layer 190 preferably has the structure of a light-emitting layer described in Embodiment 1. The light-emitting layer 170 and the light-emitting layer 190 preferably include light-emitting organic compounds exhibiting light of different colors.

The electron-transport layer 118 can be formed by using a material and a method which are similar to those of the electron-transport layer 113. The electron-injection layer 119 can be formed by using a material and a method which are similar to those of the electron-injection layer 114.

The electrode 102 can be formed by stacking a reflective conductive film and a light-transmitting conductive film. The electrode 102 may have a single-layer structure or a stacked-layer structure.

Through the above-described steps, the light-emitting element including the region 222B, the region 222G, and the region 222R over the electrode 101, the electrode 103, and the electrode 104, respectively, are formed over the substrate 200.

<<Sixth Step>>

Figure 8C:
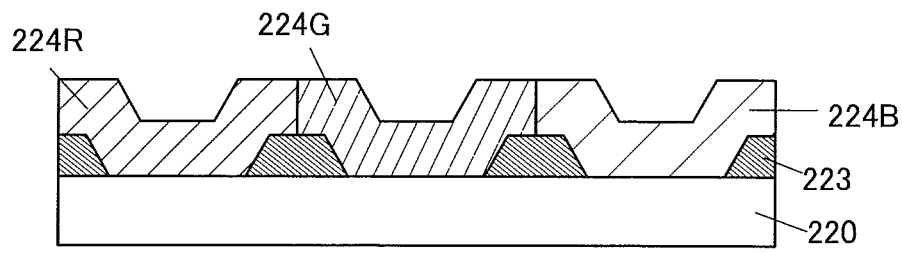

In the sixth step, the light-blocking layer 223, the optical element 224B, the optical element 224G, and the optical element 224R are formed over the substrate 220 (see FIG. 8C).

As the light-blocking layer 223, a resin film containing black pigment is formed in a desired region. Then, the optical element 224B, the optical element 224G, and the optical element 224R are formed over the substrate 220 and the light-blocking layer 223. As the optical element 224B, a resin film containing blue pigment is formed in a desired region. As the optical element 224G, a resin film containing green pigment is formed in a desired region. As the optical element 224R, a resin film containing red pigment is formed in a desired region.

<<Seventh Step>>

In the seventh step, the light-emitting element formed over the substrate 200 is attached to the light-blocking layer 223, the optical element 224B, the optical element 224G, and the optical element 224R formed over the substrate 220, and sealed with a sealant (not illustrated).

Through the above-described steps, the light-emitting element 262a illustrated in FIG. 6A can be formed.

The structure described in this embodiment can be used in combination with any of the structures described in the other embodiments as appropriate.

Embodiment 4

In this embodiment, a display device of one embodiment of the present invention will be described below with reference to FIGS. 9A and 9B, FIGS. 10A and 10B, FIG. 11, FIGS. 12A and 12B, FIGS. 13A and 13B, FIG. 14, FIGS. 15A and 15B, FIG. 16, and FIGS. 17A and 17B.

Structure Example 1 of Display Device

Figure 9A:
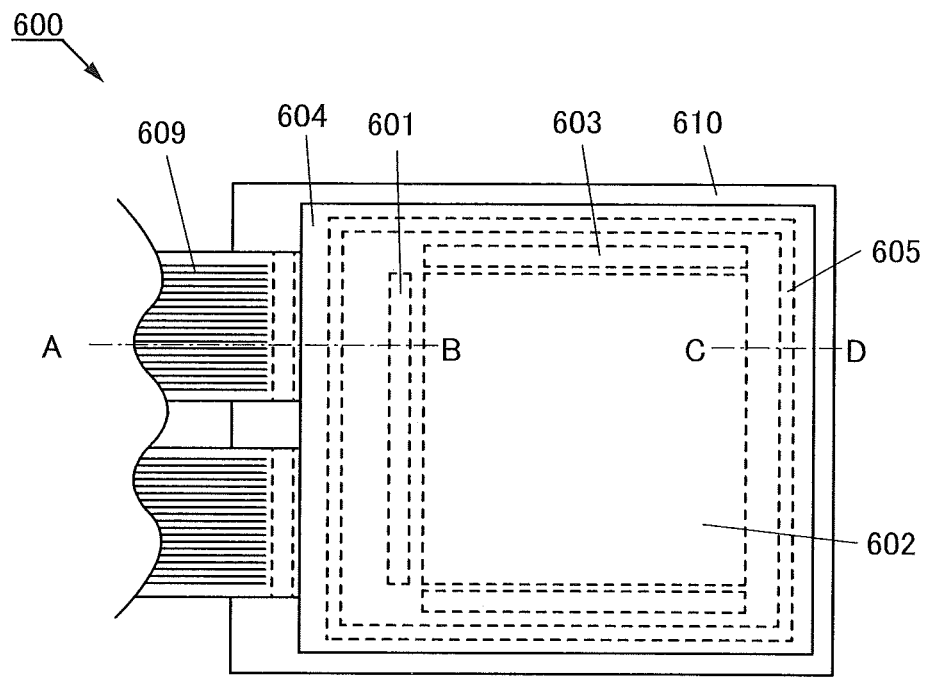
FIGS. 9A and 9B are a top view and a schematic cross-sectional view illustrating a display device of one embodiment of the present invention.
Figure 9B:
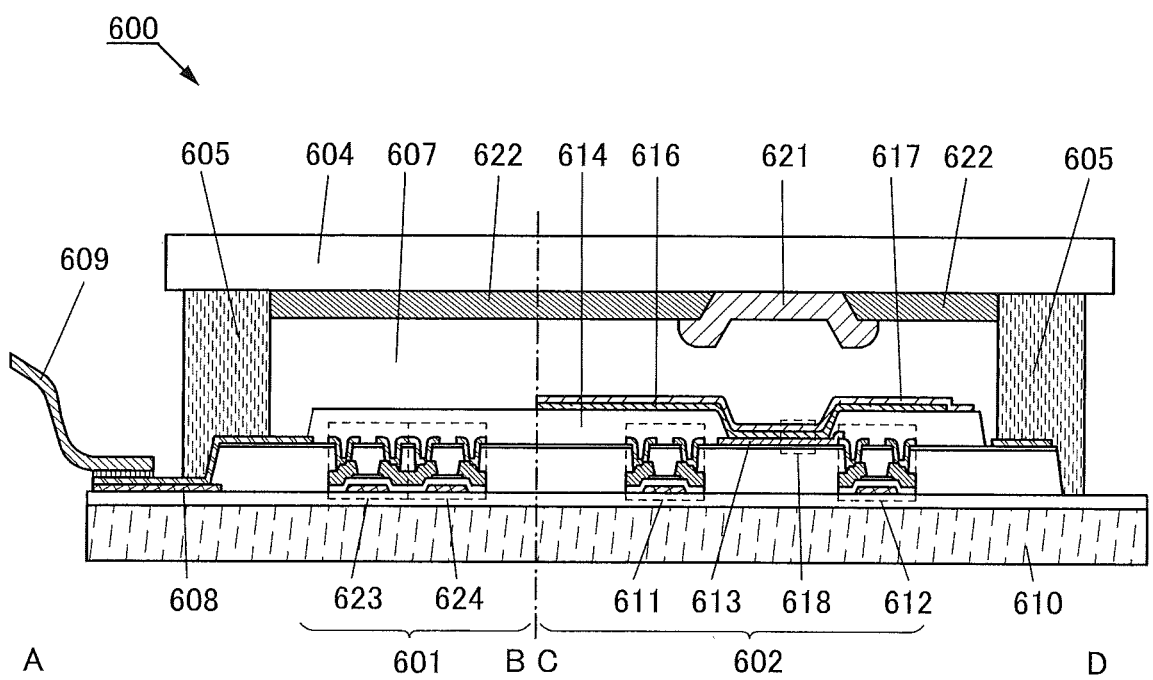

FIG. 9A is a top view illustrating a display device 600 and FIG. 9B is a cross-sectional view taken along the dashed-dotted line A-B and the dashed-dotted line C-D in FIG. 9A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission from a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive photosensitive acrylic resin film can be used.

In order to obtain favorable coverage, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for these transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more and further preferably 3 eV or more, for the transistors, so that the off-state current of the transistors can be reduced. Examples of the oxide semiconductor include an In—Ga oxide and an In-M-Zn oxide (M is aluminum (Al), gallium (Ga), yttrium (Y), zirconium (Zr), lanthanum (La), cerium (Ce), tin (Sn), hafnium (Hf), or neodymium (Nd)).

An EL layer 616 and an upper electrode 617 are formed over the lower electrode 613. Here, the lower electrode 613 functions as an anode and the upper electrode 617 functions as a cathode.

In addition, the EL layer 616 is formed by various methods such as an evaporation method with an evaporation mask, an inkjet method, or a spin coating method. As a material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 preferably has any of the structures described in Embodiments 1 to 3. In the case where the pixel portion includes a plurality of light-emitting elements, the pixel portion may include both any of the light-emitting elements described in Embodiments 1 to 3 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. It is preferable that the sealing substrate be provided with a recessed portion and a desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 3, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

In the above-described manner, the display device including any of the light-emitting elements and the optical elements which are described in Embodiments 1 to 3 can be obtained.

Structure Example 2 of Display Device

Figure 11:
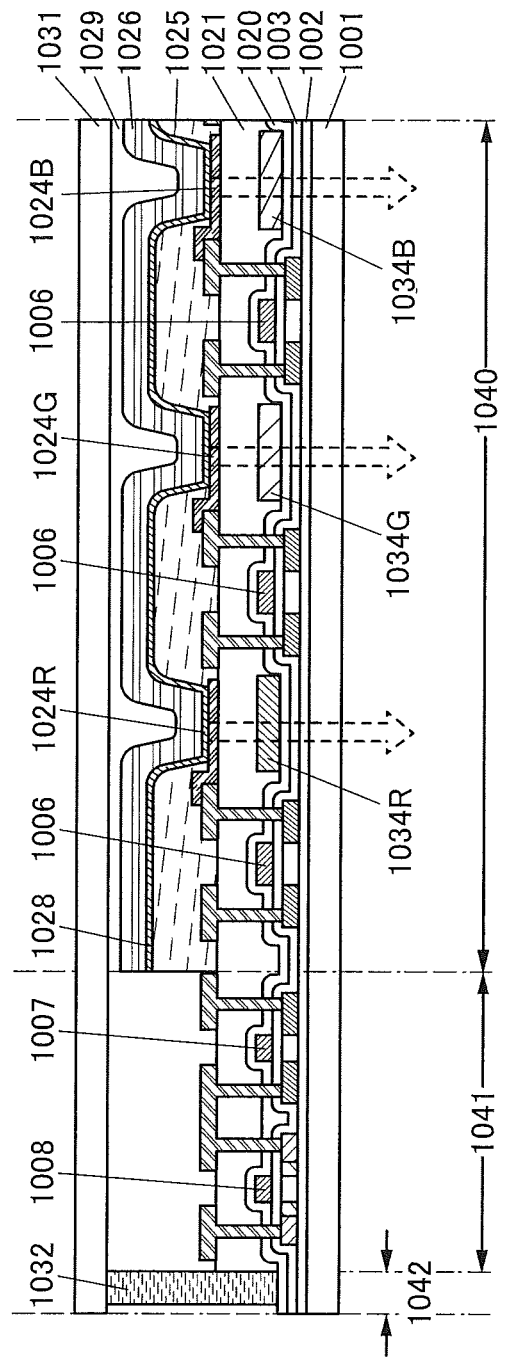
FIG. 11 is a schematic cross-sectional view illustrating a display device of one embodiment of the present invention.

Next, another example of the display device is described with reference to FIGS. 10A and 10B and FIG. 11. Note that FIGS. 10A and 10B and FIG. 11 are each a cross-sectional view of a display device of one embodiment of the present invention.

In FIG. 10A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 10A, as examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 10A, red light, green light, and blue light pass through the coloring layers, and thus an image can be displayed with the use of pixels of three colors.

FIG. 10B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

FIG. 11 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in this structure, the coloring layers may be provided between the substrate 1001 and the sealing substrate 1031.

The above-described display device has a structure in which light is extracted from the substrate 1001 side where the transistors are formed (a bottom-emission structure), but may have a structure in which light is extracted from the sealing substrate 1031 side (a top-emission structure).

Structure Example 3 of Display Device

Figure 12A:
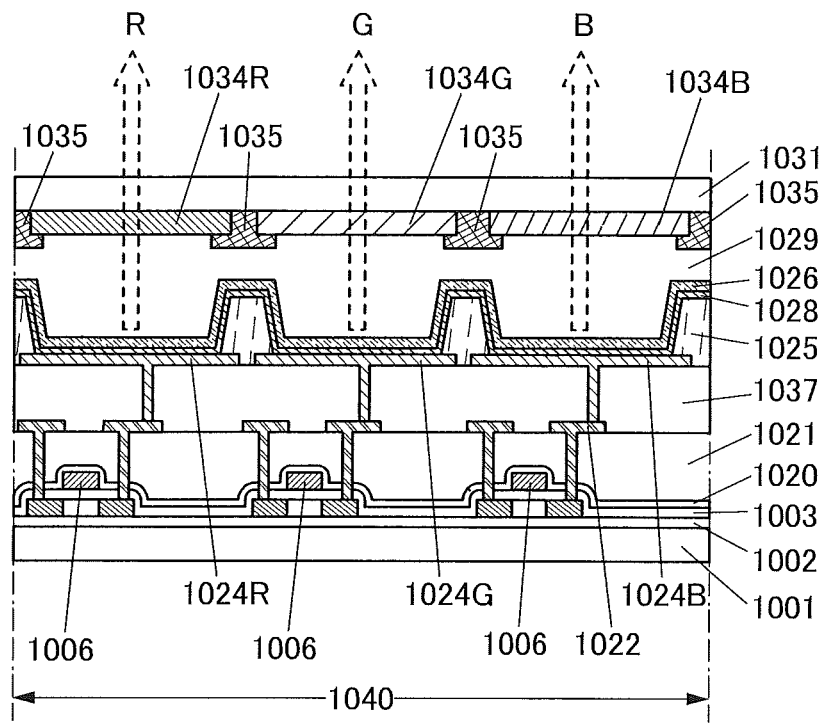
FIGS. 12A and 12B are schematic cross-sectional views each illustrating a display device of one embodiment of the present invention.
Figure 12B:
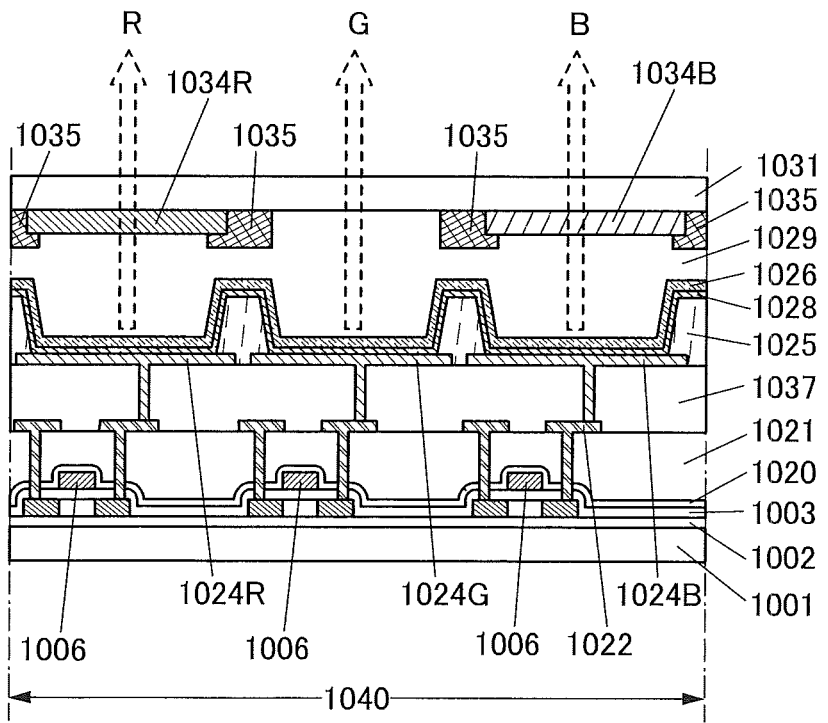

FIGS. 12A and 12B are each an example of a cross-sectional view of a display device having a top emission structure. Note that FIGS. 12A and 12B are each a cross-sectional view illustrating the display device of one embodiment of the present invention, and the driver circuit portion

1041, the peripheral portion 1042, and the like, which are illustrated in FIGS. 10A and 10B and FIG. 11, are not illustrated therein.

In this case, as the substrate 1001, a substrate that does not transmit light can be used. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed using a material similar to that of the second interlayer insulating film, or can be formed using any other various materials.

The lower electrodes 1024R, 1024G, and 1024B of the light-emitting elements each function as an anode here, but may function as a cathode. Further, in the case of a display device having a top-emission structure as illustrated in FIGS. 12A and 12B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light of a specific wavelength is increased.

In the case of a top-emission structure as illustrated in FIG. 12A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 12A illustrates the structure provided with the light-emitting elements and the coloring layers for the light-emitting elements as an example; however, the structure is not limited thereto. For example, as shown in FIG. 12B, a structure including the red coloring layer 1034R and the blue coloring layer 1034B but not including a green coloring layer may be employed to achieve full color display with the three colors of red, green, and blue. The structure as illustrated in FIG. 12A where the light-emitting elements are provided with the coloring layers is effective in suppressing reflection of external light. In contrast, the structure as illustrated in FIG. 12B where the light-emitting elements are provided with the red coloring layer and the blue coloring layer and without the green coloring layer is effective in reducing power consumption because of small energy loss of light emitted from the green light-emitting element.

Structure Example 4 of Display Device

Figure 14:
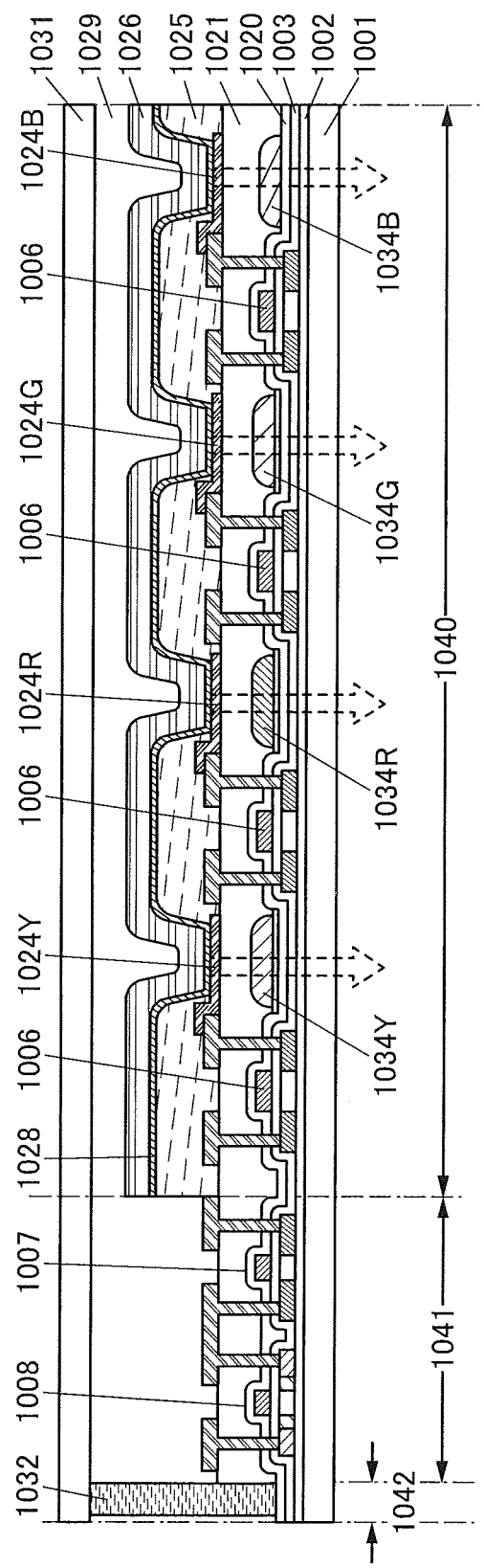
FIG. 14 is a schematic cross-sectional view illustrating a display device of one embodiment of the present invention.

Although a display device including sub-pixels of three colors (red, green, and blue) is described above, the number of colors of sub-pixels may be four (red, green, blue, and yellow, or red, green, blue, and white). FIGS. 13A and 13B, FIG. 14, and FIGS. 15A and 15B illustrate structures of display devices each including the lower electrodes 1024R, 1024G, 1024B, and 1024Y. FIGS. 13A and 13B and FIG. 14 each illustrate a display device having a structure in which light is extracted from the substrate 1001 side on which transistors are formed (bottom-emission structure), and FIGS. 15A and 15B each illustrate a display device having a structure in which light is extracted from the sealing substrate 1031 side (top-emission structure).

FIG. 13A illustrates an example of a display device in which optical elements (the coloring layer 1034R, the coloring layer 1034G, the coloring layer 1034B, and a coloring layer 1034Y) are provided on the transparent base material 1033. FIG. 13B illustrates an example of a display device in which optical elements (the coloring layer 1034R, the coloring layer 1034G, the coloring layer 1034B, and the coloring layer 1034Y) are provided between the gate insulating film 1003 and the first interlayer insulating film 1020. FIG. 14 illustrates an example of a display device in which optical elements (the coloring layer 1034R, the coloring layer 1034G, the coloring layer 1034B, and the coloring layer 1034Y) are provided between the first interlayer insulating film 1020 and the second interlayer insulating film 1021.

The coloring layer 1034R transmits red light, the coloring layer 1034G transmits green light, and the coloring layer 1034B transmits blue light. The coloring layer 1034Y transmits yellow light or transmits light of a plurality of colors selected from blue, green, yellow, and red. When the coloring layer 1034Y can transmit light of a plurality of colors selected from blue, green, yellow, and red, light that has passed through the coloring layer 1034Y may be white light. Since the light-emitting element which transmits yellow or white light has high emission efficiency, the display device including the coloring layer 1034Y can have lower power consumption.

Figure 15A:
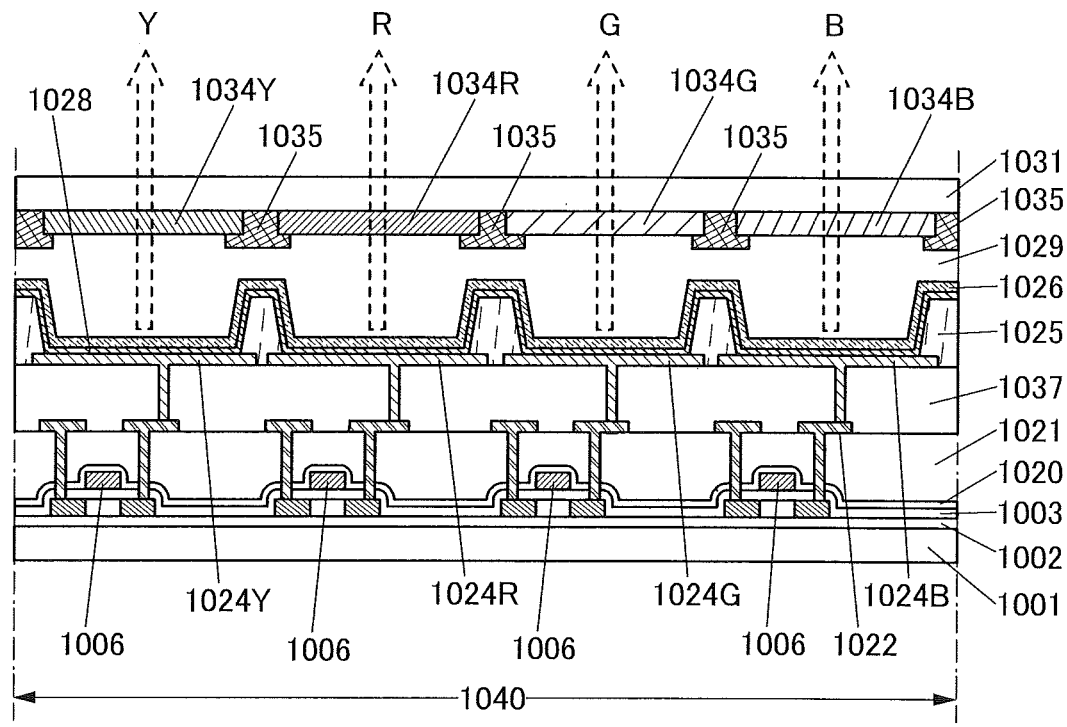
FIGS. 15A and 15B are schematic cross-sectional views each illustrating a display device of one embodiment of the present invention.
Figure 15B:
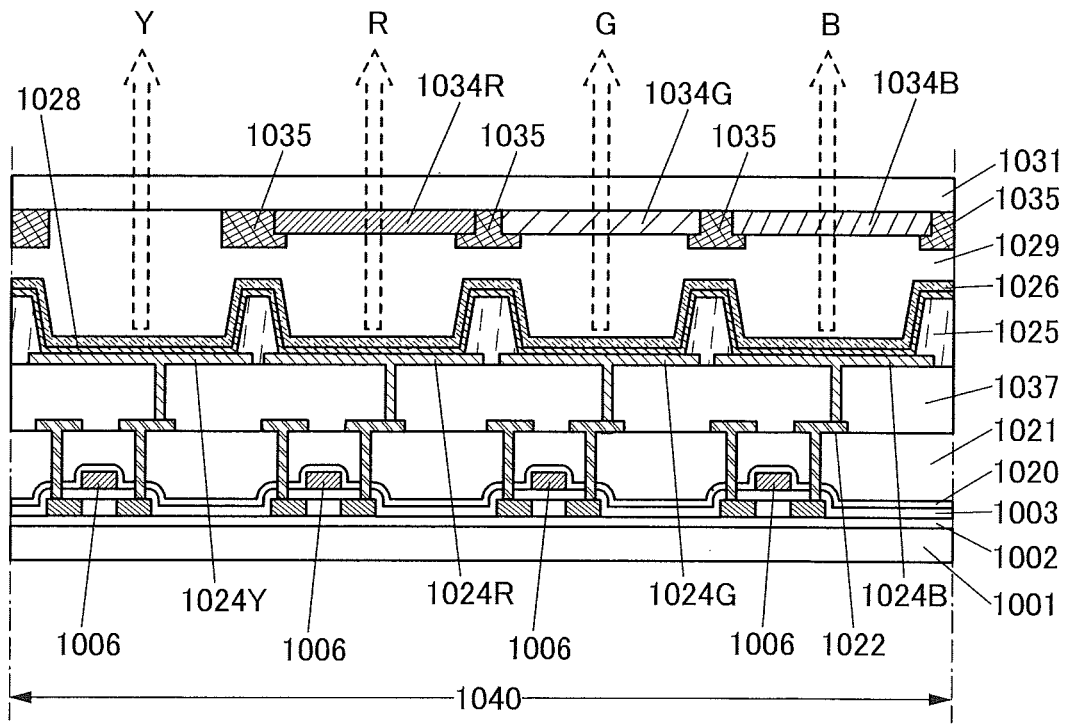

In the top-emission display devices illustrated in FIGS. 15A and 15B, a light-emitting element including the lower electrode 1024Y preferably has a microcavity structure between the upper electrode 1026 and the lower electrodes 1024R, 1024G, 1024B, and 1024Y as in the display device illustrated in FIG. 12A. In the display device illustrated in FIG. 15A, sealing can be performed with the sealing substrate 1031 on which the coloring layers (the red coloring layer 1034R, the green coloring layer 1034G, the blue coloring layer 1034B, and the yellow coloring layer 1034Y) are provided.

Light emitted through the microcavity and the yellow coloring layer 1034Y has an emission spectrum in a yellow region. Since yellow is a color with a high luminosity factor, a light-emitting element emitting yellow light has high emission efficiency. Therefore, the display device of FIG. 15A can have reduced power consumption.

FIG. 15A illustrates the structure provided with the light-emitting elements and the coloring layers for the light-emitting elements as an example; however, the structure is not limited thereto. For example, as shown in FIG. 15B, a structure including the red coloring layer 1034R, the green coloring layer 1034G, and the blue coloring layer 1034B but not including a yellow coloring layer may be employed to achieve full color display with the four colors of red, green, blue, and yellow or of red, green, blue, and white. The structure as illustrated in FIG. 15A where the light-emitting elements are provided with the coloring layers is effective in suppressing reflection of external light. In contrast, the structure as illustrated in FIG. 15B where the light-emitting elements are provided with the red coloring layer, the green coloring layer, and the blue coloring layer and without the yellow coloring layer is effective in reducing power consumption because of small energy loss of light emitted from the yellow or white light-emitting element.

Structure Example 5 of Display Device

Next, a display device of another embodiment of the present invention is described with reference to FIG. 16.

Figure 16:
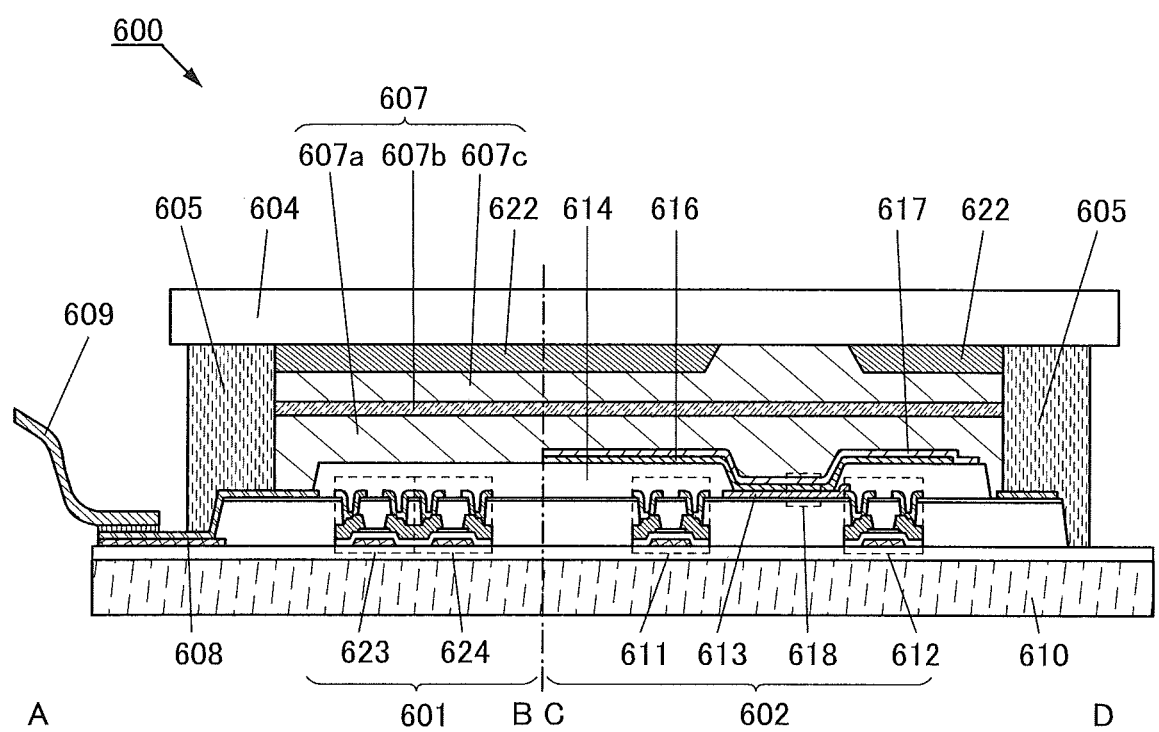
FIG. 16 is a schematic cross-sectional view illustrating a display device of one embodiment of the present invention.

FIG. 16 is a cross-sectional view taken along the dashed-dotted line A-B and the dashed-dotted line C-D in FIG. 9A. Note that in FIG. 16, portions having functions similar to those of portions in FIG. 9B are given the same reference numerals as in FIG. 9B, and a detailed description of the portions is omitted.

The display device 600 in FIG. 16 includes a sealing layer 607a, a sealing layer 607b, and a sealing layer 607c in a region 607 surrounded by the element substrate 610, the sealing substrate 604, and the sealant 605. For one or more of the sealing layer 607a, the sealing layer 607b, and the sealing layer 607c, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layers 607a, 607b, and 607c can prevent deterioration of the light-emitting element 618 due to impurities such as water, which is preferable. In the case where the sealing layers 607a, 607b, and 607c are formed, the sealant 605 is not necessarily provided.

Alternatively, any one or two of the sealing layers 607a, 607b, and 607c may be provided or four or more sealing layers may be formed. When the sealing layer has a multilayer structure, water and other impurities from the outside of the display device 600 can be effectively prevented from entering the light-emitting element 618 which is inside the display device. In the case where the sealing layer has a multilayer structure, a resin and an inorganic material are preferably stacked.

Structure Example 6 of Display Device

Although the display devices in the structure examples 1 to 4 in this embodiment each have a structure including optical elements, one embodiment of the present invention does not necessarily include an optical element.

Figure 17A:
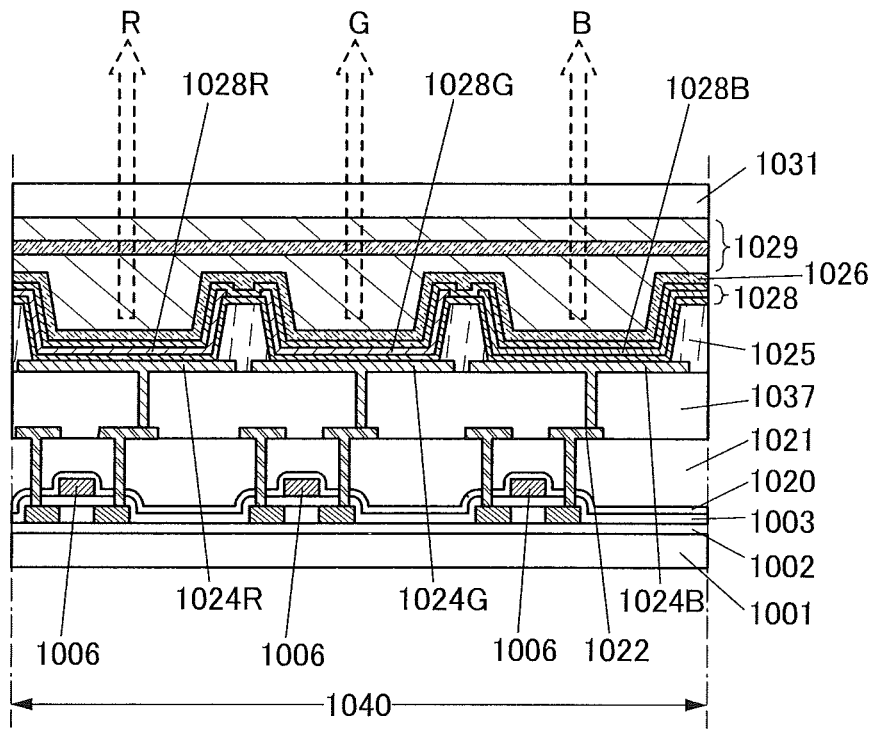
FIGS. 17A and 17B are schematic cross-sectional views each illustrating a display device of one embodiment of the present invention.
Figure 17B:
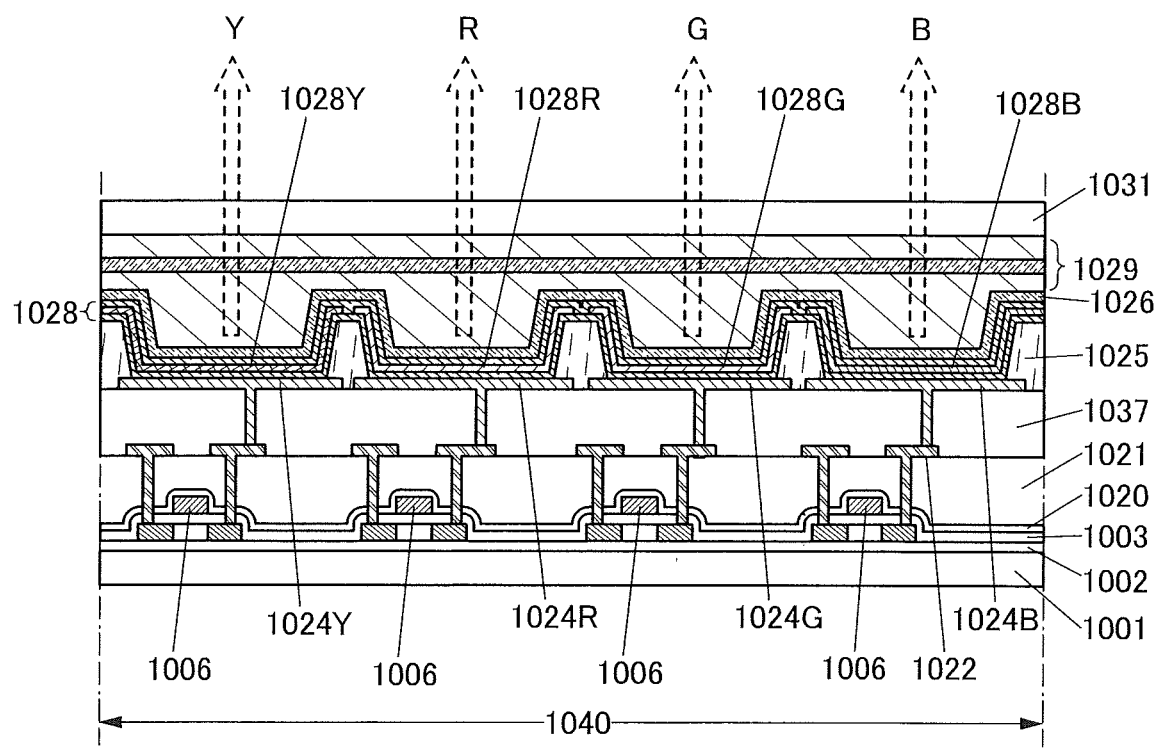

FIGS. 17A and 17B each illustrate a display device having a structure in which light is extracted from the sealing substrate 1031 side (a top-emission display device). FIG. 17A illustrates an example of a display device including a light-emitting layer 1028R, a light-emitting layer 1028G, and a light-emitting layer 1028B. FIG. 17B illustrates an example of a display device including a light-emitting layer 1028R, a light-emitting layer 1028G, a light-emitting layer 1028B, and a light-emitting layer 1028Y.

The light-emitting layer 1028R has a function of exhibiting red light, the light-emitting layer 1028G has a function of exhibiting green light, and the light-emitting layer 1028B has a function of exhibiting blue light. The light-emitting layer 1028Y has a function of exhibiting yellow light or a function of exhibiting light of a plurality of colors selected from blue, green, and red. The light-emitting layer 1028Y may exhibit white light. Since the light-emitting element which exhibits yellow or white light has high light emission efficiency, the display device including the light-emitting layer 1028Y can have lower power consumption.

Each of the display devices in FIGS. 17A and 17B does not necessarily include coloring layers serving as optical elements because EL layers exhibiting light of different colors are included in sub-pixels.

For the sealing layer 1029, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layer 1029 can prevent deterioration of the light-emitting element due to impurities such as water, which is preferable.

Alternatively, the sealing layer 1029 may have a single-layer or two-layer structure, or four or more sealing layers may be formed as the sealing layer 1029. When the sealing layer has a multilayer structure, the impurities such as water can be effectively prevented from entering the inside of the display device from the outside of the display device. In the case where the sealing layer has a multilayer structure, a resin and an inorganic material are preferably stacked.

Note that the sealing substrate 1031 has a function of protecting the light-emitting element. Thus, for the sealing substrate 1031, a flexible substrate or film can be used.

The structures described in this embodiment can be combined as appropriate with any of the other structures in this embodiment and the other embodiments.

Embodiment 5

In this embodiment, a display device including a light-emitting element of one embodiment of the present invention will be described with reference to FIGS. 18A and 18B, FIGS. 19A and 19B, and FIGS. 20A and 20B.

Figure 18A:
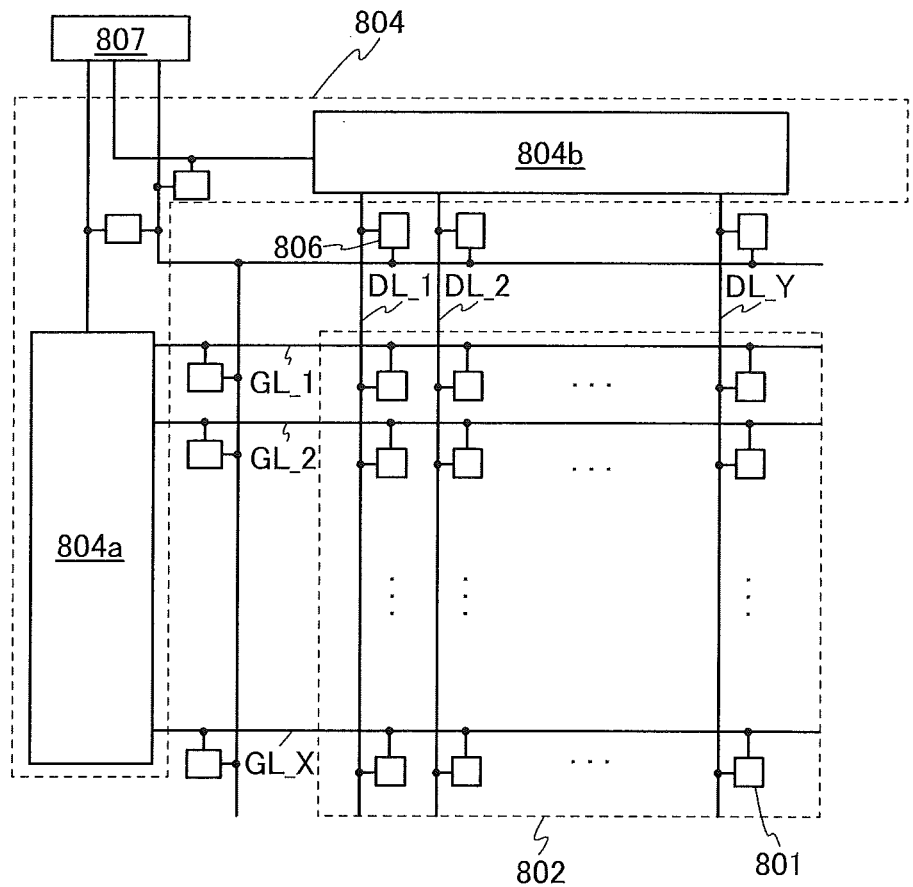
FIGS. 18A and 18B are a block diagram and a circuit diagram illustrating a display device of one embodiment of the present invention.
Figure 18B:
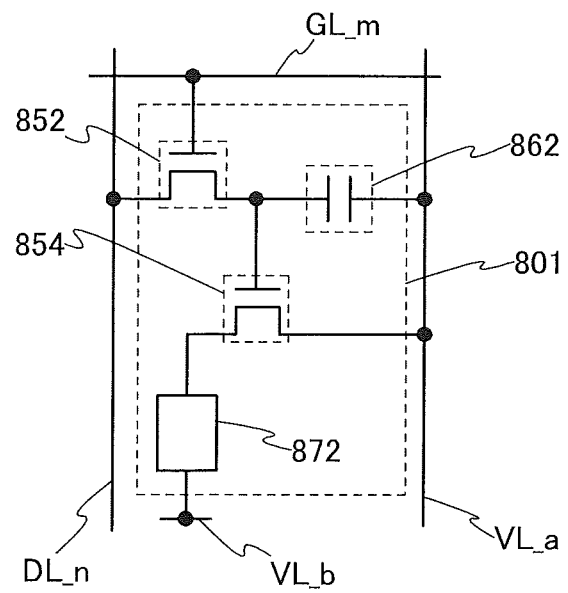

FIG. 18A is a block diagram illustrating the display device of one embodiment of the present invention, and FIG. 18B is a circuit diagram illustrating a pixel circuit of the display device of one embodiment of the present invention.

<Description of Display Device>

The display device illustrated in FIG. 18A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for outputting a signal (scan signal) to select a pixel (the circuit is hereinafter referred to as a scan line driver circuit 804a) and a circuit for supplying a signal (data signal) to drive a display element in a pixel (the circuit is hereinafter referred to as a signal line driver circuit 804b).

The scan line driver circuit 804a includes a shift register or the like. Through the terminal portion 807, the scan line driver circuit 804a receives a signal for driving the shift register and outputs a signal. For example, the scan line driver circuit 804a receives a start pulse signal, a clock signal, or the like and outputs a pulse signal. The scan line driver circuit 804a has a function of controlling the potentials of wirings supplied with scan signals (such wirings are hereinafter referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Without being limited thereto, the scan line driver circuit 804a can supply a different signal.

The signal line driver circuit 804b includes a shift register or the like. The signal line driver circuit 804b receives a signal (video signal) from which a data signal is derived, as well as a signal for driving the shift register, through the terminal portion 807. The signal line driver circuit 804b has a function of generating a data signal to be written to the pixel circuit 801 which is based on the video signal. In addition, the signal line driver circuit 804b has a function of controlling output of a data signal in response to a pulse signal produced by input of a start pulse signal, a clock signal, or the like. Furthermore, the signal line driver circuit 804b has a function of controlling the potentials of wirings supplied with data signals (such wirings are hereinafter referred to as data lines DL_1 to DL_Y). Alternatively, the signal line driver circuit 804b has a function of supplying an initialization signal. Without being limited thereto, the signal line driver circuit 804b can supply a different signal.

The signal line driver circuit 804b includes a plurality of analog switches or the like, for example. The signal line driver circuit 804b can output, as the data signals, signals obtained by time-dividing the video signal by sequentially turning on the plurality of analog switches. The signal line driver circuit 804b may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804a. For example, to the pixel circuit 801 in the m-th row and the n-th column (m is a natural number of less than or equal to X and n is a natural number of less than or equal to Y), a pulse signal is input from the scan line driver circuit 804a through the scan line GL_m, and a data signal is input from the signal line driver circuit 804b through the data line DL_n in accordance with the potential of the scan line GL_m.

The protection circuit 806 shown in FIG. 18A is connected to, for example, the scan line GL between the scan line driver circuit 804a and the pixel circuit 801. Alternatively, the protection circuit 806 is connected to the data line DL between the signal line driver circuit 804b and the pixel circuit 801. Alternatively, the protection circuit 806 can be connected to a wiring between the scan line driver circuit 804a and the terminal portion 807. Alternatively, the protection circuit 806 can be connected to a wiring between the signal line driver circuit 804b and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 18A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804a or a configuration in which the protection circuits 806 are connected to the signal line driver circuit 804b may be employed. Alternatively, the protection circuits 806 may be configured to be connected to the terminal portion 807.

In FIG. 18A, an example in which the driver circuit portion 804 includes the scan line driver circuit 804a and the signal line driver circuit 804b is shown; however, the structure is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

<Structure Example of Pixel Circuit>

Each of the plurality of pixel circuits 801 in FIG. 18A can have a structure illustrated in FIG. 18B, for example.

The pixel circuit 801 illustrated in FIG. 18B includes transistors 852 and 854, a capacitor 862, and a light-emitting element 872.

One of a source electrode and a drain electrode of the transistor 852 is electrically connected to a wiring to which a data signal is supplied (a data line DL_n). A gate electrode of the transistor 852 is electrically connected to a wiring to which a gate signal is supplied (a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 to 3 can be used.

Note that a high power supply potential VDD is supplied to one of the potential supply line VL_a and the potential supply line VL_b, and a low power supply potential VSS is supplied to the other.

In the display device including the pixel circuits 801 in FIG. 18B, the pixel circuits 801 are sequentially selected row by row by the scan line driver circuit 804a in FIG. 18A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 19A and 19B and FIGS. 20A and 20B illustrate examples of the pixel circuit.

Figure 19A:
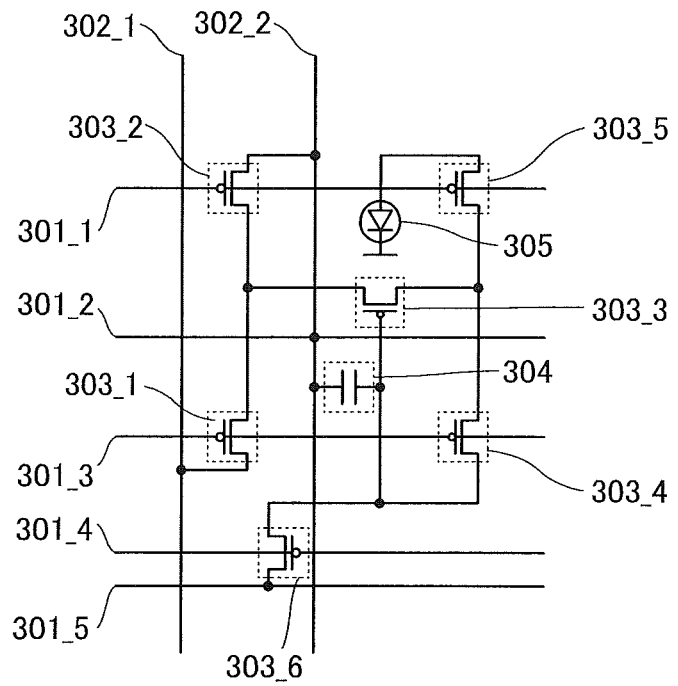
FIGS. 19A and 19B are circuit diagrams each illustrating a pixel circuit of a display device of one embodiment of the present invention.

The pixel circuit illustrated in FIG. 19A includes six transistors (transistors 303_1 to 303_6), a capacitor 304, and a light-emitting element 305. The pixel circuit illustrated in FIG. 19A is electrically connected to wirings 301_1 to 301_5 and wirings 302_1 and 302_2. Note that as the transistors 303_1 to 303_6, for example, p-channel transistors can be used.

Figure 19B:
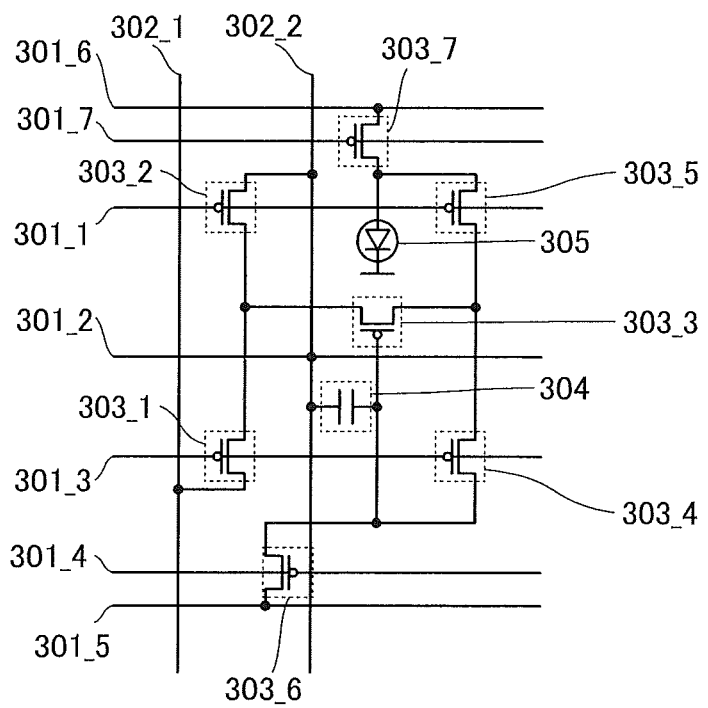

The pixel circuit shown in FIG. 19B has a configuration in which a transistor 303_7 is added to the pixel circuit shown in FIG. 19A. The pixel circuit illustrated in FIG. 19B is electrically connected to wirings 301_6 and 301_7. The wirings 301_5 and 301_6 may be electrically connected to each other. Note that as the transistor 303_7, for example, a p-channel transistor can be used.

Figure 20A:
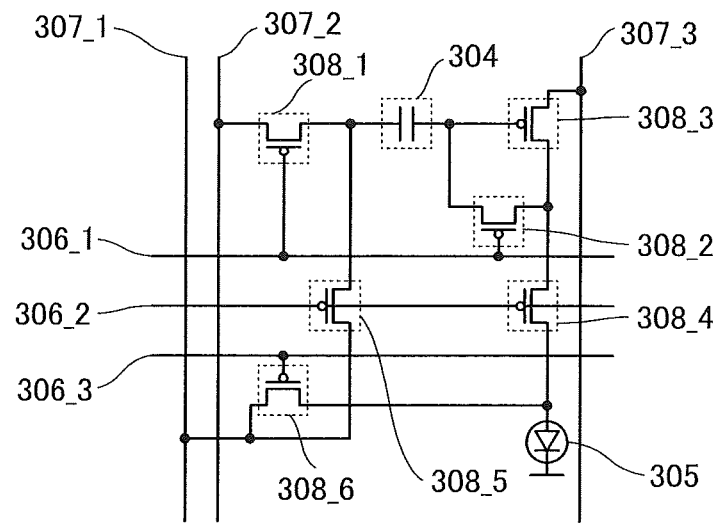
FIGS. 20A and 20B are circuit diagrams each illustrating a pixel circuit of a display device of one embodiment of the present invention.

The pixel circuit shown in FIG. 20A includes six transistors (transistors 308_1 to 308_6), the capacitor 304, and the light-emitting element 305. The pixel circuit illustrated in FIG. 20A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 20B:
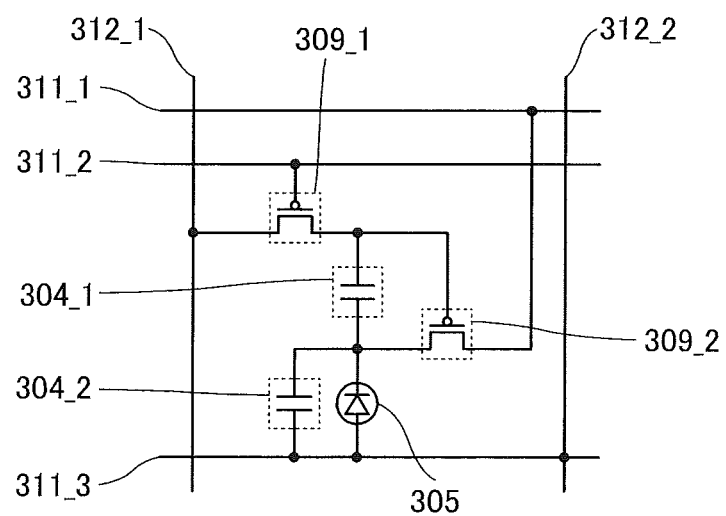

The pixel circuit illustrated in FIG. 20B includes two transistors (transistors 309_1 and 309_2), two capacitors (capacitors 304_1 and 304_2), and the light-emitting element 305. The pixel circuit illustrated in FIG. 20B is electrically connected to wirings 311_1 to 311_3 and wirings 312_1 and 312_2. With the configuration of the pixel circuit illustrated in FIG. 20B, the pixel circuit can be driven by a voltage inputting current driving method (also referred to as CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced and higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be used in combination with any of the structures described in the other embodiments as appropriate.

Embodiment 6

In this embodiment, a display device including a light-emitting element of one embodiment of the present invention and an electronic device in which the display device is provided with an input device will be described with reference to FIGS. 21A and 21B, FIGS. 22A to 22C, FIGS. 23A and 23B, FIGS. 24A and 24B, and FIG. 25.

<Description 1 of Touch Panel>

In this embodiment, a touch panel 2000 including a display device and an input device will be described as an example of an electronic device. In addition, an example in which a touch sensor is included as an input device will be described.

Figure 21A:
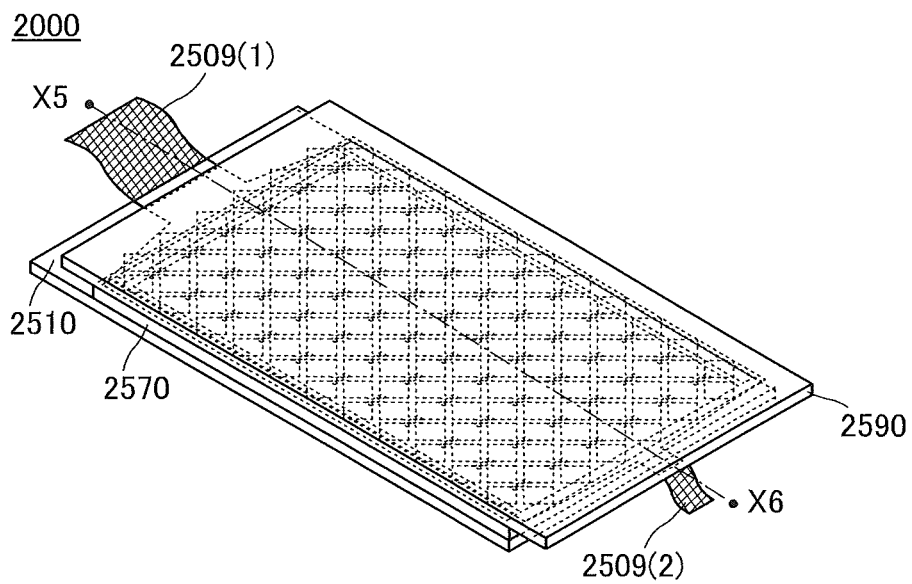
FIGS. 21A and 21B are perspective views illustrating an example of a touch panel of one embodiment of the present invention.
Figure 21B:
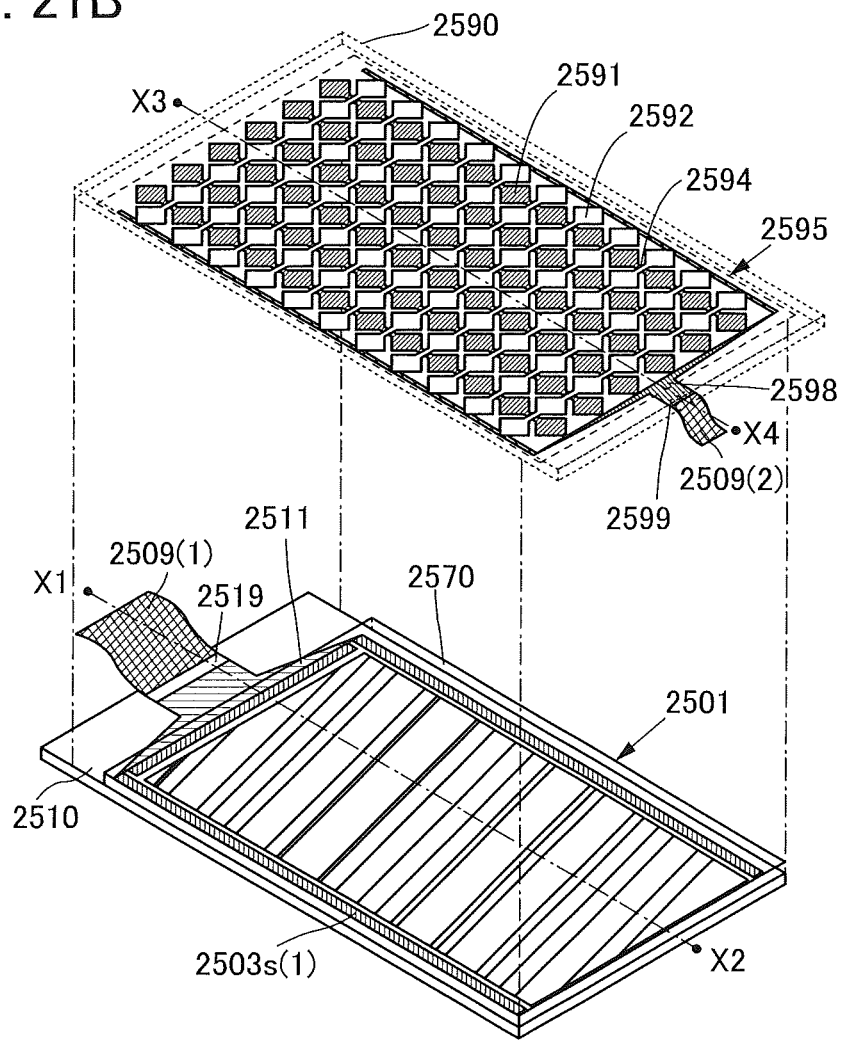

FIGS. 21A and 21B are perspective views of the touch panel 2000. Note that FIGS. 21A and 21B illustrate only main components of the touch panel 2000 for simplicity.

The touch panel 2000 includes a display device 2501 and a touch sensor 2595 (see FIG. 21B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1). The plurality of wirings 2511 can supply signals from a signal line driver circuit 2503s(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 21B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive touch sensor is preferable because multiple points can be sensed simultaneously.

Note that the touch sensor 2595 illustrated in FIG. 21B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 21A and 21B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

<Description of Display Device>

Figure 22A:
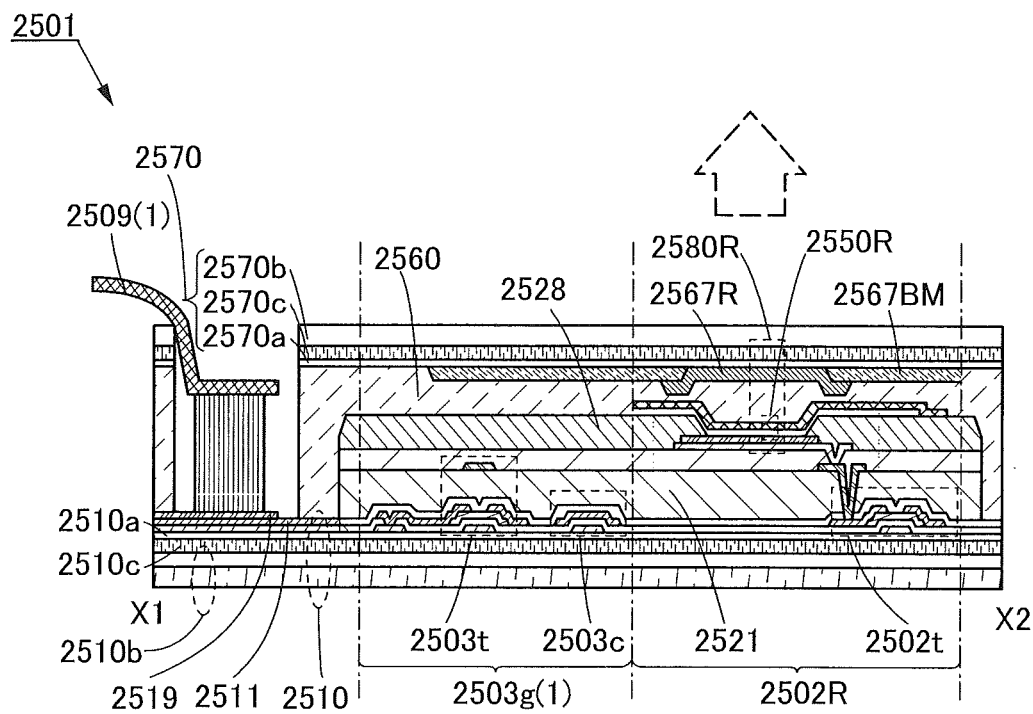
FIGS. 22A to 22C are cross-sectional views illustrating examples of a display device and a touch sensor of embodiments of the present invention.

Next, the display device 2501 will be described in detail with reference to FIG. 22A. FIG. 22A corresponds to a cross-sectional view taken along dashed-dotted line X1-X2 in FIG. 21B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ g·m$^{-2}$·day$^{-1}$, preferably lower than or equal to $1\times10^{-6}$ g·m$^{-2}$·day$^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 22A, the sealing layer 2560 can also serve as an optical adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen and argon) may be used instead of the sealing layer 2560. A drying agent may be provided in the inert gas so as to adsorb moisture or the like. A resin such as an acrylic resin or an epoxy resin may be used. An epoxy-based resin or a glass frit is preferably used as the sealant. As a material used for the sealant, a material which is impermeable to moisture and oxygen is preferably used.

The display device 2501 includes a pixel 2502R. The pixel 2502R includes a light-emitting module 2580R.

The pixel 2502R includes the light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 to 3 can be used.

A microcavity structure may be employed between the lower electrode and the upper electrode so as to increase the intensity of light of a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in the drawing.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. Note that the insulating layer 2521 has a function of covering unevenness caused by the pixel circuit. The insulating layer 2521 may have a function of suppressing impurity diffusion. This can prevent the reliability of the transistor 2502t or the like from being lowered by impurity diffusion.

The light-emitting element 2550R is formed over the insulating layer 2521. A partition 2528 is provided so as to overlap with an end portion of the lower electrode of the light-emitting element 2550R. Note that a spacer for controlling the distance between the substrate 2510 and the substrate 2570 may be formed over the partition 2528.

A scan line driver circuit 2503g(1) includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a PWB.

Figure 22B:
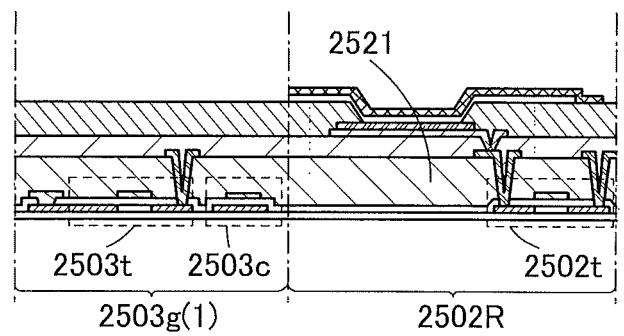

In the display device 2501, transistors with any of a variety of structures can be used. FIG. 22A illustrates an example of using bottom-gate transistors; however, the present invention is not limited to this example, and top-gate transistors may be used in the display device 2501 as illustrated in FIG. 22B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide, an In-M-Zn oxide (M represents Al, Ga, Y, Zr, La, Ce, Sn, Hf, or Nd), and the like.

<Description of Touch Sensor>

Figure 22C:
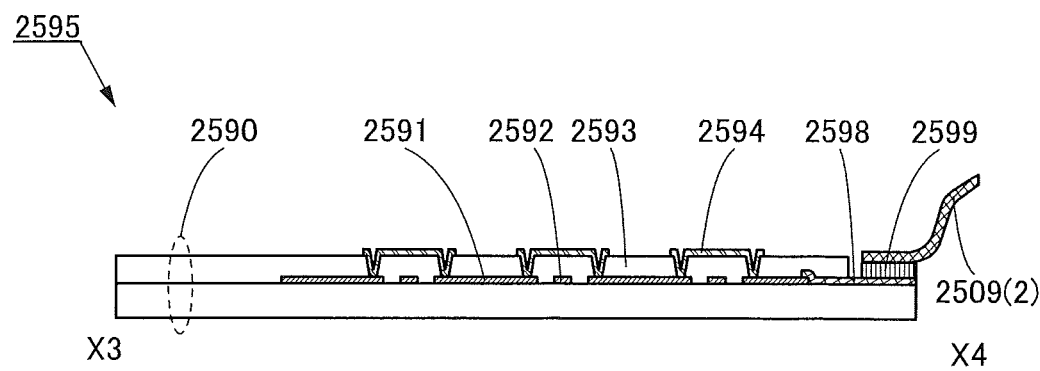

Next, the touch sensor 2595 will be described in detail with reference to FIG. 22C. FIG. 22C corresponds to a cross-sectional view taken along dashed-dotted line X3-X4 in FIG. 21B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 23A:
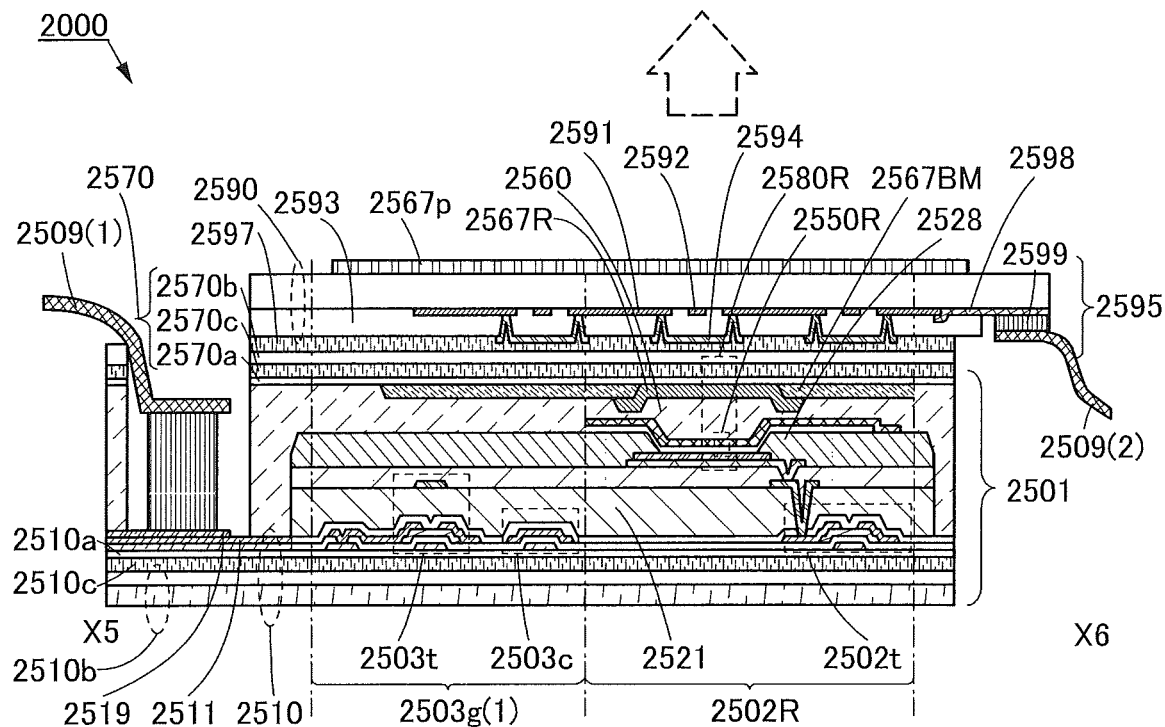
FIGS. 23A and 23B are cross-sectional views each illustrating an example of a touch panel of one embodiment of the present invention.

Next, the touch panel 2000 will be described in detail with reference to FIG. 23A. FIG. 23A corresponds to a cross-sectional view taken along dashed-dotted line X5-X6 in FIG. 21A.

In the touch panel 2000 illustrated in FIG. 23A, the display device 2501 described with reference to FIG. 22A and the touch sensor 2595 described with reference to FIG. 22C are attached to each other.

The touch panel 2000 illustrated in FIG. 23A includes an adhesive layer 2597 and an anti-reflective layer 2567p in addition to the components described with reference to FIGS. 22A and 22C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567p is positioned in a region overlapping with pixels. As the anti-reflective layer 2567p, a circularly polarizing plate can be used, for example.

Next, a touch panel having a structure different from that illustrated in FIG. 23A will be described with reference to FIG. 23B.

Figure 23B:
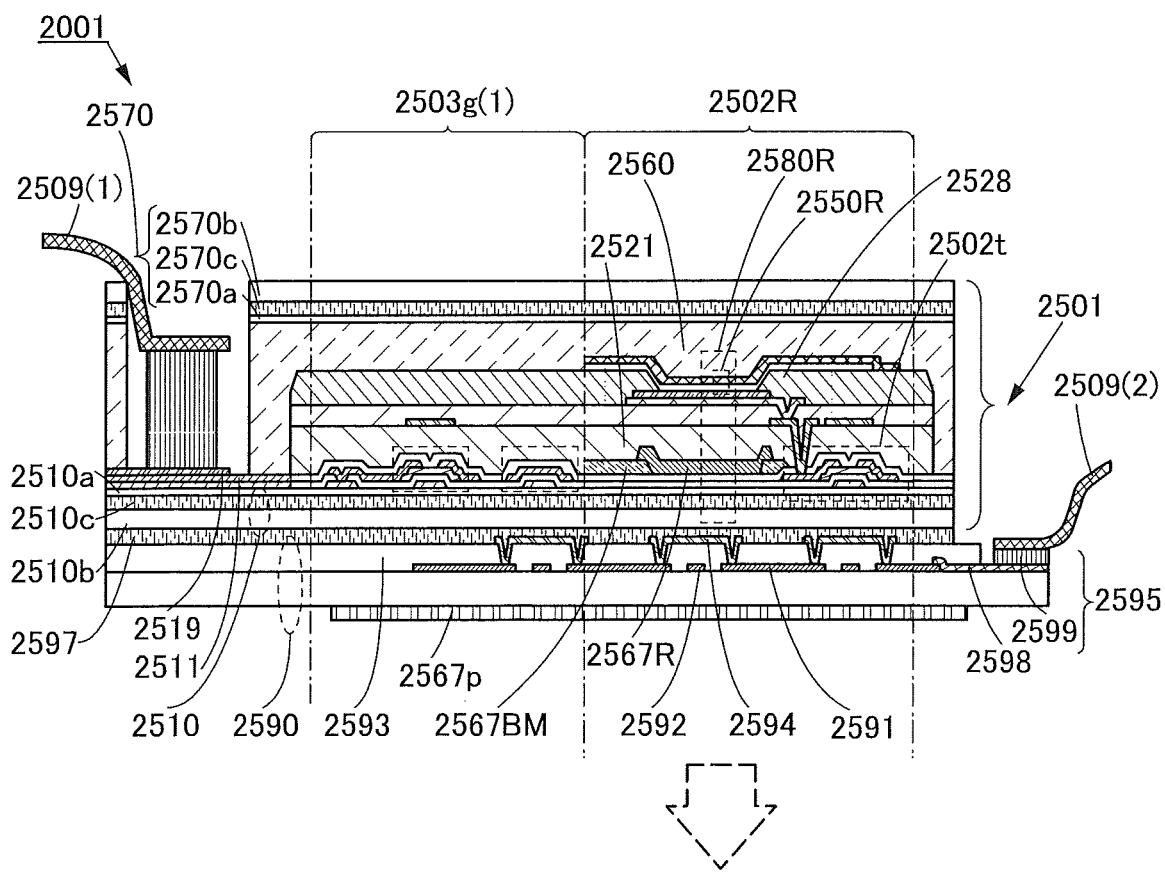

FIG. 23B is a cross-sectional view of a touch panel 2001. The touch panel 2001 illustrated in FIG. 23B differs from the touch panel 2000 illustrated in FIG. 23A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 23B emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 23B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 23A or 23B, light may be emitted from the light-emitting element through one or both of the substrate 2510 and the substrate 2570.

<Description of Method for Driving Touch Panel>

Next, an example of a method for driving a touch panel will be described with reference to FIGS. 24A and 24B.

Figure 24A:
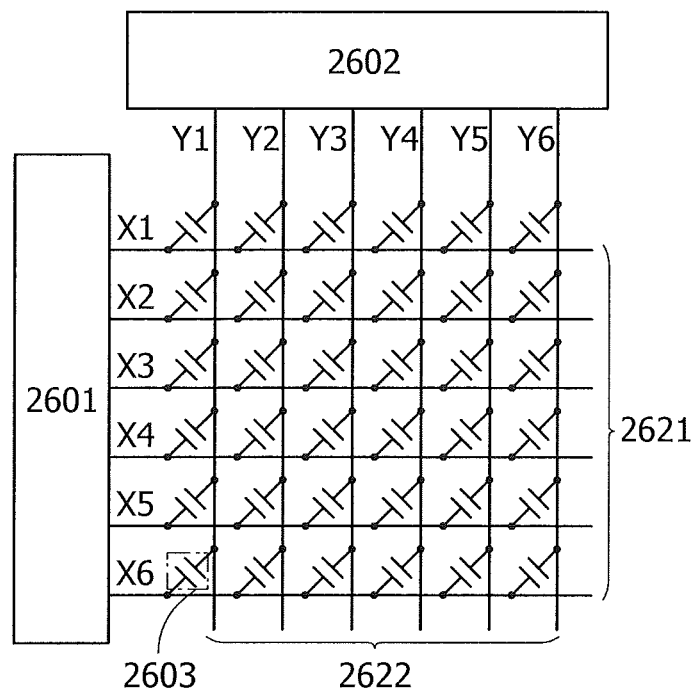
FIGS. 24A and 24B are a block diagram and a timing chart of a touch sensor of one embodiment of the present invention.

FIG. 24A is a block diagram illustrating the structure of a mutual capacitive touch sensor. FIG. 24A illustrates a pulse voltage output circuit 2601 and a current sensing circuit 2602. Note that in FIG. 24A, six wirings X1 to X6 represent the electrodes 2621 to which a pulse voltage is applied, and six wirings Y1 to Y6 represent the electrodes 2622 that detect changes in current. FIG. 24A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in mutual capacitance of the capacitor 2603. The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 24B:
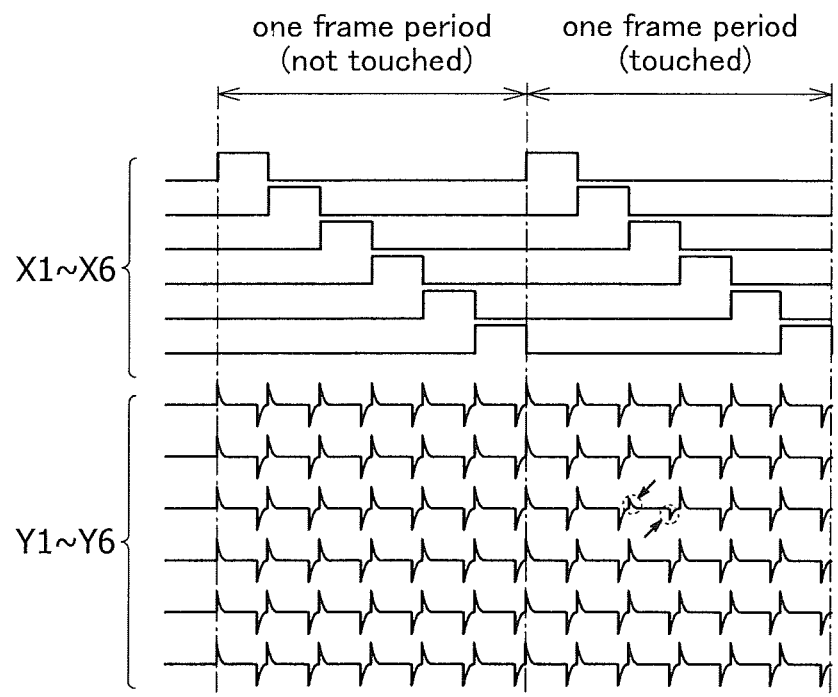

FIG. 24B is a timing chart showing input and output waveforms in the mutual capacitive touch sensor illustrated in FIG. 24A. In FIG. 24B, sensing of a sensing target is performed in all the rows and columns in one frame period. FIG. 24B shows a period when a sensing target is not sensed (not touched) and a period when a sensing target is sensed (touched). In FIG. 24B, sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Description of Sensor Circuit>

Figure 25:
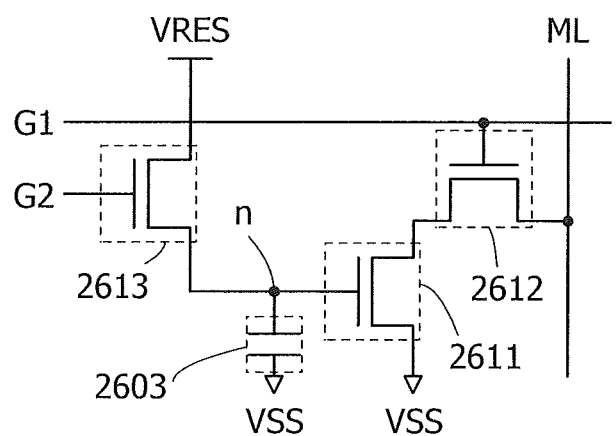
FIG. 25 is a circuit diagram of a touch sensor of one embodiment of the present invention.

Although FIG. 24A illustrates a passive matrix type touch sensor in which only the capacitor 2603 is provided at the intersection of wirings as a touch sensor, an active matrix type touch sensor including a transistor and a capacitor may be used. FIG. 25 illustrates an example of a sensor circuit included in an active matrix type touch sensor.

The sensor circuit in FIG. 25 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VS S is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 25 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be used in combination with any of the structures described in the other embodiments as appropriate.

Embodiment 7

In this embodiment, a display module and electronic devices including a light-emitting element of one embodiment of the present invention will be described with reference to FIG. 26, FIGS. 27A to 27G, FIGS. 28A to 28D, and FIGS. 29A and 29B.

<Description of Display Module>

Figure 26:
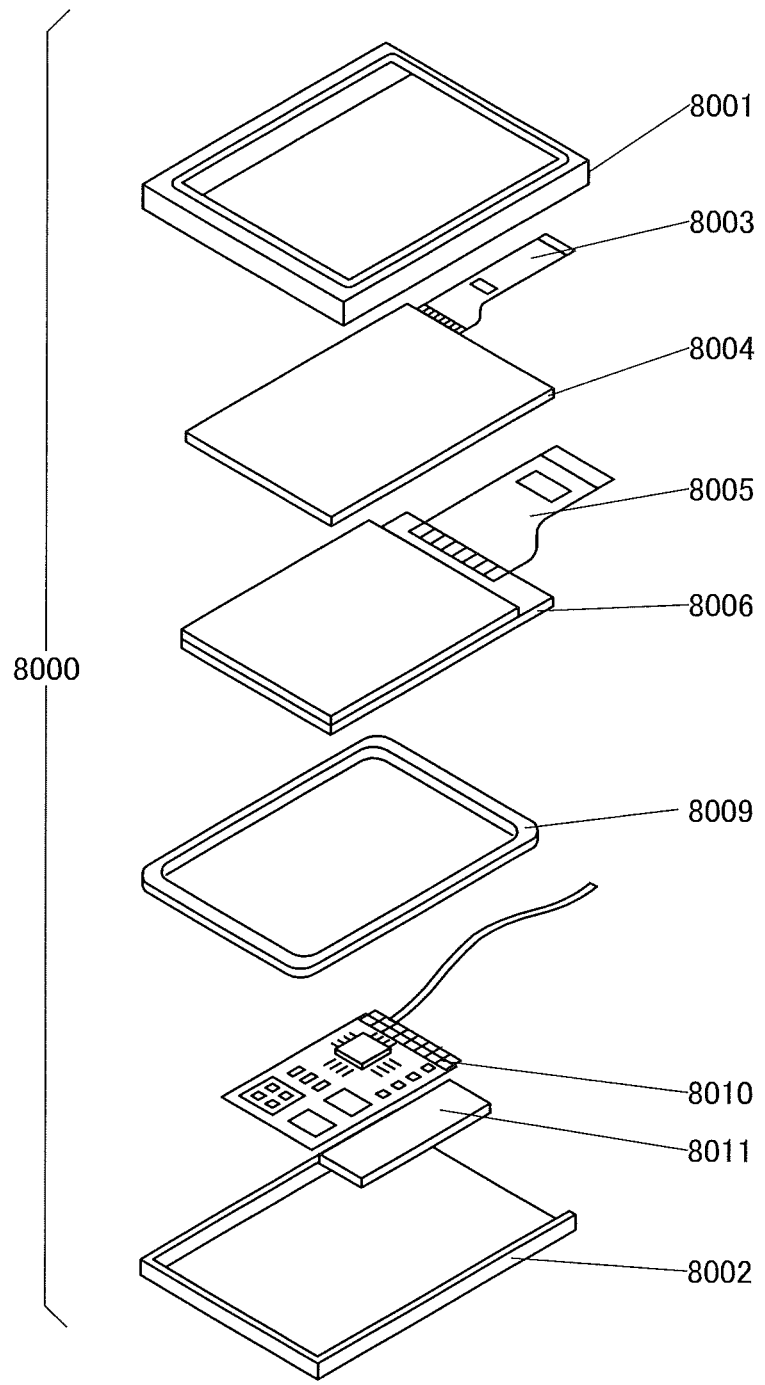
FIG. 26 is a perspective view illustrating a display module of one embodiment of the present invention.

In a display module 8000 in FIG. 26, a touch sensor 8004 connected to an FPC 8003, a display device 8006 connected to an FPC 8005, a frame 8009, a printed wiring board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed wiring board 8010. The frame 8009 may serve as a radiator plate.

The printed wiring board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<Description of Electronic Device>

FIGS. 27A to 27G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like. In addition, the sensor 9007 may have a function of measuring biological information like a pulse sensor and a finger print sensor.

The electronic devices illustrated in FIGS. 27A to 27G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 27A to 27G are not limited to those described above, and the electronic devices can have a variety of functions. Although not illustrated in FIGS. 27A to 27G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 27A to 27G will be described in detail below.

Figure 27A:
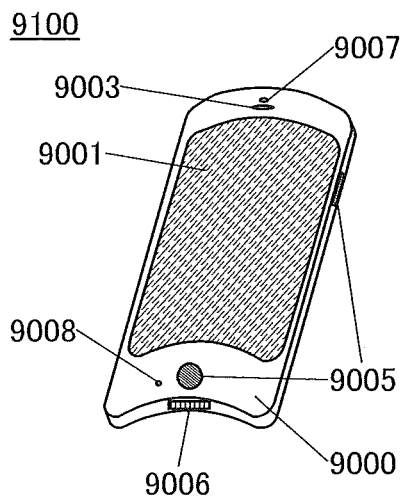
FIGS. 27A to 27G illustrate electronic devices of embodiments of the present invention.

FIG. 27A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 27B:
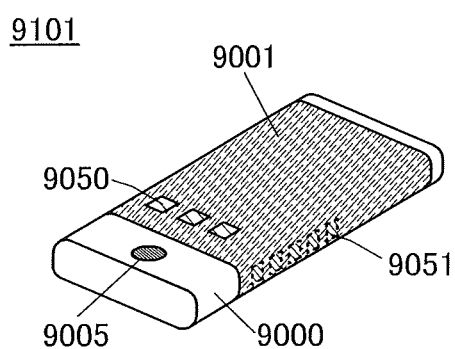

FIG. 27B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 27B, can be positioned in the portable information terminal 9101 as in the portable information terminal 9100 shown in FIG. 27A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and an SNS message; the date; the time; remaining battery; and the reception strength of an antenna. Instead of the information 9051, the operation buttons 9050 or the like may be displayed on the position where the information 9051 is displayed.

Figure 27C:
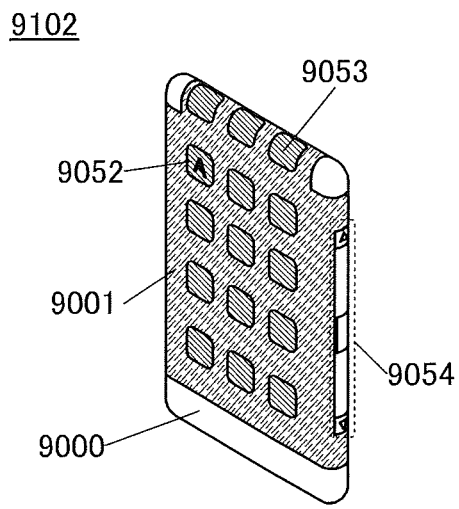

FIG. 27C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 27D:
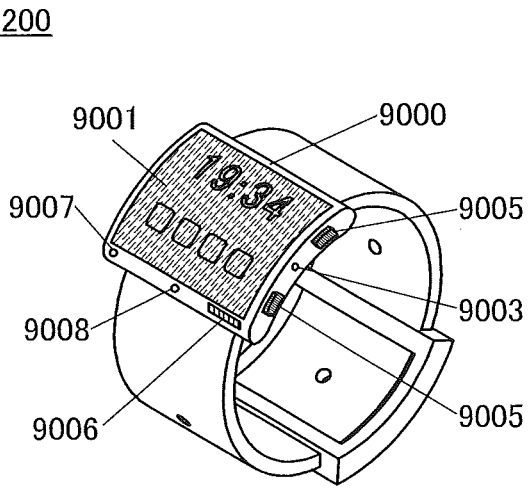

FIG. 27D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 27E:
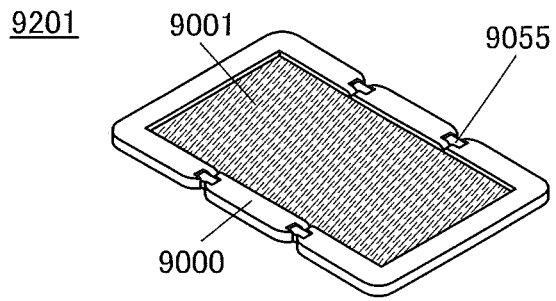
Figure 27F:
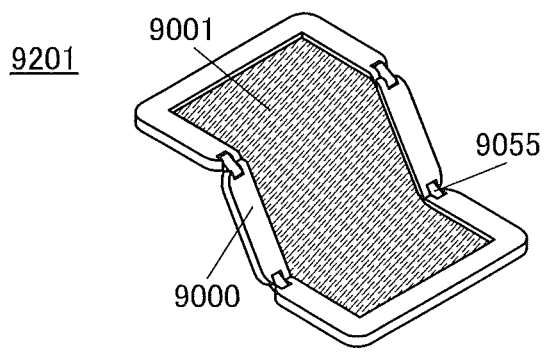
Figure 27G:
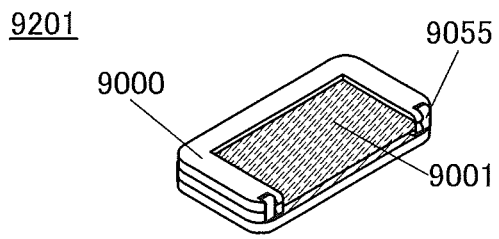

FIGS. 27E, 27F, and 27G are perspective views of a foldable portable information terminal 9201. FIG. 27E is a perspective view illustrating the portable information terminal 9201 that is opened. FIG. 27F is a perspective view illustrating the portable information terminal 9201 that is being opened or being folded. FIG. 27G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Figure 28A:
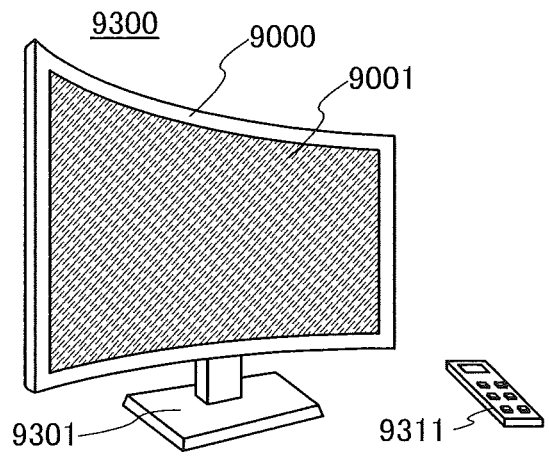
FIGS. 28A to 28D illustrate electronic devices of embodiments of the present invention.

FIG. 28A illustrates an example of a television set. In the television set 9300, the display portion 9001 is incorporated into the housing 9000. Here, the housing 9000 is supported by a stand 9301.

The television set 9300 illustrated in FIG. 28A can be operated with an operation switch of the housing 9000 or a separate remote controller 9311. The display portion 9001 may include a touch sensor. The television set 9300 can be operated by touching the display portion 9001 with a finger or the like. The remote controller 9311 may be provided with a display portion for displaying data output from the remote controller 9311. With operation keys or a touch panel of the remote controller 9311, channels or volume can be controlled and images displayed on the display portion 9001 can be controlled.

The television set 9300 is provided with a receiver, a modem, or the like. A general television broadcast can be received with the receiver. When the television set is connected to a communication network with or without wires via the modem, one-way (from a transmitter to a receiver) or two-way (between a transmitter and a receiver or between receivers) data communication can be performed.

The electronic device or the lighting device of one embodiment of the present invention has flexibility and therefore can be incorporated along a curved inside/outside wall surface of a house or a building or a curved interior/exterior surface of an automobile.

Figure 28B:
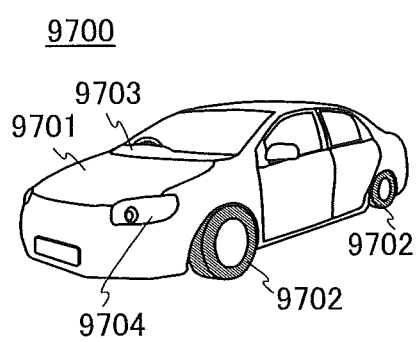
Figure 28C:
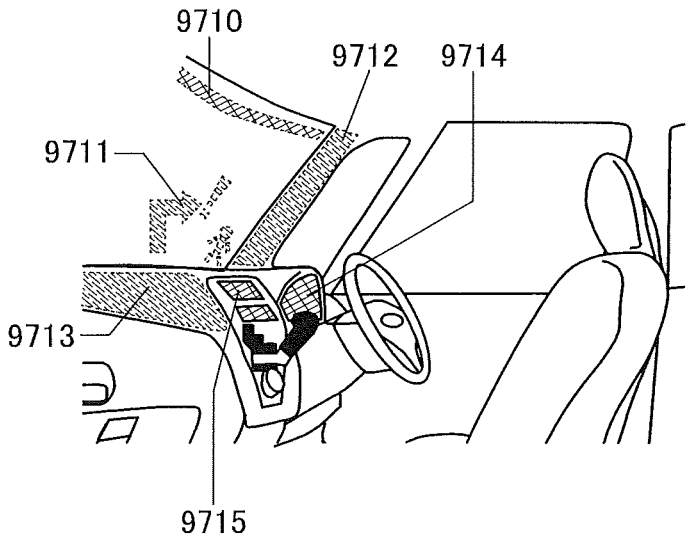

FIG. 28B is an external view of an automobile 9700. FIG. 28C illustrates a driver's seat of the automobile 9700. The automobile 9700 includes a car body 9701, wheels 9702, a dashboard 9703, lights 9704, and the like. The display device, the light-emitting device, or the like of one embodiment of the present invention can be used in a display portion or the like of the automobile 9700. For example, the display device, the light-emitting device, or the like of one embodiment of the present invention can be used in display portions 9710 to 9715 illustrated in FIG. 28C.

The display portion 9710 and the display portion 9711 are each a display device provided in an automobile windshield. The display device, the light-emitting device, or the like of one embodiment of the present invention can be a see-through display device, through which the opposite side can be seen, using a light-transmitting conductive material for its electrodes and wirings. Such a see-through display portion 9710 or 9711 does not hinder driver's vision during driving the automobile 9700. Thus, the display device, the light-emitting device, or the like of one embodiment of the present invention can be provided in the windshield of the automobile 9700. Note that in the case where a transistor or the like for driving the display device, the light-emitting device, or the like is provided, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see makes it possible for the driver to confirm safety easily and comfortably.

Figure 28D:
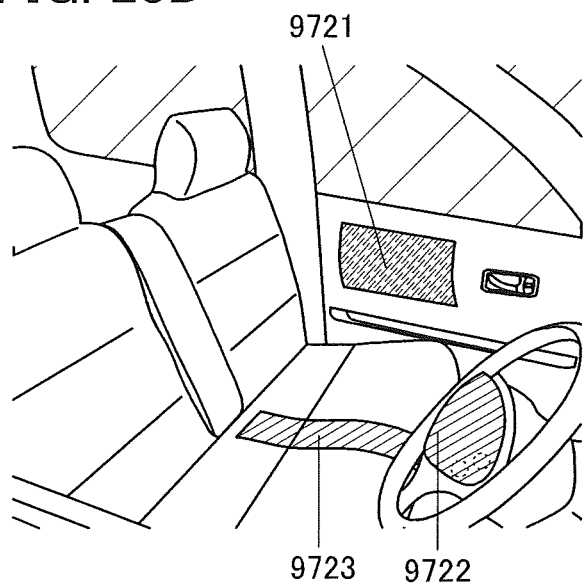

FIG. 28D illustrates the inside of an automobile in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

Figure 29A:
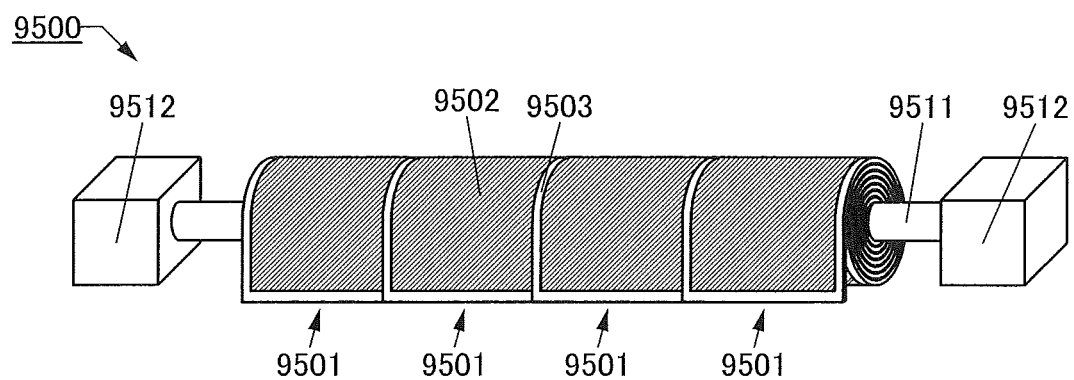
FIGS. 29A and 29B are perspective views illustrating a display device of one embodiment of the present invention.
Figure 29B:
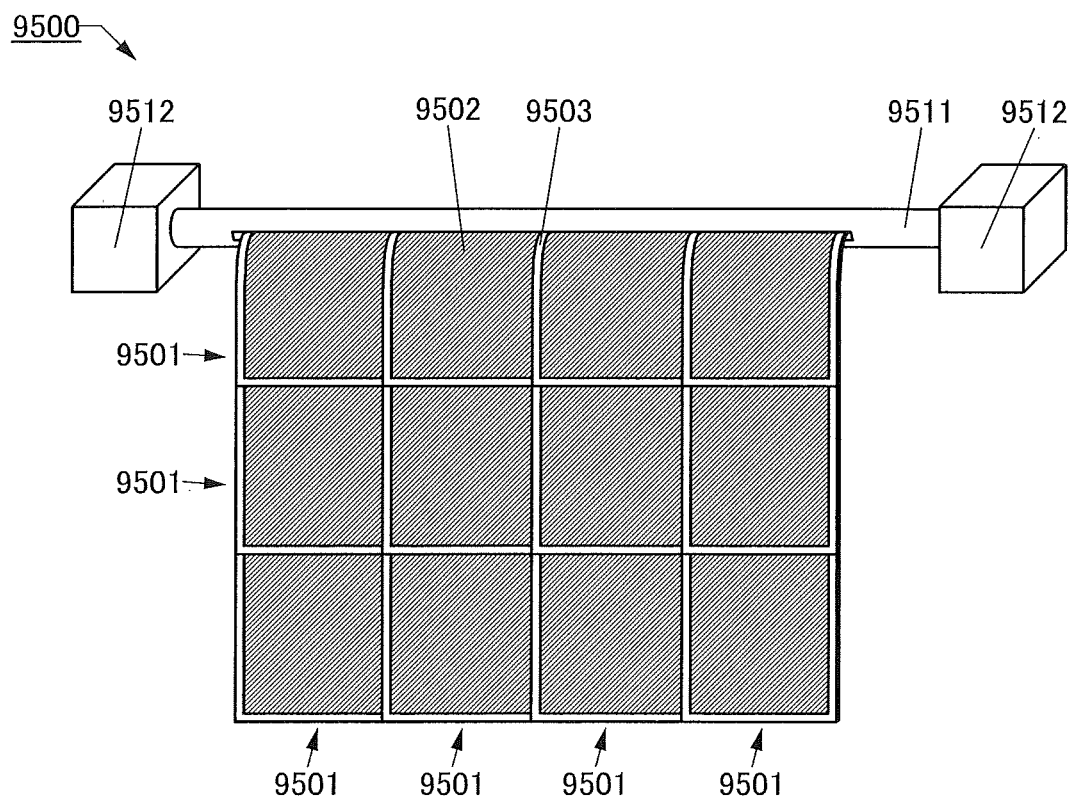

A display device 9500 illustrated in FIGS. 29A and 29B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped with each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 29A and 29B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in combination with any of the structures described in the other embodiments as appropriate.

Embodiment 8

In this embodiment, a light-emitting device including the light-emitting element of one embodiment of the present invention will be described with reference to FIGS. 30A to 30C and FIGS. 31A to 31D. \

Figure 30A:
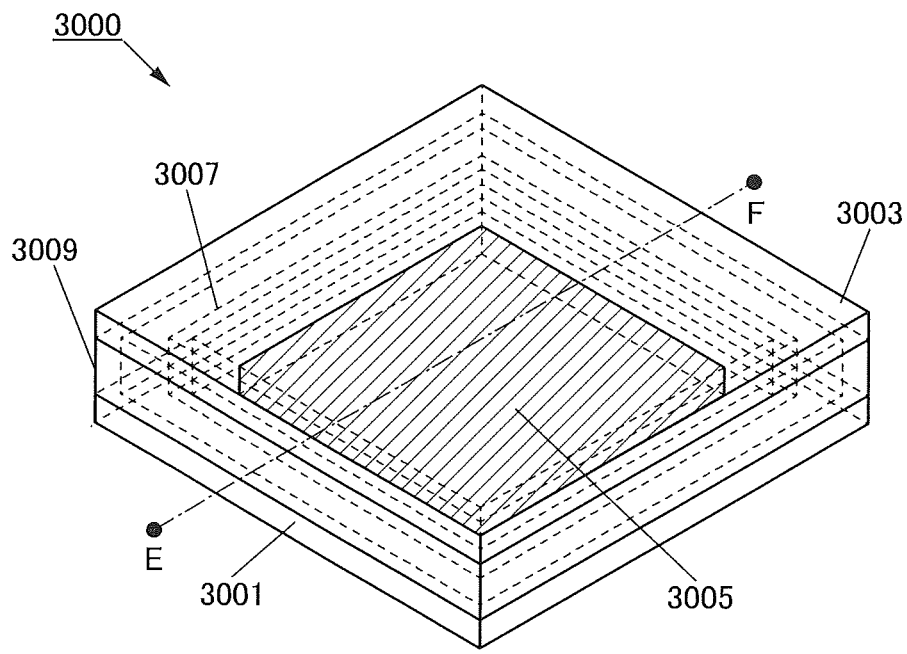
FIGS. 30A to 30C are a perspective view and cross-sectional views illustrating a light-emitting device of one embodiment of the present invention.
Figure 30B:
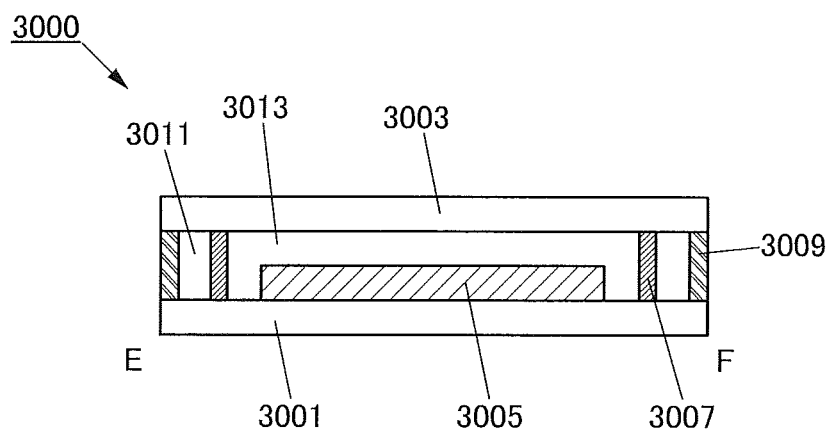

FIG. 30A is a perspective view of a light-emitting device 3000 shown in this embodiment, and FIG. 30B is a cross-sectional view along dashed-dotted line E-F in FIG. 30A. Note that in FIG. 30A, some components are illustrated by broken lines in order to avoid complexity of the drawing.

The light-emitting device 3000 illustrated in FIGS. 30A and 30B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 30A and 30B, a structure in which light is emitted from the light-emitting element 3005 to the lower side (the substrate 3001 side) is illustrated.

As illustrated in FIGS. 30A and 30B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 30B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in the above embodiment, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frit, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 30B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic resin or an epoxy resin. Note that for the first region 3011 and the second region 3013, a reduced pressure state is preferred to an atmospheric pressure state.

Figure 30C:
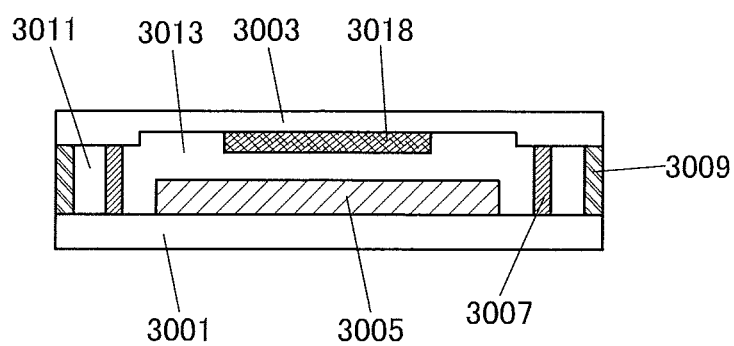

FIG. 30C illustrates a modification example of the structure in FIG. 30B. FIG. 30C is a cross-sectional view illustrating the modification example of the light-emitting device 3000.

FIG. 30C illustrates a structure in which a desiccant 3018 is provided in a recessed portion provided in part of the substrate 3003. The other components are the same as those of the structure illustrated in FIG. 30B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 30B are described with reference to FIGS. 31A to 31D. Note that FIGS. 31A to 31D are cross-sectional views illustrating the modification examples of the light-emitting device 3000 illustrated in FIG. 30B.

In each of the light-emitting devices illustrated in FIGS. 31A to 31D, the second sealing region 3009 is not provided but only the first sealing region 3007 is provided. Moreover, in each of the light-emitting devices illustrated in FIGS. 31A to 31D, a region 3014 is provided instead of the second region 3013 illustrated in FIG. 30B.

For the region 3014, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

When the above-described material is used for the region 3014, what is called a solid-sealing light-emitting device can be obtained.

Figure 31A:
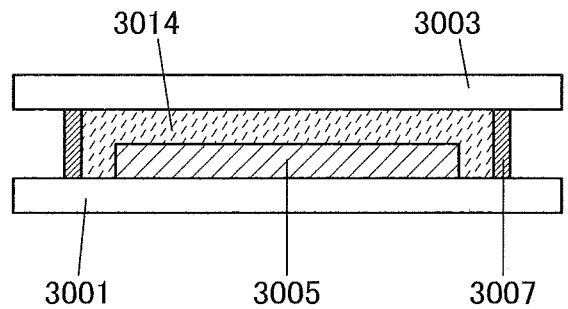
FIGS. 31A to 31D are cross-sectional views each illustrating a light-emitting device of one embodiment of the present invention.
Figure 31B:
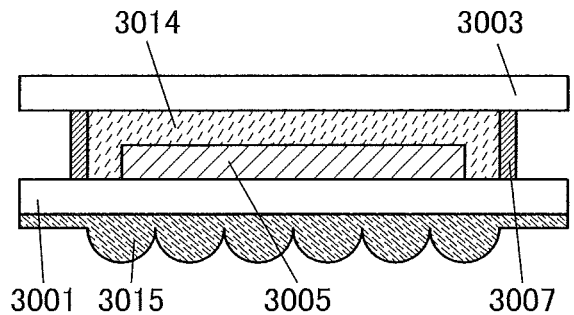

In the light-emitting device illustrated in FIG. 31B, a substrate 3015 is provided on the substrate 3001 side of the light-emitting device illustrated in FIG. 31A.

The substrate 3015 has unevenness as illustrated in FIG. 31B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 31B, a substrate having a function of a diffusion plate may be provided.

Figure 31C:
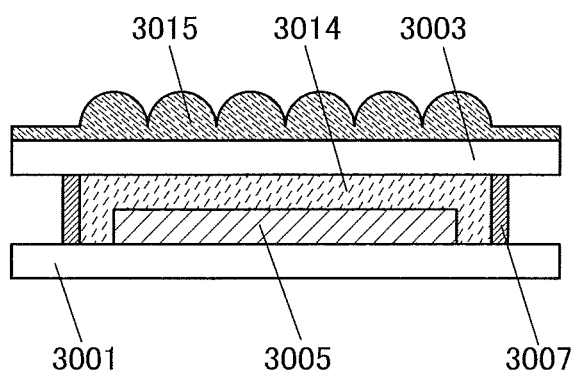

In the light-emitting device illustrated in FIG. 31C, light is extracted through the substrate 3003 side, unlike in the light-emitting device illustrated in FIG. 31A, in which light is extracted through the substrate 3001 side.

The light-emitting device illustrated in FIG. 31C includes the substrate 3015 on the substrate 3003 side. The other components are the same as those of the light-emitting device illustrated in FIG. 31B.

Figure 31D:
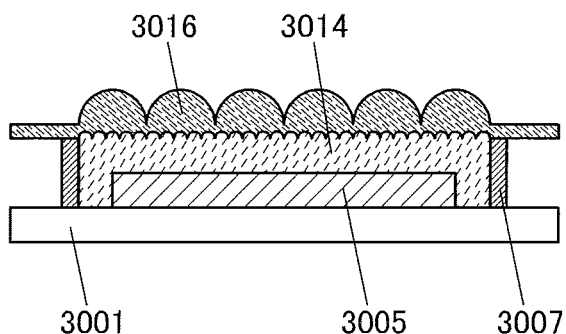

In the light-emitting device illustrated in FIG. 31D, the substrate 3003 and the substrate 3015 included in the light-emitting device illustrated in FIG. 31C are not provided but a substrate 3016 is provided.

The substrate 3016 includes first unevenness positioned closer to the light-emitting element 3005 and second unevenness positioned farther from the light-emitting element 3005. With the structure illustrated in FIG. 31D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

Note that the structure described in this embodiment can be combined as appropriate with any of the structures described in the other embodiments.

Embodiment 9

In this embodiment, examples in which the light-emitting element of one embodiment of the present invention is used for various lighting devices and electronic devices will be described with reference to FIGS. 32A to 32C and FIG. 33.

An electronic device or a lighting device that has a light-emitting region with a curved surface can be obtained with the use of the light-emitting element of one embodiment of the present invention which is manufactured over a substrate having flexibility.

Furthermore, a light-emitting device to which one embodiment of the present invention is applied can also be used for lighting for automobiles, examples of which are lighting for a dashboard, that for a windshield, that for a ceiling, and the like.

Figure 32A:
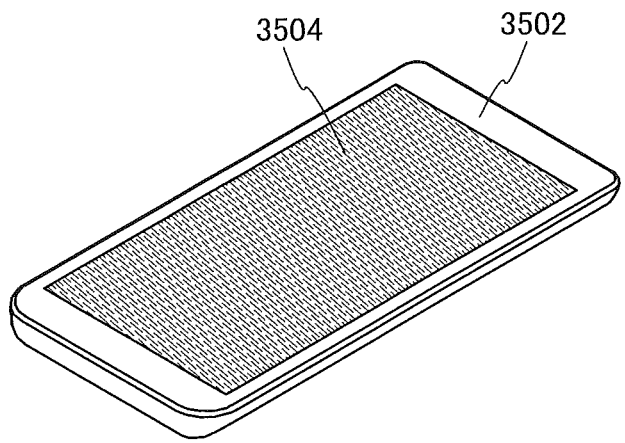
FIGS. 32A and 32B illustrate an electronic device of one embodiment of the present invention and FIG. 32C illustrates a lighting device of one embodiment of the present invention.
Figure 32B:
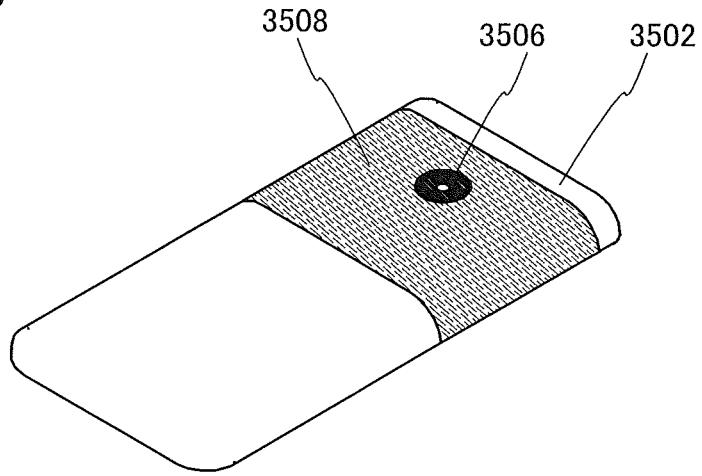

FIG. 32A is a perspective view illustrating one surface of a multifunction terminal 3500, and FIG. 32B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 32A and 32B can have a variety of functions as in the electronic devices illustrated in FIGS. 27A to 27G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 32C:
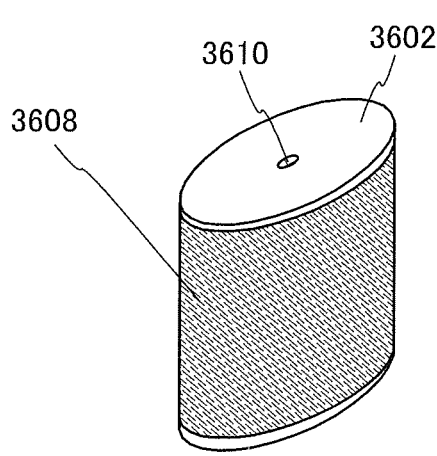

FIG. 32C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 33:
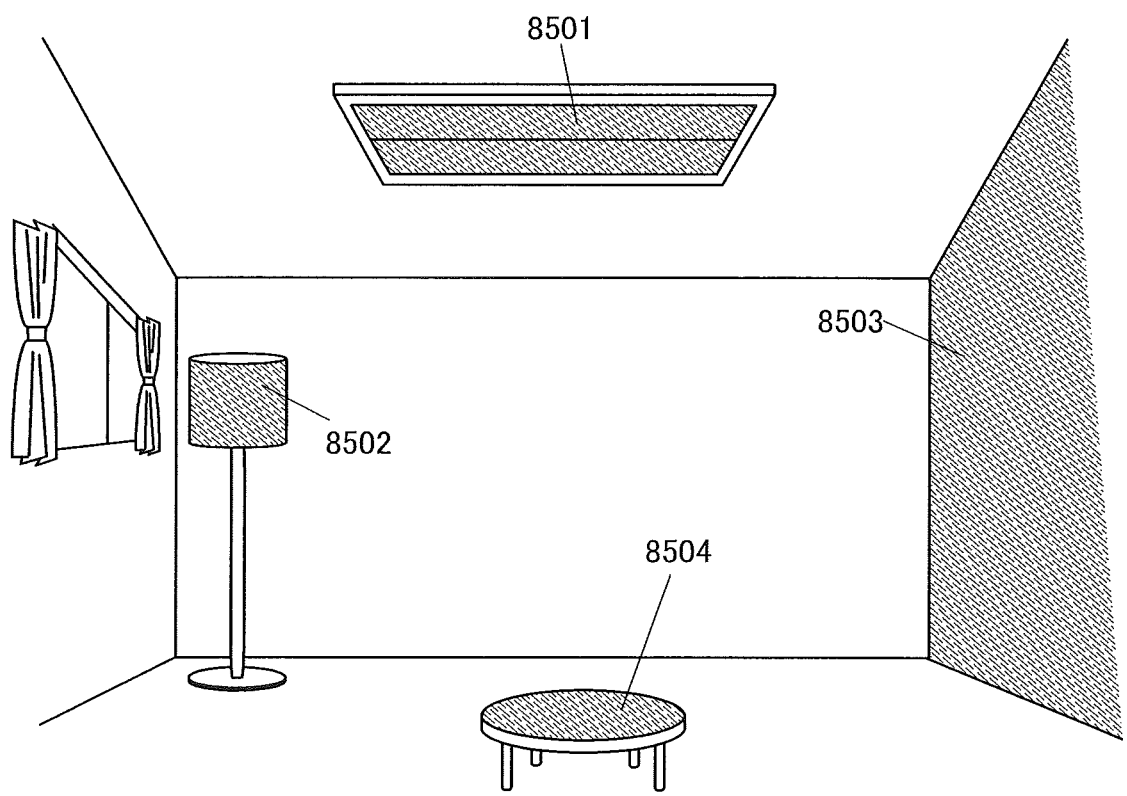
FIG. 33 illustrates lighting devices of embodiments of the present invention.

FIG. 33 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function of a table can be obtained. When the light-emitting element is used as part of other furniture, a lighting device which has a function of the furniture can be obtained.

As described above, lighting devices and electronic devices can be obtained by application of the light-emitting device of one embodiment of the present invention. Note that the light-emitting device can be used for lighting devices and electronic devices in a variety of fields without being limited to the lighting devices and the electronic devices described in this embodiment.

The structure described in this embodiment can be used in combination with any of the structures described in the other embodiments as appropriate.

Example 1

Figure 34:
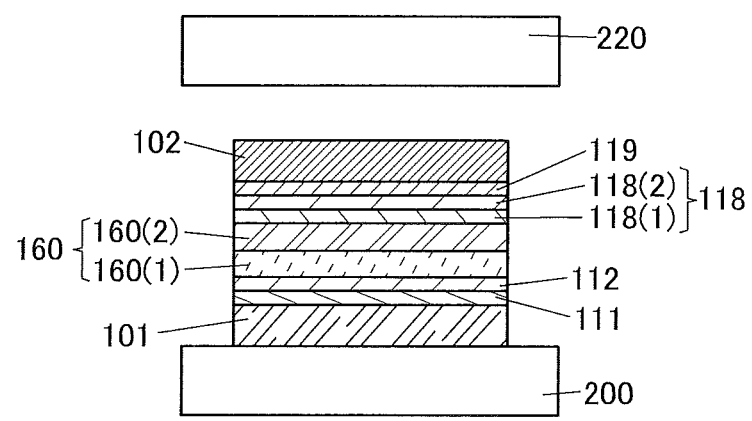
FIG. 34 is a schematic cross-sectional view illustrating a light-emitting element in Example.

In this example, examples of fabricating a light-emitting element of one embodiment of the present invention (a light-emitting element 1) and a comparative light-emitting element (a comparative light-emitting element 1) are described. FIG. 34 is a schematic cross-sectional view of each of the light-emitting elements fabricated in this example, and Table 1 shows details of the element structures. In addition, structures and abbreviations of compounds used here are given below.

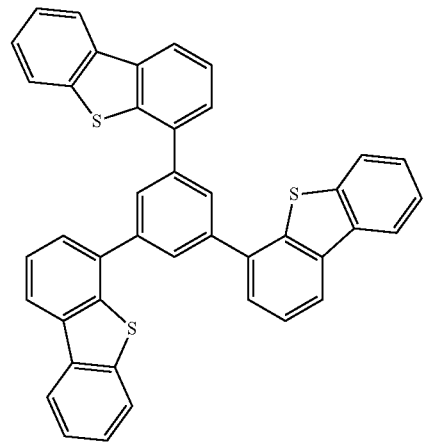

DBT3P-II

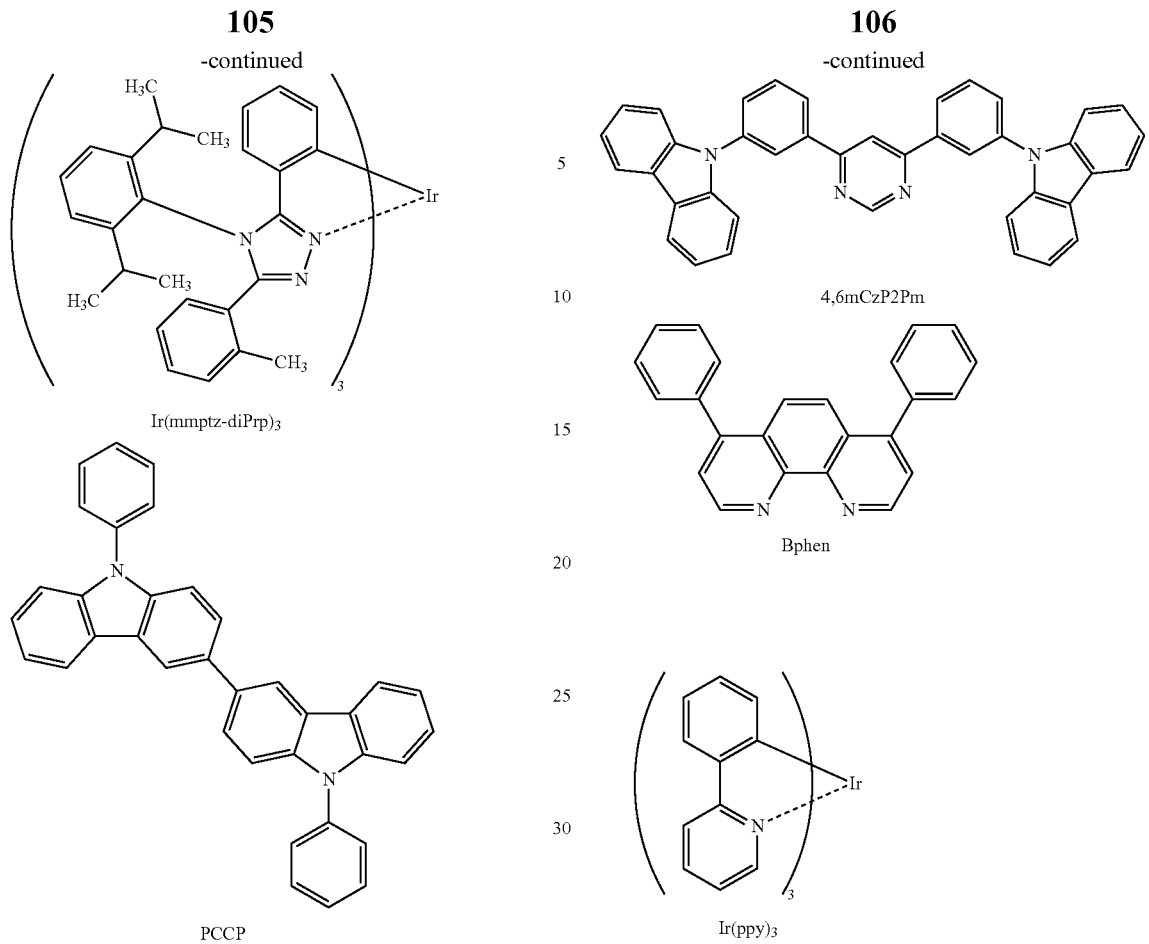

PCCP 4,6mCzP2Pm

Bphen

Ir(ppy)₃

TABLE 1

| | Layer | Reference numeral | Thickness (nm) | Material | Weight ratio |
|---|---|---|---|---|---|
| Light-emitting element 1 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 160(2) | 20 | 4,6mCzP2Pm:PCCP:Ir(ppy)₃ | 0.8:0.2:0.05 |
| | | 160(1) | 20 | 4,6mCzP2Pm:PCCP:Ir(ppy)₃ | 0.5:0.5:0.05 |
| | Hole-transport layer | 112 | 20 | PCCP | — |
| | Hole-injection layer | 111 | 20 | DBT3P-II:MoO₃ | 1:0.5 |
| | Electrode | 101 | 110 | ITSO | — |
| Comparative light-emitting element 1 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 160(2) | 20 | 4,6mCzP2Pm:PCCP:Ir(mpptz-diPrp)₃ | 0.8:0.2:0.05 |
| | | 160(1) | 20 | 4,6mCzP2Pm:PCCP:Ir(mpptz-diPrp)₃ | 0.5:0.5:0.05 |
| | Hole-transport layer | 112 | 20 | PCCP | — |

TABLE 1-continued

| Layer | Reference numeral | Thickness (nm) | Material | Weight ratio |
|---|---|---|---|---|
| Hole-injection layer | 111 | 20 | DBT3P-II:MoO$_3$ | 1:0.5 |
| Electrode | 101 | 110 | ITSO | — |

<Fabrication of Light-Emitting Elements>
<<Fabrication of Light-Emitting Element 1>>

As the electrode 101, an ITSO film was formed to a thickness of 110 nm over the substrate 200. The electrode area of the electrode 101 was set to 4 mm$^2$ (2 mm×2 mm).

As the hole-injection layer 111, 4,4',4"-(benzene-1,3,5-triyptri(dibenzothiophene) (abbreviation: DBT3P-II) and molybdenum oxide (MoO$_3$) were deposited over the electrode 101 by co-evaporation in a weight ratio of DBT3P-II:MoO$_3$=1:0.5 to a thickness of 20 nm.

As the hole-transport layer 112, 3,3'-bis(9-phenyl-9H-carbazole) (abbreviation: PCCP) was deposited over the hole-injection layer 111 by evaporation to a thickness of 20 nm.

As the light-emitting layer 160 over the hole-transport layer 112, 4,6-bis[3-(9H-carbazol-9-yl)phenyl]pyrimidine (abbreviation: 4,6mCzP2Pm), PCCP, and tris(2-phenylpyridinato-N,C$^{2'}$)iridium(III) (abbreviation: Ir(ppy)$_3$) were deposited by co-evaporation in a weight ratio of 4,6mCzP2Pm:PCCP: Ir(ppy)$_3$=0.5:0.5:0.05 to a thickness of 20 nm, and successively, 4,6mCzP2Pm, PCCP, and Ir(ppy)$_3$ were deposited by co-evaporation in a weight ratio of 4,6mCzP2Pm:PCCP: Ir(ppy)$_3$=0.8:0.2:0.05 to a thickness of 20 nm. Note that in the light-emitting layer 160, 4,6mCzP2Pm corresponds to the first organic compound, PCCP corresponds to the second organic compound, and Ir(ppy)$_3$ corresponds to the guest material (the phosphorescent material).

As the electron-transport layer 118, 4,6mCzP2Pm and bathophenanthroline (abbreviation: BPhen) were sequentially deposited by evaporation to thicknesses of 20 nm and 10 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 1 was sealed by fixing the substrate 220 to the substrate 200 over which the organic materials were deposited using a sealant for an organic EL device. Specifically, after the sealant was applied to surround the organic materials over the substrate 200 and the substrate 200 was bonded to the substrate 220, irradiation with ultraviolet light having a wavelength of 365 nm at 6 J/cm$^2$ and heat treatment at 80° C. for 1 hour were performed. Through the above process, the light-emitting element 1 was obtained.

<<Fabrication of Comparative Light-Emitting Element 1>>

The comparative light-emitting element 1 was different from the light-emitting element 1 in the guest material, and steps for the other components were the same as those in the method for fabricating the light-emitting element 1.

That is, as the light-emitting layer 160 in the comparative light-emitting element 1, 4,6mCzP2Pm, PCCP, and tris{2-[5-(2-methylphenyl)-4-(2,6-diisopropylphenyl)-4H-1,2,4-triazol-3-yl-κN$^2$]phenyl-κC}iridium(III) (abbreviation: Ir(mpptz-diPrp)$_3$) were deposited by co-evaporation in a weight ratio of 4,6mCzP2Pm:PCCP: Ir(mpptz-diPrp)$_3$=0.5: 0.5:0.05 to a thickness of 20 nm, and successively, 4,6mCzP2Pm, PCCP, and Ir(mpptz-diPrp)$_3$ were deposited by co-evaporation in a weight ratio of 4,6mCzP2Pm:PCCP: Ir(mpptz-diPrp)$_3$=0.8:0.2:0.05 to a thickness of 20 nm. Note that in the light-emitting layer 160, 4,6mCzP2Pm corresponds to the first organic compound, PCCP corresponds to the second organic compound, and Ir(mpptz-diPrp)$_3$ corresponds to the guest material (the phosphorescent material).

<Emission Spectra of Host Materials>

Figure 35:
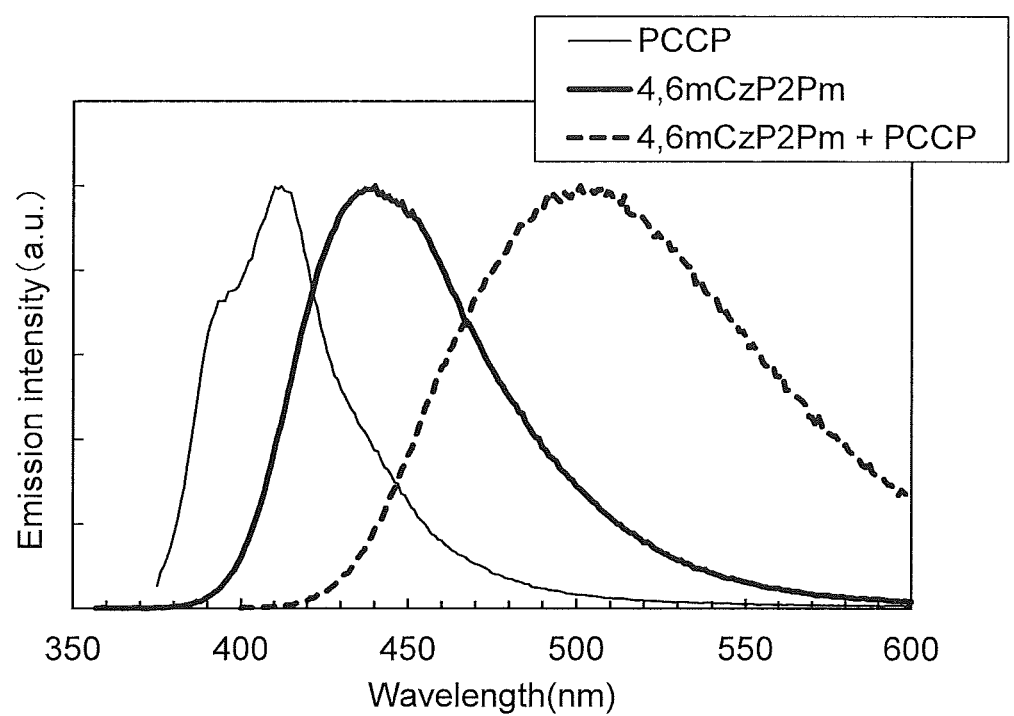
FIG. 35 is a graph showing emission spectra of host materials in Example.

In the fabricated light-emitting elements (the light-emitting element 1 and the comparative light-emitting element 1), 4,6mCzP2Pm and PCCP were used as host materials (the first organic compound and the second organic compound). FIG. 35 shows measurement results of emission spectra of a thin film of 4,6mCzP2Pm, a thin film of PCCP, and a mixed thin film of 4,6mCzP2Pm and PCCP.

For the emission spectrum measurement, thin film samples were formed over a quartz substrate by a vacuum evaporation method. The emission spectra were measured at room temperature (in an atmosphere kept at 23° C.) with a PL-EL measurement apparatus (produced by Hamamatsu Photonics K.K.). The thickness of each thin film was 50 nm. The mixing ratio of the two kinds of compounds (the first organic compound: the second organic compound) in the mixed thin film was 1:1.

As shown in FIG. 35, a peak wavelength of the emission spectrum of the mixed thin film of 4,6mCzP2Pm and PCCP is 501 nm. The emission spectrum differs from the emission spectrum of 4,6mCzP2Pm (peak wavelength: 440 nm) and the emission spectrum of PCCP (peak wavelength: 412 nm). As described later, the LUMO level of 4,6mCzP2Pm is lower than that of PCCP, and the HOMO level of PCCP is higher than that of 4,6mCzP2Pm. The energy of light emission from the mixed thin film of 4,6mCzP2Pm and PCCP approximately corresponds to an energy difference between the LUMO level of 4,6mCzP2Pm and the HOMO level of PCCP. The light emission from the mixed thin film of 4,6mCzP2Pm and PCCP has a longer wavelength (lower energy) than light emission from 4,6mCzP2Pm and light emission from PCCP. Therefore, it can be said that the light emission from the mixed thin film of 4,6mCzP2Pm and PCCP is light emission from an exciplex formed by 4,6mCzP2Pm and PCCP. That is, a combination of 4,6mCzP2Pm and PCCP is a combination of organic compounds which forms an exciplex. With use of 4,6mCzP2Pm and PCCP as host materials, a light-emitting element utilizing ExTET can be fabricated.

<Absorption Spectra and Emission Spectra of Guest Materials>

Figure 36A:
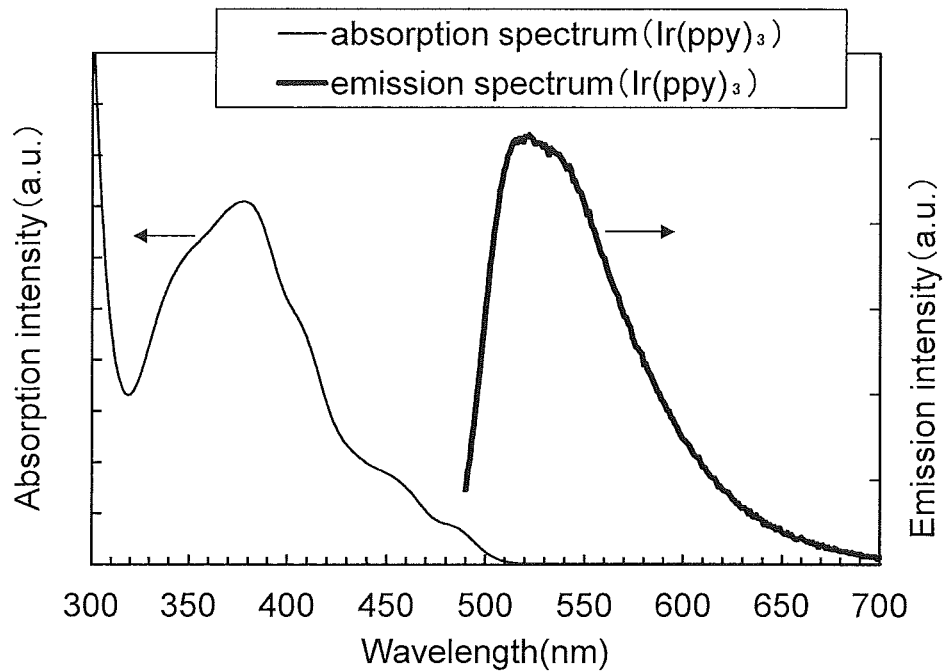
FIGS. 36A and 36B are graphs each showing absorption and emission spectra of a guest material in Example.
Figure 36B:
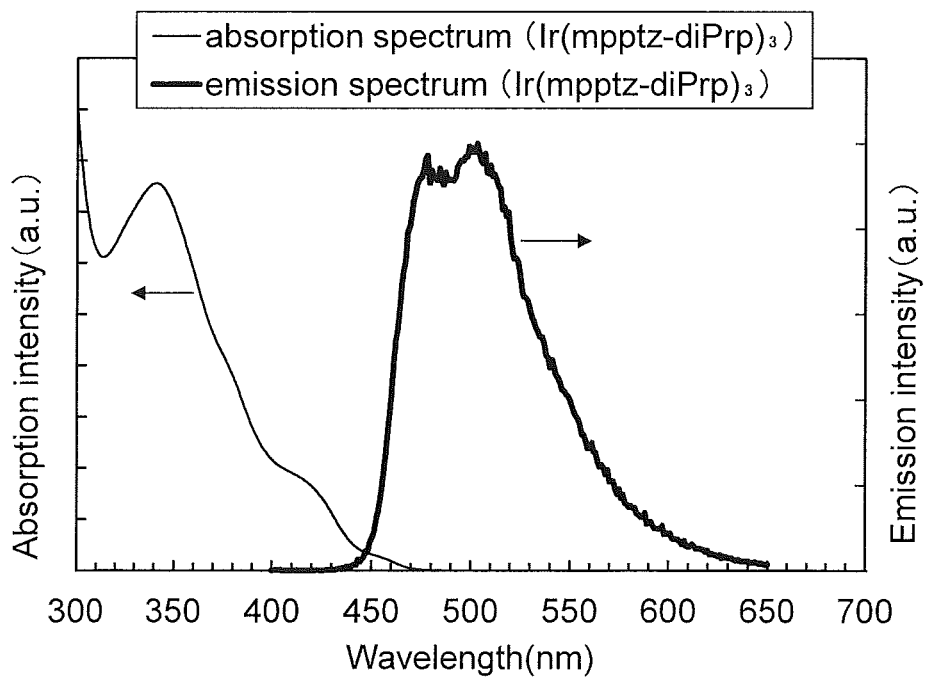

FIGS. 36A and 36B show the measurement results of the absorption spectra and the emission spectra of Ir(ppy)$_3$ and Ir(mpptz-diPrp)$_3$ that are the guest materials in the light-emitting elements.

For the absorption spectrum measurement, a dichloromethane solution in which a guest material (Ir(ppy)$_3$ or Ir(mpptz-diPrp)$_3$ was dissolved was prepared, and a quartz cell was used. The absorption spectrum was measured using an ultraviolet-visible spectrophotometer (V-550, produced by JASCO Corporation). The absorption spectra of the quartz cell and dichloromethane were subtracted from the measured absorption spectrum. The emission spectra were measured with a PL-EL measurement apparatus (manufactured by Hamamatsu Photonics K.K.). The measurement was performed at room temperature (in an atmosphere kept at 23° C.).

As shown in FIGS. 36A and 36B, absorption bands on the lowest energy sides (the longest wavelength sides) of the absorption spectra of Ir(ppy)$_3$ and Ir(mpptz-diPrp)$_3$ are at around 500 nm and 450 nm, respectively. The absorption edges were calculated from data of the absorption spectra, and transition energies were estimated on the assumption of direct transition, so that the following results were obtained: the absorption edge of the absorption spectrum of Ir(ppy)$_3$ is at 507 nm and transition energy thereof is 2.44 eV, and the absorption edge of the absorption spectrum of Ir(mpptz-diPrp)$_3$ is at 471 nm and transition energy thereof is 2.63 eV.

Therefore, the absorption bands of the absorption spectra of Ir(ppy)$_3$ and Ir(mpptz-diPrp)$_3$ on the lowest energy side (the longest wavelength side) each have a region that overlaps with the emission spectrum of an exciplex formed by 4,6mCzP2Pm and PCCP, which means that in the light-emitting element 1 and the comparative light-emitting element 1 including 4,6mCzP2Pm and PCCP as the host materials, excitation energy can be transferred effectively to the guest material.

As described above, in each of the light-emitting element 1 and the comparative light-emitting element 1, the host materials which are 4,6mCzP2Pm (the first organic compound) and PCCP (the second organic compound) form an exciplex in combination with each other.

<Phosphorescence Emission Spectra of Host Materials>

Figure 37:
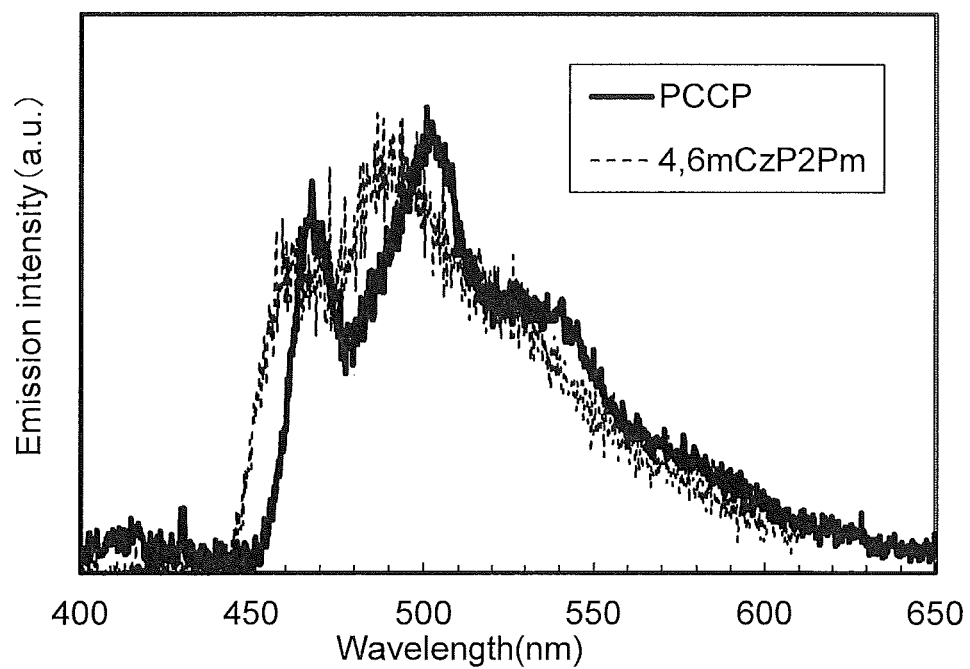
FIG. 37 is a graph showing phosphorescence spectra of host materials in Example.

FIG. 37 shows the measurement results of the triplet excitation energy levels (T1 levels) of the first organic compound (4,6mCzP2Pm) and the second organic compound (PCCP), which were used as the host materials.

For the triplet excitation energy level measurement, phosphorescence from the thin film sample of the compound was measured. The measurement was performed by using a PL microscope, LabRAM HR-PL, produced by HORMA, Ltd., a He—Cd laser (325 nm) as excitation light, and a CCD detector at a measurement temperature of 10 K. The triplet excitation energy level (T1 level) was calculated from a peak on the shortest wavelength side of the phosphorescence spectrum obtained by the measurement.

In FIG. 37, a peak wavelength on the shortest wavelength side of the phosphorescence emission spectrum of the first organic compound (4,6mCzP2Pm) was 459 nm, and that of the second organic compound (PCCP) was 467 nm. Accordingly, the triplet excitation energy level (T1 level) of the first organic compound (4,6mCzP2Pm) was 2.70 eV, and that of the second organic compound (PCCP) was 2.66 eV.

A peak wavelength on the shortest wavelength side of the phosphorescence emission spectrum of each of 4,6mCzP2Pm and PCCP is shorter than a peak wavelength on the shortest wavelength side of the emission spectrum of the exciplex formed by 4,6mCzP2Pm and PCCP which is shown in FIG. 35. The exciplex has a feature in that an energy difference between the singlet excitation energy level (S1 level) and the triplet excitation energy level (T1 level) is small. Therefore, the triplet excitation energy level (T1 level) of the exciplex can be obtained from a peak wavelength on the shortest wavelength side of the emission spectrum. Accordingly, the triplet excitation energy level (T1 level) of each of the first organic compound (4,6mCzP2Pm) and the second organic compound (PCCP) is higher than the triplet excitation energy level (T1 level) of the exciplex.

The triplet excitation energy levels (T1 level) of 4,6mCzP2Pm and PCCP are each higher than the transition energy of the guest material (2.44 eV for Ir(ppy)$_3$, and 2.63 eV for Ir(mpptz-diPrp)$_3$) which was calculated from the absorption edge of the absorption spectrum shown in FIG. 36A or 36B.

Therefore, the first organic compound (4,6mCzP2Pm) and the second organic compound (PCCP), which were used as the host materials in this example, have triplet excitation energy levels (T1 levels) high enough for host materials.

<Characteristics of Light-Emitting Elements>

Then, the characteristics of the fabricated light-emitting element 1 and comparative light-emitting element 1 were measured. Luminances and CIE chromaticities were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.).

Figure 38:
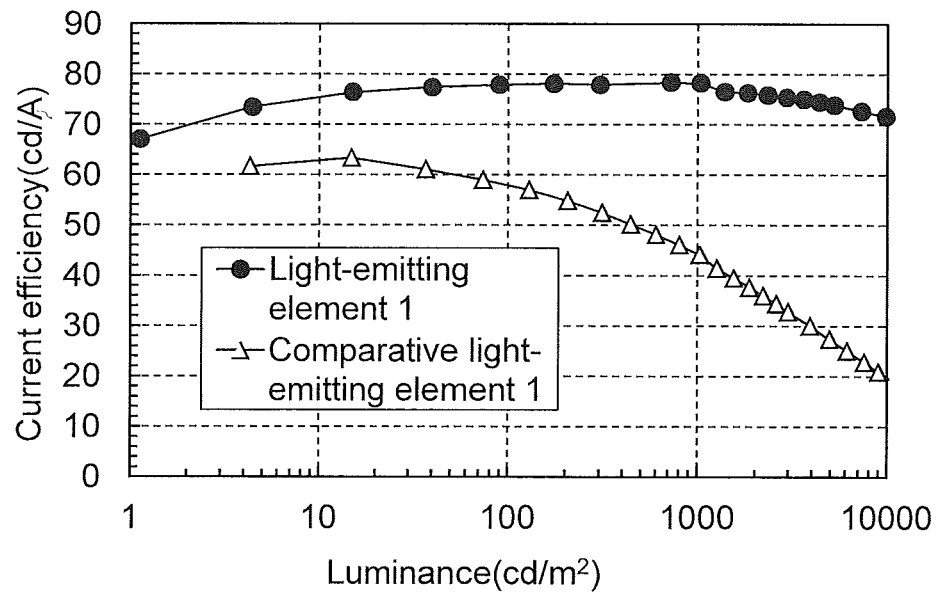
FIG. 38 is a graph showing current efficiency-luminance characteristics of light-emitting elements in Example.
Figure 39:
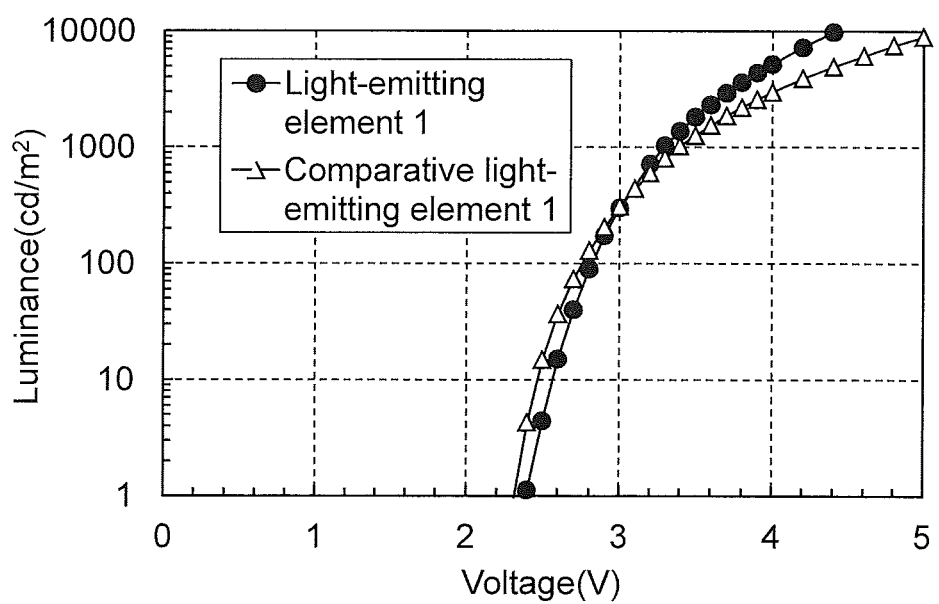
FIG. 39 is a graph showing luminance-voltage characteristics of light-emitting elements in Example.
Figure 40:
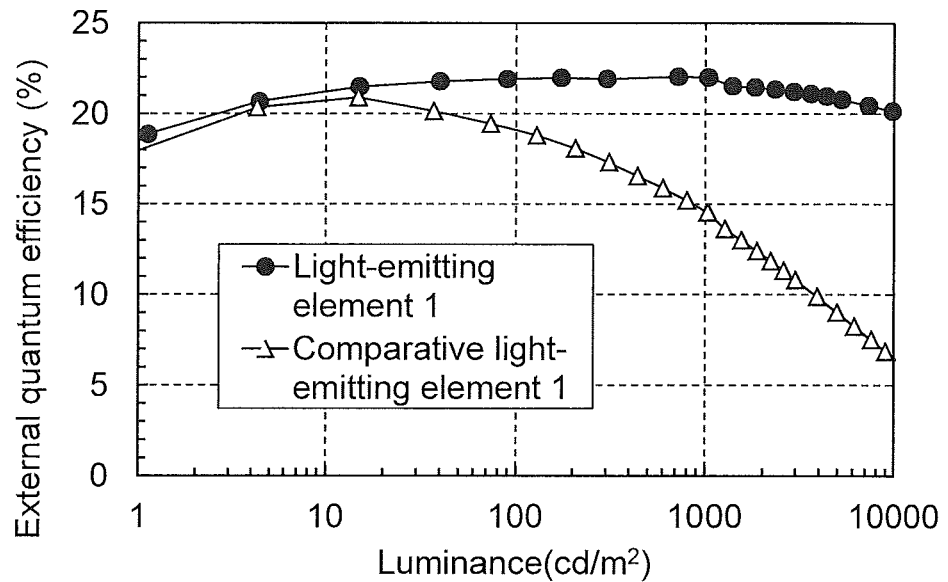
FIG. 40 is a graph showing external quantum efficiency-luminance characteristics of light-emitting elements in Example.
Figure 41:
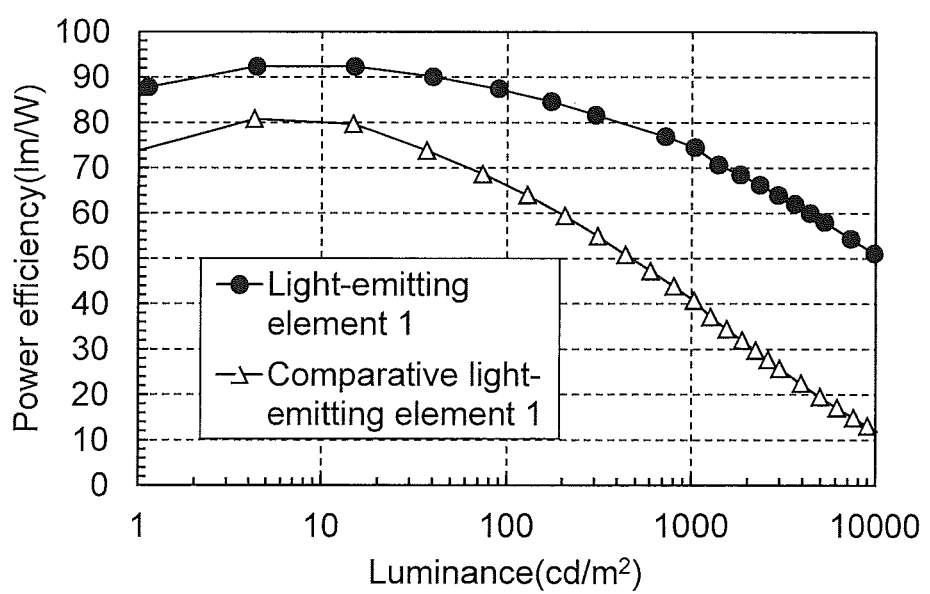
FIG. 41 is a graph showing power efficiency-luminance characteristics of light-emitting elements in Example.

FIG. 38 shows current efficiency-luminance characteristics of the light-emitting element 1 and the comparative light-emitting element 1. FIG. 39 shows luminance-voltage characteristics. FIG. 40 shows external quantum efficiency-luminance characteristics. FIG. 41 shows power efficiency-luminance characteristics. The measurement of the light-emitting elements was performed at room temperature (in an atmosphere kept at 23° C.).

Table 2 shows the element characteristics of the light-emitting element 1 and the comparative light-emitting element 1 at 1000 cd/m$^2$.

TABLE 2

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 1 | 3.3 | 1.3 | (0.34, 0.61) | 1000 | 78 | 75 | 22 |
| Comparative light-emitting element 1 | 3.4 | 2.3 | (0.30, 0.52) | 1000 | 44 | 41 | 15 |

Figure 42:
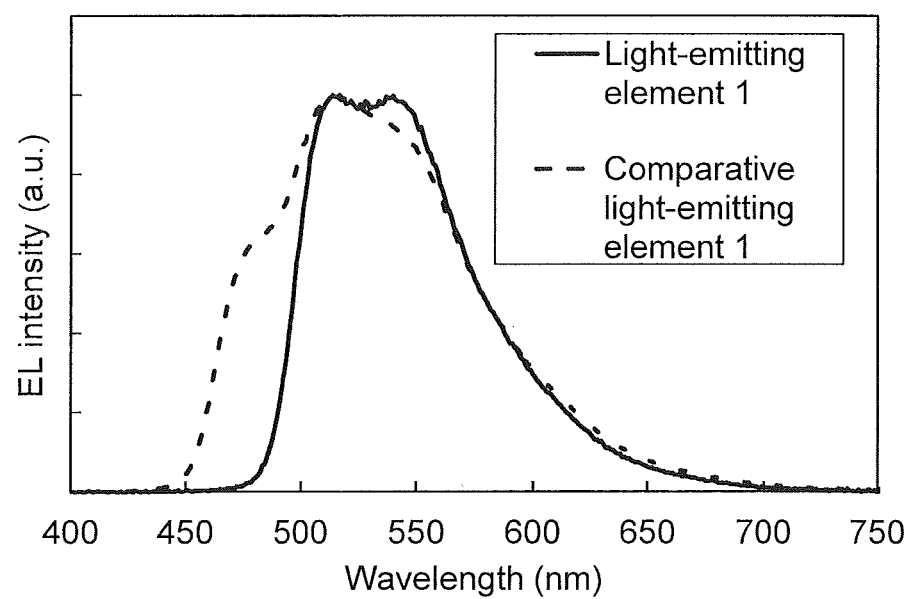
FIG. 42 is a graph showing electroluminescence spectra of light-emitting elements in Example.

FIG. 42 shows the electroluminescence spectra when a current at a current density of 2.5 mA/cm² was supplied to the light-emitting element 1 and the comparative light-emitting element 1.

From FIG. 38 to FIG. 41 and Table 2, it is found that the light-emitting element 1 has higher current efficiency than the comparative light-emitting element 1. The maximum external quantum efficiency of the light-emitting element 1 is 22%, which is an excellent value. The light-emitting element 1 was driven at a lower voltage. Thus, the power efficiency of the light-emitting element 1 is higher than that of the comparative light-emitting element 1.

The light emission starting voltages (a voltage at the time when the luminance exceeds 1 cd/m²) of the light-emitting element 1 and the comparative light-emitting element 1 were each 2.4 V. This voltage is smaller than a voltage corresponding to an energy difference between the LUMO level and the HOMO level of each of the guest materials Ir(ppy)$_3$ and Ir(mpptz-diPrp)$_3$, which is described later. The results suggest that emission in the light-emitting element 1 and the comparative light-emitting element 1 is obtained not by direct recombination of carriers in the guest material but by recombination of carriers in the material having a smaller energy gap.

As shown in FIG. 42, the light-emitting element 1 emits green light. The electroluminescence spectrum of the light-emitting element 1 has a peak at a wavelength of 514 nm and a full width at half maximum of 82 nm. Whereas, the electroluminescence spectrum of the comparative light-emitting element 1 has a peak at a wavelength of 517 nm and a full width at half maximum of 108 nm, which is a broad spectrum. The electroluminescence spectrum of the comparative light-emitting element 1 was significantly different from the emission spectrum of the guest material (Ir(mpptz-diPrp)$_3$) shown in FIG. 36B.

<Results of CV Measurement>

The electrochemical characteristics (oxidation reaction characteristics and reduction reaction characteristics) of the compounds used as the host materials (the first organic compound and the second organic compound) and the guest materials in the above-described light-emitting elements were measured by cyclic voltammetry (CV). Note that for the measurement, an electrochemical analyzer (ALS model 600A or 600C, produced by BAS Inc.) was used, and measurement was performed on solutions obtained by dissolving the compounds in NA-dimethylformamide (abbreviation: DMF). In the measurement, the potential of a working electrode with respect to the reference electrode was changed within an appropriate range, so that the oxidation peak potential and the reduction peak potential were obtained. In addition, the HOMO and LUMO levels of each compound were calculated from the estimated redox potential of the reference electrode of −4.94 eV and the obtained peak potentials.

Table 3 shows oxidation potentials and reduction potentials of the compounds obtained from the results of the CV measurement and HOMO levels and LUMO levels of the compounds calculated from the CV measurement results.

TABLE 3

| Material | Oxidation potential (V) | Reduction potential (V) | HOMO level calculated from oxidation potential (eV) | LUMO level calculated from reduction potential (eV) |
|---|---|---|---|---|
| 4,6mCzP2Pm | 0.95 | −2.06 | −5.89 | −2.88 |
| PCCP | 0.69 | −2.98 | −5.63 | −1.96 |
| Ir(ppy)$_3$ | 0.38 | −2.63 | −5.32 | −2.31 |
| Ir(mpptz-diPrp)$_3$ | 0.34 | −2.98 | −5.28 | −1.96 |
| Ir(mCNpptz-diPrp)$_3$ | 0.48 | −2.51 | −5.42 | −2.43 |

As shown in Table 3, the reduction potential of the first organic compound (4,6mCzP2Pm) is higher than that of the second organic compound (PCCP), the oxidation potential of the first organic compound (4,6mCzP2Pm) is higher than that of the second organic compound (PCCP), the reduction potential of each of the guest materials (Ir(ppy)$_3$ and Ir(mpptz-diPrp)$_3$) is lower than that of the first organic compound (4,6mCzP2Pm), and the oxidation potential of each of the guest materials (Ir(ppy)$_3$ and Ir(mpptz-diPrp)$_3$) is lower than that of the second organic compound (PCCP). In addition, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). The LUMO level of each of the guest materials (Ir(ppy)$_3$ and Ir(mpptz-diPrp)$_3$) is higher than that of the first organic compound (4,6mCzP2Pm), and the HOMO level of each of the guest materials (Ir(ppy)$_3$ and Ir(mpptz-diPrp)$_3$) is higher than that of the second organic compound (PCCP).

The results of the CV measurement show that the combination of the first organic compound (4,6mCzP2Pm) and the second organic compound (PCCP) forms an exciplex.

An energy difference between the LUMO level and the HOMO level of Ir(ppy)$_3$ was 3.01 eV and that of Ir(mpptz-diPrp)$_3$ was 3.32 eV. These values were calculated from the CV measurement results shown in Table 3.

As described above, the transition energies of Ir(ppy)$_3$ and Ir(mpptz-diPrp)$_3$ that were calculated from the absorption edges of the absorption spectra in FIGS. 36A and 36B are 2.44 eV and 2.63 eV, respectively.

That is, the energy difference between the LUMO level and the HOMO level of Ir(ppy)$_3$ is larger than the transition energy thereof calculated from the absorption edge by 0.57 eV. The energy difference between the LUMO level and the HOMO level of Ir(mpptz-diPrp)$_3$ is larger than the transition energy thereof calculated from the absorption edge by 0.69 eV.

The peak wavelengths on the shortest wavelength sides of the emission spectra in FIGS. 36A and 36B are 514 nm and 477 nm, respectively. According to that, the light emission energy of Ir(ppy)$_3$ was calculated to be 2.41 eV and that of Ir(mpptz-diPrp)$_3$ was calculated to be 2.60 eV.

That is, the energy difference between the LUMO level and the HOMO level of Ir(ppy)$_3$ was larger than the light emission energy by 0.60 eV, and the energy difference between the LUMO level and the HOMO level of Ir(mpptz-diPrp)$_3$ was larger than the light emission energy by 0.72 eV.

Consequently, in each of the guest materials of the light-emitting elements, the energy difference between the LUMO level and the HOMO level is larger than the transition energy calculated from the absorption edge by 0.4 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention can have reduced power consumption.

Note that an energy difference between the LUMO level of the first organic compound (4,6mCzP2Pm) and the HOMO level of the second organic compound (PCCP) (4,6mCzP2Pm and PCCP are the host materials) was calculated to be 2.75 eV from Table 3. Consequently, energy corresponding to the energy difference between the LUMO level and the HOMO level of an exciplex formed by the host materials is smaller than the energy difference between the LUMO level and the HOMO level of the guest material (3.01 eV for Ir(ppy)$_3$ and 3.32 eV for Ir(mpptz-diPrp)$_3$), and larger than the transition energy calculated from the absorption edge of the absorption spectrum of the guest material (2.44 eV for Ir(ppy)$_3$ and 2.63 eV for Ir(mpptz-diPrp)$_3$). Therefore, in the light-emitting element 1 and the comparative light-emitting element 1, the guest material can be excited through the exciplex, whereby the driving voltage can be lowered. Therefore, the light-emitting element of one embodiment of the present invention can have reduced power consumption.

According to the CV measurement results in Table 3, among carriers (electrons and holes) injected from the pair of electrodes, electrons tend to be injected into the first organic compound (4,6mCzP2Pm) which is a host material with a low LUMO level, whereas holes tend to be injected into the guest material (Ir(ppy)$_3$ or Ir(mpptz-diPrp)$_3$) with a high HOMO level. That is, there is a possibility that an exciplex is formed by the first organic compound (4,6mCzP2Pm) and the guest material (Ir(ppy)$_3$ or Ir(mpptz-diPrp)$_3$).

As shown in FIG. 42, the electroluminescence spectrum of the comparative light-emitting element 1 has a full width at half maximum of 108 nm, which is a broad spectrum, and is different from the emission spectrum of Ir(mpptz-diPrp)$_3$ (the full width at half maximum is 77 nm) shown in FIG. 36B. Accordingly, in the comparative light-emitting element 1, the guest material (Ir(mpptz-diPrp)$_3$) and the first organic compound (4,6mCzP2Pm) form an exciplex, and thus, the electroluminescence spectrum becomes broader. For the same reason, the current efficiency and the external quantum efficiency of the comparative light-emitting element 1 are not sufficiently high. In contrast, the full width at half maximum of the electroluminescence spectrum of the light-emitting element 1 is 82 nm, which is close to that of the emission spectrum of Ir(ppy)$_3$ (80 nm) shown in FIG. 36A.

The energy difference between the LUMO level of the first organic compound (4,6mCzP2Pm) and the HOMO level of the guest material Ir(ppy)$_3$ and that between the LUMO level of the first organic compound (4,6mCzP2Pm) and the HOMO level of the guest material Ir(mpptz-diPrp)$_3$ were calculated from the CV measurement results shown in Table 3 and found to be 2.44 eV and 2.40 eV, respectively.

In the comparative light-emitting element 1 using Ir(mpptz-diPrp)$_3$, the energy difference (2.40 eV) between the LUMO level of the first organic compound and the HOMO level of the guest material is smaller than the transition energy (2.63 eV) calculated from the absorption edge of the absorption spectrum of the guest material. Furthermore, the energy difference (2.40 eV) between the LUMO level of the first organic compound and the HOMO level of the guest material is smaller than the energy (2.60 eV) of the light emission exhibited by the guest material. Accordingly, the combination of the first organic compound and the guest material easily forms an exciplex, which hinders efficient light emission from the guest material.

In the light-emitting element 1 using Ir(ppy)$_3$, the energy difference (2.44 eV) between the LUMO level of the first organic compound and the HOMO level of the guest material is higher than or equal to the transition energy (2.44 eV) calculated from the absorption edge of the absorption spectrum of the guest material. Furthermore, the energy difference (2.44 eV) between the LUMO level of the first organic compound and the HOMO level of the guest material is higher than or equal to the energy (2.41 eV) of the light emission exhibited by the guest material. Accordingly, rather than formation of an exciplex by the combination of the first organic compound and the guest material, transfer of excitation energy to the guest material is more facilitated eventually, whereby efficient light emission from the guest material is achieved. The above-described relationship is a feature of one embodiment of the present invention which contributes to efficient light emission.

<Results of Reliability Test>

Figure 43:
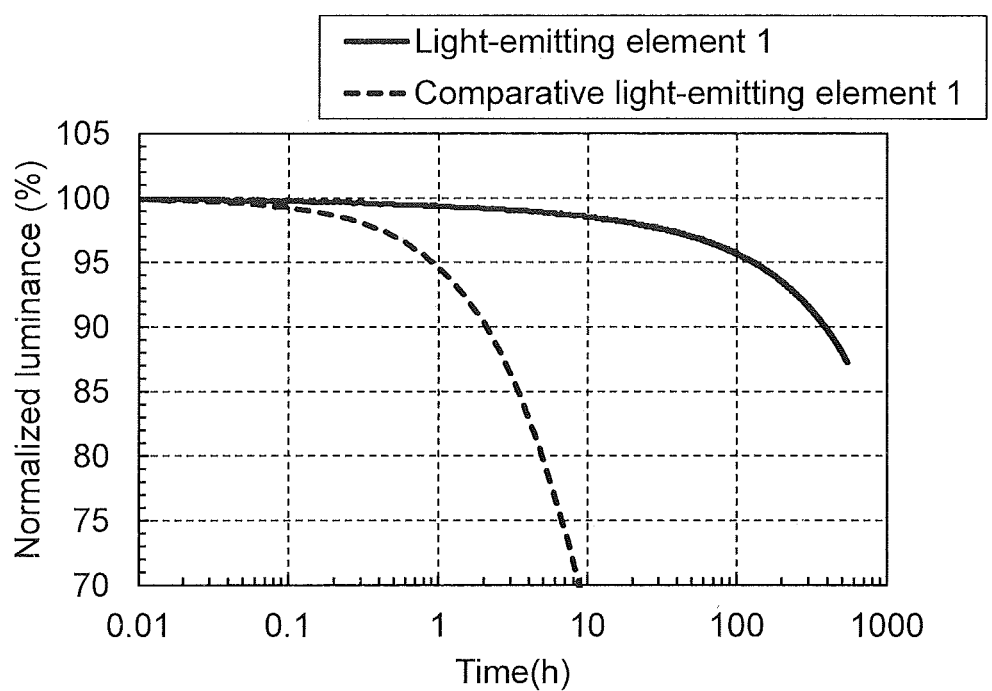
FIG. 43 is a graph showing reliability test results of light-emitting elements in Example.

FIG. 43 shows the results of reliability tests of the light-emitting elements. For the reliability test, the initial luminance was set to 5000 cd/m$^2$, and each of the light-emitting elements (the light-emitting element 1 and the comparative light-emitting element 1) was continuously driven at a constant current density.

The time (LT90) taken for the luminance of the light-emitting element 1 and the comparative light-emitting element 1 to decrease to 90% of the initial luminance was as follows: the light-emitting element 1, 390 hours; and the comparative light-emitting element 1, 2 hours. The light-emitting element 1 shows high reliability.

That is, a light-emitting element having the following structure like the light-emitting element 1 can achieve high emission efficiency with low driving voltage and have excellent reliability: the LUMO level of the first organic compound is lower than that of the second organic compound, the HOMO level of the first organic compound is lower than that of the second organic compound, the LUMO level of the guest material is higher than that of the first organic compound, the HOMO level of the guest material is higher than that of the second organic compound, the first organic compound and the second organic compound form an exciplex in combination with each other, and the energy difference between the LUMO level of the first organic compound and the HOMO level of the guest material is larger than or equal to the transition energy calculated from the absorption edge of the absorption spectrum of the guest material or is larger than or equal to the light emission energy of the guest material.

As described above, by employing the structure of one embodiment of the present invention, a light-emitting element having high emission efficiency can be manufactured. A light-emitting element with reduced power consumption can be manufactured. A highly reliable light-emitting element can be manufactured.

Example 2

In this example, examples of fabricating a light-emitting element of one embodiment of the present invention (a light-emitting element 2) and comparative light-emitting elements (a comparative light-emitting element 2 and a comparative light-emitting element 3) are described. A schematic cross-sectional view of the light-emitting elements fabricated in this example is similar to that shown in FIG. 34. Table 4 shows details of the element structures. In addition, structures and abbreviations of compounds used here are given below. Note that Example 1 can be referred to for other compounds.

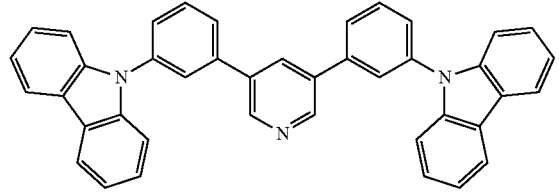

35DCzPPy

-continued

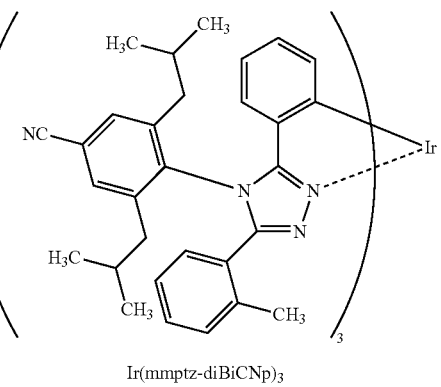

Ir(mmptz-diBiCNp)₃

TABLE 4

| | Layer | Reference numeral | Thickness (nm) | Material | Weight ratio |
|---|---|---|---|---|---|
| Light-emitting element 2 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(mpptz-diBuCNp)₃ | 0.6:0.4:0.06 |
| | | 160(1) | 30 | 4,6mCzP2Pm:PCCP:Ir(mpptz-diBuCNp)₃ | 0.5:0.5:0.06 |
| | Hole-transport layer | 112 | 20 | PCCP | — |
| | Hole-injection layer | 111 | 20 | DBT3P-II:MoO₃ | 1:0.5 |
| | Electrode | 101 | 70 | ITSO | — |
| Comparative light-emitting element 2 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 35DCzPPy | — |
| | Light-emitting layer | 160(2) | 10 | 35DCzPPy:Ir(mpptz-diBuCNp)₃ | 1:0.06 |
| | | 160(1) | 30 | 35DCzPPy:PCCP:Ir(mpptz-diBuCNp)₃ | 0.65:0.65:0.06 |
| | Hole-transport layer | 112 | 20 | PCCP | — |
| | Hole-injection layer | 111 | 15 | DBT3P-II:MoO₃ | 1:0.5 |
| | Electrode | 101 | 70 | ITSO | — |
| Comparative light-emitting element 3 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 35DCzPPy | — |
| | Light-emitting layer | 160(2) | 10 | 35DCzPPy:Ir(mpptz-diPrp)₃ | 1:0.06 |
| | | 160(1) | 30 | 35DCzPPy:PCCP:Ir(mpptz-diPrp)₃ | 0.3:1:0.06 |
| | Hole-transport layer | 112 | 20 | PCCP | — |
| | Hole-injection layer | 111 | 15 | DBT3P-II:MoO₃ | 1:0.5 |
| | Electrode | 101 | 70 | ITSO | — |

<Fabrication of Light-Emitting Elements>
<<Fabrication of Light-Emitting Element 2>>

As the electrode 101, an ITSO film was formed to a thickness of 70 nm over the substrate 200. The electrode area of the electrode 101 was set to 4 mm² (2 mm×2 mm).

As the hole-injection layer 111, DBT3P-II and MoO₃ were deposited over the electrode 101 by co-evaporation in a weight ratio of DBT3P-II:MoO₃=1:0.5 to a thickness of 20 nm.

As the hole-transport layer 112, PCCP was deposited over the hole-injection layer 111 by evaporation to a thickness of 20 nm.

As the light-emitting layer 160 over the hole-transport layer 112, 4,6mCzP2Pm, PCCP, and tris {2-[4-(4-cyano-2,6-diisobutylphenyl)-5-(2-methylphenyl)-4H-1,2,4-triazol-3-yl-κN²]phenyl-κC}iridium(III) (abbreviation: Ir(mpptz-diBuCNp)₃) were deposited by co-evaporation in a weight ratio of 4,6mCzP2Pm:PCCP: Ir(mpptz-diBuCNp)₃=0.5:0.5:0.06 to a thickness of 30 nm, and successively, 4,6mCzP2Pm, PCCP, and Ir(mpptz-diBuCNp)₃ were deposited by co-evaporation in a weight ratio of 4,6mCzP2Pm:PCCP: Ir(mpptz-diBuCNp)₃=0.6:0.4:0.06 to a thickness of 10 nm. Note that in the light-emitting layer 160, 4,6mCzP2Pm corresponds to the first organic compound, PCCP corresponds to the second organic compound, and Ir(mpptz-diBuCNp)₃ corresponds to the guest material (the phosphorescent material).

As the electron-transport layer 118, 4,6mCzP2Pm and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 2 was sealed by fixing the substrate 220 to the substrate 200 over which the organic materials were deposited using a sealant for an organic EL device. For the detailed method, description of Example 1 can be referred to. Through the above steps, the light-emitting element 2 was obtained.

<<Fabrication of Comparative Light-Emitting Element 2>>

As the electrode 101, an ITSO film was formed to a thickness of 70 nm over the substrate 200. The electrode area of the electrode 101 was set to 4 mm² (2 mm×2 mm).

As the hole-injection layer 111, DBT3P-II and MoO₃ were deposited over the electrode 101 by co-evaporation in a weight ratio of DBT3P-II:MoO₃=1:0.5 to a thickness of 15 nm.

As the hole-transport layer 112, PCCP was deposited over the hole-injection layer 111 by evaporation to a thickness of 20 nm.

As the light-emitting layer 160 over the hole-transport layer 112, 3,5-bis[3-(9H-carbazol-9-yl)phenyl]pyridine (abbreviation: 35DCzPPy), PCCP, and Ir(mpptz-diBuCNp)₃ were deposited by co-evaporation in a weight ratio of 35DCzPPy:PCCP: Ir(mpptz-diBuCNp)₃=0.65:0.65:0.06 to a thickness of 30 nm, and successively, 35DCzPPy and Ir(mpptz-diBuCNp)₃ were deposited by co-evaporation in a weight ratio of 35DCzPPy: Ir(mpptz-diBuCNp)₃=1:0.06 to a thickness of 10 nm. Note that in the light-emitting layer 160, 35DCzPPy corresponds to the first organic compound, PCCP corresponds to the second organic compound, and Ir(mpptz-diBuCNp)₃ corresponds to the guest material (the phosphorescent material).

As the electron-transport layer 118, 35DCzPPy and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the comparative light-emitting element 2 was sealed by fixing the substrate 220 to the substrate 200 over which the organic materials were deposited using a sealant for an organic EL device. For the detailed method, description of the light-emitting element 2 can be referred to. Through the above steps, the comparative light-emitting element 2 was obtained.

<<Fabrication of Comparative Light-Emitting Element 3>>

The comparative light-emitting element 3 was fabricated through the same steps as those for the comparative light-emitting element 2 except for the step of forming the light-emitting layer 160.

As the light-emitting layer 160 in the comparative light-emitting element 3, 35DCzPPy, PCCP, and Ir(mpptz-diPrp)₃ were deposited by co-evaporation in a weight ratio of 35DCzPPy:PCCP:Ir(mpptz-diPrp)₃=0.3:1:0.06 to a thickness of 30 inn, and successively, 35DCzPPy and Ir(mpptz-diPrp)₃ were deposited by co-evaporation in a weight ratio of 35DCzPPy: Ir(mpptz-diPrp)₃=1:0.06 to a thickness of 10 nm. Note that in the light-emitting layer 160, 35DCzPPy corresponds to the first organic compound, PCCP corresponds to the second organic compound, and Ir(mpptz-diPrp)₃ corresponds to the guest material (the phosphorescent material).

<Emission Spectra of Host Materials>

Figure 44:
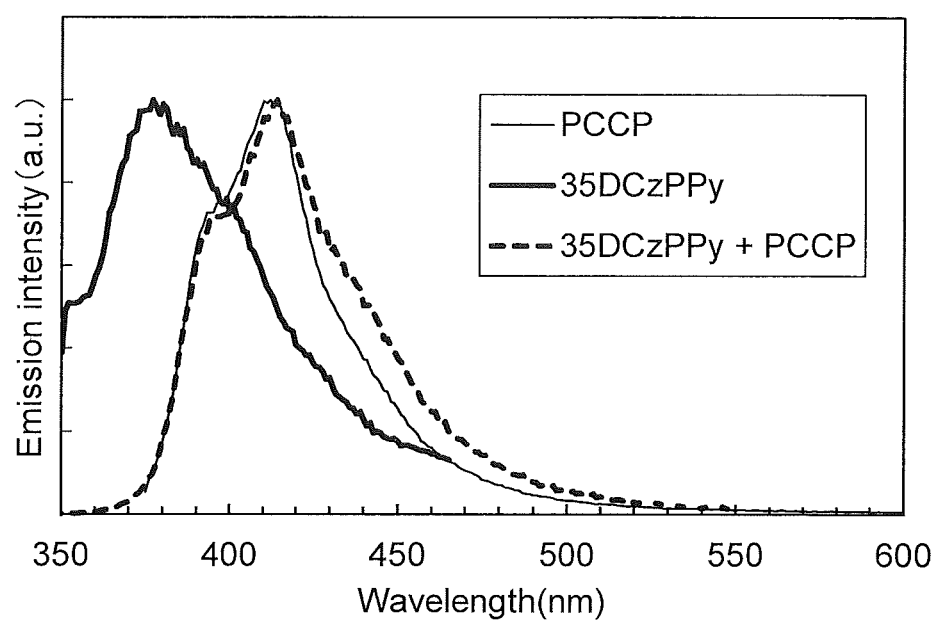
FIG. 44 is a graph showing emission spectra of host materials in Example.

In the fabricated light-emitting elements (the comparative light-emitting element 2 and the comparative light-emitting element 3), 35DCzPPy and PCCP were used as host materials (the first organic compound and the second organic compound). FIG. 44 shows measurement results of emission spectra of a thin film of 35DCzPPy, a thin film of PCCP, and a mixed thin film of 35DCzPPy and PCCP.

For the emission spectrum measurement, thin film samples were formed over a quartz substrate by a vacuum evaporation method. The emission spectra were measured at room temperature (in an atmosphere kept at 23° C.) with a PL-EL measurement apparatus (produced by Hamamatsu Photonics K.K.). The thickness of each thin film was 50 nm. The mixing ratio of the two kinds of compounds (the first organic compound: the second organic compound) in the mixed thin film was 1:1.

As shown in FIG. 44, a peak wavelength of the emission spectrum of 35DCzPPy is 377 nm and that of PCCP is 412 nm; accordingly, the emission spectrum of each of 35DCzPPy and PCCP has an emission peak at a significantly short wavelength. A peak wavelength of the emission spectrum of the mixed thin film of 35DCzPPy and PCCP is 414 nm, which is substantially the same as that of PCCP. Therefore, it can be said that a combination of 35DCzPPy and PCCP does not form an exciplex.

As shown in FIG. 35, the emission spectrum of the mixed thin film of 4,6mCzP2Pm and PCCP, which were used as the host materials of the light-emitting element 2 (the first organic compound and the second organic compound), differs from the emission spectra of 4,6mCzP2Pm alone and PCCP alone. As described in Example 1, the LUMO level of 4,6mCzP2Pm is lower than that of PCCP, and the HOMO level of PCCP is higher than that of 4,6mCzP2Pm. The energy of light emission from the mixed thin film of 4,6mCzP2Pm and PCCP approximately corresponds to an energy difference between the LUMO level of 4,6mCzP2Pm and the HOMO level of PCCP. The light emission from the mixed thin film of 4,6mCzP2Pm and PCCP has a longer wavelength (lower energy) than light emission from 4,6mCzP2Pm and light emission from PCCP. Therefore, it can be said that the light emission from the mixed thin film of 4,6mCzP2Pm and PCCP is light emission from an exciplex formed by 4,6mCzP2Pm and PCCP. That is, a combination of 4,6mCzP2Pm and PCCP is a combination of organic compounds which forms an exciplex. With use of 4,6mCzP2Pm and PCCP as host materials, a light-emitting element utilizing ExTET can be fabricated.

As described above, in each of the comparative light-emitting element 2 and the comparative light-emitting element 3, the host materials do not form an exciplex, whereas in the light-emitting element 2, the host materials which are 4,6mCzP2Pm (the first organic compound) and PCCP (the second organic compound) form an exciplex in combination with each other.

<Absorption Spectra and Emission Spectra of Guest Materials>

Figure 45A:
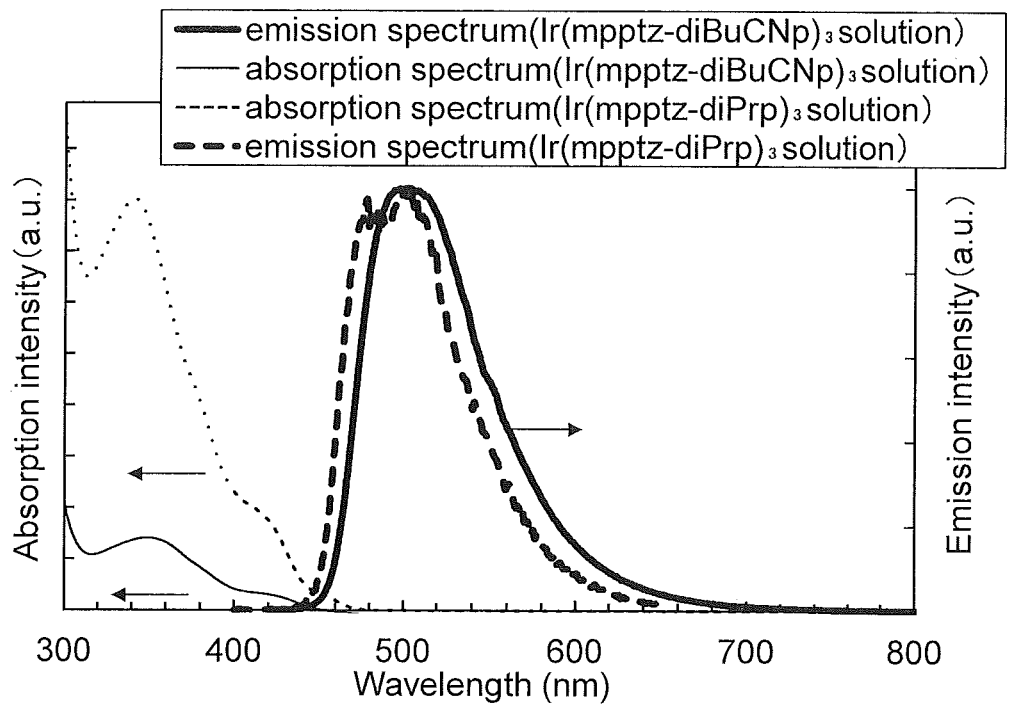
FIGS. 45A and 45B are graphs showing absorption spectra and emission spectra of guest materials in Example.
Figure 45B:
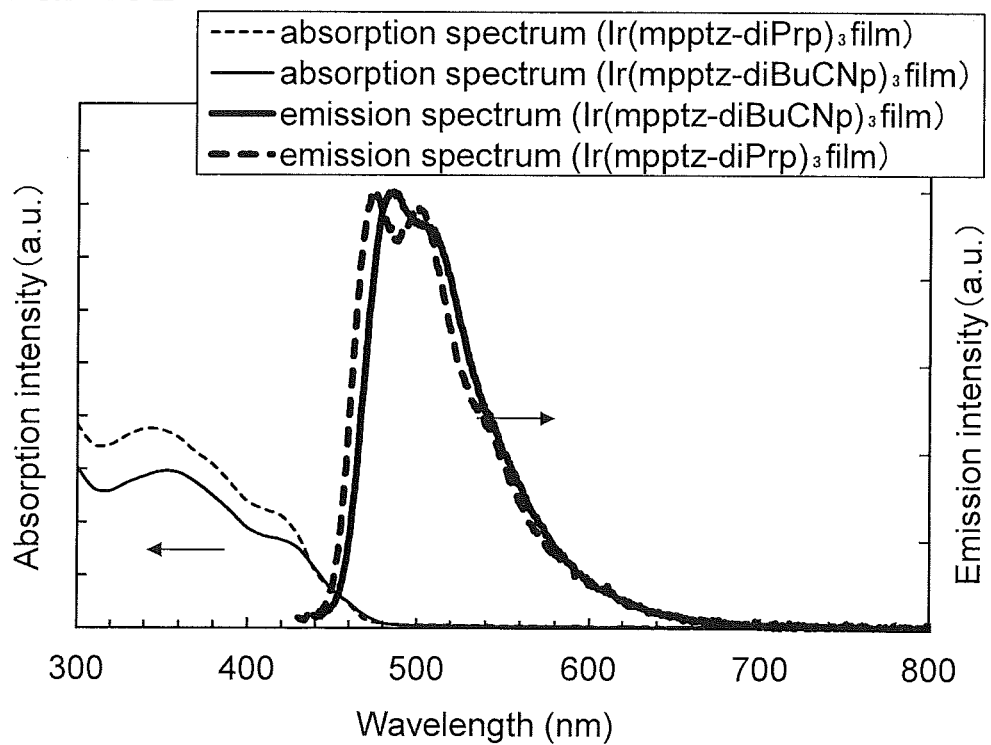

FIG. 45A shows the measurement results of the absorption spectra and the emission spectra of solutions of the guest materials Ir(mpptz-diBuCNp)$_3$ and Ir(mpptz-diPrp)$_3$, and FIG. 45B shows the measurement results of the absorption spectra and the emission spectra of thin films of Ir(mpptz-diBuCNp)$_3$ and Ir(mpptz-diPrp)$_3$.

For the measurement of absorption spectra and emission spectra in FIG. 45A, a dichloromethane solution of Ir(mpptz-diBuCNp)$_3$ and that of Ir(mpptz-diPrp)$_3$) were prepared and a quartz cell was used. The absorption spectrum was measured at room temperature with the use of an ultraviolet-visible spectrophotometer (V-550, produced by JASCO Corporation) in a state where the dichloromethane solution was put in a quartz cell. The emission spectrum was measured at room temperature in such a manner that an absolute PL quantum yield measurement system (C11347-01 produced by Hamamatsu Photonics K. K.) was used and the deoxidized dichloromethane solution was sealed in a quartz cell under a nitrogen atmosphere in a glove box (LABstar M13 (1250/780) produced by Bright Co., Ltd.). Note that the absorption spectra in FIG. 45A are each a result obtained by subtraction of a measured absorption spectrum of only dichloromethane that was put in a quartz cell from the measured absorption spectrum of the dichloromethane solution in a quartz cell.

To measure an absorption spectrum and an emission spectrum of a thin film of each of the guest materials, a thin film was formed in which the guest material (Ir(mpptz-diBuCNp)$_3$ or Ir(mpptz-diPrp)$_3$) was dispersed in poly(m-ethylmethacrylate) (abbreviation: PMMA) such that the weight ratio of the guest material to PMMA was 0.01:1. The absorption spectra were measured using an ultraviolet-visible spectrophotometer (V-550, produced by JASCO Corporation). The emission spectra were measured at room temperature with the use of an absolute PL quantum yield measurement system (C11347-01 produced by Hamamatsu Photonics K. K.).

As can be seen from FIG. 45A, the dichloromethane solution of Ir(mpptz-diBuCNp)$_3$ exhibited blue light emission producing an emission peak at 502 nm, and the dichloromethane solution of Ir(mpptz-diPrp)$_3$ exhibited blue light emission producing an emission peak at 503 mm. The luminescence quantum yields of the dichloromethane solutions of Ir(mpptz-diBuCNp)$_3$ and Ir(mpptz-diPrp)$_3$ were found to be 92% and 93%, respectively.

As can be seen from FIG. 45B, the thin film of Ir(mpptz-diBuCNp)$_3$ exhibited blue light emission producing emission peaks at 486 nm and 505 nm, and the thin film of Ir(mpptz-diPrp)$_3$ exhibited blue light emission producing emission peaks at 474 nm and 502 nm.

Absorption bands on the lowest energy sides (the longest wavelength sides) of the absorption spectra of the dichloromethane solutions and the thin films of the guest materials (Ir(mpptz-diBuCNp)$_3$ and Ir(mpptz-diPrp)$_3$) are at around 450 nm. The absorption edges were calculated from data of the absorption spectra, and transition energies were estimated on the assumption of direct transition, so that the following results were obtained: the absorption edge of the absorption spectrum of Ir(mpptz-diBuCNp)$_3$ is at 478 nm and transition energy thereof is 2.59 eV, and the absorption edge of the absorption spectrum of Ir(mpptz-diPrp)$_3$ is at 471 nm and transition energy thereof is 2.63 eV.

Thus, an absorption band on the lowest energy side (the longest wavelength side) of the absorption spectrum of each of Ir(mpptz-diBuCNp)$_3$ and Ir(mpptz-diPrp)$_3$ has a region overlapping with light emission by an exciplex formed by 4,6mCzP2Pm and PCCP. Therefore, in the light-emitting element using 4,6mCzP2Pm and PCCP as host materials, excitation energy can be effectively transferred to the guest material.

Next, time-resolved emission measurement of the dichloromethane solutions of Ir(mpptz-diBuCNp)$_3$ and Ir(mpptz-diPrp)$_3$ was conducted.

A picosecond fluorescence lifetime measurement system (manufactured by Hamamatsu Photonics K.K.) was used for the measurement. In this measurement, the solution was irradiated with pulsed laser, and emission of the solution which was attenuated from the laser irradiation underwent time-resolved measurement using a streak camera to measure the lifetime of the emission of the solution. A nitrogen gas laser with a wavelength of 337 nm was used as the pulsed laser. The measurement was performed at room temperature (in an atmosphere kept at 23° C.).

According to the measurement results, the luminescence lifetimes of Ir(mpptz-diBuCNp)$_3$ and Ir(mpptz-diPrp)$_3$ were 1.4 μs and 2.0 μs, respectively.

<Characteristics of Light-Emitting Elements>

Figure 46:
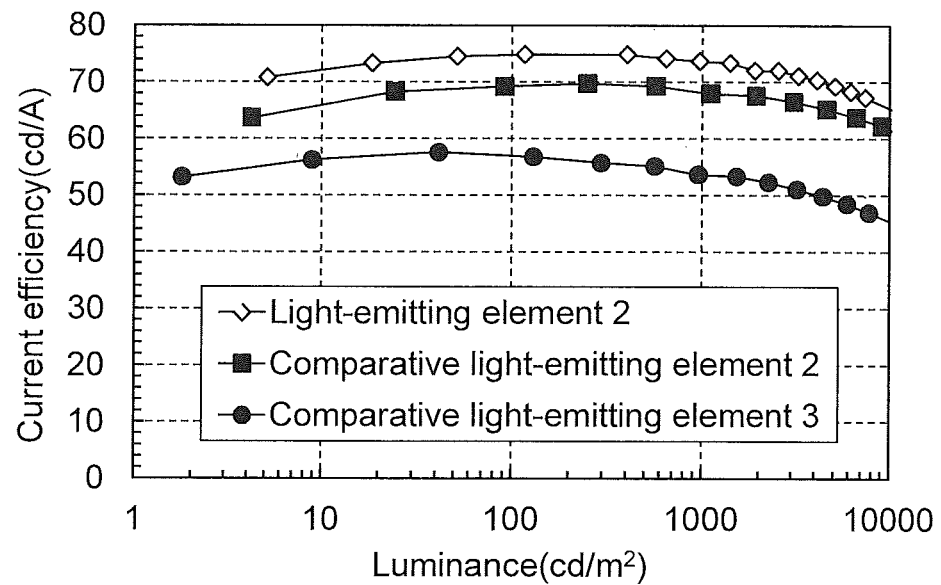
FIG. 46 is a graph showing current efficiency-luminance characteristics of light-emitting elements in Example.
Figure 47:
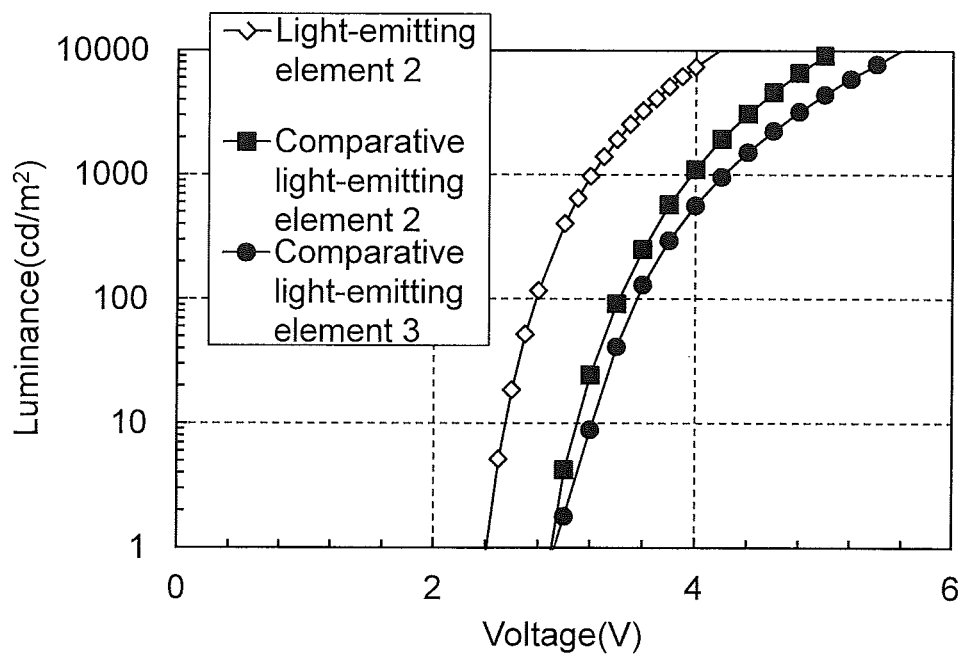
FIG. 47 is a graph showing luminance-voltage characteristics of light-emitting elements in Example.
Figure 48:
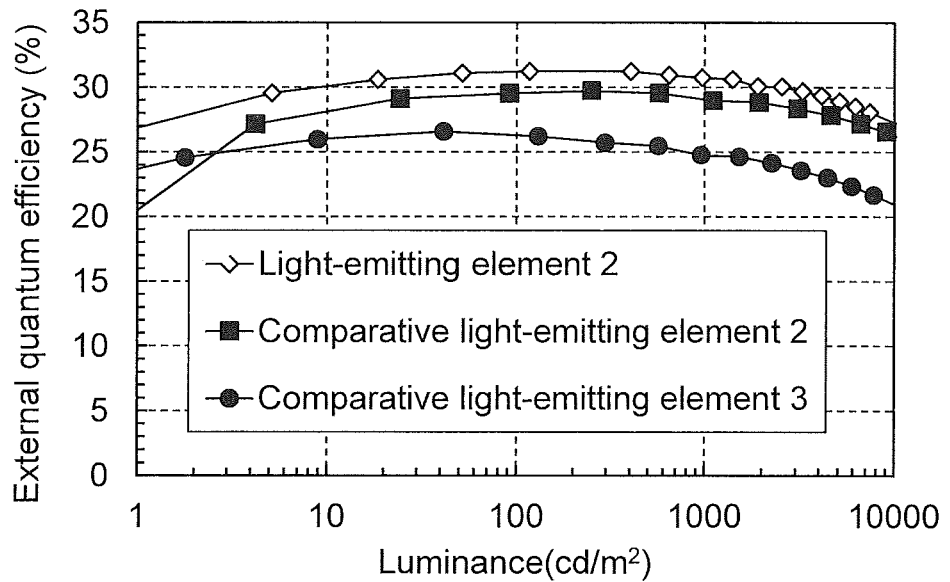
FIG. 48 is a graph showing external quantum efficiency-luminance characteristics of light-emitting elements in Example.
Figure 49:
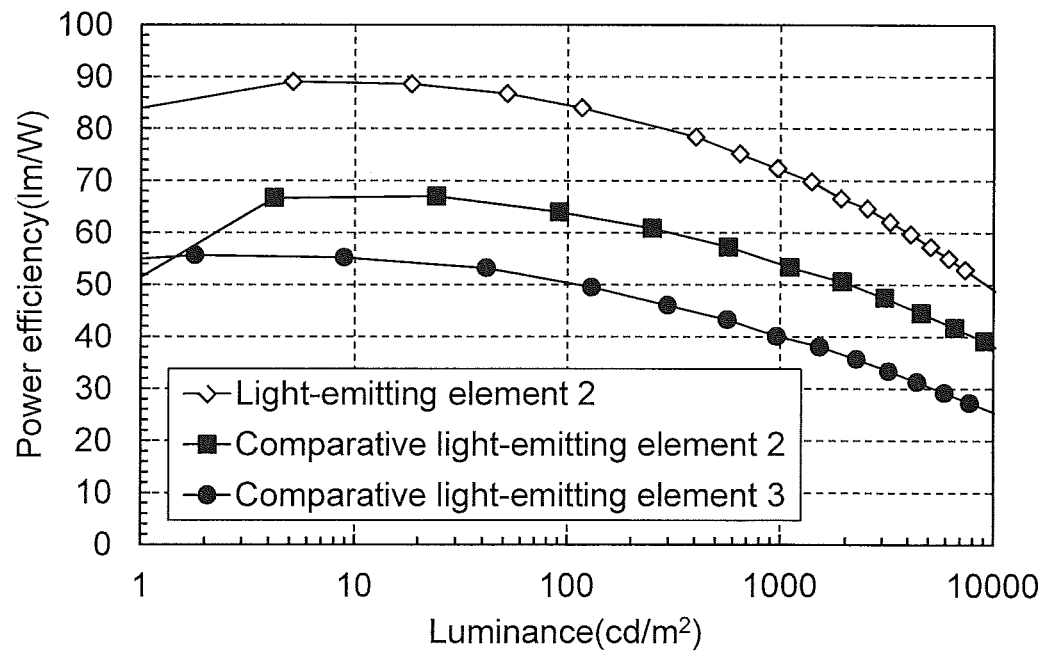
FIG. 49 is a graph showing power efficiency-luminance characteristics of light-emitting elements in Example.

FIG. 46 shows current efficiency-luminance characteristics of the light-emitting element 2 and the comparative light-emitting elements 2 and 3. FIG. 47 shows luminance-voltage characteristics. FIG. 48 shows external quantum efficiency-luminance characteristics. FIG. 49 shows power efficiency-luminance characteristics. Note that the measurement for the light-emitting elements was performed at room temperature (in an atmosphere kept at 23° C.) by a measurement method similar to that used in Example 1.

Table 5 shows the element characteristics of the light-emitting element 2 and the comparative light-emitting elements 2 and 3 at around 1000 cd/m².

TABLE 5

|  | Voltage (V) | Current density (mA/cm²) | CIE chromaticity (x, y) | Luminance (cd/m²) | Current efficiency (cd/A) | Power efficiency (lm/W) | External quantum efficiency (%) |
| --- | --- | --- | --- | --- | --- | --- | --- |
| Light-emitting element 2 | 3.2 | 1.3 | (0.18, 0.45) | 970 | 74 | 72 | 31 |
| Comparative light-emitting element 2 | 4.0 | 1.6 | (0.17, 0.41) | 1100 | 68 | 53 | 29 |
| Comparative light-emitting element 3 | 4.2 | 1.8 | (0.17, 0.35) | 960 | 54 | 40 | 25 |

Figure 50:
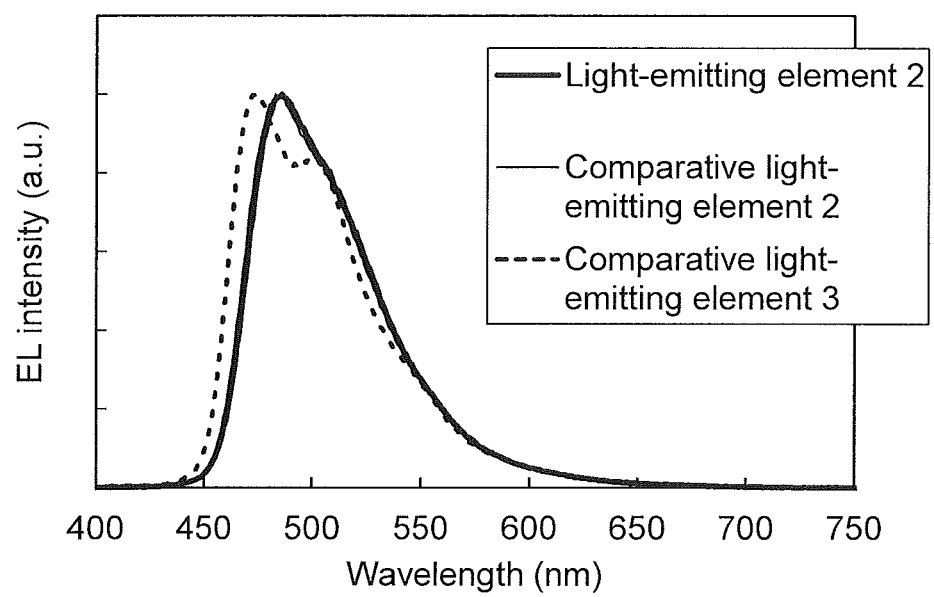
FIG. 50 is a graph showing electroluminescence spectra of light-emitting elements in Example.

FIG. 50 shows the electroluminescence spectra when a current at a current density of 2.5 mA/cm² was supplied to the light-emitting element 2 and the comparative light-emitting elements 2 and 3.

From FIG. 46 to FIG. 49 and Table 5, it is found that the light-emitting element 2 has higher current efficiency and higher external quantum efficiency than the comparative light-emitting elements 2 and 3. The maximum external quantum efficiency of the light-emitting element 2 is 31%, which is an excellent value. As shown in FIG. 50, the light-emitting element 2 emits blue light. The electroluminescence spectrum of the light-emitting element 2 has a peak at a wavelength of 486 nm and a full width at half maximum of 62 nm Therefore, with use of an iridium complex including, in a ligand, an aryl group including a cyano group as a guest material, a light-emitting element emitting blue light with high emission efficiency can be fabricated.

As shown in FIG. 46 to FIG. 49 and Table 5, the light-emitting element 2 was driven at a lower voltage than the comparative light-emitting elements 2 and 3. Thus, the light-emitting element 2 shows excellent power efficiency.

The light emission starting voltage (a voltage at the time when the luminance exceeds 1 cd/m²) of the light-emitting element 2 was 2.4 V. This voltage is smaller than a voltage corresponding to an energy difference between the LUMO level and the HOMO level of the guest material Ir(mpptz-diBuCNp)$_3$, which is described later. The results suggest that emission in the light-emitting element 2 is obtained not by direct recombination of carriers in the guest material but by recombination of carriers in the material having a smaller energy gap.

<Results of CV Measurement>

The electrochemical characteristics (oxidation reaction characteristics and reduction reaction characteristics) of the compounds used as the host materials (the first organic compound and the second organic compound) and the guest materials in the above-described light-emitting elements were measured by cyclic voltammetry (CV). Note that for the measurement, an electrochemical analyzer (ALS model 600A or 600C, produced by BAS Inc.) was used. In the measurement, the potential of a working electrode with respect to the reference electrode was changed within an appropriate range, so that the oxidation peak potential and the reduction peak potential were obtained. In addition, the HOMO and LUMO levels of each compound were calculated from the estimated redox potential of the reference electrode of −4.94 eV and the obtained peak potentials.

For the measurement of oxidation reaction characteristics and reduction reaction characteristics of the host material (35DCzPPy), a solution obtained by dissolving the host material in N,N-dimethylformamide (abbreviation: DMF) was used. In general, an organic compound used in an organic EL element has a refractive index of approximately 1.7 to 1.8 and its relative dielectric constant is approximately 3. When DMF, which is a high polarity solvent (relative dielectric constant: 38), is used for measurement of oxidation reaction characteristics of a compound including a substituent with a high polarity (in particular, with a high electron-withdrawing property) such as a cyano group, the accuracy might be decreased. For this reason, in this example, a solution obtained by dissolving the guest material (Ir(mpptz-diBuCNp)$_3$ or Ir(mpptz-diPrp)$_3$) in chloroform with a low polarity (relative dielectric constant: 4.8) was used for the measurement of oxidation reaction characteristics. For the measurement of reduction reaction characteristics of the guest material, a solution obtained by dissolving the guest material in DMF was used.

Table 6 shows oxidation potentials and reduction potentials of the compounds obtained from the results of the CV measurement and HOMO levels and LUMO levels of the compounds calculated from the CV measurement results. Note that the measurement results of the host materials PCCP and 4,6mCzP2Pm are shown in Table 3 in Example 1.

TABLE 6

| Material | Oxidation potential (V) | Reduction potential (V) | HOMO level calculated from oxidation potential (eV) | LUMO level calculated from reduction potential (eV) |
| --- | --- | --- | --- | --- |
| 35DCzPPy | 0.96 | −2.56 | −5.90 | −2.39 |
| Ir(mpptz-diBuCNp)$_3$ | 0.46 | −2.46 | −5.40 | −2.49 |
| Ir(mppfz-diPrp)$_3$ | 0.30 | −2.98 | −5.24 | −1.96 |

Figure 51A:
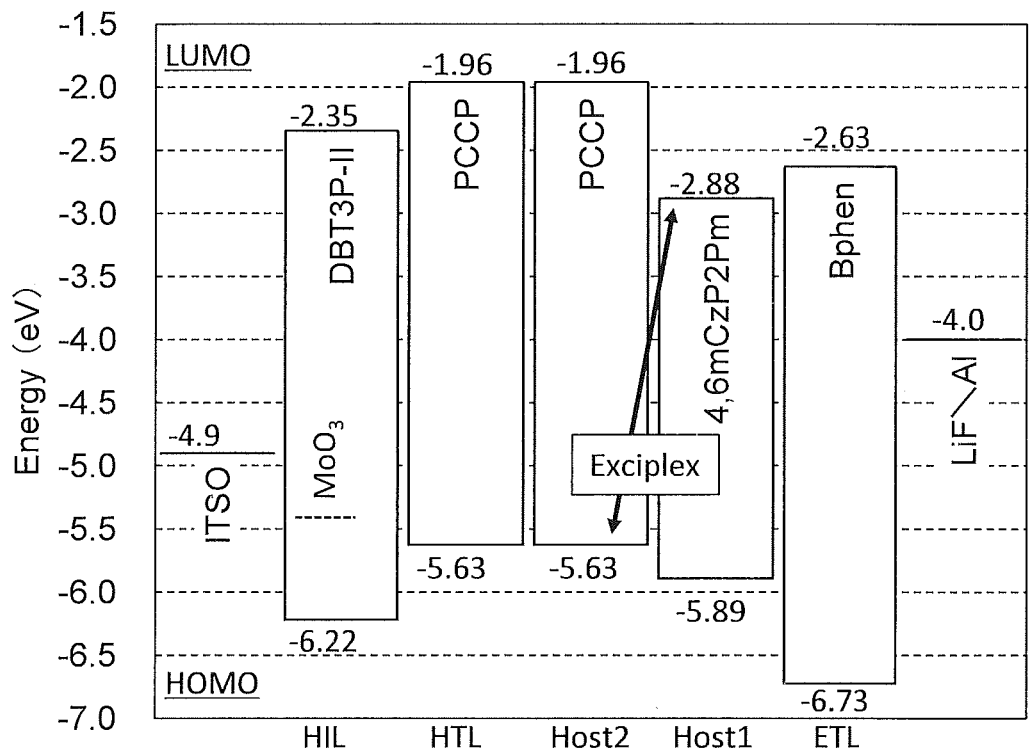
FIGS. 51A and 51B each show a correlation of energy bands in Example.
Figure 51B:
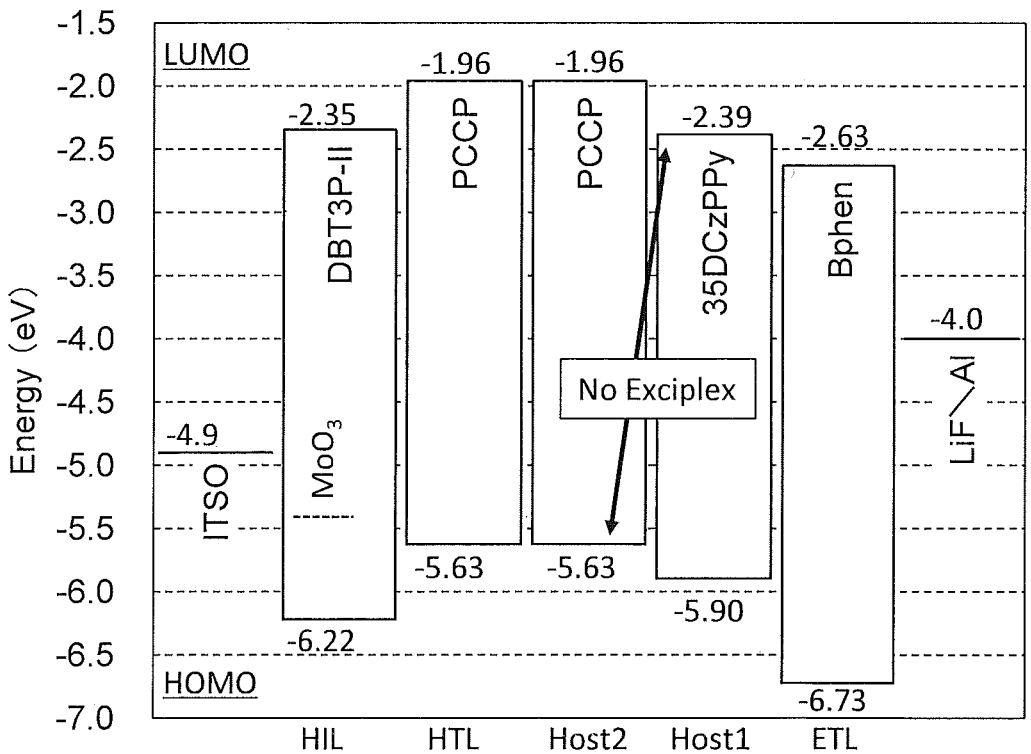

FIGS. 51A and 51B show the work functions of a pair of electrodes (ITSO and Al) and the LUMO and HOMO levels of the compounds contained in the light-emitting element 2 and the comparative light-emitting element 2 and 3. The LUMO and HOMO levels were estimated from CV measurement similar to the above CV measurement. Note that FIG. 51A shows correlation of energy bands in the light-emitting element 2, and FIG. 51B shows correlation of energy bands in the comparative light-emitting element 2 and the comparative light-emitting element 3. The work functions of the pair of electrodes were measured by photoelectron spectroscopy using "AC-2" produced by Riken Keiki Co., Ltd. in the air. In FIGS. 51A and 51B, HIL, HTL, ETL, Host1, and Host2 represent the hole-injection layer, the hole-transport layer, the electron-transport layer, the first organic compound, and the second organic compound.

As shown in Table 3 and Table 6, in the light-emitting element 2, the reduction potential of the first organic compound (4,6mCzP2Pm) is higher than that of the second organic compound (PCCP), the oxidation potential of the first organic compound (4,6mCzP2Pm) is higher than that of the second organic compound (PCCP), the reduction potential of the guest material (Ir(mpptz-diBuCNp)$_3$) is lower than that of the first organic compound (4,6mCzP2Pm), and the oxidation potential of the guest material (Ir(mpptz-diBuCNp)$_3$) is lower than that of the second organic compound (PCCP). In addition, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). The LUMO level of the guest material (Ir(mpptz-diBuCNp)$_3$) is higher than that of the first organic compound (4,6mCzP2Pm), and the HOMO level of the guest material (Ir(mpptz-diBuCNp)$_3$) is higher than that of the second organic compound (PCCP).

An energy difference between the LUMO level and the HOMO level of Ir(mpptz-diBuCNp)$_3$ was 2.91 eV and that of Ir(mpptz-diPrp)$_3$ was 3.28 eV. These values were calculated from the CV measurement results shown in Table 6.

As described above, the transition energies of Ir(mpptz-diBuCNp)$_3$ and Ir(mpptz-diPrp)$_3$ that were calculated from the absorption edges of the absorption spectra are 2.59 eV and 2.63 eV, respectively.

That is, the energy difference between the LUMO level and the HOMO level of Ir(mpptz-diBuCNp)$_3$ is larger than the transition energy thereof calculated from the absorption edge by 0.32 eV. The energy difference between the LUMO level and the HOMO level of Ir(mpptz-diPrp)$_3$ is larger than the transition energy thereof calculated from the absorption edge by 0.65 eV.

The peak wavelengths on the shortest wavelength sides of the electroluminescence spectra of the light-emitting element 2 and the comparative light-emitting element 2 in FIG. 50 are 486 nm and 474 nm, respectively. According to that, the light emission energy of Ir(mpptz-diBuCNp)$_3$ was calculated to be 2.55 eV and that of Ir(mpptz-diPrp)$_3$ was calculated to be 2.61 eV.

That is, the energy difference between the LUMO level and the HOMO level of Ir(mpptz-diBuCNp)$_3$ was larger than the light emission energy by 0.36 eV, and the energy difference between the LUMO level and the HOMO level of Ir(mpptz-diPrp)$_3$ was larger than the light emission energy by 0.67 eV.

Consequently, in each of the guest materials of the light-emitting elements, the energy difference between the LUMO level and the HOMO level is larger than the transition energy calculated from the absorption edge by 0.3 eV or more. In addition, the energy difference between the LUMO level and the HOMO level is larger than the light emission energy by 0.3 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element 2 that is one embodiment of the present invention, the guest material can be excited by energy transfer from an exciplex without the direct carrier recombination in the guest material, whereby the driving voltage can be lowered. Therefore, the light-emitting element of one embodiment of the present invention can have reduced power consumption.

Note that an energy difference between the LUMO level of the first organic compound (4,6mCzP2Pm) and the HOMO level of the second organic compound (PCCP) (4,6mCzP2Pm and PCCP are the host materials) was calculated to be 2.75 eV from Table 3. Consequently, energy corresponding to the energy difference between the LUMO level and the HOMO level of an exciplex formed by the host materials is smaller than the energy difference between the LUMO level and the HOMO level (2.91 eV) of the guest material (Ir(mpptz-diBuCNp)$_3$), and larger than the transition energy (2.59 eV) calculated from the absorption edge of the absorption spectrum of the guest material (Ir(mpptz-diBuCNp)$_3$). Therefore, in the light-emitting element 2, the guest material can be excited through the exciplex, whereby the driving voltage can be lowered. Therefore, the light-emitting element of one embodiment of the present invention can have reduced power consumption.

<Results of Reliability Test>

Figure 52:
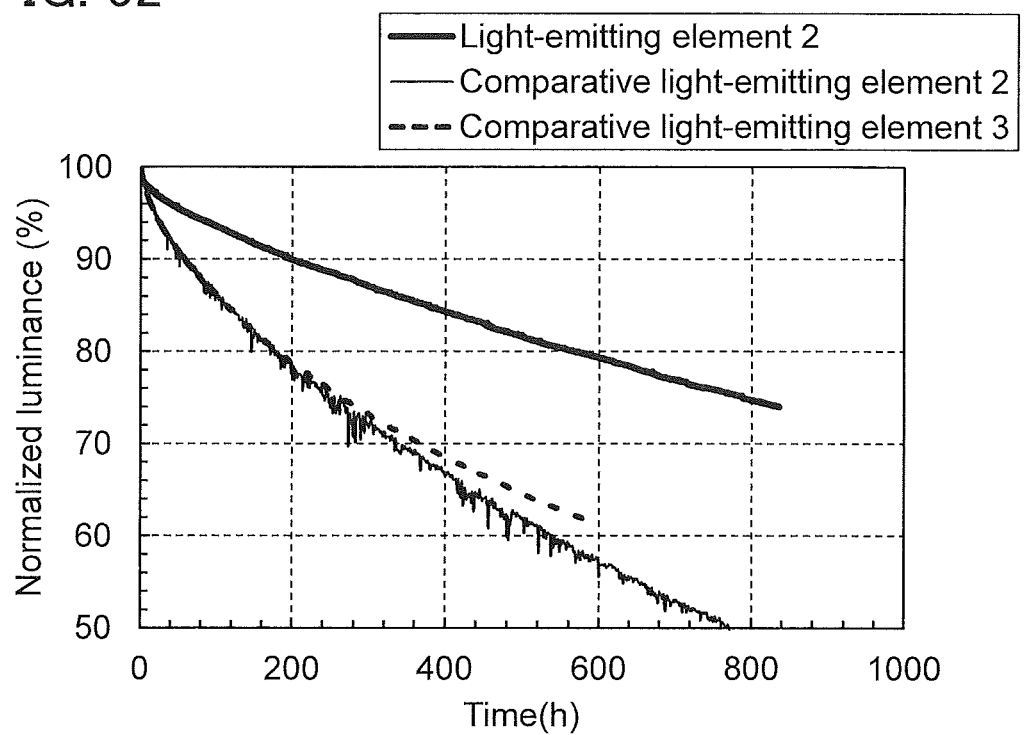
FIG. 52 is a graph showing reliability test results of light-emitting elements in Example.

FIG. 52 shows the results of reliability tests of the light-emitting element 2 and the comparative light-emitting elements 2 and 3. For the reliability test, to set the initial luminance of the light-emitting elements to 1000 cd/m$^2$, the current densities of the light-emitting element 2, the comparative light-emitting element 2, and the comparative light-emitting element 3 were respectively set to 1.4 mA/cm$^2$, 1.5 mA/cm$^2$, and 1.9 mA/cm$^2$, and the light-emitting elements were continuously driven at a constant current density.

The time (LT90) taken for the luminance of the light-emitting element 2, the comparative light-emitting element 2, and the comparative light-emitting element 3 to decrease to 90% of the initial luminance was as follows: the light-emitting element 2, 200 hours; the comparative light-emitting element 2, 60 hours; and the comparative light-emitting element 3, 57 hours. In particular, the light-emitting element 2 shows high reliability.

That is, a light-emitting element having the following structure like the light-emitting element 2 can emit blue light with high emission efficiency with low driving voltage and have excellent reliability: the LUMO level of the first organic compound is lower than that of the second organic compound, the HOMO level of the first organic compound is lower than that of the second organic compound, the LUMO level of the guest material is higher than that of the first organic compound, the HOMO level of the guest material is higher than that of the second organic compound, and the first organic compound and the second organic compound form an exciplex in combination with each other.

As described above, by employing the structure of one embodiment of the present invention, a light-emitting element having high emission efficiency can be manufactured. A light-emitting element with reduced power consumption can be manufactured. A highly reliable light-emitting element can be manufactured. A highly reliable light-emitting element emitting blue light and having high emission efficiency can be manufactured.

The structure described in this example can be used in combination with any of the other examples and embodiments as appropriate.

Example 3

In this example, examples of fabricating light-emitting elements of embodiments of the present invention (a light-emitting element 3 and a light-emitting element 6) are described. A schematic cross-sectional view of the light-emitting elements fabricated in this example is similar to that shown in FIG. 34. Table 7 shows details of the element structures. In addition, structures and abbreviations of compounds used here are given below. Note that the above example can be referred to for other compounds.

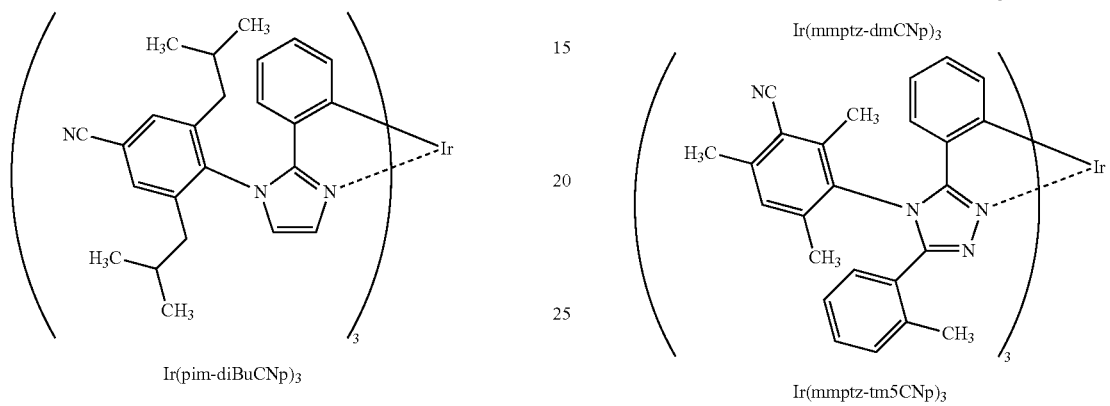

Ir(pim-diBuCNp)₃

Ir(mmptz-dmCNp)₃

Ir(mmptz-tm5CNp)₃

TABLE 7

| | Layer | Reference numeral | Thickness (nm) | Material | Weight ratio |
|---|---|---|---|---|---|
| Light-emitting element 3 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(pim-diBuCNp)₃ | 0.6:0.4:0.125 |
| | | 160(1) | 30 | 4,6mCzP2Pm:PCCP:Ir(pim-diBuCNp)₃ | 0.2:0.8:0.125 |
| | Hole-transport layer | 112 | 20 | PCCP | — |
| | Hole-injection layer | 111 | 20 | DBT3P-II:MoO₃ | 1:0.5 |
| | Electrode | 101 | 70 | ITSO | — |
| Light-emitting element 4 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 35DCzPPy | — |
| | Light-emitting layer | 160 | 40 | 35DCzPPy:PCCP:Ir(pim-diBuCNp)₃ | 0.6:0.4:0.125 |
| | Hole-transport layer | 112 | 20 | PCCP | — |
| | Hole-injection layer | 111 | 20 | DBT3P-II:MoO₃ | 1:0.5 |
| | Electrode | 101 | 70 | ITSO | — |

TABLE 7-continued

| Layer | | Reference numeral | Thickness (nm) | Material | Weight ratio |
|---|---|---|---|---|---|
| Light-emitting element 5 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(mpptz-dmCNp)₃ | 0.8:0.2:0.125 |
| | | 160(1) | 30 | 4,6mCzP2Pm:PCCP:Ir(mpptz-dmCNp)₃ | 0.4:0.6:0.125 |
| | Hole-transport layer | 112 | 20 | PCCP | — |
| | Hole-injection layer | 111 | 20 | DBT3P-II:MoO₃ | 1:0.5 |
| | Electrode | 101 | 70 | ITSO | — |
| Light-emitting element 6 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(mpptz-tm5CNp)₃ | 0.8:0.2:0.125 |
| | | 160(1) | 30 | 4,6mCzP2Pm:PCCP:Ir(mpptz-tm5CNp)₃ | 0.6:0.4:0.125 |
| | Hole-transport layer | 112 | 20 | PCCP | — |
| | Hole-injection layer | 111 | 20 | DBT3P-II:MoO₃ | 1:0.5 |
| | Electrode | 101 | 70 | ITSO | — |

<Fabrication of Light-Emitting Elements>
<<Fabrication of Light-Emitting Element 3>>

As the electrode 101, an ITSO film was formed to a thickness of 70 nm over the substrate 200. The electrode area of the electrode 101 was set to 4 mm² (2 mm×2 mm).

As the hole-injection layer 111, DBT3P-II and MoO₃ were deposited over the electrode 101 by co-evaporation in a weight ratio of DBT3P-II:MoO₃=1:0.5 to a thickness of 20 nm.

As the hole-transport layer 112, PCCP was deposited over the hole-injection layer 111 by evaporation to a thickness of 20 nm.

As the light-emitting layer 160 over the hole-transport layer 112, 4,6mCzP2Pm, PCCP, and Ir(pim-diBuCNp)₃ were deposited by co-evaporation in a weight ratio of 4,6mCzP2Pm:PCCP:Ir(pim-diBuCNp)₃=0.2:0.8:0.125 to a thickness of 30 nm, and successively, 4,6mCzP2Pm, PCCP, and Ir(pim-diBuCNp)₃ were deposited by co-evaporation in a weight ratio of 4,6mCzP2Pm:PCCP: Ir(pim-diBuCNp)₃=0.6:0.4:0.125 to a thickness of 10 nm. Note that in the light-emitting layer 160, 4,6mCzP2Pm corresponds to the first organic compound, PCCP corresponds to the second organic compound, and Ir(pim-diBuCNp)₃ corresponds to the guest material (the phosphorescent material).

As the electron-transport layer 118, 4,6mCzP2Pm and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm. As the electrode 102, aluminum (Al) was deposited over the electron-injection layer 119 to a thickness of 200 nm.

Next, in a glove box containing a nitrogen atmosphere, the light-emitting element 3 was sealed by fixing the substrate 220 to the substrate 200 over which the organic materials were deposited using a sealant for an organic EL device. For the detailed method, description of the light-emitting element 1 can be referred to. Through the above steps, the light-emitting element 3 was obtained.

<<Fabrication of Light-Emitting Element 4>>

The light-emitting element 4 was fabricated through the same steps as those for the light-emitting element 3 except for the steps of forming the light-emitting layer 160 and the electron-transport layer 118.

As the light-emitting layer 160 of the light-emitting element 4, 35DCzPPy, PCCP, and Ir(pim-diBuCNp)₃ were deposited by co-evaporation in a weight ratio of 35DCzPPy: PCCP: Ir(pim-diBuCNp)₃=0.6:0.4:0.125 to a thickness of 40 nm. Note that in the light-emitting layer 160, 35DCzPPy corresponds to the first organic compound, PCCP corresponds to the second organic compound, and Ir(pim-diBuCNp)₃ corresponds to the guest material (the phosphorescent material).

As the electron-transport layer 118, 35DCzPPy and BPhen were sequentially deposited by evaporation to thicknesses of 10 nm and 15 nm, respectively, over the light-emitting layer 160.

<<Fabrication of Light-Emitting Element 5>>

The light-emitting element 5 was fabricated through the same steps as those for the light-emitting element 3 except for the step of forming the light-emitting layer 160.

As the light-emitting layer 160 in the light-emitting element 5, 4,6mCzP2Pm, PCCP, and Ir(mpptz-dmCNp)₃ were deposited by co-evaporation in a weight ratio of 4,6mCzP2Pm:PCCP:Ir(mpptz-dmCNp)₃=0.4:0.6:0.125 to a thickness of 30 nm, and successively, 4,6mCzP2Pm, PCCP, and Ir(mpptz-dmCNp)₃ were deposited by co-evaporation in a weight ratio of 4,6mCzP2Pm:PCCP: Ir(mpptz-dmCNp)₃=0.8:0.2:0.125 to a thickness of 10 nm. Note that in the light-emitting layer 160, 4,6mCzP2Pm corresponds to the first organic compound, PCCP corresponds to the second organic compound, and Ir(mpptz-dmCNp)₃ corresponds to the guest material (the phosphorescent material).

<<Fabrication of Light-Emitting Element 6>>

The light-emitting element 6 was fabricated through the same steps as those for the light-emitting element 3 except for the step of forming the light-emitting layer 160.

As the light-emitting layer 160 in the light-emitting element 6, 4,6mCzP2Pm, PCCP, and Ir(mpptz-tm5CNp)₃ were deposited by co-evaporation in a weight ratio of 4,6mCzP2Pm:PCCP:Ir(mpptz-tm5CNp)₃=0.6:0.4:0.125 to a thickness of 30 nm, and successively, 4,6mCzP2Pm, PCCP, and Ir(mpptz-tm5CNp)₃ were deposited by co-evaporation in a weight ratio of 4,6mCzP2Pm:PCCP: Ir(mpptz-tm5CNp)₃=0.8:0.2:0.125 to a thickness of 10 nm. Note that in the light-emitting layer 160, 4,6mCzP2Pm corresponds to the first organic compound, PCCP corresponds to the second organic compound, and Ir(mpptz-tm5CNp)₃ corresponds to the guest material (the phosphorescent material).

<Absorption Spectra and Emission Spectra of Guest Materials>

Figure 53:
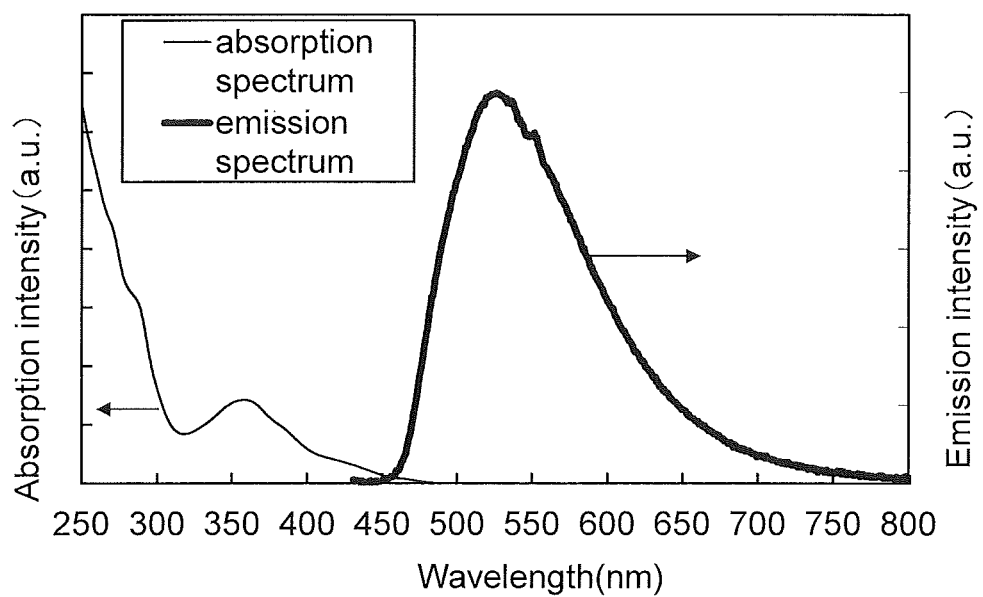
FIG. 53 is a graph showing absorption and emission spectra of a guest material in Example.
Figure 54:
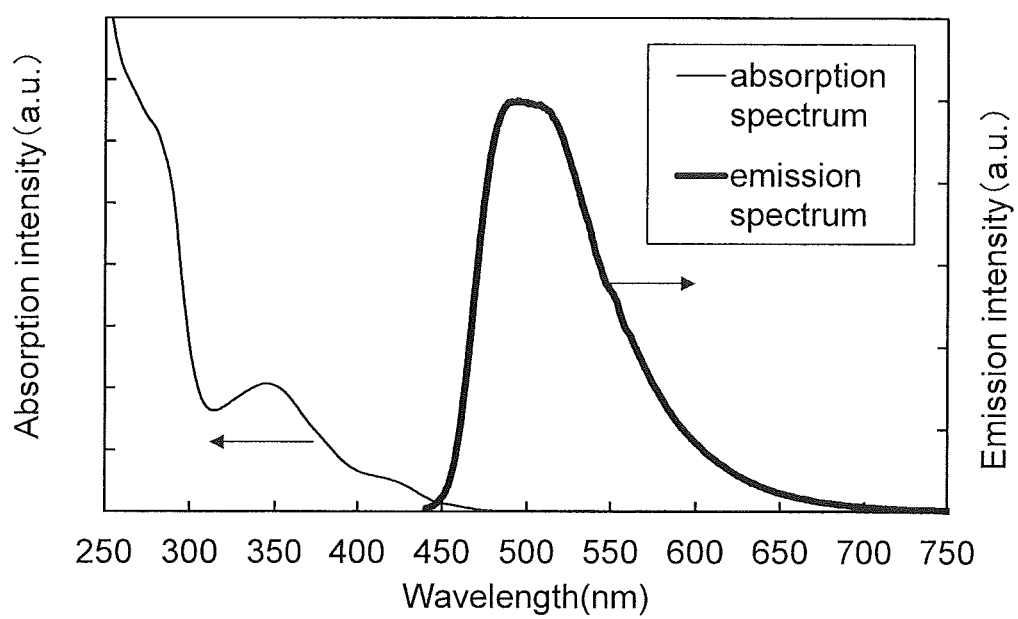
FIG. 54 is a graph showing absorption and emission spectra of a guest material in Example.
Figure 55:
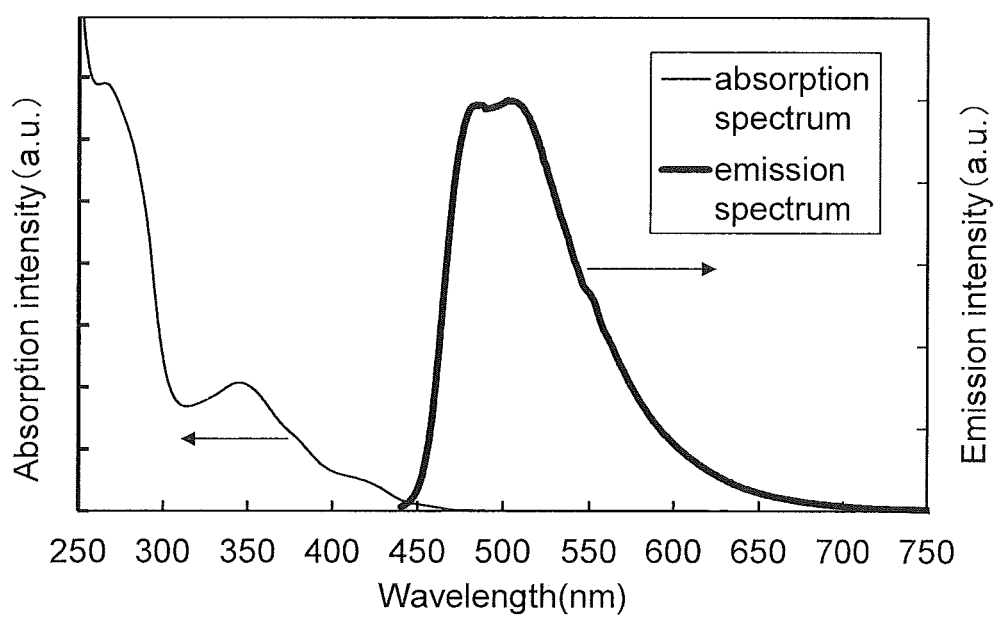
FIG. 55 is a graph showing absorption and emission spectra of a guest material in Example

FIG. 53, FIG. 54, and FIG. 55 show the measurement results of the absorption spectra and the emission spectra of solutions of the guest materials Ir(pim-diBuCNp)₃, Ir(mpptz-dmCNp)₃, and Ir(mpptz-tm5CNp)₃, respectively.

For the measurement of absorption spectra and emission spectra, dichloromethane solutions of the guest materials (Ir(pim-diBuCNp)₃, Ir(mpptz-dmCNp)₃, and Ir(mpptz-tm5CNp)₃) were prepared and a quartz cell was used. The absorption spectrum was measured at room temperature with the use of an ultraviolet-visible spectrophotometer (V-550, produced by JASCO Corporation) in a state where the dichloromethane solution was put in a quartz cell. The emission spectrum was measured at room temperature in such a manner that an absolute PL quantum yield measurement system (C11347-01 produced by Hamamatsu Photonics K. K.) was used and the deoxidized dichloromethane solution was sealed in a quartz cell under a nitrogen atmosphere in a glove box (LABstar M13 (1250/780) produced by Bright Co., Ltd.). Note that the absorption spectra in FIGS. 53 to 55 are each a result obtained by subtraction of a measured absorption spectrum of only dichloromethane that was put in a quartz cell from the measured absorption spectrum of the dichloromethane solution in a quartz cell.

As can be seen from FIGS. 53 to 55, the dichloromethane solution of Ir(pim-diBuCNp)₃ exhibited green light emission producing an emission peak at 526 nm, the dichloromethane solution of Ir(mpptz-dmCNp)₃ exhibited blue light emission producing an emission peak at 494 nm, and the dichloromethane solution of Ir(mpptz-tm5CNp)₃ exhibited blue green light emission producing emission peaks at 484 nm and 502 nm.

Absorption bands on the lowest energy sides (the longest wavelength sides) of the absorption spectra of the dichloromethane solutions of the guest materials (Ir(pim-diBuCNp)₃, Ir(mpptz-dmCNp)₃, and Ir(mpptz-tm5CNp)₃) are at around 460 nm. The absorption edges were calculated from data of the absorption spectra, and transition energies were estimated on the assumption of direct transition, so that the following results were obtained: the absorption edge of the absorption spectrum of Iffpim-diBuCNp)₃ is at 484 nm and transition energy thereof is 2.56 eV, the absorption edge of the absorption spectrum of Ir(mpptz-dmCNp)₃ is at 475 nm and transition energy thereof is 2.61 eV, and the absorption edge of the absorption spectrum of Ir(mpptz-tm5CNp)₃ is at 474 nm and transition energy thereof is 2.62 eV.

Thus, an absorption band on the lowest energy side (the longest wavelength side) of the absorption spectrum of each of Ir(pim-diBuCNp)₃, Ir(mpptz-dmCNp)₃, and Ir(mpptz-tm5CNp)₃ has a region overlapping with light emission by an exciplex formed by 4,6mCzP2Pm and PCCP. Therefore, in the light-emitting element using 4,6mCzP2Pm and PCCP as host materials, excitation energy can be effectively transferred to the guest material.

As shown in the above example, the triplet excitation energy level (T1 level) of the first organic compound (4,6mCzP2Pm) is 2.70 eV and that of the second organic compound (PCCP) is 2.66 eV. Each triplet excitation energy level (T1 level) is higher than the transition energy which is calculated from the absorption edge of the absorption spectrum of the guest material. Therefore, the first organic compound (4,6mCzP2Pm) and the second organic compound (PCCP), which were used as the host materials, have triplet excitation energy levels (T1 levels) high enough for host materials.

<Characteristics of Light-Emitting Elements>

Figure 56:
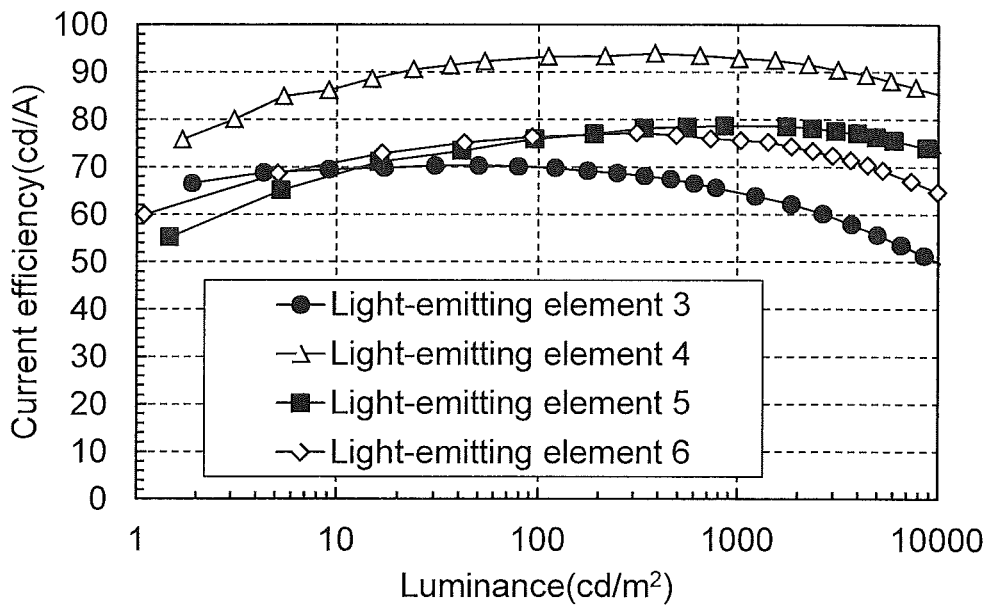
FIG. 56 is a graph showing current efficiency-luminance characteristics of light-emitting elements in Example.
Figure 57:
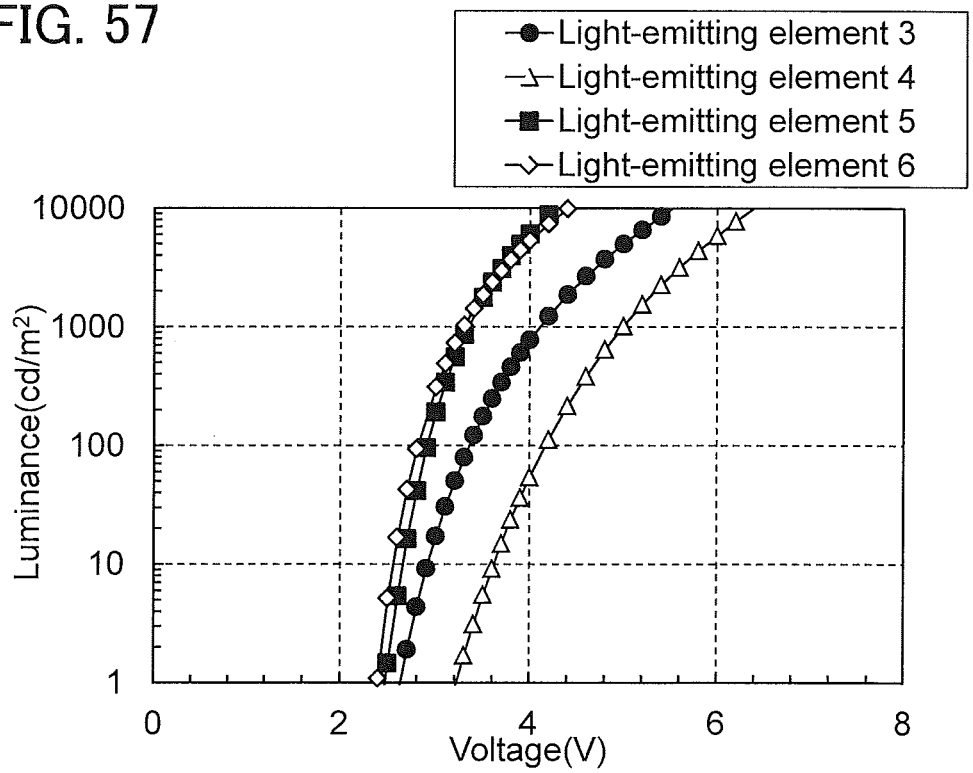
FIG. 57 is a graph showing luminance-voltage characteristics of light-emitting elements in Example.
Figure 58:
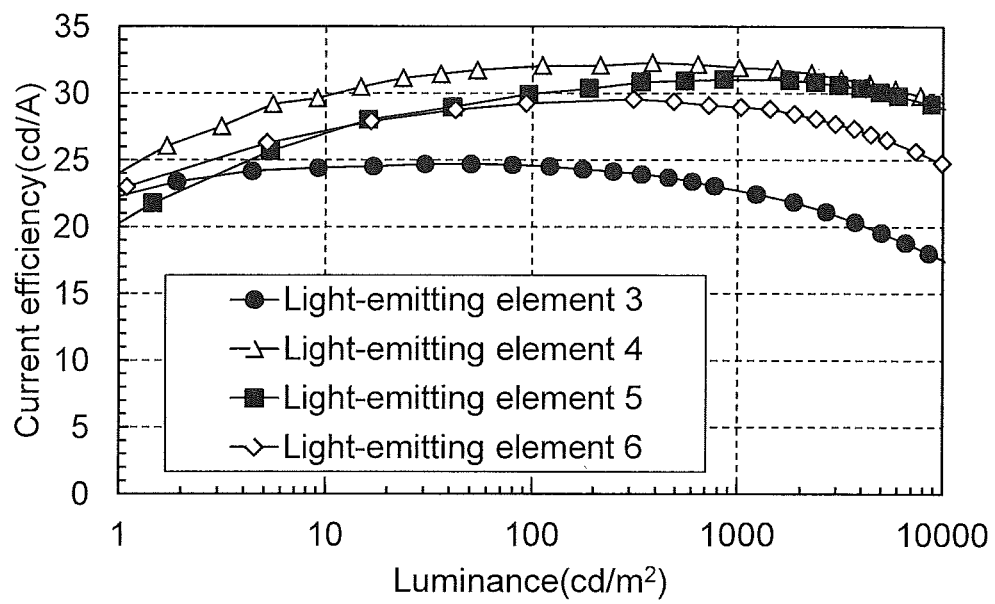
FIG. 58 is a graph showing external quantum efficiency-luminance characteristics of light-emitting elements in Example.
Figure 59:
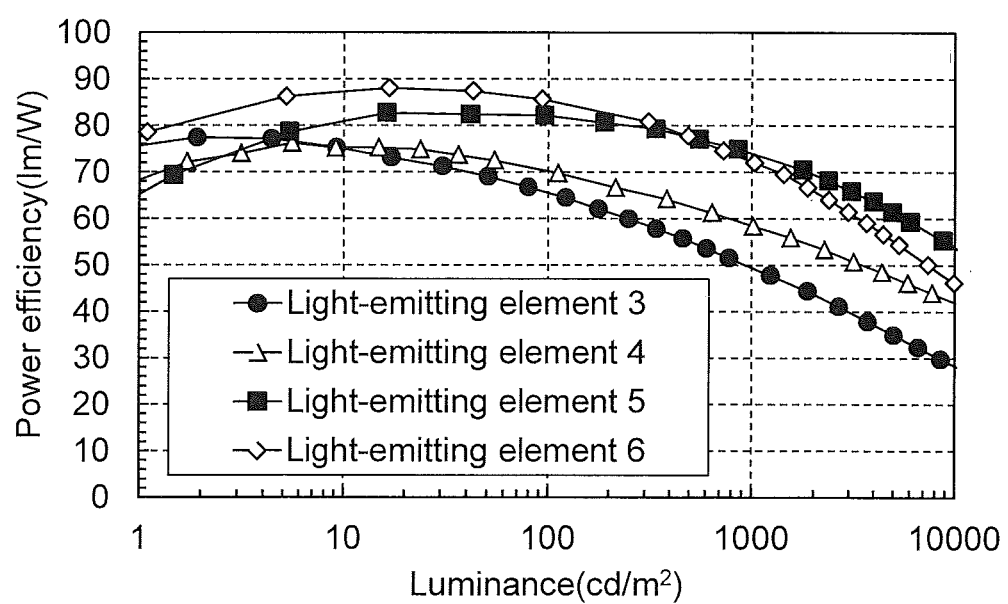
FIG. 59 is a graph showing power efficiency-luminance characteristics of light-emitting elements in Example.
Figure 60:
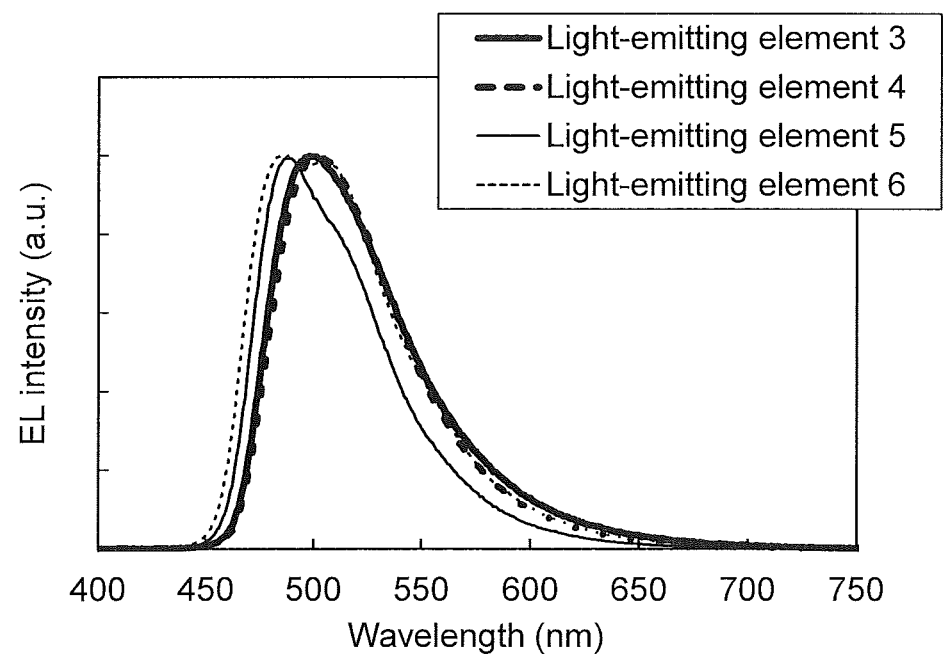
FIG. 60 is a graph showing electroluminescence spectra of light-emitting elements in Example.

FIG. 56 shows current efficiency-luminance characteristics of the light-emitting elements 3 to 6. FIG. 57 shows luminance-voltage characteristics. FIG. 58 shows external quantum efficiency-luminance characteristics. FIG. 59 shows power efficiency-luminance characteristics. Note that the measurement for the light-emitting elements was performed at room temperature (in an atmosphere kept at 23° C.) by a measurement method similar to that used in Example 1. FIG. 60 shows electroluminescence spectra when a current at a current density of 2.5 mA/cm² was supplied to the light-emitting elements 3 to 6.

Table 8 shows the element characteristics of the light-emitting elements 3 to 6 at around 1000 cd/m².

TABLE 8

|  | Voltage (V) | Current density (mA/cm²) | CIE chromaticity (x, y) | Luminance (cd/m²) | Current efficiency (cd/A) | Power efficiency (lm/W) | External quantum efficiency (%) |
| --- | --- | --- | --- | --- | --- | --- | --- |
| Light-emitting element 3 | 4.0 | 1.2 | (0.23, 0.55) | 780 | 66 | 52 | 23 |
| Light-emitting element 4 | 5.0 | 1.1 | (0.23, 0.57) | 1000 | 93 | 58 | 32 |
| Light-emitting element 5 | 3.3 | 1.1 | (0.21, 0.50) | 860 | 79 | 75 | 31 |
| Light-emitting element 6 | 3.3 | 1.4 | (0.21, 0.48) | 1000 | 76 | 72 | 29 |

From FIGS. 56 to 59 and Table 8, it is found that the light-emitting elements 3 to 6 have high emission efficiency (current efficiency and external quantum efficiency). The maximum external quantum efficiencies of the light-emitting elements 3, 4, 5, and 6 are 25%, 32%, 31%, and 30%, which are excellent values.

As shown in FIG. 60, the light-emitting elements 3, 4, 5, and 6 emit blue light. The electroluminescence spectra of the light-emitting elements 3, 4, 5, and 6 have peaks at wavelengths of 498 nm, 502 nm, 488 nm, and 485 nm and full widths at half maximum of 70 nm, 67 nm, 64 nm, and 77 nm.

As shown in FIGS. 56 to 59 and Table 8, the light-emitting elements 3, 5, and 6 were driven at a lower voltage than the light-emitting element 4.

<Results of CV Measurement>

The electrochemical characteristics (oxidation reaction characteristics and reduction reaction characteristics) of the compounds used as the guest materials in the above-described light-emitting elements were measured by cyclic voltammetry (CV). Note that for the measurement, an electrochemical analyzer (ALS model 600A or 600C, produced by BAS Inc.) was used. In the measurement, the potential of a working electrode with respect to the reference electrode was changed within an appropriate range, so that the oxidation peak potential and the reduction peak potential were obtained. In addition, the HOMO and LUMO levels of each compound were calculated from the estimated redox potential of the reference electrode of −4.94 eV and the obtained peak potentials.

In this example, a solution obtained by dissolving the guest material in chloroform was used for the measurement of oxidation reaction characteristics, and a solution obtained by dissolving the guest material in DMF was used for the measurement of reduction reaction characteristics.

Table 9 shows oxidation potentials and reduction potentials of the compounds obtained from the results of the CV measurement and HOMO levels and LUMO levels of the compounds calculated from the CV measurement results. Note that the measurement results of the host materials PCCP and 4,6mCzP2Pm are shown in Table 3 in Example 1.

TABLE 9

| Material | Oxidation potential (V) | Reduction potential (V) | HOMO level calculated from oxidation potential (eV) | LUMO level calculated from reduction potential (eV) |
|---|---|---|---|---|
| Ir(pim-diBuCNp)$_3$ | 0.28 | −2.54 | −5.22 | −2.41 |
| Ir(mpptz-dmCNp)$_3$ | 0.48 | −2.44 | −5.42 | −2.51 |
| Ir(mpptz-tm5CNp)$_3$ | 0.46 | −2.58 | −5.40 | −2.37 |

As shown in Table 3 and Table 9, in the light-emitting elements 3, 5, and 6, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). The LUMO level of each of the guest materials (Ir(pim-diBuCNp)$_3$, Ir(mpptz-dmCNp)$_3$, and Ir(mpptz-tm5CNp)$_3$) is higher than that of the first organic compound (4,6mCzP2Pm), and the HOMO level of each of the guest materials (Ir(pim-diBuCNp)$_3$, Ir(mpptz-dmCNp)$_3$, and Ir(mpptz-tm5CNp)$_3$) is higher than that of the second organic compound (PCCP).

An energy difference between the LUMO level and the HOMO level of Ir(pim-diBuCNp)$_3$ was 2.81 eV, that of Ir(mpptz-dmCNp)$_3$ was 2.91 eV, and that of Ir(mpptz-tm5CNp)$_3$ was 3.03 eV. These values were calculated from the CV measurement results.

That is, the energy difference between the LUMO level and the HOMO level of Ir(pim-diBuCNp)$_3$ is larger than the transition energy thereof calculated from the absorption edge by 0.25 eV. The energy difference between the LUMO level and the HOMO level of Ir(mpptz-dmCNp)$_3$ is larger than the transition energy thereof calculated from the absorption edge by 0.30 eV. The energy difference between the LUMO level and the HOMO level of Ir(mpptz-tm5CNp)$_3$ is larger than the transition energy thereof calculated from the absorption edge by 0.41 eV.

The peak wavelengths on the shortest wavelength sides of the electroluminescence spectra of the light-emitting elements 3, 5, and 6 in FIG. 60 are 498 nm, 488 nm, and 485 nm, respectively. According to that, the light emission energies of Ir(pim-diBuCNp)$_3$, Ir(mpptz-dmCNp)$_3$, and Ir(mpptz-tm5CNp)$_3$ were calculated to be 2.49 eV, 2.54 eV, and 2.56 eV, respectively.

That is, the energy difference between the LUMO level and the HOMO level of Ir(pim-diBuCNp)$_3$ was larger than the light emission energy by 0.32 eV, the energy difference between the LUMO level and the HOMO level of Ir(mpptz-dmCNp)$_3$ was larger than the light emission energy by 0.37 eV, and the energy difference between the LUMO level and the HOMO level of Ir(mpptz-tm5CNp)$_3$ was larger than the light emission energy by 0.47 eV.

Consequently, in each of the guest materials of the light-emitting elements, the energy difference between the LUMO level and the HOMO level is larger than the transition energy calculated from the absorption edge. In addition, the energy difference between the LUMO level and the HOMO level is larger than the light emission energy by 0.3 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention can have reduced power consumption.

Note that an energy difference between the LUMO level of the first organic compound (4,6mCzP2Pm) and the HOMO level of the second organic compound (PCCP) (4,6mCzP2Pm and PCCP are the host materials) in the light-emitting elements 3, 5, and 6 was calculated to be 2.75 eV from Table 3. Consequently, energy corresponding to the energy difference between the LUMO level and the HOMO level of an exciplex formed by the host materials in the light-emitting elements 3, 5, and 6 is smaller than the energy difference between the LUMO level and the HOMO level of the guest material (2.81 eV for Ir(pim-diBuCNp)$_3$, 2.91 eV for Ir(mpptz-dmCNp)$_3$, and 3.03 eV for Ir(mpptz-tm5CNp)$_3$), and larger than the transition energy calculated from the absorption edge of the absorption spectrum of the guest material (2.56 eV for Ir(pim-diBuCNp)$_3$, 2.61 eV for Ir(mpptz-dmCNp)$_3$, and 2.62 eV for Ir(mpptz-tm5CNp)$_3$). Therefore, in the light-emitting elements 3, 5, and 6, the guest material can be excited through the exciplex, whereby the driving voltage can be lowered. Therefore, the light-emitting element of one embodiment of the present invention can have reduced power consumption.

As described above, by employing the structure of one embodiment of the present invention, a light-emitting element having high emission efficiency can be provided. A light-emitting element with reduced power consumption can be provided. A light-emitting element emitting blue light and having high emission efficiency can be provided.

The structure described in this example can be used in combination with any of the other examples and embodiments as appropriate.

Example 4

In this example, an example of fabricating a light-emitting element of one embodiment of the present invention (a

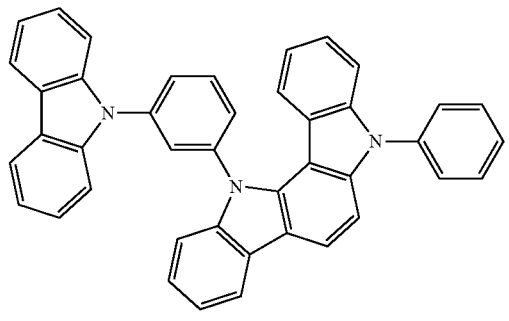

mCzPlCz

TABLE 10

| Layer | | Reference numeral | Thickness (nm) | Material | Weight ratio |
|---|---|---|---|---|---|
| Light-emitting element 7 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:mCzPICz:Ir(Mptz1-mp)₃ | 0.6:0.4:0.125 |
| | | 160(1) | 30 | 4,6mCzP2Pm:mCzPICz:Ir(Mptz1-mp)₃ | 0.4:0.6:0.125 |
| | Hole-transport layer | 112 | 20 | dmCBP | — |
| | Hole-injection layer | 111 | 20 | DBT3P-II:MoO₃ | 1:0.5 |
| | Electrode | 101 | 70 | ITSO | — | light-emitting element 7) is described. A schematic cross-sectional view of the light-emitting element fabricated in this example is similar to that shown in FIG. 34. Table 10 shows details of the element structure. In addition, structures and abbreviations of compounds used here are given below. Note that Example 1 can be referred to for other compounds.

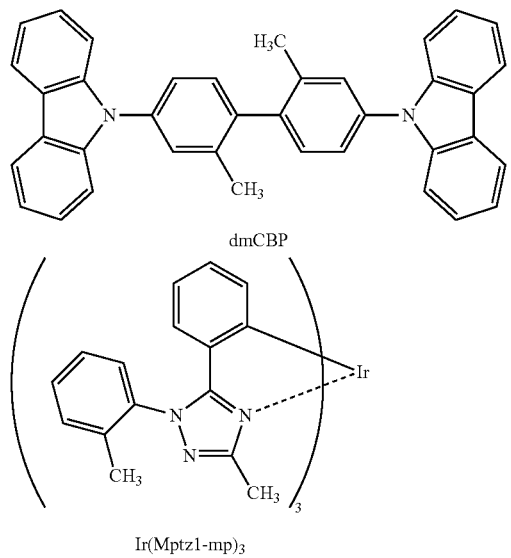

dmCBP

Ir(Mptz1-mp)₃

<Fabrication of Light-Emitting Element 7>

As the electrode 101, an ITSO film was formed to a thickness of 70 nm over the substrate 200. The electrode area of the electrode 101 was set to 4 mm² (2 mm×2 mm).

As the hole-injection layer 111, DBT3P-II and MoO₃ were deposited over the electrode 101 by co-evaporation in a weight ratio of DBT3P-II:MoO₃=1:0.5 to a thickness of 20 nm.

As the hole-transport layer 112, 4,4'-bis(9-carbazole)-2,2'-dimethylbiphenyl (abbreviation: dmCBP) was deposited over the hole-injection layer 111 by evaporation to a thickness of 20 nm.

As the light-emitting layer 160 over the hole-transport layer 112, 4,6mCzP2Pm, 12-[3-(9H-carbazol-9-yl)phenyl]-5,12-dihydro-5-phenyl-indolo[3,2-a]carbazole (abbreviation: mCzPICz), and tris[3-methyl-1-(2-methylphenyl)-5-phenyl-1H-1,2,4-triazolato]iridium(III) (abbreviation: Ir(Mptz1-mp)₃) were deposited by co-evaporation in a weight ratio of 4,6mCzP2Pm:mCzPICz: Ir(Mptz1-mp)₃=0.4:0.6:0.125 to a thickness of 30 nm, and successively, 4,6mCzP2Pm, mCzPICz, and Ir(Mptz1-mp)₃ were deposited by co-evaporation in a weight ratio of 4,6mCzP2Pm:mCzPICz: Ir(Mptz1-mp)₃=0.6:0.4:0.125 to a thickness of 10 rm. Not that in the light-emitting layer 160, 4,6mCzP2Pm corresponds to the first organic compound, mCzPICz corresponds to the second organic compound, and Ir(Mptz1-mp)₃ corresponds to the guest material (the phosphorescent material).

As the electron-transport layer 118, 4,6mCzP2Pm and bathophenanthroline BPhen were sequentially deposited by evaporation to thicknesses of 20 nm and 10 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 7 was sealed by fixing the substrate 220 to the substrate 200 over which the organic materials were deposited using a sealant for an organic EL device. For the detailed method, description of Example 1 can be referred to. Through the above process, the light-emitting element 7 was obtained.

<Emission Spectra of Host Materials>

Figure 61:
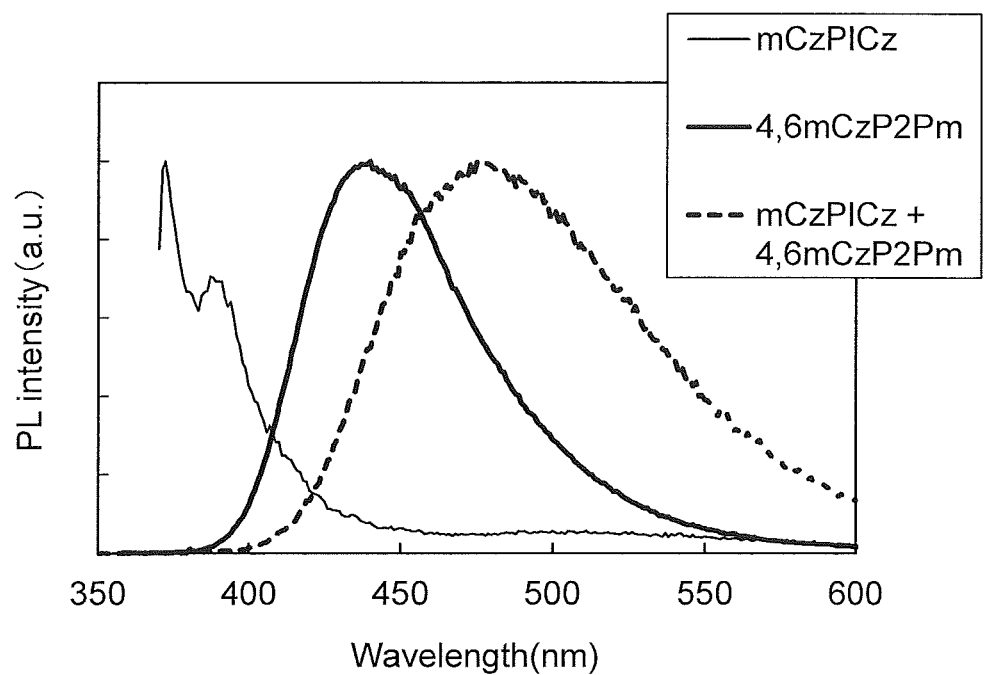
FIG. 61 is a graph showing emission spectra of host materials in Example.

In the fabricated light-emitting element 7, 4,6mCzP2Pm and mCzPICz were used as host materials (the first organic compound and the second organic compound). FIG. 61 shows measurement results of emission spectra of a thin film of 4,6mCzP2Pm, a thin film of mCzPICz, and a mixed thin film of 4,6mCzP2Pm and mCzPICz.

For the emission spectrum measurement, thin film samples were formed over a quartz substrate by a vacuum evaporation method. The emission spectra were measured at room temperature (in an atmosphere kept at 23° C.) with a PL-EL measurement apparatus (produced by Hamamatsu Photonics K.K.). The thickness of each thin film was 50 nm. The mixing ratio of the two kinds of compounds (4,6mCzP2Pm:mCzPICz) in the mixed thin film was 1:1.

As shown in FIG. 61, a peak wavelength of the emission spectrum of the mixed thin film of 4,6mCzP2Pm and mCzPICz is 477 nm. The emission spectrum differs from the emission spectrum of 4,6mCzP2Pm (peak wavelength: 440 nm) and the emission spectrum of mCzPICz (peak wavelength: 372 nm). As described later, the LUMO level of 4,6mCzP2Pm is lower than that of mCzPICz, and the HOMO level of mCzPICz is higher than that of 4,6mCzP2Pm. The energy of light emission from the mixed thin film of 4,6mCzP2Pm and mCzPICz approximately corresponds to an energy difference between the LUMO level of 4,6mCzP2Pm and the HOMO level of mCzPICz. The light emission from the mixed thin film of 4,6mCzP2Pm and mCzPICz has a longer wavelength (lower energy) than light emission from 4,6mCzP2Pm and light emission from mCzPICz. Therefore, it can be said that the light emission from the mixed thin film of 4,6mCzP2Pm and mCzPICz is light emission from an exciplex formed by 4,6mCzP2Pm and mCzPICz. That is, a combination of 4,6mCzP2Pm and mCzPICz is a combination of organic compounds which forms an exciplex. With use of 4,6mCzP2Pm and mCzPICz as host materials, a light-emitting element utilizing ExTET can be, fabricated.

<Absorption Spectrum of Guest Material>

Figure 62:
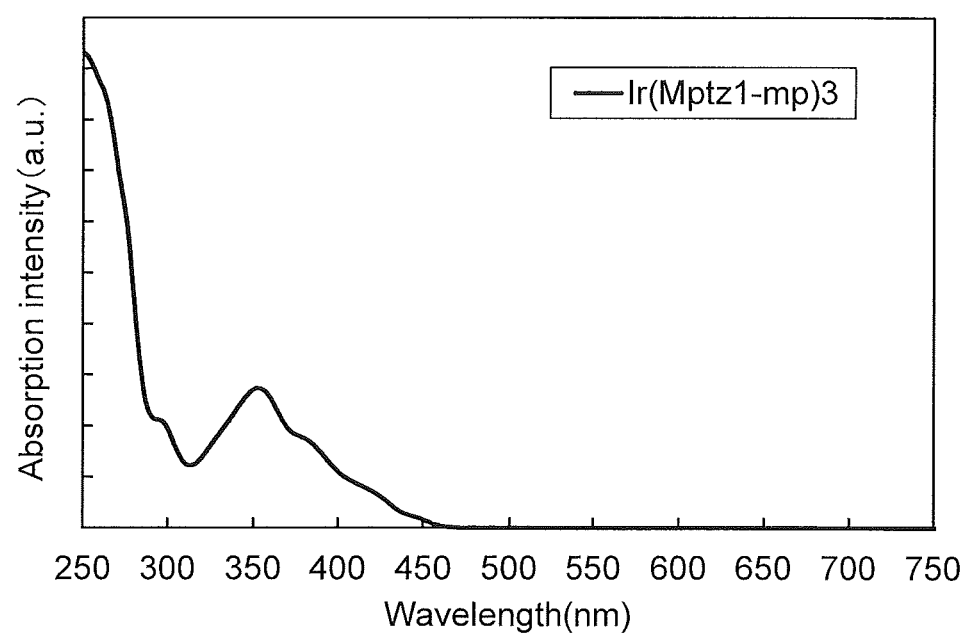
FIG. 62 is a graph showing an absorption spectrum of a guest material in Example.

FIG. 62 shows the measurement result of the absorption spectrum of Ir(Mptz1-mp)$_3$ that is the guest material in the light-emitting element.

For the absorption spectrum measurement, a dichloromethane solution in which Ir(Mptz1-mp)$_3$ was dissolved was prepared, and a quartz cell was used. The absorption spectrum was measured using an ultraviolet-visible spectrophotometer (V-550, produced by JASCO Corporation). The absorption spectra of the quartz cell and dichloromethane were subtracted from the measured absorption spectrum.

As shown in FIG. 62, an absorption band on the lowest energy side (the longest wavelength side) of the absorption spectrum of Ir(Mptz1-mp)$_3$ is at around 450 nm. The absorption edge was calculated from data of the absorption spectrum, and a transition energy was estimated on the assumption of direct transition, whereby it was found that the absorption edge of the absorption spectrum of Ir(Mptz1-mp)$_3$ was at 462 nm and transition energy thereof was 2.68 eV.

Therefore, the absorption band of the absorption spectrum of Ir(Mptz1-mp)$_3$ on the lowest energy side (the longest wavelength side) has a region that overlaps with light emission by an exciplex formed by 4,6mCzP2Pm and mCzPICz, which means that in the light-emitting element 7 including 4,6mCzP2Pm and mCzPICz as the host materials, excitation energy can be transferred effectively to the guest material.

As described above, in the light-emitting element 7, the host materials which are 4,6mCzP2Pm (the first organic compound) and mCzPICz (the second organic compound) form an exciplex in combination with each other.

<Phosphorescence Emission Spectrum of Host Material>

Figure 63:
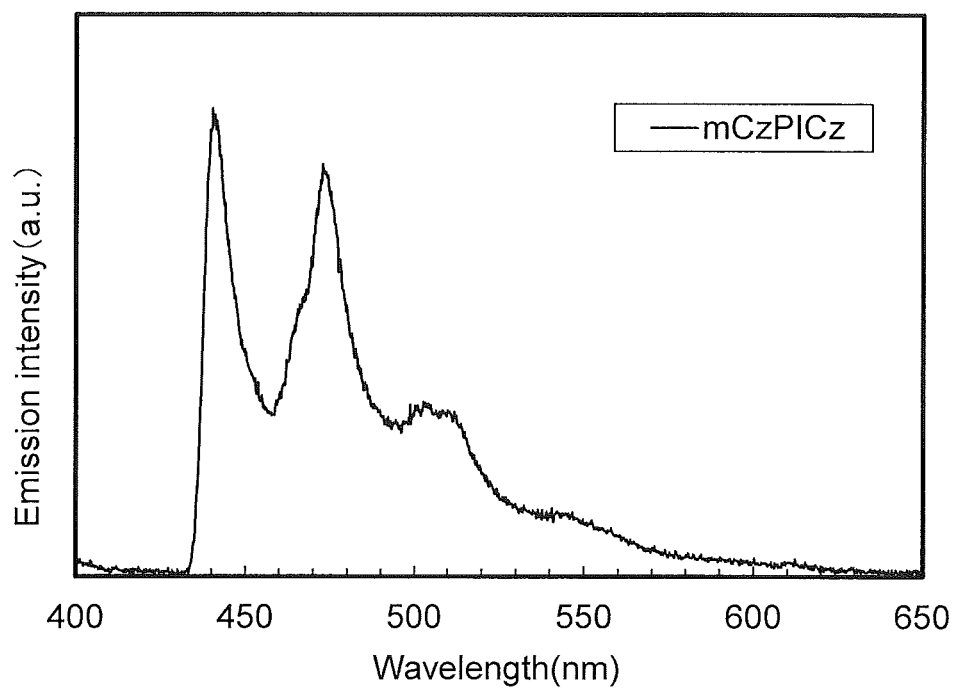
FIG. 63 is a graph showing a phosphorescence spectrum of a host material in Example.

FIG. 63 shows the measurement results of the triplet excitation energy level (T1 level) of mCzPICz. The triplet excitation energy level (T1 level) was measured by a method similar to that used in Example 1.

In FIG. 63, a peak wavelength on the shortest wavelength side of the phosphorescence emission spectrum of mCzPICz was 441 nm. The triplet excitation energy level (T1 level) of mCzPICz was thus calculated to be 2.81 eV. Note that a peak wavelength on the shortest wavelength side of the phosphorescence emission spectrum of 4,6mCzP2Pm is 459 nm as shown in FIG. 37. The triplet excitation energy level (T1 level) of 4,6mCzP2Pm is 2.70 eV.

Thus, a peak wavelength on the shortest wavelength side of the phosphorescence emission spectrum of each of 4,6mCzP2Pm and mCzPICz is shorter than a peak wavelength on the shortest wavelength side of the emission spectrum of the exciplex formed by 4,6mCzP2Pm and mCzPICz which is shown in FIG. 53. The exciplex has a feature in that an energy difference between the singlet excitation energy level (S1 level) and the triplet excitation energy level (T1 level) is small. Therefore, the triplet excitation energy level (T1 level) of the exciplex can be obtained from a peak wavelength on the shortest wavelength side of the emission spectrum. Accordingly, the triplet excitation energy level (T1 level) of each of the first organic compound (4,6mCzP2Pm) and the second organic compound (mCzPICz) is higher than the triplet excitation energy level (T1 level) of the exciplex.

The triplet excitation energy levels (T1 level) of 4,6mCzP2Pm and mCzPICz are each higher than the transition energy of Ir(Mptz1-mp)$_3$ (2.68 eV) which was calculated from the absorption edge of the absorption spectrum shown in FIG. 62.

Therefore, the first organic compound (4,6mCzP2Pm) and the second organic compound (mCzPICz), which were used as the host materials in this example, have triplet excitation energy levels (T1 levels) high enough for host materials.

<Characteristics of Light-Emitting Element>

Figure 64:
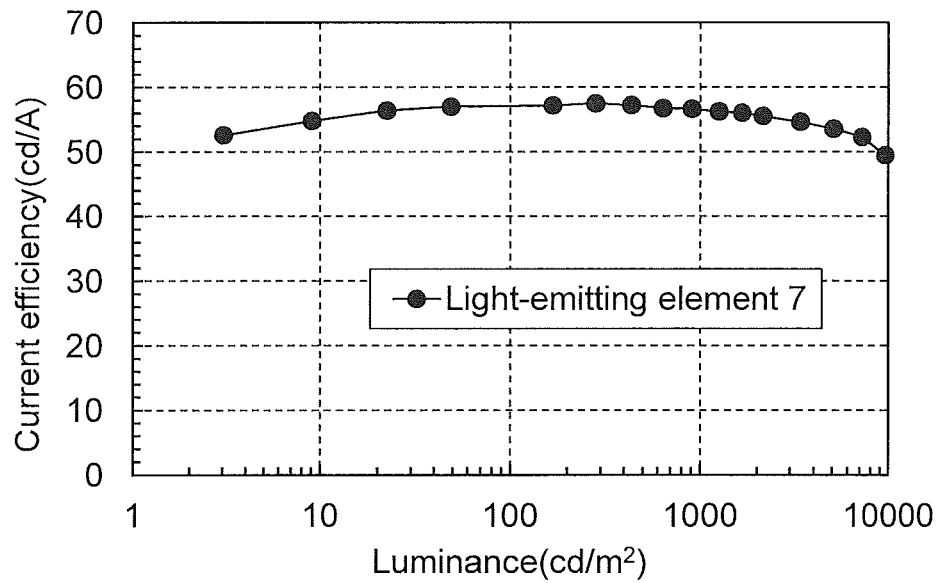
FIG. 64 is a graph showing current efficiency-luminance characteristics of a light-emitting element in Example.
Figure 65:
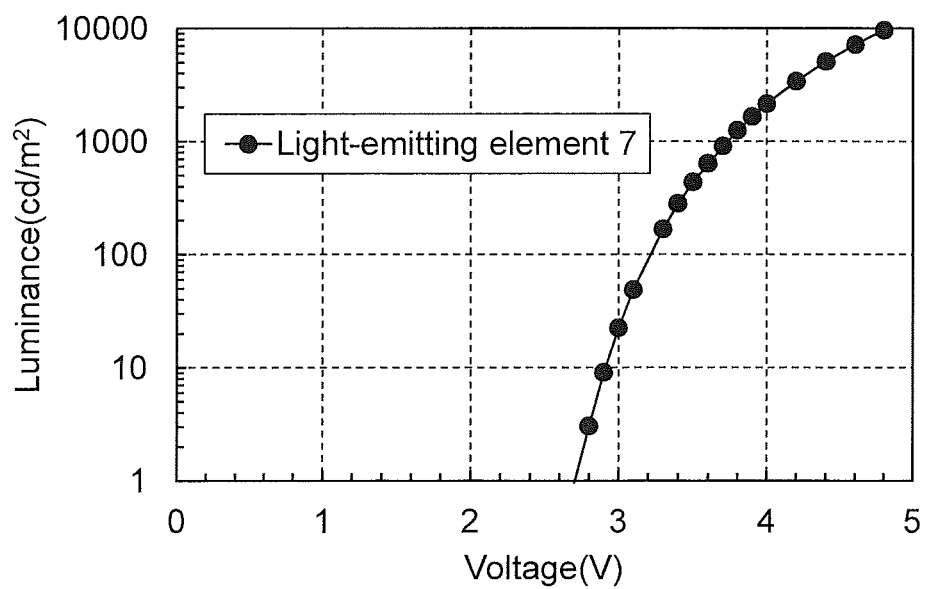
FIG. 65 is a graph showing luminance-voltage characteristics of a light-emitting element in Example.
Figure 66:
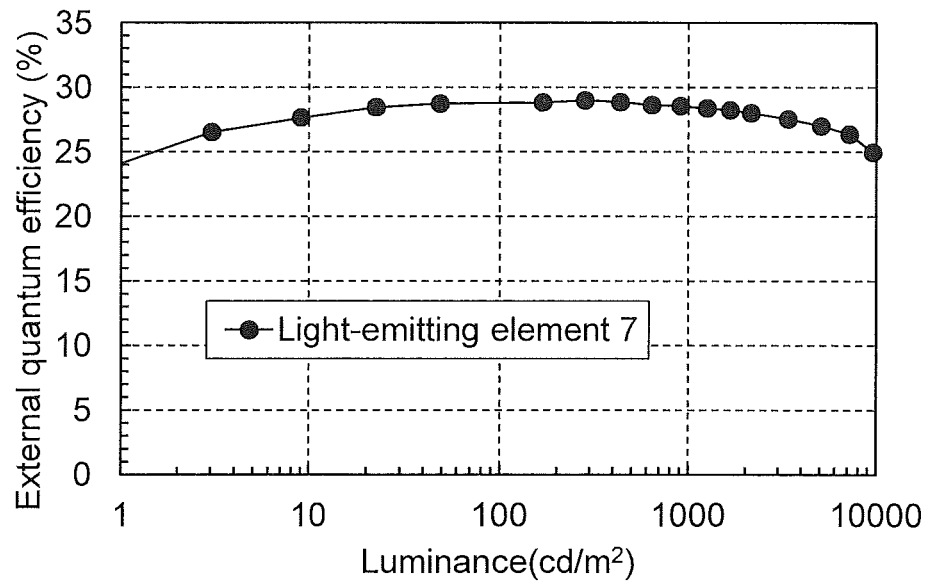
FIG. 66 is a graph showing external quantum efficiency-luminance characteristics of a light-emitting element in Example.
Figure 67:
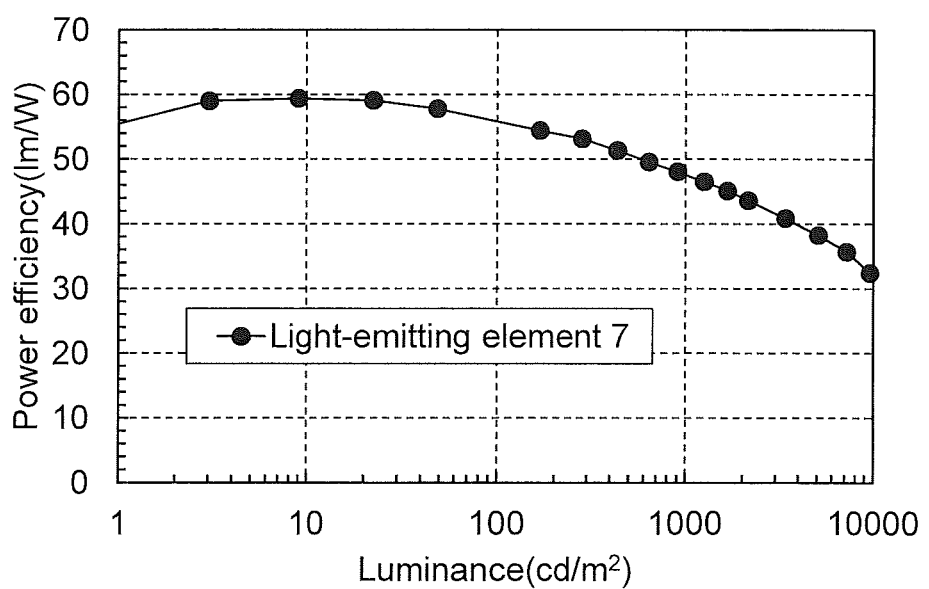
FIG. 67 is a graph showing power efficiency-luminance characteristics of a light-emitting element in Example.
Figure 68:
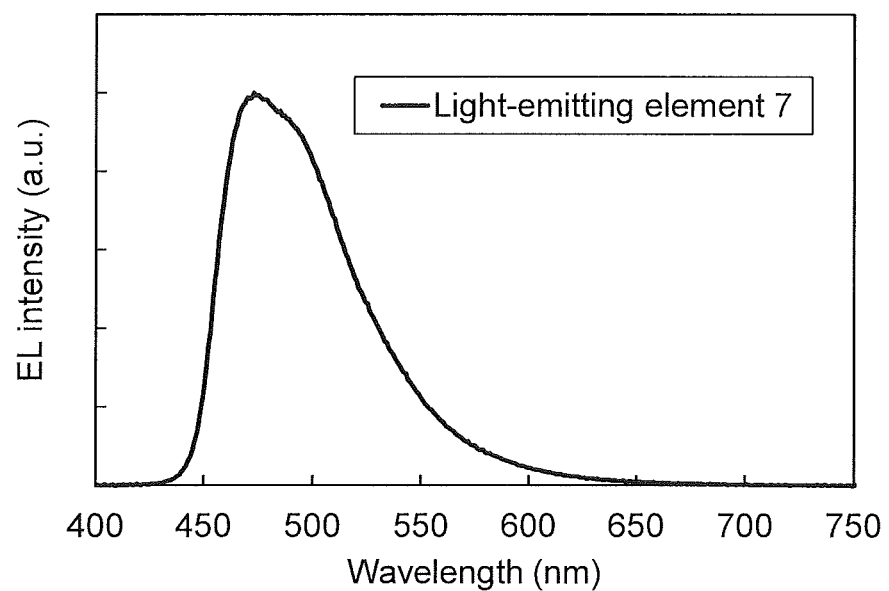
FIG. 68 is a graph showing an electroluminescence spectrum of a light-emitting element in Example.

FIG. 64 shows current efficiency-luminance characteristics of the light-emitting element 7. FIG. 65 shows luminance-voltage characteristics. FIG. 66 shows external quantum efficiency-luminance characteristics. FIG. 67 shows power efficiency-luminance characteristics. Note that the measurement for the light-emitting element was performed at room temperature (in an atmosphere kept at 23° C.) by a measurement method similar to that used in Example 1. FIG. 68 shows an electroluminescence spectrum when a current at a current density of 2.5 mA/cm$^2$ was supplied to the light-emitting element 7.

Table 11 shows the element characteristics of the light-emitting element 7 at around 1000 cd/m$^2$.

TABLE 11

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 7 | 3.7 | 1.6 | (0.17, 0.33) | 910 | 57 | 48 | 29 |

From FIGS. 64 to 67 and Table 11, it is found that the light-emitting element 7 has high current efficiency and high external quantum efficiency. The maximum external quantum efficiency of the light-emitting element 7 is 29%, which is an excellent value. As shown in FIG. 68, the light-emitting element 7 emits blue light with high color purity. The electroluminescence spectrum of the light-emitting element 7 has a peak at a wavelength of 473 nm and a full width at half maximum of 67 nm.

The light-emitting element 7 was driven at a lower voltage. Thus, the power efficiency of the light-emitting element 7 is high.

The light emission starting voltage (a voltage at the time when the luminance exceeds 1 cd/m$^2$) of the light-emitting element 7 was 2.8 V. This voltage is smaller than a voltage corresponding to an energy difference between the LUMO level and the HOMO level of the guest material Ir(Mptz1-mp)$_3$, which is described later. The results suggest that emission in the light-emitting element 7 is obtained not by direct recombination of carriers in the guest material but by recombination of carriers in the material having a smaller energy gap.

<Results of CV Measurement>

The electrochemical characteristics (oxidation reaction characteristics and reduction reaction characteristics) of the compounds used as the host materials (the first organic compound and the second organic compound) and the guest materials in the above-described light-emitting elements were measured by cyclic voltammetry (CV). Note that for the measurement, an electrochemical analyzer (ALS model 600A or 600C, produced by BAS Inc.) was used. In the measurement, the potential of a working electrode with respect to the reference electrode was changed within an appropriate range, so that the oxidation peak potential and the reduction peak potential were obtained. In addition, the HOMO and LUMO levels of each compound were calculated from the estimated redox potential of the reference electrode of −4.94 eV and the obtained peak potentials.

For the measurement of oxidation reaction characteristics and reduction reaction characteristics of the host materials (4,6mCzP2Pm and mCzPICz), a solution obtained by dissolving each compound in DMF was used. A solution obtained by dissolving the guest material (Ir(Mptz1-mp)$_3$) in dichloromethane was used for the measurement of the oxidation reaction characteristics of the guest material, and a solution obtained by dissolving the guest material in DMF was used for the measurement of the reduction reaction characteristics of the guest material.

Table 12 shows oxidation potentials and reduction potentials of the compounds obtained from the results of the CV measurement and HOMO levels and LUMO levels of the compounds calculated from the CV measurement results.

TABLE 12

| Material | Oxidation potential (V) | Reduction potential (V) | HOMO level calculated from oxidation potential (eV) | LUMO level calculated from reduction potential (eV) |
|---|---|---|---|---|
| 4,6mCzP2Pm | 0.95 | −2.06 | −5.89 | −2.88 |
| mCzPICz | 0.68 | −3.00 | −5.62 | −1.95 |
| Ir(Mptz1-mp)$_3$ | 0.60 | −2.76 | −5.54 | −2.19 |

As shown in Table 12, the LUMO level of the first organic compound (4,6mCzP2Pm) is lower than that of the second organic compound (mCzPICz), and the HOMO level of the first organic compound (4,6mCzP2Pm) is lower than that of the second organic compound (mCzPICz). The LUMO level of the guest material (Ir(Mptz1-mp)$_3$) is higher than that of the first organic compound (4,6mCzP2Pm), and the HOMO level of the guest material (Ir(Mptz1-mp)$_3$) is higher than that of the second organic compound (mCzPICz).

The results of the CV measurement show that the combination of the first organic compound (4,6mCzP2Pm) and the second organic compound (mCzPICz) forms an exciplex.

An energy difference between the LUMO level and the HOMO level of Ir(Mptz1-mp)$_3$ was 3.36 eV. This value was calculated from the CV measurement results shown in Table 12.

As described above, the transition energy of Ir(Mptz1-mp)$_3$ that was calculated from the absorption edge of the absorption spectrum in FIG. 62 is 2.68 eV.

That is, the energy difference between the LUMO level and the HOMO level of Ir(Mptz1-mp)$_3$ is larger than the transition energy thereof calculated from the absorption edge by 0.68 eV.

The peak wavelength on the shortest wavelength side of the electroluminescence spectrum of the light-emitting element 7 that is shown in FIG. 68 is 473 nm. According to that, the light emission energy of Ir(Mptz1-mp)$_3$ was calculated to be 2.62 eV.

That is, the energy difference between the LUMO level and the HOMO level of Ir(Mptz1-mp)$_3$ was larger than the light emission energy by 0.74 eV.

Consequently, in the guest material of the light-emitting element 7, the energy difference between the LUMO level and the HOMO level is larger than the transition energy calculated from the absorption edge by 0.4 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention can have reduced power consumption.

Note that an energy difference between the LUMO level of the first organic compound (4,6mCzP2Pm) and the HOMO level of the second organic compound (mCzPICz) (4,6mCzP2Pm and mCzPICz are the host materials) was calculated to be 2.74 eV from Table 12. Consequently, energy corresponding to the energy difference between the LUMO level and the HOMO level of an exciplex formed by the host materials is smaller than the energy difference (3.36 eV) between the LUMO level and the HOMO level of the guest material Ir(Mptz1-mp)$_3$, and larger than the transition energy (2.68 eV) calculated from the absorption edge of the absorption spectrum of the guest material. Therefore, in the light-emitting element 7, the guest material can be excited through the exciplex, whereby the driving voltage can be lowered. Therefore, the light-emitting element of one embodiment of the present invention can have reduced power consumption.

According to the CV measurement results in Table 12, among carriers (electrons and holes) injected from the pair of electrodes, electrons tend to be injected into the first organic compound (4,6mCzP2Pm) which is a host material with a low LUMO level, whereas holes tend to be injected into the guest material (Ir(Mptz1-mp)$_3$) with a high HOMO level. That is, there is a possibility that an exciplex is formed by the first organic compound (4,6mCzP2Pm) and the guest material (Ir(Mptz1-mp)$_3$).

The energy difference between the LUMO level of the first organic compound (4,6mCzP2Pm) and the HOMO level of the guest material Ir(Mptz-1mp)$_3$ was calculated from the CV measurement results shown in Table 12 and found to be 2.66 eV.

In the light-emitting element 7 that includes Ir(Mptz1-mp)$_3$, the energy difference (2.66 eV) between the LUMO level of the first organic compound and the HOMO level of the guest material is higher than or equal to the energy (2.62 eV) of the light emission exhibited by the guest material. Accordingly, rather than formation of an exciplex by the combination of the first organic compound and the guest material, transfer of excitation energy to the guest material is more facilitated eventually, whereby efficient light emission from the guest material is achieved. The above-described relationship is a feature of one embodiment of the present invention which contributes to efficient light emission.

That is, a light-emitting element having the following structure like the light-emitting element 7 can achieve high emission efficiency with low driving voltage: the LUMO level of the first organic compound is lower than that of the second organic compound, the HOMO level of the first organic compound is lower than that of the second organic compound, the LUMO level of the guest material is higher than that of the first organic compound, the HOMO level of the guest material is higher than that of the second organic compound, the first organic compound and the second organic compound form an exciplex in combination with each other, and the energy difference between the LUMO level of the first organic compound and the HOMO level of the guest material is larger than or equal to the light emission energy of the guest material.

As described above, by employing the structure of one embodiment of the present invention, a light-emitting element having high emission efficiency can be provided. A light-emitting element with reduced power consumption can be provided.

Example 5

In this example, an example of fabricating a light-emitting element of one embodiment of the present invention (a light-emitting element 8) is described. A schematic cross-sectional view of the light-emitting element fabricated in this example is similar to that shown in FIG. 34. Table 13 shows details of the element structure. In addition, structures and abbreviations of compounds used here are given below. Note that the above example can be referred to for other compounds.

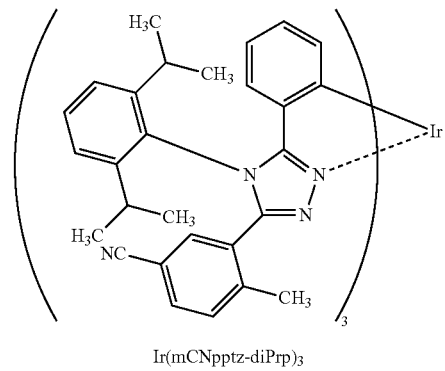

Ir(mCNpptz-diPrp)$_3$

TABLE 13

| | Layer | Reference numeral | Thickness (nm) | Material | Weight ratio |
|---|---|---|---|---|---|
| Light-emitting element 8 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(mCNpptz-diPrp)$_3$ | 0.8:0.2:0.125 |
| | | 160(1) | 30 | 4,6mCzP2Pm:PCCP:Ir(mCNpptz-diPrp)$_3$ | 0.4:0.6:0.125 |

TABLE 13-continued

| Layer | Reference numeral | Thickness (nm) | Material | Weight ratio |
|---|---|---|---|---|
| Hole-transport layer | 112 | 20 | PCCP | — |
| Hole-injection layer | 111 | 20 | DBT3P-II:MoO$_3$ | 1:0.5 |
| Electrode | 101 | 70 | ITSO | — |

<Fabrication of Light-Emitting Element 8>

As the electrode 101, an ITSO film was formed to a thickness of 70 nm over the substrate 200. The electrode area of the electrode 101 was set to 4 mm$^2$ (2 mm×2 mm).

As the hole-injection layer 111, DBT3P-II and MoO$_3$ were deposited over the electrode 101 by co-evaporation in a weight ratio of DBT3P-II:MoO$_3$=1:0.5 to a thickness of 20 nm.

As the hole-transport layer 112, PCCP was deposited over the hole-injection layer 111 by evaporation to a thickness of 20 nm.

As the light-emitting layer 160 over the hole-transport layer 112, 4,6mCzP2Pm, PCCP, and Ir(mCNpptz-diPrp)$_3$ were deposited by co-evaporation in a weight ratio of 4,6mCzP2Pm:PCCP:Ir(mCNpptz-diPrp)$_3$=0.4:0.6:0.125 to a thickness of 30 nm, and successively, 4,6mCzP2Pm, PCCP, and Ir(mCNpptz-diPrp)$_3$ were deposited by co-evaporation in a weight ratio of 4,6mCzP2Pm:PCCP:Ir(mCNpptz-diPrp)$_3$=0.8:0.2:0.125 to a thickness of 10 nm. Note that in the light-emitting layer 160, 4,6mCzP2Pm corresponds to the first organic compound, PCCP corresponds to the second organic compound, and Ir(mCNpptz-diPrp)$_3$ corresponds to the guest material (the phosphorescent material).

As the electron-transport layer 118, 4,6mCzP2Pm and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 8 was sealed by fixing the substrate 220 to the substrate 200 over which the organic materials were deposited using a sealant for an organic EL device. For the detailed method, description of the light-emitting element 1 can be referred to. Through the above steps, the light-emitting element 8 was obtained.

<Absorption Spectrum and Emission Spectrum of Guest Material>

Figure 69:
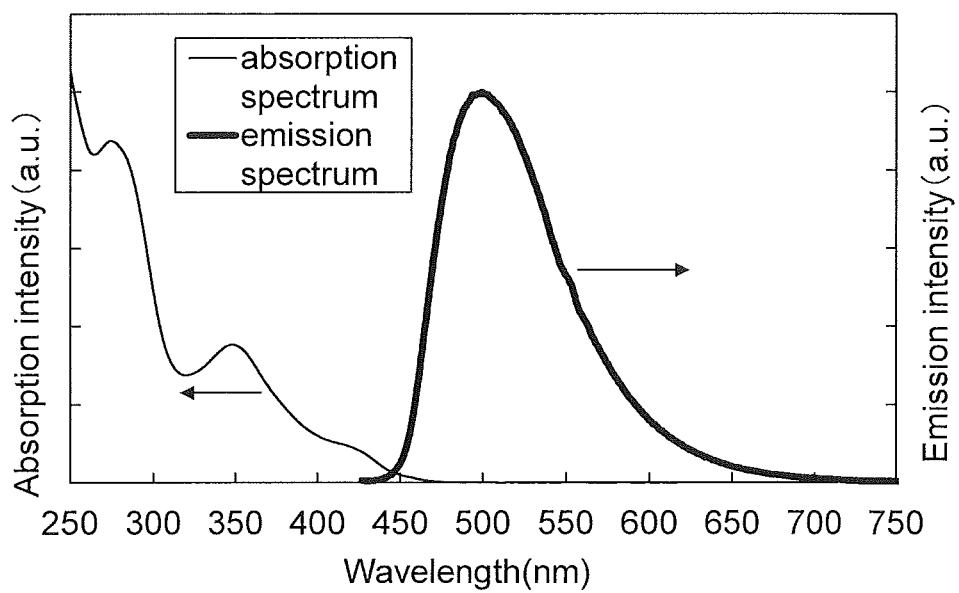
FIG. 69 is a graph showing absorption and emission spectra of a guest material in Example.

FIG. 69 shows the measurement results of the absorption spectrum and the emission spectrum of a solution of the guest material Ir(mCNpptz-diPrp)$_3$.

For the measurement of an absorption spectrum and an emission spectrum, a dichloromethane solution of the guest material (Ir(mCNpptz-diPrp)$_3$) was prepared and a quartz cell was used. The absorption spectrum was measured at room temperature with the use of an ultraviolet-visible spectrophotometer (V-550, produced by JASCO Corporation) in a state where the dichloromethane solution was put in a quartz cell. The emission spectrum was measured at room temperature in such a manner that an absolute PL quantum yield measurement system (C11347-01 produced by Hamamatsu Photonics K. K.) was used and the deoxidized dichloromethane solution was sealed in a quartz cell under a nitrogen atmosphere in a glove box (LABstar M13 (1250/780) produced by Bright Co., Ltd.). Note that the absorption spectrum in FIG. 69 is a result obtained by subtraction of a measured absorption spectrum of only dichloromethane that was put in a quartz cell from the measured absorption spectrum of the dichloromethane solution in a quartz cell.

As can be seen from FIG. 69, the dichloromethane solution of Ir(mCNpptz-diPrp)$_3$ exhibited green light emission producing an emission peak at 499 nm.

An absorption band on the lowest energy side (the longest wavelength side) of the absorption spectrum of the dichloromethane solution of the guest material (Ir(mCNpptz-diPrp)$_3$) is at around 460 nm. The absorption edge was calculated from data of the absorption spectrum, and a transition energy was estimated on the assumption of direct transition, whereby it was found that the absorption edge of the absorption spectrum of Ir(mCNpptz-diPrp)$_3$ is at 472 nm and transition energy thereof is 2.63 eV.

Thus, an absorption band on the lowest energy side (the longest wavelength side) of the absorption spectrum of Ir(mCNpptz-diPrp)$_3$ has a region overlapping with light emission by an exciplex formed by 4,6mCzP2Pm and PCCP. Therefore, in the light-emitting element using 4,6mCzP2Pm and PCCP as host materials, excitation energy can be effectively transferred to the guest material.

As shown in the above example, the triplet excitation energy level (T1 level) of the first organic compound (4,6mCzP2Pm) is 2.70 eV and that of the second organic compound (PCCP) is 2.66 eV. Each triplet excitation energy level (T1 level) is higher than the transition energy which is calculated from the absorption edge of the absorption spectrum of the guest material. Therefore, the first organic compound (4,6mCzP2Pm) and the second organic compound (PCCP), which were used as the host materials, have triplet excitation energy levels (T1 levels) high enough for host materials.

<Characteristics of Light-Emitting Element>

Figure 70:
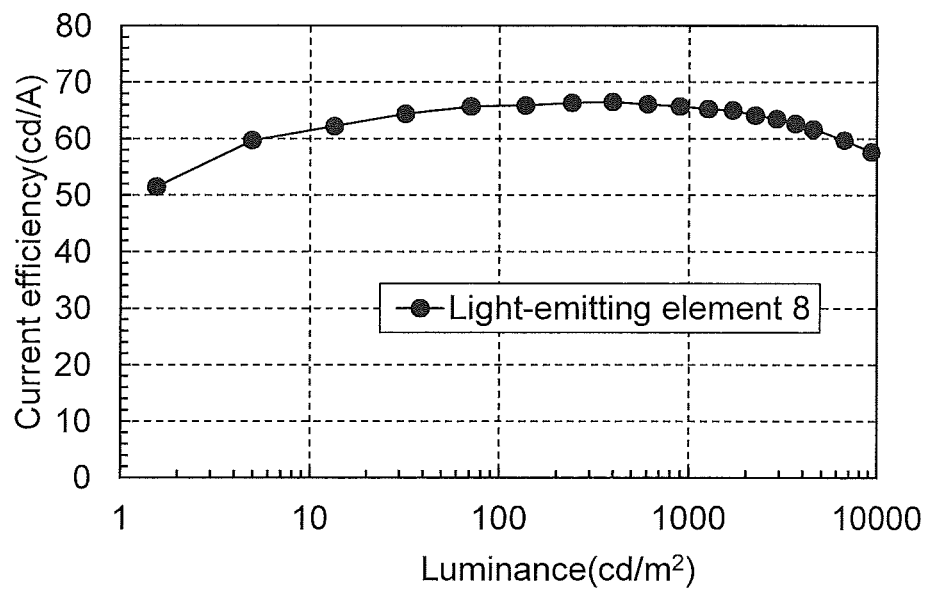
FIG. 70 is a graph showing current efficiency-luminance characteristics of a light-emitting element in Example.
Figure 71:
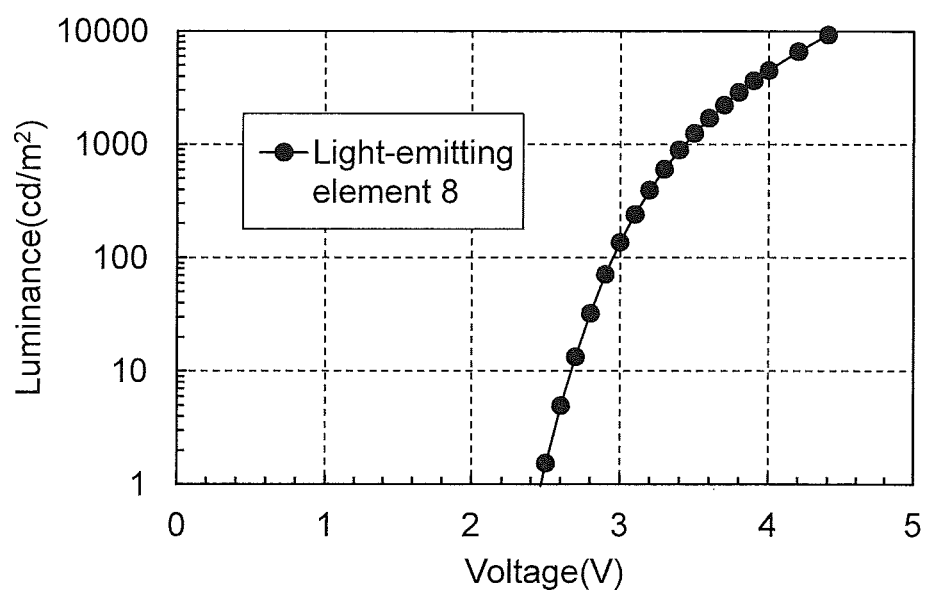
FIG. 71 is a graph showing luminance-voltage characteristics of a light-emitting element in Example.
Figure 72:
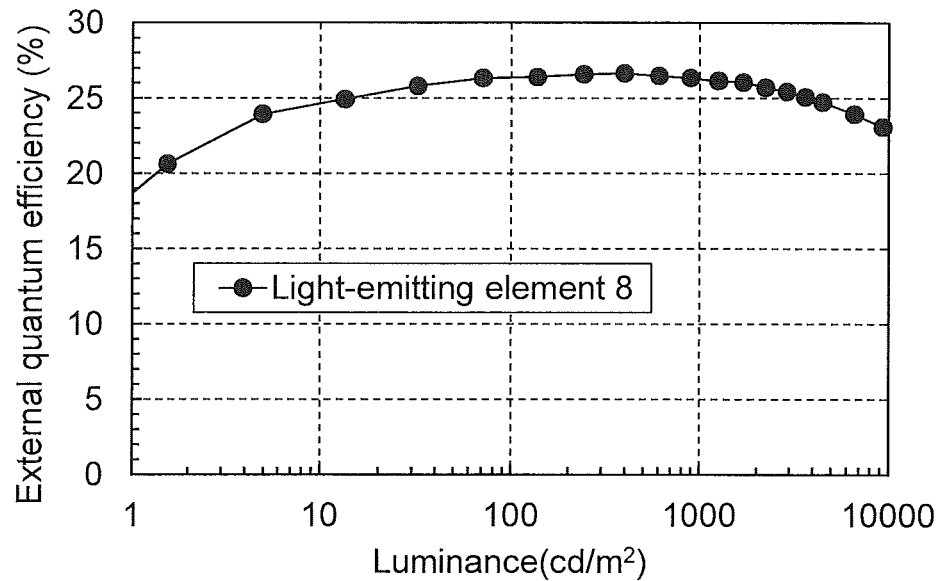
FIG. 72 is a graph showing external quantum efficiency-luminance characteristics of a light-emitting element in Example.
Figure 73:
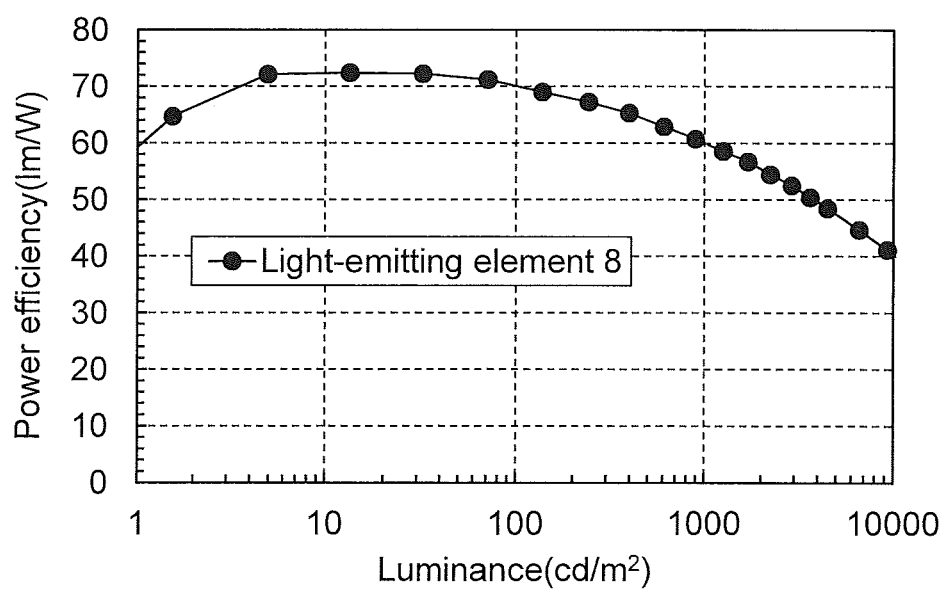
FIG. 73 is a graph showing power efficiency-luminance characteristics of a light-emitting element in Example.
Figure 74:
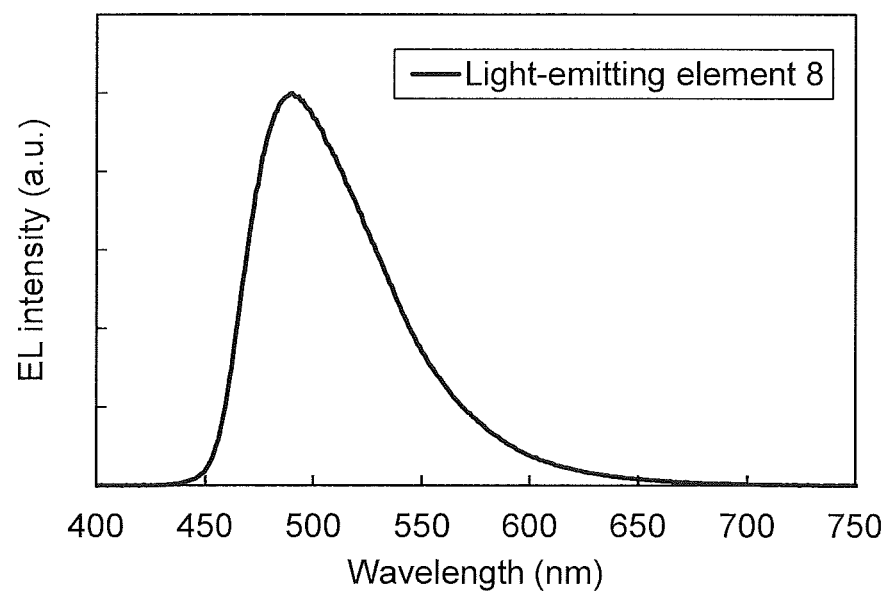
FIG. 74 is a graph showing an electroluminescence spectrum of a light-emitting element in Example.

FIG. 70 shows current efficiency-luminance characteristics of the light-emitting element 8. FIG. 71 shows luminance-voltage characteristics. FIG. 72 shows external quantum efficiency-luminance characteristics. FIG. 73 shows power efficiency-luminance characteristics. FIG. 74 shows an electroluminescence spectrum when a current at a current density of 2.5 mA/cm$^2$ was supplied to the light-emitting element 8. Note that the measurement for the light-emitting element was performed at room temperature (in an atmosphere kept at 23° C.) by a measurement method similar to that used in Example 1.

Table 14 shows the element characteristics of the light-emitting element 8 at around 1000 cd/m$^2$.

TABLE 14

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
| --- | --- | --- | --- | --- | --- | --- | --- |
| Light-emitting element 8 | 3.4 | 1.4 | (0.20, 0.46) | 900 | 66 | 61 | 26 |

From FIGS. 70 to 73 and Table 14, it is found that the light-emitting element 8 has high emission efficiency (current efficiency and external quantum efficiency). The maximum external quantum efficiency of the light-emitting element 8 is 27%, which is an excellent value. As shown in FIG. 74, the light-emitting element 8 emits blue light. The electroluminescence spectrum of the light-emitting element 8 has a peak at a wavelength of 490 inn and a full width at half maximum of 70 nm.

As shown in FIGS. 70 to 73 and Table 14, the light-emitting element 8 was driven at a lower voltage.

<Results of CV Measurement>

The electrochemical characteristics (oxidation reaction characteristics and reduction reaction characteristics) of Ir(mCNpptz-diPrp)$_3$ used as the guest material in the above-described light-emitting element were measured by cyclic voltammetry (CV). A measurement method similar to that used in the above example was employed. A solution obtained by dissolving Ir(mCNpptz-diPrp)$_3$ in dichloromethane was used for the measurement of the oxidation reaction characteristics, and a solution obtained by dissolving Ir(mCNpptz-diPrp)$_3$ in DMF was used for the measurement of the reduction reaction characteristics.

According to the CV measurement results, the oxidation potential of Ir(mCNpptz-diPrp)$_3$ was 0.48 V, and the reduction potential thereof was −2.51 V. In addition, the HOMO level and the LUMO level of Ir(mCNpptz-diPrp)$_3$ which were calculated from the CV measurement results were −5.42 eV and −2.43 eV, respectively.

In the light-emitting element 8, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). The LUMO level of each of the guest material (Ir(mCNpptz-diPrp)$_3$) is higher than that of the first organic compound (4,6mCzP2Pm), and the HOMO level of the guest material (Ir(mCNpptz-diPrp)$_3$) is higher than that of the second organic compound (PCCP).

An energy difference between the LUMO level and the HOMO level of Ir(mCNpptz-diPrp)$_3$ was 2.99 eV. These values were calculated from the CV measurement results.

That is, the energy difference between the LUMO level and the HOMO level of Ir(mCNpptz-diPrp)$_3$ is larger than the transition energy thereof calculated from the absorption edge by 0.36 eV.

The peak wavelength on the shortest wavelength side of the electroluminescence spectrum of the light-emitting element 8 in FIG. 74 is 490 nm. According to that, the light emission energy of Ir(mCNpptz-diPrp)$_3$ was calculated to be 2.53 eV That is, the energy difference between the LUMO level and the HOMO level of Ir(mCNpptz-diPrp)$_3$ was larger than the light emission energy by 0.46 eV.

Consequently, in each of the guest materials of the light-emitting elements, the energy difference between the LUMO level and the HOMO level is larger than the transition energy calculated from the absorption edge by 0.3 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention can have reduced power consumption.

Note that an energy difference between the LUMO level of the first organic compound (4,6mCzP2Pm) and the HOMO level of the second organic compound (PCCP) (4,6mCzP2Pm and PCCP are the host materials) in the light-emitting element 8 was calculated to be 2.75 eV from Table 3. Consequently, energy corresponding to the energy difference between the LUMO level and the HOMO level of an exciplex formed by the host materials in the light-emitting element 8 is smaller than the energy difference (2.99 eV) between the LUMO level and the HOMO level of the guest material Ir(mCNpptz-diPrp)$_3$, and larger than the transition energy (2.63 eV) calculated from the absorption edge. Therefore, in the light-emitting element 8, the guest material can be excited through the exciplex, whereby the driving voltage can be lowered. Therefore, the light-emitting element of one embodiment of the present invention can have reduced power consumption.

According to the CV measurement results, among carriers (electrons and holes) injected from the pair of electrodes, electrons tend to be injected into the first organic compound (4,6mCzP2Pm) which is a host material with a low LUMO level, whereas holes tend to be injected into the guest material (Ir(mCNpptz-diPrp)$_3$) with a high HOMO level. That is, there is a possibility that an exciplex is formed by the first organic compound (4,6mCzP2Pm) and the guest material (Ir(mCNpptz-diPrp)$_3$).

The energy difference between the LUMO level of the first organic compound (4,6mCzP2Pm) and the HOMO level of the guest material Ir(mCNpptz-diPrp)$_3$ was calculated from the CV measurement results and found to be 2.54 eV.

In the light-emitting element 8 that includes Ir(mCNpptz-diPrp)$_3$, the energy difference (2.54 eV) between the LUMO level of the first organic compound and the HOMO level of the guest material is higher than or equal to the energy (2.53 eV) of the light emission exhibited by the guest material. Accordingly, rather than formation of an exciplex by the combination of the first organic compound and the guest material, transfer of excitation energy to the guest material is more facilitated eventually, whereby efficient light emission from the guest material is achieved. The above-described relationship is a feature of one embodiment of the present invention which contributes to efficient light emission.

That is, a light-emitting element having the following structure like the light-emitting element 8 can achieve high emission efficiency with low driving voltage: the LUMO level of the first organic compound is lower than that of the second organic compound, the HOMO level of the first organic compound is lower than that of the second organic compound, the LUMO level of the guest material is higher than that of the first organic compound, the HOMO level of the guest material is higher than that of the second organic compound, the first organic compound and the second organic compound form an exciplex in combination with each other, and the energy difference between the LUMO level of the first organic compound and the HOMO level of the guest material is larger than or equal to the light emission energy of the guest material.

As described above, by employing the structure of one embodiment of the present invention, a light-emitting element having high emission efficiency can be provided. A light-emitting element with reduced power consumption can be provided. A light-emitting element emitting blue light and having high emission efficiency can be provided.

The structure described in this example can be used in combination with any of the other examples and embodiments as appropriate.

Example 6

In this example, examples of fabricating light-emitting elements of embodiments of the present invention (a light-emitting element 9 and a light-emitting element 10) and a comparative light-emitting element (a comparative light-emitting element 4) are described. A schematic cross-sectional view of the light-emitting elements fabricated in this example is similar to that shown in FIG. 34. Table 15 shows details of the element structures. In addition, structures and abbreviations of compounds used here are given below. Note that the above example can be referred to for other compounds.

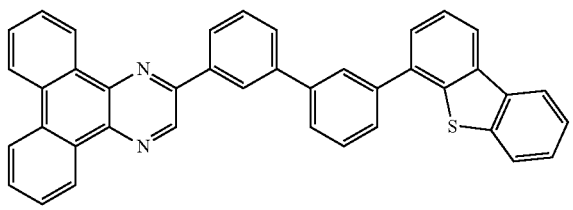

2mDBTBPDBq-II

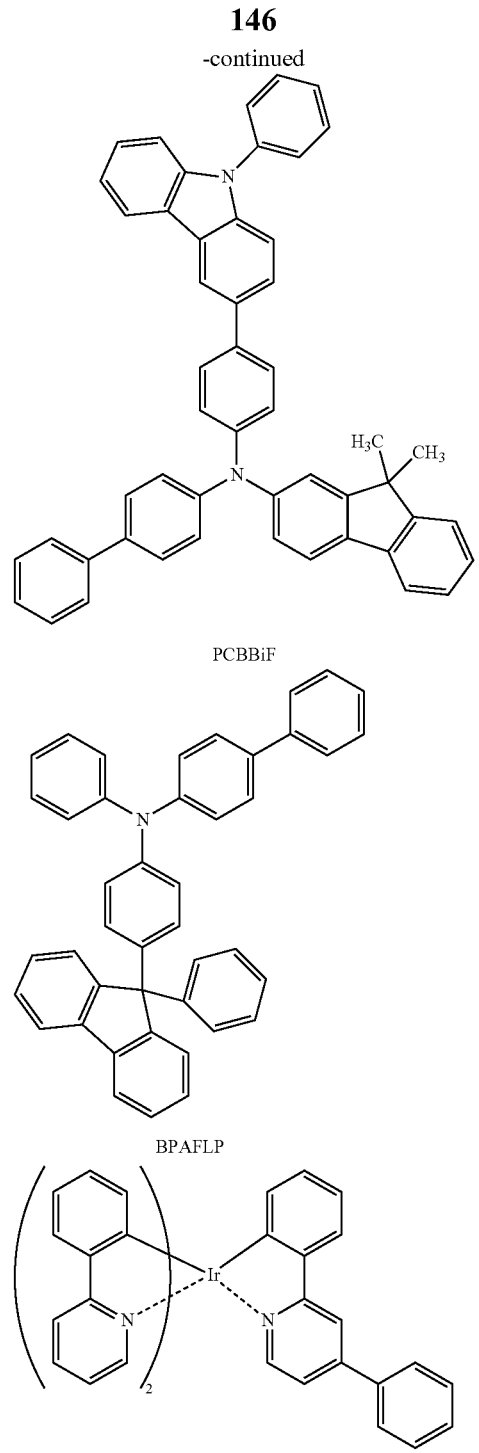

PCBBiF

BPAFLP

Ir(ppy)$_2$(4dppy)

TABLE 15

| | Layer | Reference numeral | Thickness (nm) | Material | Weight ratio |
|---|---|---|---|---|---|
| Light-emitting element 9 | Electrode | 102 | 200 | Al | — |
| | Electron-injection layer | 119 | 1 | LiF | — |

TABLE 15-continued

| | Layer | Reference numeral | Thickness (nm) | Material | Weight ratio |
|---|---|---|---|---|---|
| | Electron-transport layer | 118(2) | 10 | BPhen | — |
| | | 118(1) | 20 | 2mDBTBPDBq-II | — |
| | Light-emitting layer | 160 | 40 | 2mDBTBPDBq-II:PCBBiF:Ir(ppy)$_2$(4dppy) | 0.8:0.2:0.1 |
| | Hole-transport layer | 112 | 20 | BPAFLP | — |
| | Hole-injection layer | 111 | 60 | DBT3P-II:MoO$_3$ | 1:0.5 |
| | Electrode | 101 | 70 | ITSO | — |
| Light-emitting element 10 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 2mDBTBPDBq-II | — |
| | Light-emitting layer | 160 | 40 | 2mDBTBPDBq-II:PCCP:Ir(ppy)$_2$(4dppy) | 0.45:0.45:0.1 |
| | Hole-transport layer | 112 | 20 | BPAFLP | — |
| | Hole-injection layer | 111 | 60 | DBT3P-II:MoO$_3$ | 1:0.5 |
| | Electrode | 101 | 70 | ITSO | — |
| Comparative light-emitting element 4 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 2mDBTBPDBq-II | — |
| | Light-emitting layer | 160 | 40 | 2mDBTBPDBq-II:Ir(ppy)$_2$(4dppy) | 0.9:0.1 |
| | Hole-transport layer | 112 | 20 | BPAFLP | — |
| | Hole-injection layer | 111 | 60 | DBT3P-II:MoO$_3$ | 1:0.5 |
| | Electrode | 101 | 70 | ITSO | — |

<Fabrication of Light-Emitting Elements>
<<Fabrication of Light-Emitting Element 9>>

As the electrode 101, an ITSO film was formed to a thickness of 70 nm over the substrate 200. The electrode area of the electrode 101 was set to 4 mm$^2$ (2 mm×2 mm).

As the hole-injection layer 111, DBT3P-II and MoO$_3$ were deposited over the electrode 101 by co-evaporation in a weight ratio of DBT3P-II:MoO$_3$=1:0.5 to a thickness of 60 mm As the hole-transport layer 112, BPAFLP was deposited over the hole-injection layer 111 by evaporation to a thickness of 20 nm.

As the light-emitting layer 160 over the hole-transport layer 112, 2mDBTBPDBq-II, PCBBiF, and [2-(4-phenyl-2-pyridinyl-κN)phenyl-κC]bis[2-(2-pyridinyl-κN)phenyl-κC]iridium(III) (abbreviation: Ir(ppy)$_2$(4dppy)) were deposited by co-evaporation in a weight ratio of 2mDBTBPDBq-II: PCBBiF: Ir(ppy)$_2$(4dppy)=0.8:0.2:0.1 to a thickness of 40 nm. Note that in the light-emitting layer 160, 2mDBTBPDBq-II corresponds to the first organic compound, PCBBiF corresponds to the second organic compound, and Ir(ppy)$_2$(4dppy) corresponds to the guest material (the phosphorescent material).

As the electron-transport layer 118, 2mDBTBPDBq-II and BPhen were sequentially deposited by evaporation to thicknesses of 20 nm and 10 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 9 was sealed by fixing the substrate 220 to the substrate 200 over which the organic materials were deposited using a sealant for an organic EL device. For the detailed method, description of Example 1 can be referred to. Through the above steps, the light-emitting element 9 was obtained.

<<Fabrication of Light-Emitting Element 10>>

The light-emitting element 10 is different from the light-emitting element 9 in the structure of the light-emitting layer 160 and was fabricated through the same steps as those for the light-emitting element 9 except for the step of forming the light-emitting layer 160.

As the light-emitting layer 160 in the light-emitting element 10, 2mDBTBPDBq-II, PCCP, and Ir(ppy)$_2$(4dppy) were deposited by co-evaporation in a weight ratio of 2mDBTBPDBq-II:PCCP: Ir(ppy)$_2$(4dppy)=0.45:0.45:0.1 to a thickness of 40 nm. Note that in the light-emitting layer 160, 2mDBTBPDBq-II corresponds to the first organic compound, PCCP corresponds to the second organic compound, and Ir(ppy)$_2$(4dppy) corresponds to the guest material (the phosphorescent material).

<<Fabrication of Comparative Light-Emitting Element 4>>

The comparative light-emitting element 4 is different from the light-emitting element 9 in the structure of the light-emitting layer 160 and was fabricated through the same steps as those for the light-emitting element 9 except for the step of forming the light-emitting layer 160.

As the light-emitting layer 160 in the comparative light-emitting element 4, 2mDBTBPDBq-II and Ir(ppy)$_2$(4dppy) were deposited by co-evaporation in a weight ratio of 2mDBTBPDBq-II: Ir(ppy)$_2$(4dppy)=0.9:0.1 to a thickness of 40 nm. Note that in the light-emitting layer 160, 2mDBTBPDBq-II and Ir(ppy)$_2$(4dppy) correspond to the first organic compound and the guest material (the phosphorescent material), respectively, and the second organic compound is not contained.

<Characteristics of Light-Emitting Elements>

Figure 75:
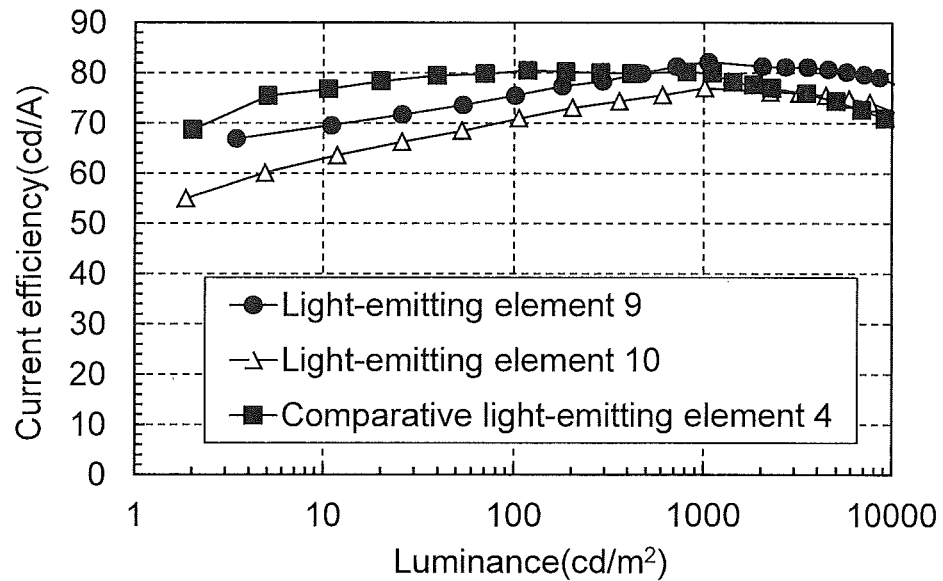
FIG. 75 shows current efficiency-luminance characteristics of light-emitting elements in Example.
Figure 76:
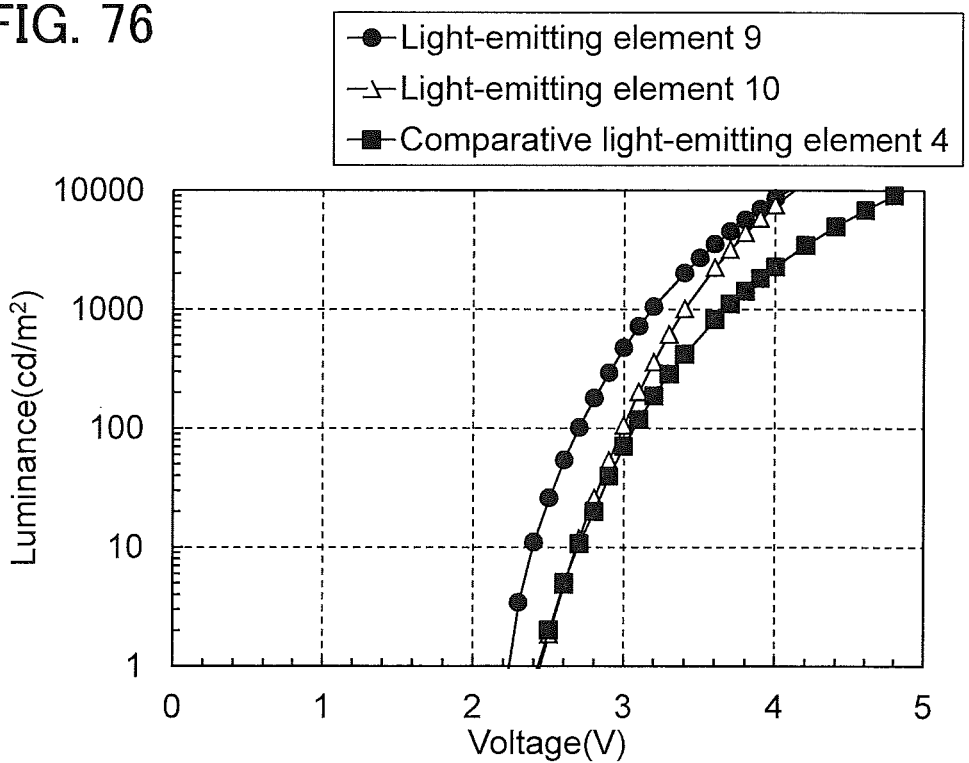
FIG. 76 is a graph showing luminance-voltage characteristics of light-emitting elements in Example.
Figure 77:
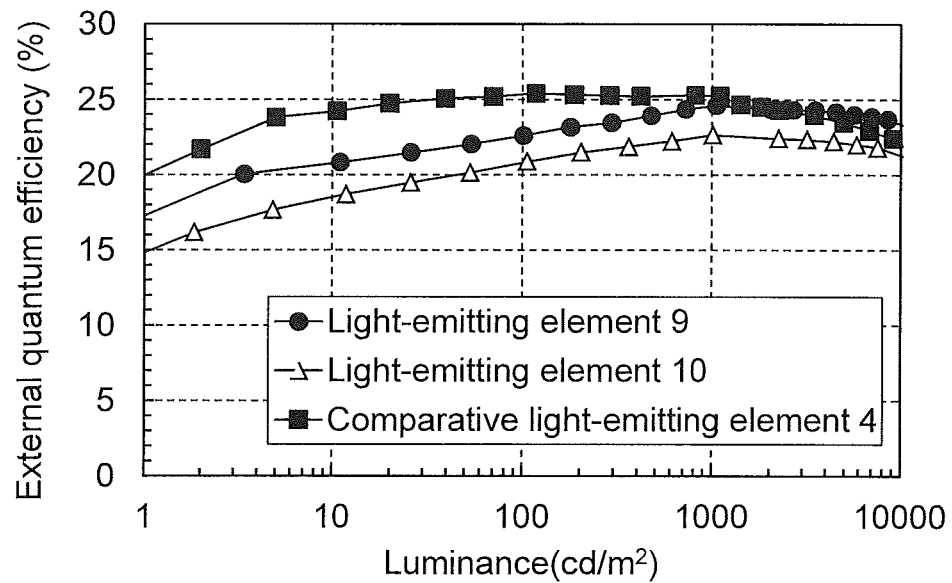
FIG. 77 is a graph showing external quantum efficiency-luminance characteristics of light-emitting elements in Example.
Figure 78:
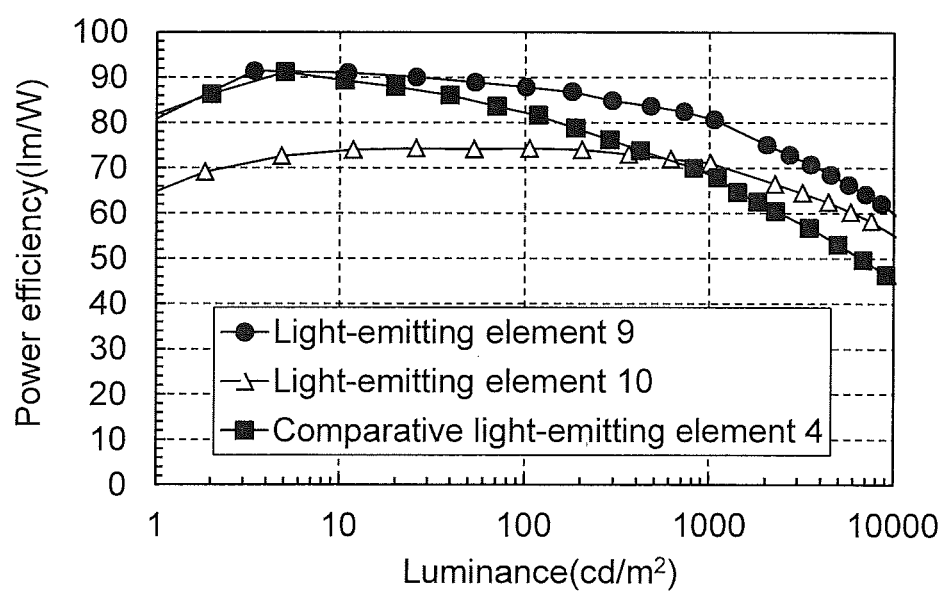
FIG. 78 is a graph showing power efficiency-luminance characteristics of light-emitting elements in Example.
Figure 79:
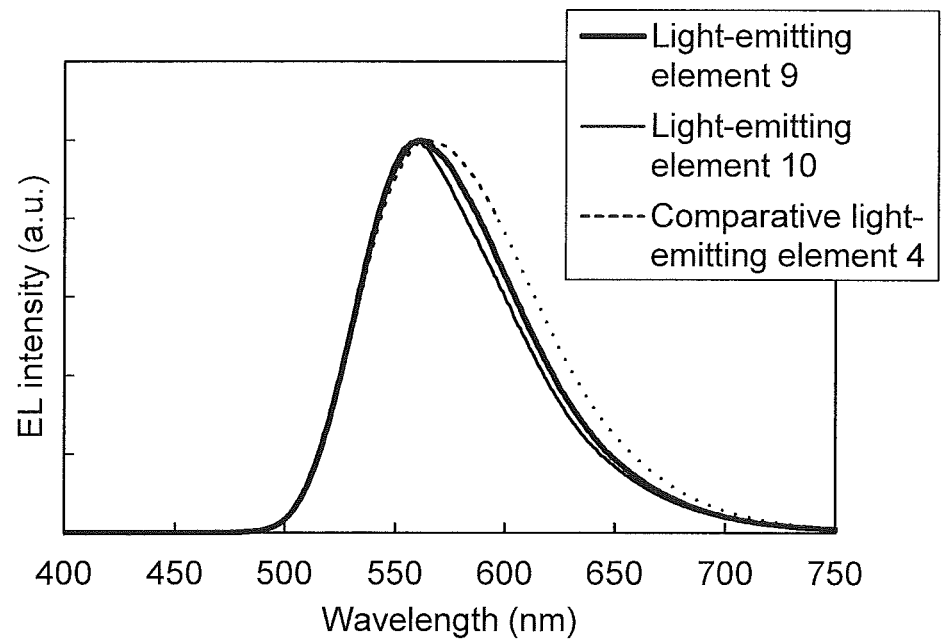
FIG. 79 is a graph showing electroluminescence spectra of light-emitting elements in Example.

Then, the characteristics of the fabricated light-emitting elements 9 and 10 and comparative light-emitting element 4 were measured. FIG. 75 shows the current efficiency-luminance characteristics of the light-emitting elements 9 and 10 and the comparative light-emitting element 4. FIG. 76 shows the luminance-voltage characteristics thereof. FIG. 77 shows the external quantum efficiency-luminance characteristics thereof. FIG. 78 shows the power efficiency-luminance characteristics thereof. FIG. 79 shows the electroluminescence spectra when a current at a current density of 2.5 mA/cm$^2$ was supplied to the light-emitting elements 9 and 10 and the comparative light-emitting element 4. The measurements of the light-emitting elements were performed at room temperature (in an atmosphere kept at 23° C.). The measurement method was similar to that used in Example 1.

Table 16 shows the element characteristics of the light-emitting elements 9 and 10 and the comparative light-emitting element 4 at around 1000 cd/m$^2$.

light. The electroluminescence spectra of the light-emitting elements 9 and 10 and the comparative light-emitting element 4 have peak wavelengths at 562 nm, 559 nm, and 564 nm, respectively, and full widths at half maximum of 84 nm, 80 nm, and 93 nm, respectively. The light emission of these light-emitting elements originates from the guest material Ir(ppy)$_2$(4dppy).

From FIGS. 75 to 79 and Table 16, it is found that the light-emitting elements 9 and 10 and the comparative light-emitting element 4 have high current efficiency and high external quantum efficiency. The maximum external quantum efficiencies of the light-emitting elements 9 and 10 and the comparative light-emitting element 4 are 24.6%, 22.6%, and 25.4%, which are excellent values. The light-emitting elements 9 and 10 were driven at a lower voltage than the comparative light-emitting element 4. Thus, the power efficiency of the light-emitting elements 9 and 10 is high.

The light emission starting voltages (a voltage at the time when the luminance exceeds 1 cd/m$^2$) of the light-emitting elements 9 and 10 were 2.3 V and 2.5 V, respectively. These voltages are smaller than a voltage corresponding to an energy difference between the LUMO level and the HOMO level of the guest material Ir(ppy)$_2$(4dppy), which is described later. The results suggest that emission in the light-emitting elements 9 and 10 is obtained not by direct recombination of carriers in the guest material but by recombination of carriers in the material having a smaller energy gap.

<Emission Spectra of Host Materials>

Figure 80:
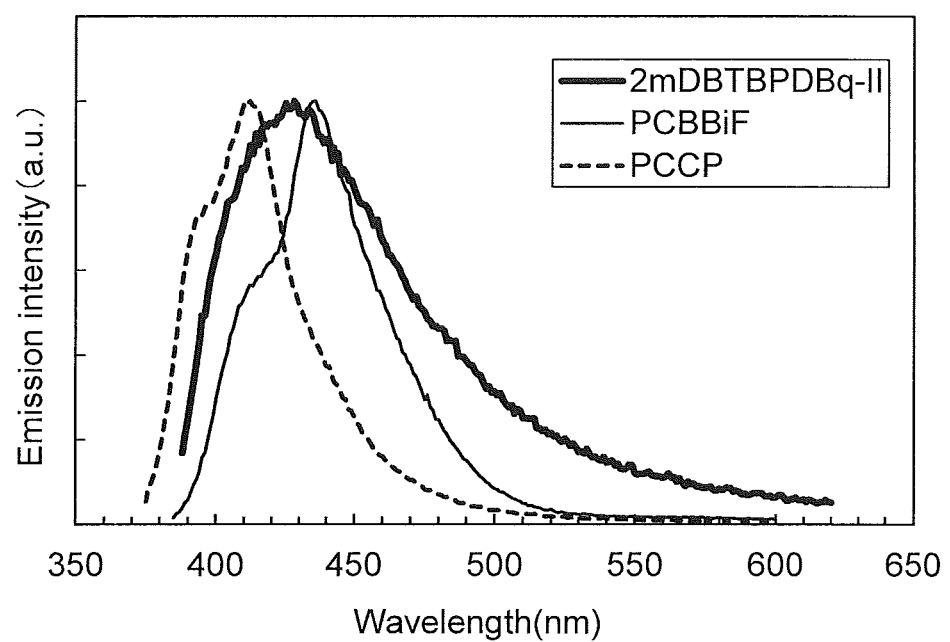
FIG. 80 is a graph showing emission spectra of host materials in Example.

In the fabricated light-emitting elements, 2mDBTBPDBq-II and PCBBiF were used as host materials (the first organic compound and the second organic compound). FIG. 80 shows measurement results of emission spectra of a thin film of 2mDBTBPDBq-II, a thin film of PCBBiF, and a thin film of PCCP.

For the emission spectrum measurement, thin film samples were formed over a quartz substrate by a vacuum evaporation method. The emission spectra were measured at room temperature (in an atmosphere kept at 23° C.) with a PL-EL measurement apparatus (produced by Hamamatsu Photonics K.K.). The thickness of each thin film was 50 nm.

As shown in FIG. 80, 2mDBTBPDBq-II, PCBBiF, and PCCP each emit blue light. The emission spectra of 2mDBTBPDBq-II, PCBBiF, and PCCP have peak wavelengths at 428 nm, 435 nm, and 412 nm, respectively.

<Fabrication of Comparative Light-Emitting Elements>

Next, comparative light-emitting elements 5 and 6 not containing guest materials were fabricated as comparative light-emitting elements for the light-emitting elements 9 and 10. The characteristics of the comparative light-emitting

TABLE 16

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 9 | 3.2 | 1.3 | (0.46, 0.53) | 1100 | 82 | 81 | 25 |
| Light-emitting element 10 | 3.4 | 1.3 | (0.45, 0.54) | 1000 | 77 | 71 | 23 |
| Comparative light-emitting element 4 | 3.7 | 1.4 | (0.47, 0.52) | 1100 | 80 | 68 | 25 |

As shown in FIG. 79, the light-emitting elements 9 and 10 and the comparative light-emitting element 4 emit green elements 5 and 6 were evaluated. The detailed element structures are shown in Table 17.

TABLE 17

| Layer | | Reference numeral | Thickness (nm) | Material | Weight ratio |
|---|---|---|---|---|---|
| Comparative light-emitting element 5 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 2mDBTBPDBq-II | — |
| | Light-emitting layer | 160 | 40 | 2mDBTBPDBq-II:PCBBiF | 0.8:0.2 |
| | Hole-transport layer | 112 | 20 | BPAFLP | — |
| | Hole-injection layer | 111 | 60 | DBT3P-II:MoO$_3$ | 1:0.5 |
| | Electrode | 101 | 70 | ITSO | — |
| Comparative light-emitting element 6 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 2mDBTBPDBq-II | — |
| | Light-emitting layer | 160 | 40 | 2mDBTBPDBq-II:PCCP | 0.8:0.2 |
| | Hole-transport layer | 112 | 20 | BPAFLP | — |
| | Hole-injection layer | 111 | 60 | DBT3P-II:MoO$_3$ | 1:0.5 |
| | Electrode | 101 | 70 | ITSO | — |

The comparative light-emitting elements 5 and 6 are respectively different from the light-emitting elements 9 and 10 in the structure of the light-emitting layer 160 and were fabricated through the same steps as those for the light-emitting elements 9 and 10 except for the step of forming the light-emitting layer 160.

As the light-emitting layer 160 in the comparative light-emitting element 5, 2mDBTBPDBq-II and PCBBiF were deposited by co-evaporation in a weight ratio of 2mDBTBPDBq-II:PCBBiF=0.8:0.2 to a thickness of 40 nm.

As the light-emitting layer 160 in the comparative light-emitting element 6, 2mDBTBPDBq-II and PCCP were deposited by co-evaporation in a weight ratio of 2mDBTBPDBq-II:PCCP=0.8:0.2 to a thickness of 40 nm.

<Characteristics of Comparative Light-Emitting Elements>

Then, the characteristics of the fabricated comparative light-emitting elements 5 and 6 were measured. The measurement method was similar to that used in Example 1.

Figure 81:
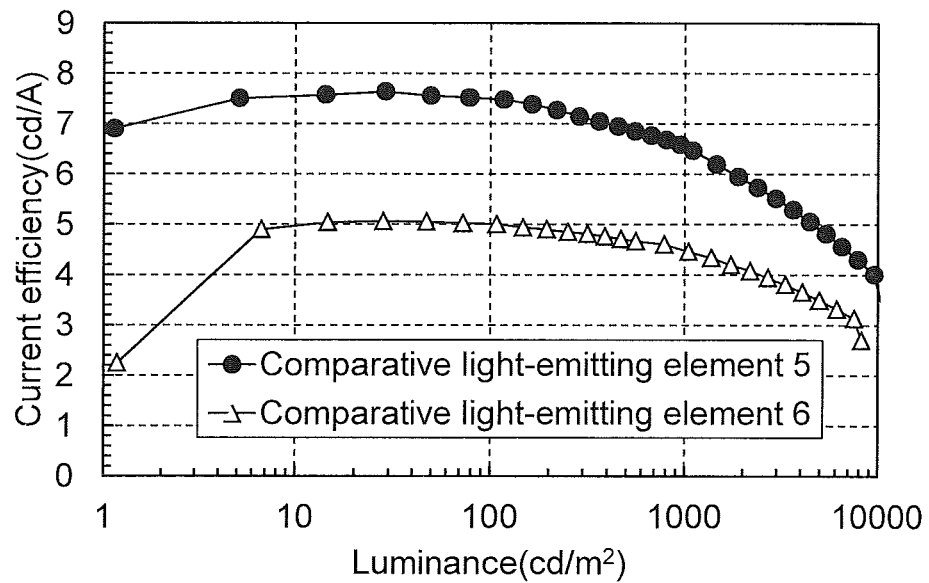
FIG. 81 is a graph showing current efficiency-luminance characteristics of light-emitting elements in Example.
Figure 82:
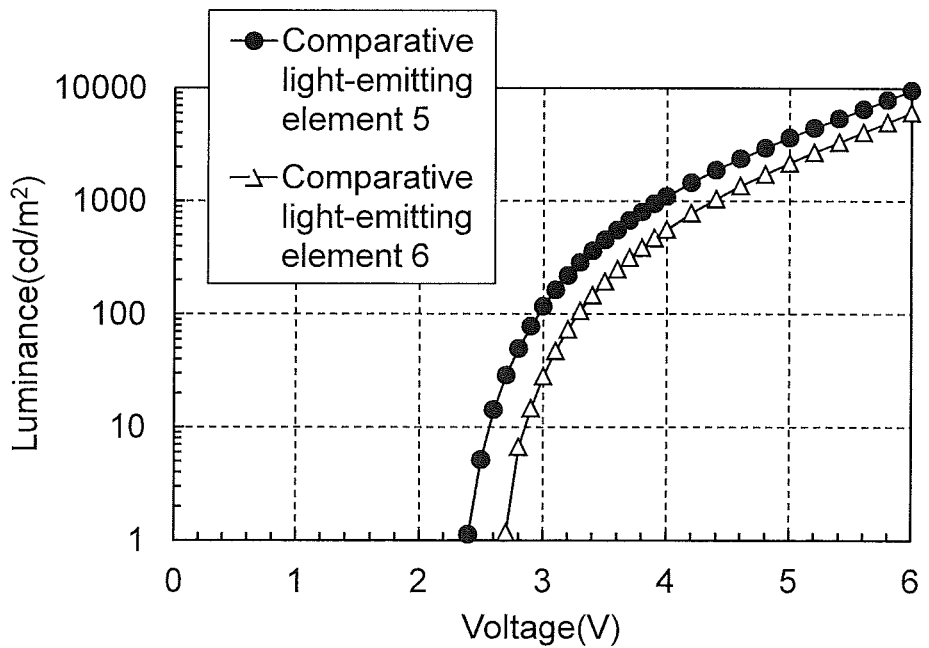
FIG. 82 is a graph showing luminance-voltage characteristics of light-emitting elements in Example.
Figure 83:
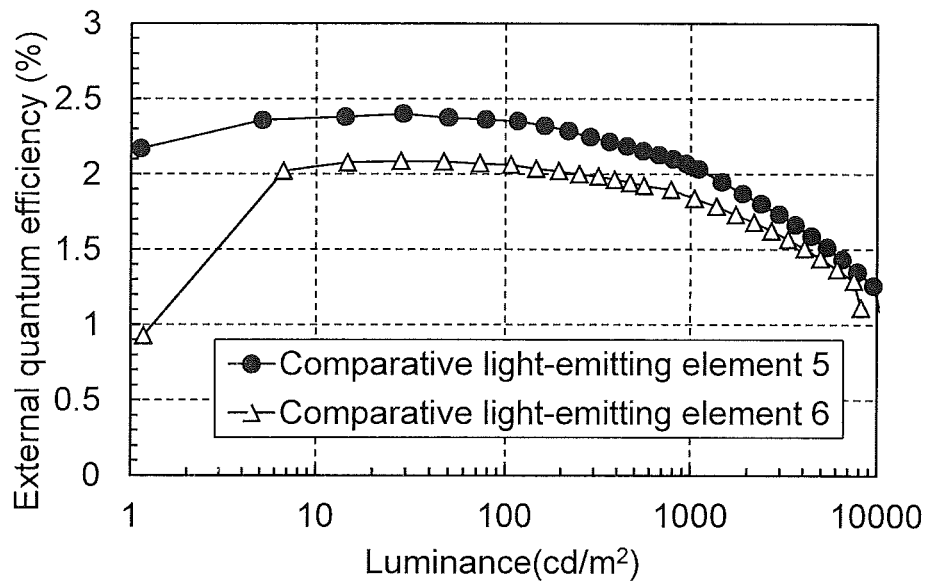
FIG. 83 is a graph showing external quantum efficiency-luminance characteristics of light-emitting elements in Example.
Figure 84:
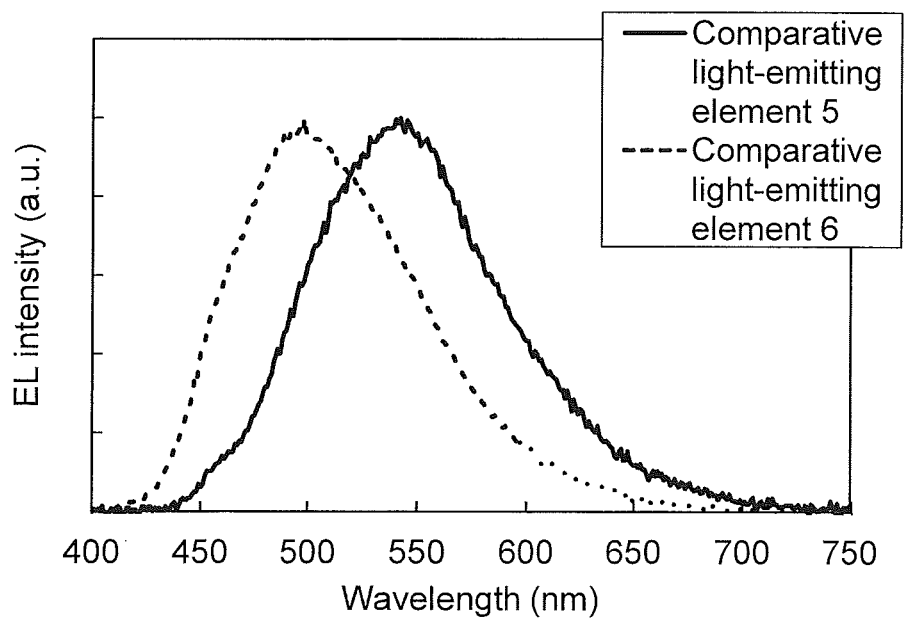
FIG. 84 is a graph showing electroluminescence spectra of light-emitting elements in Example.

FIG. 81 shows current efficiency-luminance characteristics of the comparative light-emitting elements 5 and 6. FIG. 82 shows luminance-voltage characteristics. FIG. 83 shows external quantum efficiency-luminance characteristics. FIG. 84 shows electroluminescence spectra when a current at a current density of 2.5 mA/cm$^2$ was supplied to the comparative light-emitting elements 5 and 6. The measurement of the light-emitting elements was performed at room temperature (in an atmosphere kept at 23° C.).

Table 18 shows the element characteristics of the comparative light-emitting elements 5 and 6 at around 1000 cd/m$^2$.

TABLE 18

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting element 5 | 3.9 | 14 | (0.33, 0.55) | 950 | 6.6 | 5.3 | 2.1 |
| Comparative light-emitting element 6 | 4.4 | 23 | (0.21, 0.39) | 1050 | 4.5 | 3.2 | 1.8 |

As shown in FIG. 84, the comparative light-emitting elements 5 and 6 emit yellow light. The electroluminescence spectra of the comparative light-emitting elements 5 and 6 have peak wavelengths at 542 nm and 498 nm, respectively, and full widths at half maximum of 101 nm and 103 nm, respectively. The emission spectra are significantly different from those of the thin film of 2mDBTBPDBq-II, the thin film of PCBBiF, and the thin film of PCCP in FIG. 80.

As described later, the LUMO level of 2mDBTBPDBq-II is lower than the LUMO level of PCBBiF and that of PCCP, and the HOMO level of PCBBiF and that of PCCP are higher than the HOMO level of 2mDBTBPDBq-II. The comparative light-emitting element 5 using the mixed film of 2mDBTBPDBq-II and PCBBiF emits light having an energy equivalent to the energy difference between the LUMO level of 2mDBTBPDBq-II and the HOMO level of PCBBiF. In addition, the light emission from the comparative light-emitting element 5 using the mixed film has a longer wavelength (lower energy) than light emission from 2mDBTBPDBq-II alone and light emission from PCBBiF alone. It can thus be said that the light emission from the comparative light-emitting element 5 is light emission from an exciplex formed by these compounds. The comparative light-emitting element 6 using the mixed film of 2mDBTBPDBq-II and PCCP emits light having an energy equivalent to the energy difference between the LUMO level of 2mDBTBPDBq-II and the HOMO level of PCCP. In addition, the light emission from the comparative light-emitting element 6 using the mixed film has a longer wavelength (lower energy) than light emission from 2mDBTBPDBq-II alone and light emission from PCCP alone. It can thus be said that the light emission from the comparative light-emitting element 6 is light emission from an exciplex formed by these compounds. That is, 2mDBTBPDBq-II and PCBBiF are organic compounds which form an exciplex in combination with each other. Furthermore, 2mDBTBPDBq-II and PCCP are organic compounds which form an exciplex in combination with each other. Thus, the use of 2mDBTBPDBq-II and PCBBiF as host materials or the use of 2mDBTBPDBq-II and PCCP as host materials can fabricate a light-emitting element utilizing ExTET.

<Absorption Spectrum and Emission Spectrum of Guest Material>

Figure 85:
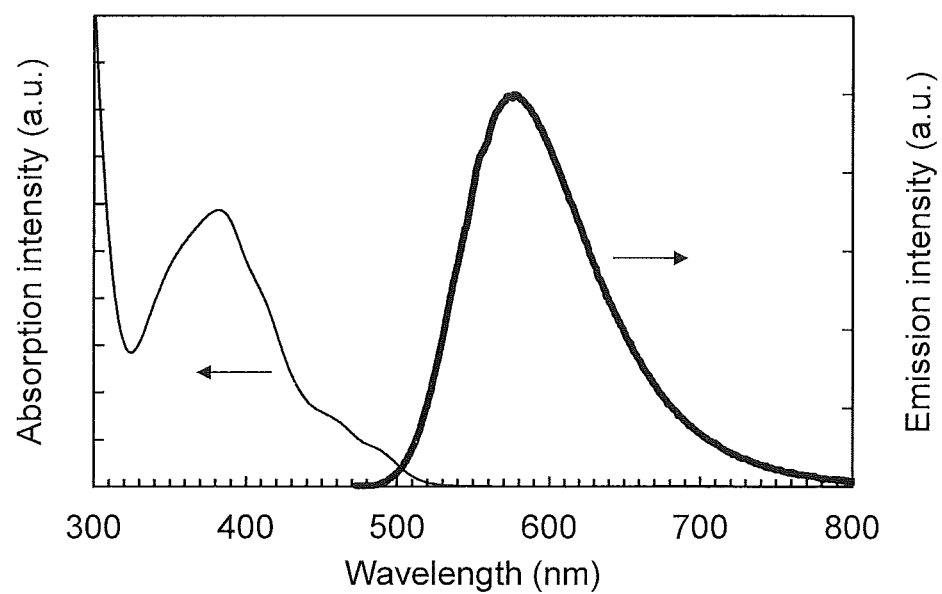
FIG. 85 is a graph showing absorption and emission spectra of a guest material in Example.

FIG. 85 shows the measurement results of the absorption spectrum and the emission spectrum of $Ir(ppy)_2(4dppy)$ that is the guest material in the above light-emitting elements.

For the absorption spectrum measurement, a dichloromethane solution in which $Ir(ppy)_2(4dppy)$ was dissolved was prepared, and a quartz cell was used. The absorption spectrum was measured at room temperature with the use of an ultraviolet-visible spectrophotometer (V-550, produced by JASCO Corporation) in a state where the dichloromethane solution was put in a quartz cell. The absorption spectra of the quartz cell and dichloromethane were subtracted from the measured absorption spectrum. The emission spectrum was measured at room temperature in such a manner that an absolute PL quantum yield measurement system (C11347-01 produced by Hamamatsu Photonics K. K.) was used and the deoxidized dichloromethane solution was sealed in a quartz cell under a nitrogen atmosphere in a glove box (LABstar M13 (1250/780) produced by Bright Co., Ltd.).

As shown in FIG. 85, an absorption band on the lowest energy side (the longest wavelength side) of the absorption spectrum of $Ir(ppy)_2(4dppy)$ is at around 500 nm. The absorption edge was calculated from data of the absorption spectrum, and a transition energy was estimated on the assumption of direct transition, whereby it was found that the absorption edge of the absorption spectrum of $Ir(ppy)_2(4dppy)$ was at 516 nm and transition energy thereof was 2.40 eV.

Thus, an absorption band on the lowest energy side (the longest wavelength side) of the absorption spectrum of $Ir(ppy)_2(4dppy)$ has a region overlapping with light emission by an exciplex formed by 2mDBTBPDBq-II and PCBBiF and light emission by an exciplex formed by 2mDBTBPDBq-II and PCCP. Therefore, in the light-emitting element 9 using 2mDBTBPDBq-II and PCBBiF as host materials and the light-emitting element 10 using 2mDBTBPDBq-II and PCCP as host materials, excitation energy can be effectively transferred to the guest material ($Ir(ppy)_2(4dppy)$).

As described above, in the light-emitting elements 9 and 10, the host materials which are 2mDBTBPDBq-II (the first organic compound) and PCBBiF or PCCP (the second organic compound) form an exciplex in combination with each other.

<Phosphorescence Emission Spectra of Host Materials>

Figure 86:
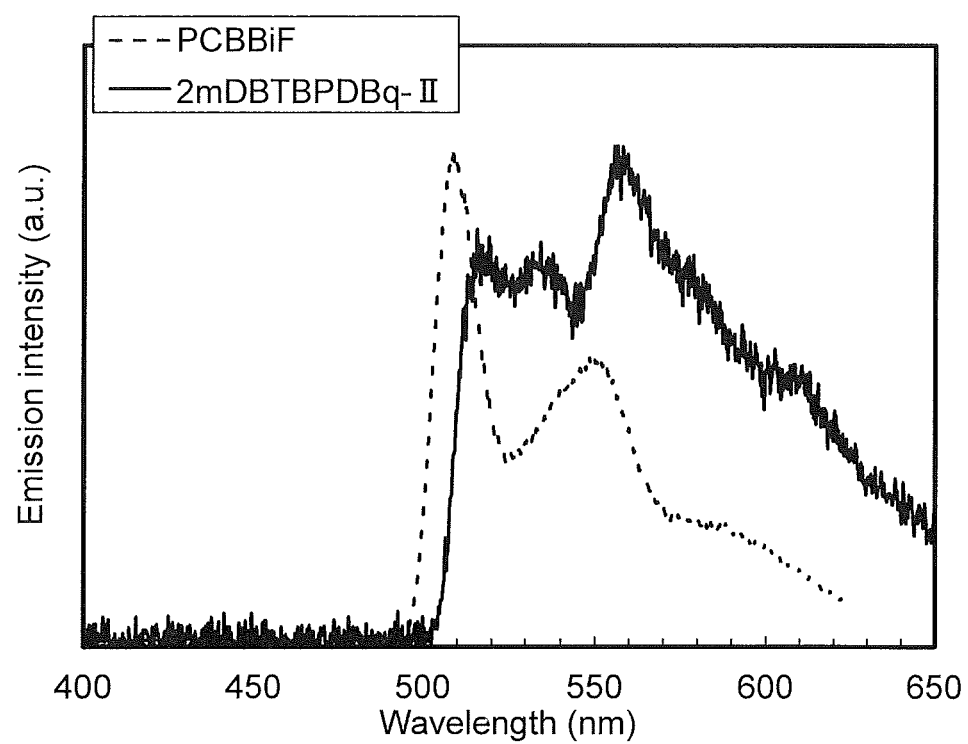
FIG. 86 is a graph showing phosphorescence spectra of host materials in Example.

FIG. 86 shows the measurement results of the triplet excitation energy levels (T1 levels) of 2mDBTBPDBq-II and PCBBiF, which were used as the host materials. The measurement method was similar to that used in Example 1. For the measurement results of the triplet excitation energy level (T1 level) of PCCP, FIG. 37 can be referred to.

In FIG. 86, a peak wavelength on the shortest wavelength side of the phosphorescence emission spectrum of 2mDBTBPDBq-II was 515 nm, and that of PCBBiF was 509 nm. Accordingly, the triplet excitation energy level (T1 level) of 2mDBTBPDBq-II was 2.41 eV, and that of PCBBiF was 2.44 eV. As shown in Example 1, the triplet excitation energy level (T1 level) of PCCP was 2.66 eV.

The triplet excitation energy levels (T1 level) of 2mDBTBPDBq-II, PCBBiF, and PCCP are each higher than the transition energy (2.40 eV) of $Ir(ppy)_2(4dppy)$ which was calculated from the absorption edge of the absorption spectrum shown in FIG. 85.

Therefore, the first organic compound (2mDBTBPDBq-II) and the second organic compounds (PCBBiF and PCCP), which were used as the host materials in this example, have triplet excitation energy levels (T1 levels) high enough for host materials.

<Results of CV Measurement>

The electrochemical characteristics (oxidation reaction characteristics and reduction reaction characteristics) of 2mDBTBPDBq-II, PCBBiF, PCCP, and $Ir(ppy)_2(4dppy)$ were measured by cyclic voltammetry (CV). The measurement method was similar to that used in Example 1 and a solution obtained by dissolving each compound in DMF was subjected to the measurement.

Table 19 shows oxidation potentials and reduction potentials of the compounds obtained from the results of the CV measurement and HOMO levels and LUMO levels of the compounds calculated from the CV measurement results.

TABLE 19

| Material | Oxidation potential (V) | Reduction potential (V) | HOMO level calculated from oxidation potential (eV) | LUMO level calculated from reduction potential (eV) |
| --- | --- | --- | --- | --- |
| 2mDBTBPDBq-II | 1.28 | −2.00 | −6.22 | −2.94 |
| PCBBiF | 0.42 | −2.94 | −5.36 | −2.00 |
| PCCP | 0.69 | −2.98 | −5.63 | −1.96 |
| $Ir(ppy)_2(4dppy)$ | 0.37 | −2.38 | −5.31 | −2.57 |

As shown in Table 19, the reduction potential of the first organic compound (2mDBTBPDBq-II) is higher than that of each of the second organic compounds (PCBBiF and PCCP), the oxidation potential of the first organic compound (2mDBTBPDBq-II) is higher than that of each of the second organic compounds (PCBBiF and PCCP), the reduction potential of the guest material (Ir(ppy)$_2$(4dppy)) is lower than that of the first organic compound (2mDBTBPDBq-II), and the oxidation potential of the guest material (Ir(ppy)$_2$(4dppy)) is lower than that of each of the second organic compounds (PCBBiF and PCCP). In addition, the LUMO level of the first organic compound (2mDBTBPDBq-II) is lower than that of each of the second organic compounds (PCBBiF and PCCP), and the HOMO level of the first organic compound (2mDBTBPDBq-II) is lower than that of each of the second organic compounds (PCBBiF and PCCP). The LUMO level of the guest material (Ir(ppy)$_2$(4dppy)) is higher than that of the first organic compound (2mDBTBPDBq-II), and the HOMO level of the guest material (Ir(ppy)$_2$(4dppy)) is higher than that of each of the second organic compounds (PCBBiF and PCCP).

The results of the CV measurement show that the combination of the first organic compound (2mDBTBPDBq-II) and each of the second organic compounds (PCBBiF and PCCP) forms an exciplex.

An energy difference between the LUMO level and the HOMO level of Ir(ppy)$_2$(4dppy) was 2.75 eV. The value was calculated from the CV measurement results shown in Table 19.

As described above, the transition energy of Ir(ppy)$_2$(4dppy) that was calculated from the absorption edge of the absorption spectrum in FIG. 85 is 2.40 eV.

That is, the energy difference between the LUMO level and the HOMO level of Ir(ppy)$_2$(4dppy) is larger than the transition energy thereof calculated from the absorption edge by 0.35 eV.

The peak wavelength on the shortest wavelength side of the emission spectrum in FIG. 85 is 576 nm. According to that, the light emission energy of Ir(ppy)$_2$(4dppy) was calculated to be 2.15 eV.

That is, the energy difference between the LUMO level and the HOMO level of Ir(ppy)$_2$(4dppy) was larger than the light emission energy by 0.60 eV.

Consequently, in each of the guest materials of the light-emitting elements 9 and 10, the energy difference between the LUMO level and the HOMO level is larger than the transition energy calculated from the absorption edge by 0.3 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention can have reduced power consumption.

Note that an energy difference between the LUMO level of 2mDBTBPDBq-II (the first organic compound) and the HOMO level of PCBBiF (the second organic compound) (2mDBTBPDBq-II and PCBBiF are the host materials) was calculated to be 2.42 eV from Table 19. Furthermore, an energy difference between the LUMO level of 2mDBTBPDBq-II (the first organic compound) and the HOMO level of PCCP (the second organic compound) (2mDBTBPDBq-II and PCCP are the host materials) was calculated to be 2.69 eV from Table 19. Consequently, energy corresponding to the energy difference between the LUMO level and the HOMO level of an exciplex formed by the host materials is smaller than the energy difference (2.75 eV) between the LUMO level and the HOMO level of the guest material (Ir(ppy)$_2$(4dppy)), and larger than the transition energy (2.40 eV) calculated from the absorption edge of the absorption spectrum of the guest material (Ir(ppy)$_2$(4dppy)). Therefore, in the light-emitting elements 9 and 10, the guest material can be excited through the exciplex, whereby the driving voltage can be lowered. Therefore, the light-emitting element of one embodiment of the present invention can have reduced power consumption.

According to the CV measurement results in Table 19, among carriers (electrons and holes) injected from the pair of electrodes, electrons tend to be injected into the first organic compound (2mDBTBPDBq-II) which is a host material with a low LUMO level, whereas holes tend to be injected into the guest material (Ir(ppy)$_2$(4dppy)) with a high HOMO level. That is, there is a possibility that an exciplex is formed by the first organic compound (2mDBTBPDBq-II) and the guest material (Ir(ppy)$_2$(4dppy)).

However, an exciplex is not formed by the first organic compound and the guest material. This is shown by the fact that the electroluminescence spectra of the light-emitting elements 9 and 10 are similar to the emission spectrum of the guest material (Ir(ppy)$_2$(4dppy)) shown in FIG. 85. The present inventors have found this characteristic phenomenon.

The energy difference between the LUMO level of the first organic compound (2mDBTBPDBq-II) and the HOMO level of the guest material Ir(ppy)$_2$(4dppy) was calculated from the CV measurement results shown in Table 19 and found to be 2.37 eV.

Accordingly, in the light-emitting elements 9 and 10, the energy difference (2.37 eV) between the LUMO level of the first organic compound (2mDBTBPDBq-II) and the HOMO level of the guest material (Ir(ppy)$_2$(4dppy)) is higher than or equal to the energy (2.15 eV) of light emission from the guest material (Ir(ppy)$_2$(4dppy)). Accordingly, rather than formation of an exciplex by the combination of the first organic compound and the guest material, transfer of excitation energy to the guest material is more facilitated eventually, whereby efficient light emission from the guest material is achieved. The above-described relationship is a feature of one embodiment of the present invention which contributes to efficient light emission.

<Results of Reliability Test>

Figure 87:
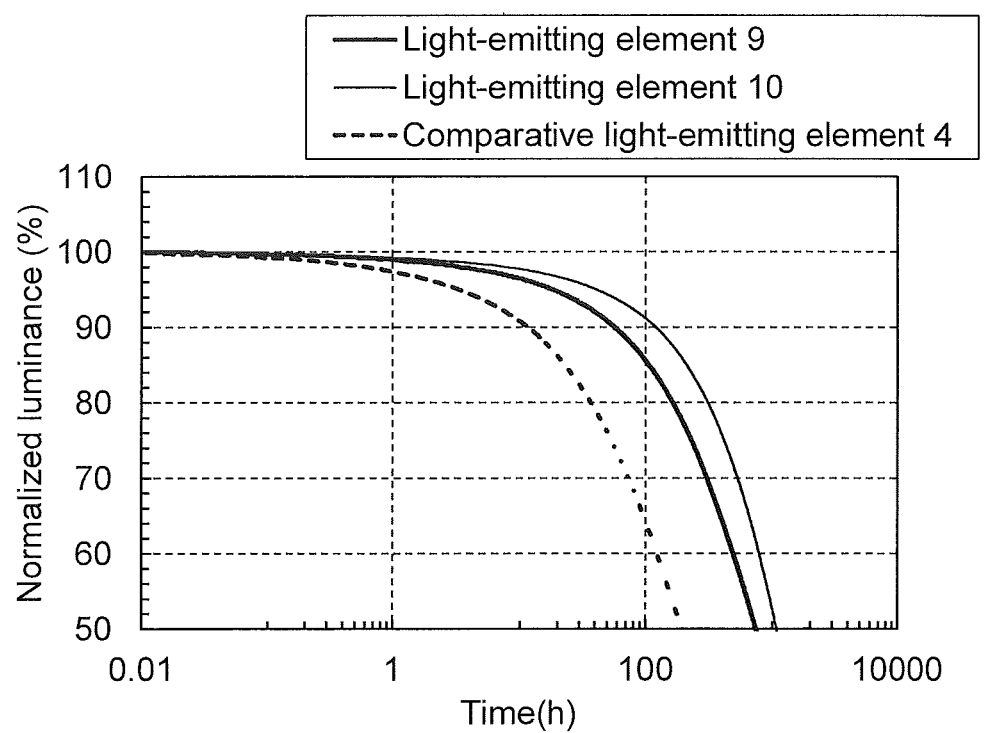
FIG. 87 is a graph showing reliability test results of light-emitting elements in Example.

FIG. 87 shows the results of reliability tests of the light-emitting elements. For the reliability test, the current density for the light-emitting elements (the light-emitting elements 9 and 10 and the comparative light-emitting element 4) was set to 50 mA/cm² and each of the light-emitting elements was continuously driven at a constant current density.

The time (LT90) taken for the luminance of the light-emitting elements 9 and 10 and the comparative light-emitting element 4 to decrease to 90% of the initial luminance was as follows: the light-emitting element 9, 60 hours; the light-emitting element 10, 120 hours; and the comparative light-emitting element 4, 10 hours. The light-emitting elements 9 and 10 show high reliability.

That is, a light-emitting element having the following structure like the light-emitting elements 9 and 10 can achieve high emission efficiency with low driving voltage and have excellent reliability: the LUMO level of the first organic compound is lower than that of the second organic compound, the HOMO level of the first organic compound is lower than that of the second organic compound, the LUMO level of the guest material is higher than that of the first organic compound, the HOMO level of the guest material is higher than that of the second organic compound, the first organic compound and the second organic compound form an exciplex in combination with each other, and the energy difference between the LUMO level of the first organic compound and the HOMO level of the guest material is larger than or equal to the light emission energy of the guest material.

As described above, by employing the structure of one embodiment of the present invention, a light-emitting element having high emission efficiency can be manufactured. A light-emitting element with reduced power consumption can be manufactured. A highly reliable light-emitting element can be manufactured.

Example 7

In this example, an example of fabricating a light-emitting element of one embodiment of the present invention (a light-emitting element 11) is described. A schematic cross-sectional view of the light-emitting element fabricated in this example is similar to that shown in FIG. 34. Table 20 shows details of the element structure. In addition, structures and abbreviations of compounds used here are given below. Note that the above example can be referred to for other compounds.

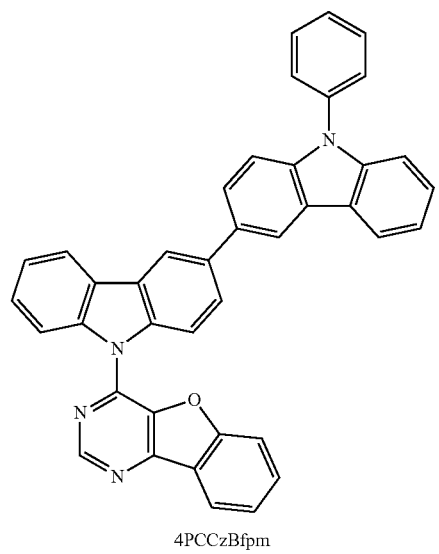 [SMILES: c1ccc(-n2c3ccccc3c3cc(-c4ccc5c(c4)c4ccccc4n5-c4ncnc5c4oc4ccccc45)ccc32)cc1]

4PCCzBfpm

TABLE 20

| | Layer | Reference numeral | Thickness (nm) | Material | Weight ratio |
|---|---|---|---|---|---|
| Light-emitting element 11 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4PCCzBfpm | — |
| | Light-emitting layer | 160(2) | 20 | 4PCCzBfpm:PCCP:Ir(ppy)₃ | 0.8:0.2:0.05 |
| | | 160(1) | 20 | 4PCCzBfpm:PCCP:Ir(ppy)₃ | 0.5:0.5:0.05 |
| | Hole-transport layer | 112 | 20 | PCCP | — |
| | Hole-injection layer | 111 | 60 | DBT3P-II:MoO₃ | 1:0.5 |
| | Electrode | 101 | 70 | ITSO | — |

<Fabrication of Light-Emitting Element 11>

As the electrode 101, an ITSO film was formed to a thickness of 70 nm over the substrate 200. The electrode area of the electrode 101 was set to 4 mm² (2 mm×2 mm).

As the hole-injection layer 111, DBT3P-II and MoO$_3$ were deposited over the electrode 101 by co-evaporation in a weight ratio of DBT3P-II:MoO$_3$=1:0.5 to a thickness of 60 nm.

As the hole-transport layer 112, PCCP was deposited over the hole-injection layer 111 by evaporation to a thickness of 20 nm.

As the light-emitting layer 160 over the hole-transport layer 112, 4-(9-phenyl-3,3'-bi-9H-carbazol-9-yl)benzofuro[3,2-d]pyrimidine (abbreviation: 4PCCzBfpm), PCCP, and Ir(ppy)$_3$ were deposited by co-evaporation in a weight ratio of 4PCCzBfpm:PCCP: Ir(ppy)$_3$=0.5:0.5:0.05 to a thickness of 20 nm, and successively, 4PCCzBfpm, PCCP, and Ir(ppy)$_3$ were deposited by co-evaporation in a weight ratio of 4PCCzBfpm:PCCP: Ir(ppy)$_3$=0.8:0.2:0.05 to a thickness of 20 mm Note that in the light-emitting layer 160, 4PCCzBfpm corresponds to the first organic compound, PCCP corresponds to the second organic compound, and Ir(ppy)$_3$ corresponds to the guest material (the phosphorescent material).

As the electron-transport layer 118, 4PCCzBfpm and bathophenanthroline BPhen were sequentially deposited by evaporation to thicknesses of 20 nm and 10 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 11 was sealed by fixing the substrate 220 to the substrate 200 over which the organic materials were deposited using a sealant for an organic EL device. For the detailed method, description of Example 1 can be referred to. Through the above process, the light-emitting element 11 was obtained.

<Characteristics of Light-Emitting Element>

Figure 88:
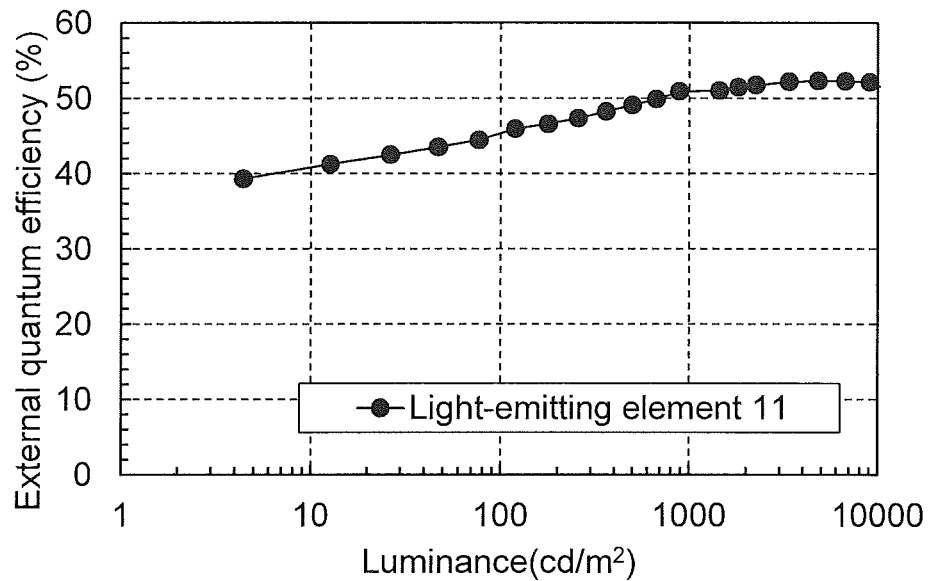
FIG. 88 is a graph showing current efficiency-luminance characteristics of a light-emitting element in Example.
Figure 89:
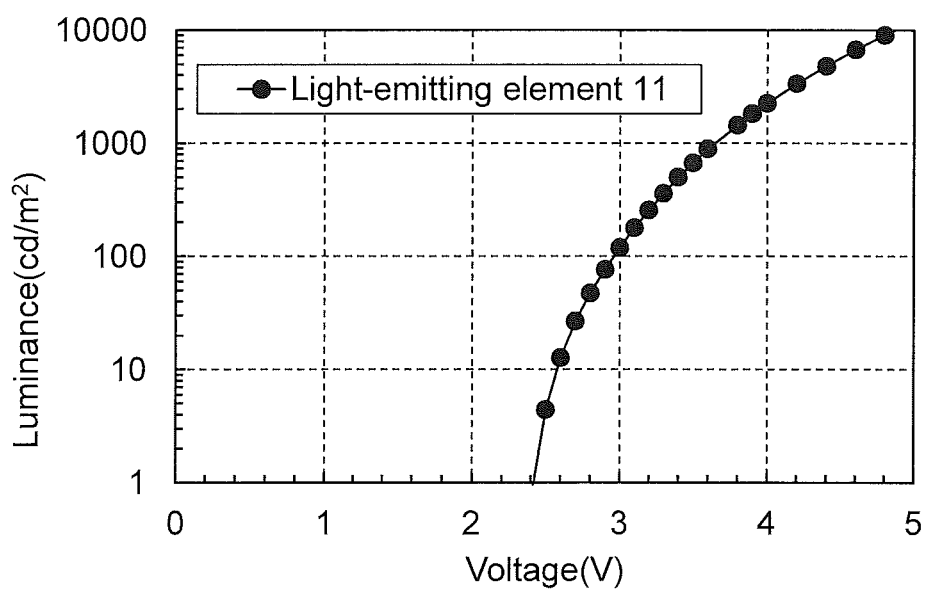
FIG. 89 is a graph showing luminance-voltage characteristics of a light-emitting element in Example.
Figure 90:
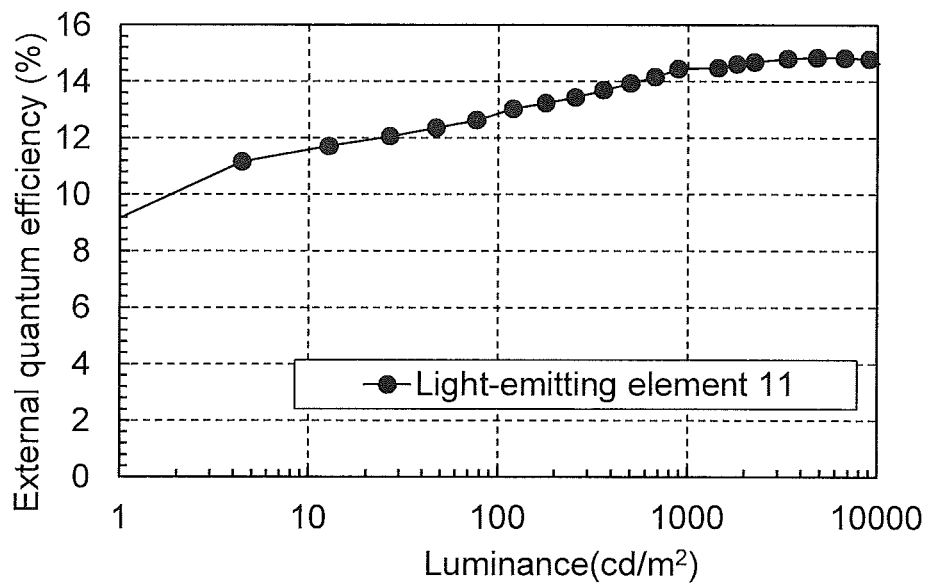
FIG. 90 is a graph showing external quantum efficiency-luminance characteristics of a light-emitting element in Example.
Figure 91:
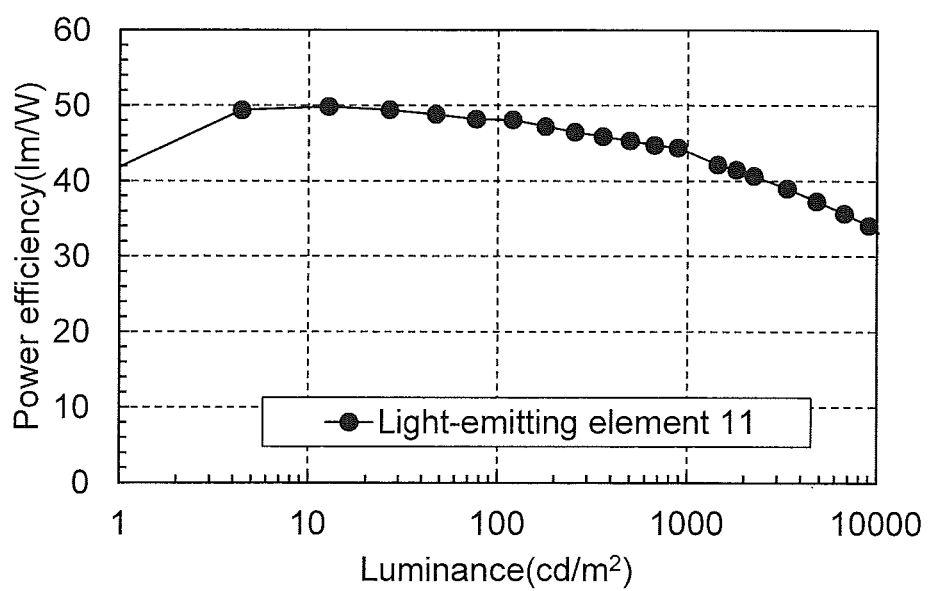
FIG. 91 is a graph showing power efficiency-luminance characteristics of a light-emitting element in Example.
Figure 92:
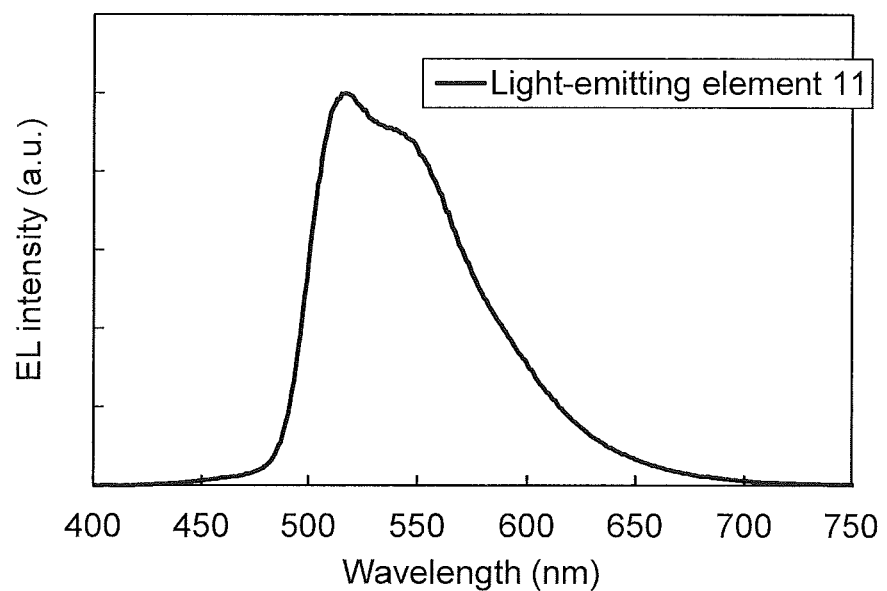
FIG. 92 is a graph showing an electroluminescence spectrum of a light-emitting element in Example.

Then, the characteristics of the fabricated light-emitting element 11 were measured. FIG. 88 shows the current efficiency-luminance characteristics of the light-emitting element 11. FIG. 89 shows the luminance-voltage characteristics thereof. FIG. 90 shows the external quantum efficiency-luminance characteristics thereof. FIG. 91 shows the power efficiency-luminance characteristics thereof. FIG. 92 shows the electroluminescence spectrum when a current at a current density of 2.5 mA/cm² was supplied to the light-emitting element 11. The measurement of the light-emitting element was performed at room temperature (in an atmosphere kept at 23° C.). The measurement method was similar to that used in Example 1.

Table 21 shows the element characteristics of the light-emitting element 11 at around 1000 cd/m².

As shown in FIG. 92, the light-emitting element 11 emits green light. The electroluminescence spectrum of the light-emitting element 11 has a peak wavelength at 517 nm and a full width at half maximum of 80 nm. The light emission of the light-emitting element originates from the guest material Ir(ppy)$_3$.

From FIGS. 88 to 91 and Table 21, it is found that the light-emitting element 11 has high current efficiency and high external quantum efficiency. The maximum external quantum efficiency of the light-emitting element 11 is 15%, which is an excellent value. The light-emitting element 11 was driven at a lower voltage. Thus, the power efficiency of the light-emitting element 11 is high.

The light emission starting voltage (a voltage at the time when the luminance exceeds 1 cd/m²) of the light-emitting element 11 was 2.5 V. This voltage is smaller than a voltage corresponding to an energy difference (3.01 eV) between the LUMO level and the HOMO level of the guest material Ir(ppy)$_3$, as described in Example 1. The results suggest that emission in the light-emitting element 11 is obtained not by direct recombination of carriers in the guest material but by recombination of carriers in the material having a smaller energy gap.

<Phosphorescence Emission Spectrum of Host Material>

Figure 93:
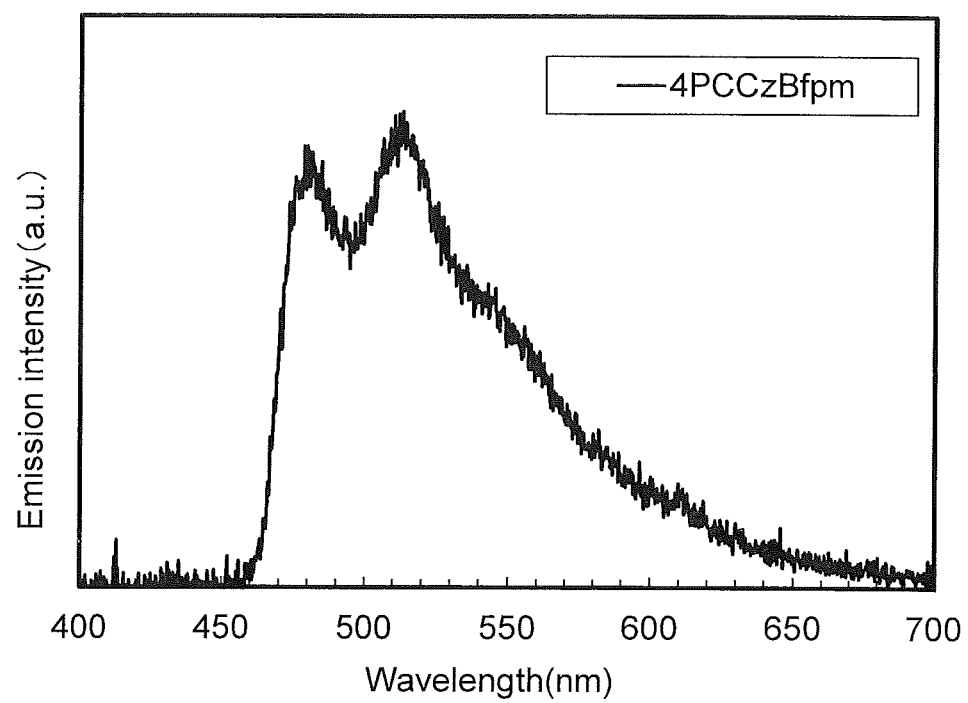
FIG. 93 is a graph showing a phosphorescence spectrum of a host material in Example.

FIG. 93 shows the measurement results of the triplet excitation energy level (T1 level) of 4PCCzBfpm, which was used as the host material. The measurement method was similar to that used in Example 1. For the measurement results of the triplet excitation energy level (T1 level) of PCCP, FIG. 37 can be referred to.

In FIG. 93, a peak wavelength on the shortest wavelength side of the phosphorescence emission spectrum of 4PCCzBfpm was 480 nm. Accordingly, the triplet excitation energy level (T1 level) of 4PCCzBfpm was 2.58 eV. As shown in Example 1, the triplet excitation energy level (T1 level) of PCCP was 2.66 eV.

The triplet excitation energy levels (T1 level) of 4PCCzBfpm and PCCP are each higher than the transition energy (2.44 eV) of Ir(ppy)$_3$ which was calculated from the absorption edge of the absorption spectrum shown in FIG. 36A.

Therefore, the first organic compound (4PCCzBfpm) and the second organic compound (PCCP), which were used as the host materials in this example, have triplet excitation energy levels (T1 levels) high enough for host materials.

<Results of CV Measurement>

The electrochemical characteristics (oxidation reaction characteristics and reduction reaction characteristics) of 4PCCzBfpm were measured by cyclic voltammetry (CV). The measurement method was similar to that used in Example 1 and a solution obtained by dissolving 4PCCzBfpm in DMF was subjected to the measurement.

According to the CV measurement results, the oxidation potential of 4PCCzBfpm was 0.76 V and the reduction potential thereof was −2.10 V; therefore, the HOMO level

TABLE 21

|  | Voltage (V) | Current density (mA/cm²) | CIE chromaticity (x, y) | Luminance (cd/m²) | Current efficiency (cd/A) | Power efficiency (lm/W) | External quantum efficiency (%) |
|---|---|---|---|---|---|---|---|
| Light-emitting element 11 | 3.6 | 1.8 | (0.33, 0.61) | 900 | 51 | 44 | 14 | and the LUMO level calculated from the CV measurement were −5.70 eV and −2.84 eV, respectively.

As can be seen from the CV measurement results, the reduction potential of the first organic compound (4PCCzBfpm) is higher than that of the second organic compound (PCCP), the oxidation potential of the first organic compound (4PCCzBfpm) is higher than that of the second organic compound (PCCP), the reduction potential of the guest material (Ir(ppy)$_3$) is lower than that of the first organic compound (4PCCzBfpm), and the oxidation potential of the guest material (Ir(ppy)$_3$) is lower than that of the second organic compound (PCCP). In addition, the LUMO level of the first organic compound (4PCCzBfpm) is lower than that of the second organic compound (PCCP), and the HOMO level of the first organic compound (4PCCzBfpm) is lower than that of the second organic compound (PCCP). The LUMO level of the guest material (Ir(ppy)$_3$) is higher than that of the first organic compound (4PCCzBfpm), and the HOMO level of the guest material (Ir(ppy)$_3$) is higher than that of the second organic compound (PCCP).

The results of the CV measurement show that the combination of the first organic compound (4PCCzBfpm) and the second organic compound (PCCP) forms an exciplex.

An energy difference between the LUMO level and the HOMO level of Ir(ppy)$_3$ was 3.01 eV. The value was calculated from the CV measurement results.

The transition energy of Ir(ppy)$_3$ that was calculated from the absorption edge of the absorption spectrum in FIG. 36A is 2.44 eV.

That is, the energy difference between the LUMO level and the HOMO level of Ir(ppy)$_3$ is larger than the transition energy thereof calculated from the absorption edge by 0.57 eV.

The peak wavelength on the shortest wavelength side of the emission spectrum in FIG. 36A is 514 nm. According to that, the light emission energy of Ir(ppy)$_3$ was calculated to be 2.41 eV.

That is, the energy difference between the LUMO level and the HOMO level of Ir(ppy)$_3$ was larger than the light emission energy by 0.60 eV.

Consequently, in the guest material (Ir(ppy)$_3$) of the light-emitting element 11, the energy difference between the LUMO level and the HOMO level is larger than the transition energy calculated from the absorption edge by 0.4 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention can have reduced power consumption.

Note that an energy difference between the LUMO level of the first organic compound (4PCCzBfpm) and the HOMO level of the second organic compound (PCCP) (4PCCzBfpm and PCCP are the host materials) was calculated to be 2.79 eV. Consequently, energy corresponding to the energy difference between the LUMO level and the HOMO level of an exciplex formed by the host materials is smaller than the energy difference (3.01 eV) between the LUMO level and the HOMO level of the guest material (Ir(ppy)$_3$), and larger than the transition energy (2.44 eV) calculated from the absorption edge of the absorption spectrum of the guest material (Ir(ppy)$_3$). Therefore, in the light-emitting element 11, the guest material can be excited through the exciplex, whereby the driving voltage can be lowered. Therefore, the light-emitting element of one embodiment of the present invention can have reduced power consumption.

According to the CV measurement results, among carriers (electrons and holes) injected from the pair of electrodes, electrons tend to be injected into the first organic compound (4PCCzBfpm) which is a host material with a low LUMO level, whereas holes tend to be injected into the guest material (Ir(ppy)$_3$) with a high HOMO level. That is, there is a possibility that an exciplex is formed by the first organic compound (4PCCzBfpm) and the guest material (Ir(ppy)$_3$).

However, an exciplex is not formed by the first organic compound and the guest material. This is shown by the fact that the electroluminescence spectrum of the light-emitting element 11 is similar to the emission spectrum of Ir(ppy)$_3$ shown in FIG. 36A. The present inventors have found this characteristic phenomenon.

The energy difference between the LUMO level of the first organic compound (4PCCzBfpm) and the HOMO level of the guest material Ir(ppy)$_3$ was calculated from the CV measurement results and found to be 2.48 eV.

Thus, in the light-emitting element 11, the energy difference (2.48 eV) between the LUMO level of the first organic compound (4PCCzBfpm) and the HOMO level of the guest material (Ir(ppy)$_3$) is higher than or equal to the transition energy (2.44 eV) calculated from the absorption edge of the absorption spectrum of the guest material (Ir(ppy)$_3$). Furthermore, the energy difference (2.48 eV) between the LUMO level of the first organic compound (4PCCzBfpm) and the HOMO level of the guest material (Ir(ppy)$_3$) is higher than or equal to the energy (2.41 eV) of the light emission exhibited by the guest material (Ir(ppy)$_3$). Accordingly, rather than formation of an exciplex by the combination of the first organic compound and the guest material, transfer of excitation energy to the guest material is more facilitated eventually, whereby efficient light emission from the guest material is achieved. The above-described relationship is a feature of one embodiment of the present invention which contributes to efficient light emission.

A light-emitting element having the following structure like the light-emitting element 11 can achieve high emission efficiency with low driving voltage: the LUMO level of the first organic compound is lower than that of the second organic compound, the HOMO level of the first organic compound is lower than that of the second organic compound, the LUMO level of the guest material is higher than that of the first organic compound, the HOMO level of the guest material is higher than that of the second organic compound, the first organic compound and the second organic compound form an exciplex in combination with each other, and the energy difference between the LUMO level of the first organic compound and the HOMO level of the guest material is larger than or equal to the transition energy calculated from the absorption edge of the absorption spectrum of the guest material or is larger than or equal to the light emission energy of the guest material.

As described above, by employing the structure of one embodiment of the present invention, a light-emitting element having high emission efficiency can be manufactured. A light-emitting element with reduced power consumption can be manufactured.

Reference Example 1

In this reference example, a method for synthesizing tris{2-[4-(4-cyano-2,6-diisobutylphenyl)-5-(2-methylphenyl)-4H-1,2,4-triazol-3-yl-κN²]phenyl-κC}iridium(III) (abbreviation: Ir(mpptz-diBuCNp)₃), which is the organometallic complex used as the guest material in Example 2, is described.

Synthesis Example 1

Step 1: Synthesis of
4-Amino-3,5-Diisobutylbenzonitrile

Into a 1000 mL three-neck flask were put 9.4 g (50 mmol) of 4-amino-3,5-dichlorobenzonitrile, 26 g (253 mmol) of isobutylboronic acid, 54 g (253 mmol) of tripotassium phosphate, 2.0 g (4.8 mmol) of 2-dicyclohexylphosphino-2',6'-dimethoxybiphenyl (S-phos), and 500 mL of toluene. The air in the flask was replaced with nitrogen, and this mixture was degassed while being stirred under reduced pressure. After the degassing, 0.88 g (0.96 mmol) of tris(dibenzylideneacetone)palladium(0) was added, and the mixture was stirred at 130° C. under a nitrogen stream for 8 hours to be reacted. Toluene was added to the reacted solution, and the solution was filtered through a filter aid in which Celite, aluminum oxide, and Celite were stacked in this order. The obtained filtrate was concentrated to give an oily substance. The obtained oily substance was purified by silica column chromatography. Toluene was used as a developing solvent. The resulting fraction was concentrated to give 10 g of a yellow oily substance in a yield of 87%. The obtained yellow oily substance was identified as 4-amino-3,5-diisobutylbenzonitrile by nuclear magnetic resonance (NMR) spectroscopy. The synthesis scheme of Step 1 is shown in (a-1) below.

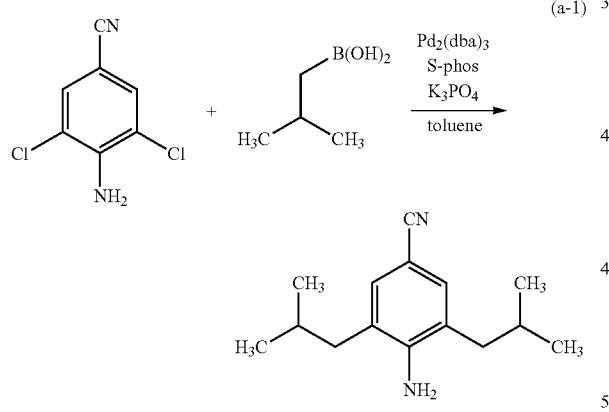

(a-1)

Step 2: Synthesis of 4-(4-cyano-2,6-diisobutylphenyl)-3-(2-methylphenyl)-5-phenyl-4H-1,2,4-triazole
(abbreviation: Hmpptz-diBuCNp)

Into a 300 mL three-neck flask were put 11 g (48 mmol) of 4-amino-3,5-diisobutylbenzonitrile synthesized in Step 1, 4.7 g (16 mmol) of N-(2-methylphenyl)chloromethylidene-N'-phenylchloromethylidenehydrazine, and 40 mL of N,N-dimethylaniline, and the mixture was stirred at 160° C. under a nitrogen stream for 7 hours to be reacted. After the reaction, the reacted solution was added to 300 mL of 1M hydrochloric acid and stirring was performed for 3 hours. An organic layer and an aqueous layer were separated and the aqueous layer was subjected to extraction with ethyl acetate. The organic layer and the obtained solution of the extract were combined, and washed with a saturated aqueous solution of sodium hydrogen carbonate and then with saturated brine, and anhydrous magnesium sulfate was added to the organic layer for drying. The obtained mixture was subjected to gravity filtration, and the filtrate was concentrated to give an oily substance. The obtained oily substance was purified by silica column chromatography. As a developing solvent, a 5:1 hexane-ethyl acetate mixed solvent was used. The obtained fraction was concentrated to give a solid. Hexane was added to the obtained solid, and the mixture was irradiated with ultrasonic waves and then subjected to suction filtration to give 2.0 g of a white solid in a yield of 28%. The obtained white solid was identified as 4-(4-cyano-2,6-diisobutylphenyl)-3-(2-methylphenyl)-5-phenyl-4H-1,2,4-triazole (abbreviation: Hmpptz-diBuCNp) by nuclear magnetic resonance (NMR) spectroscopy. The synthesis scheme of Step 2 is shown in (b-1) below.

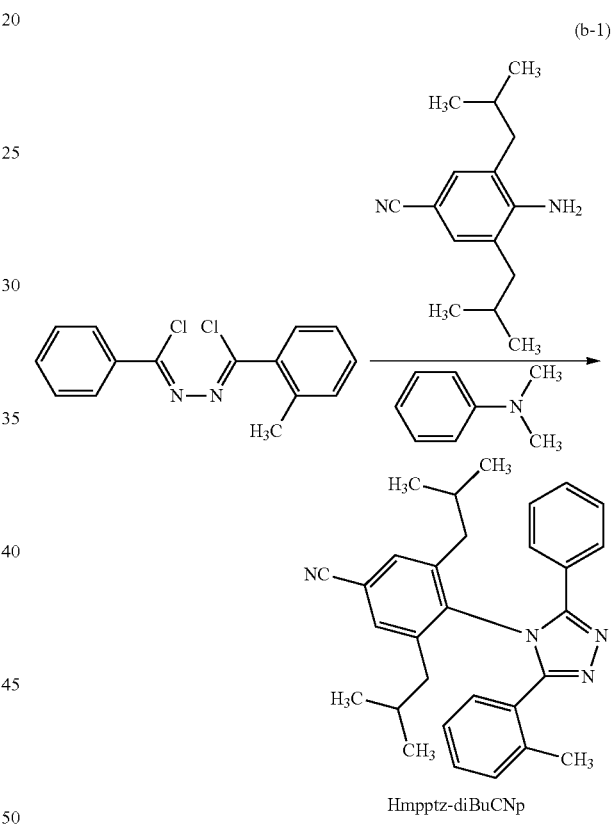

(b-1)

Step 3: Synthesis of Ir(mpptz-diBuCNp)₃

Into a reaction container equipped with a three-way cock were put 2.0 g (4.5 mmol) of Hmpptz-diBuCNp synthesized in Step 2 and 0.44 g (0.89 mmol) of tris(acetylacetonato)iridium(III), and the mixture was stirred at 250° C. under an argon stream for 43 hours to be reacted. The obtained reaction mixture was added to dichloromethane, and an insoluble matter was removed. The obtained filtrate was concentrated to give a solid. The obtained solid was purified by silica column chromatography. As a developing solvent, dichloromethane was used. The obtained fraction was concentrated to give a solid. The obtained solid was recrystallized from ethyl acetate/hexane, so that 0.32 g of a yellow solid was obtained in a yield of 23%. Then 0.31 g of the obtained yellow solid was purified by a train sublimation method. The purification by sublimation was performed by heating at 310° C. under a pressure of 2.6 Pa with an argon flow rate of 5.0 mL/min for 19 hours. After the purification by sublimation, 0.26 g of a yellow solid was obtained at a collection rate of 84%. The synthesis scheme of Step 3 is shown in (c-1) below.

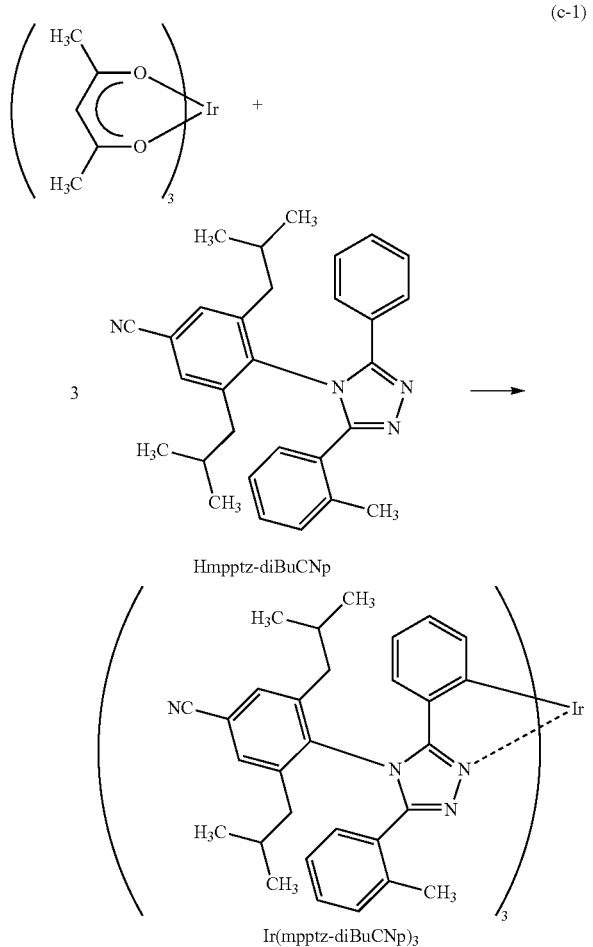

The protons ($^1$H) of the yellow solid that was obtained in Step 3 were measured by nuclear magnetic resonance (NMR) spectroscopy. The obtained values are shown below. These results reveal that Ir(mpptz-diBuCNp)$_3$ was obtained in this synthesis example.

$^1$H-NMR δ (CDCl$_3$): 0.33 (d, 18H), 0.92 (d, 18H), 1.51-1.58 (m, 3H), 1.80-1.88 (m, 6H), 2.10-2.15 (m, 6H), 2.26-2.30 (m, 3H), 2.55 (s, 9H), 6.12 (d, 3H), 6.52 (t, 3H), 6.56 (d, 3H), 6.72 (t, 3H), 6.83 (t, 3H), 6.97 (d, 3H), 7.16 (t, 3H), 7.23 (d, 3H), 7.38 (s, 3H), 7.55 (s, 3H).

Reference Example 2

In this reference example, a method for synthesizing tris{2-[1-(4-cyano-2,6-diisobutylphenyl)-1H-imidazol-2-yl-κN$^3$]phenyl-κC}iridium(III) (abbreviation: Ir(pim-diBuCNp)$_3$), which is the organometallic complex used as the guest material in Example 3, is described.

Synthesis Example 2

Step 1: Synthesis of 1-(4-Cyano-2,6-Diisobutylphenyl)-2-Phenyl-4,5-Dihydro-1H-Imidazole Into a 1000 mL three-neck flask were put 22 g (117 mmol) of N-(2-chloroethyl)benzamide and 260 mL of dehydrated xylene. To this mixed solution was added 33 g (158 mmol) of phosphorus pentachloride, and the mixture was heated and stirred at 140° C. for 1 hour to be reacted. After the reaction, the mixture was cooled down to room temperature, a mixed solution of 28 g (120 mmol) of 4-amino-3,5-diisobutylbenzonitrile and 60 mL of dehydrated xylene was dropped thereinto, and heating and stirring were performed at 140° C. for 5 hours. This reaction mixture was slowly added to 500 mL of water and stirring was performed at room temperature for 30 minutes. Chloroform was added to this mixture to carry out extraction. The obtained solution of the extract was slowly added to a 1M sodium hydroxide aqueous solution and the mixture was stirred at room temperature for 30 minutes. An aqueous layer and an organic layer of this mixture were separated. The obtained solution of the extract was washed with a saturated aqueous solution of sodium hydrogen carbonate, and then washed with saturated brine. After the washing, anhydrous magnesium sulfate was added to the organic layer for drying, and the resulting mixture was subjected to gravity filtration to give a filtrate. The obtained filtrate was concentrated to give a solid. A mixed solvent of ethyl acetate and hexane was added to the solid, and the mixture was subjected to suction filtration, whereby 33 g of a white solid was obtained in a yield of 79%. The obtained white solid was identified as 1-(4-cyano-2,6-diisobutylphenyl)-2-phenyl-4,5-dihydro-1H-imidazole by nuclear magnetic resonance (NMR) spectroscopy. The synthesis scheme of Step 1 is shown in (a-2) below.

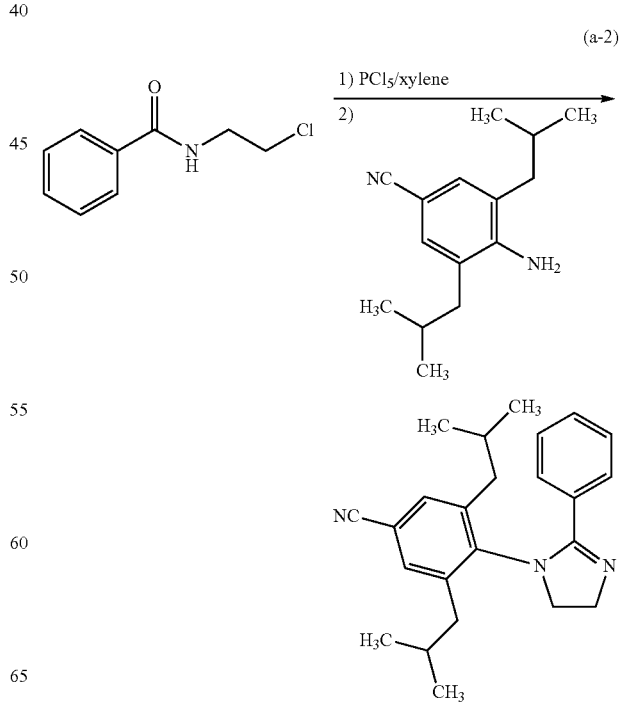

Step 2: Synthesis of 1-(4-cyano-2,6-diisobutylphenyl)-2-phenyl-1H-imidazole (abbreviation: Hpim-diBuCNp)

Into a 200 mL three-neck flask were put 15 g (42 mmol) of 1-(4-cyano-2,6-diisobutylphenyl)-2-phenyl-4,5-dihydro-1H-imidazole synthesized in Step 1 and acetonitrile. To the mixed solution was added a powder obtained by putting 13 g (84 mmol) of potassium permanganate and 29 g of aluminum oxide in a mortar and grinding them, and the mixture was stirred at room temperature for 17 hours to be reacted. This reaction mixture was subjected to suction filtration through Celite. The obtained filtrate was concentrated to give an oily substance. Toluene was added to the obtained oily substance, and the mixture was filtered through a filter aid in which Celite, aluminum oxide, and Celite were stacked in this order. The obtained filtrate was concentrated to give an oily substance. The obtained oily substance was purified by silica column chromatography. As a developing solvent, a 5:1 hexane-ethyl acetate mixed solvent was used. The obtained fraction was concentrated to give 8.0 g of a colorless oily substance in a yield of 53%. The obtained colorless oily substance was identified as 1-(4-cyano-2,6-diisobutylphenyl)-2-phenyl-1H-imidazole (abbreviation: Hpim-diBuCNp) by nuclear magnetic resonance (NMR) spectroscopy. The synthesis scheme of Step 2 is shown in (b-2) below.

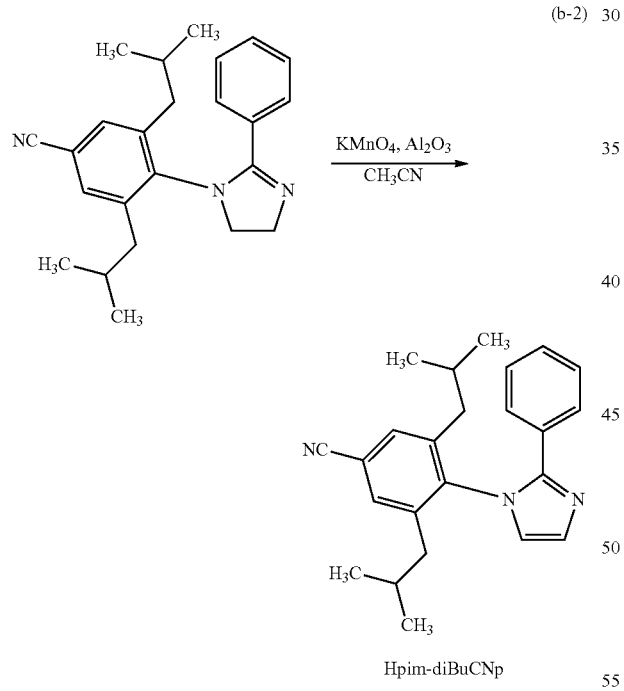

Step 3: Synthesis of Ir(pim-diBuCNp)₃

Into a reaction container equipped with a three-way cock were put 5.0 g (14 mmol) of 1-(4-cyano-2,6-diisobutylphenyl)-2-phenyl-1H-imidazole synthesized in Step 2 and 1.4 g (2.8 mmol) of tris(acetylacetonato)iridium(III), and the mixture was heated at 250° C. under an argon stream for 38 hours to be reacted. Toluene was added to the obtained reaction mixture, and an insoluble matter was removed. The obtained filtrate was concentrated to give a solid. The obtained solid was purified by silica column chromatography. As a developing solvent, first, toluene was used. Next, a 9:1 toluene-ethyl acetate mixed solvent was used. The obtained fraction was concentrated to give a solid. The obtained solid was recrystallized from ethyl acetate/hexane, so that 0.6 g of a yellow solid was obtained in a yield of 18%. Then, 0.6 g of the obtained yellow solid was purified by a train sublimation method. The purification by sublimation was performed by heating at 280° C. under a pressure of 2.6 Pa with an argon flow rate of 5.0 mL/min for 17 hours. After the purification by sublimation, 0.4 g of a yellow solid was obtained at a collection rate of 67%. The synthesis scheme of Step 3 is shown in (c-2) below.

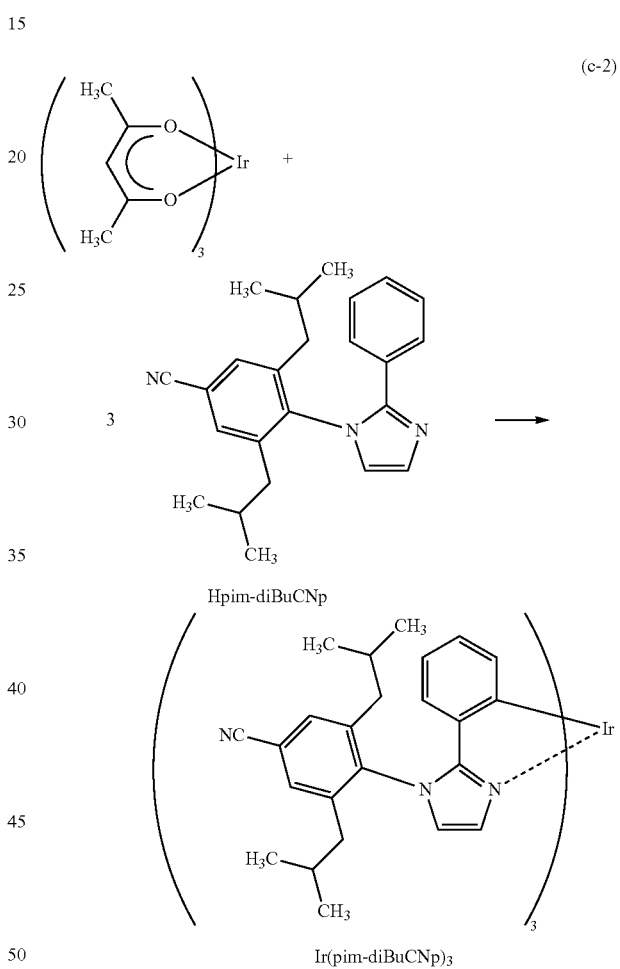

The protons ($^1$H) of the yellow solid that was obtained in Step 3 were measured by nuclear magnetic resonance (NMR) spectroscopy. The obtained values are shown below. These results reveal that Ir(pim-diBuCNp)₃ was obtained in this synthesis example.

$^1$H-NMR δ (CDCl₃): 0.43 (d, 9H), 0.56 (d, 9H), 0.79 (t, 18H), 1.42-1.50 (m, 3H), 1.73-1.81 (m, 3H), 1.97-2.02 (m, 3H), 2.12-2.17 (m, 3H), 2.24-2.29 (m, 3H), 2.46-2.50 (m, 3H), 6.05 (d, 3H), 6.40 (t, 3H), 6.59 (t, 3H), 6.71-6.76 (m, 9H), 7.54 (d, 6H).

Reference Example 3

In Reference Example 3, a method for synthesizing tris{2-[4-(4-cyano-2,6-dimethylphenyl)-5-(2-methylphenyl)-4H-

1,2,4-triazol-3-yl-κN²]phenyl-κC}iridium(III) (abbreviation: Ir(mpptz-dmCNp)₃), which is the organometallic complex used as the guest material in Example 3, is described.

Synthesis Example 3

Step 1: Synthesis of 4-(4-cyano-2,6-dimethylphenyl)-3-(2-methylphenyl)-5-phenyl-4H-1,2,4-triazole (abbreviation: Hmpptz-dmCNp)

Into a 300 mL three-neck flask were put 6.5 g (44 mmol) of 4-amino-2,6-dimethylbenzonitrile, 10 g (34 mmol) of N-(2-methylphenyl)chloromethylidene-N-phenylchloromethylidenehydrazine, and 80 mL of N,N-dimethylaniline, and the mixture was stirred at 160° C. under a nitrogen stream for 21 hours to be reacted. After the reaction, the reacted solution was added to 300 mL of 1M hydrochloric acid, and stirring was performed for 3 hours. An organic layer and an aqueous layer were separated and the aqueous layer was subjected to extraction with toluene. The organic layer and the obtained solution of the extract were combined, and washed with a saturated aqueous solution of sodium hydrogen carbonate and then with saturated brine, and anhydrous magnesium sulfate was added to the organic layer for drying. The obtained mixture was subjected to gravity filtration, and the filtrate was concentrated to give an oily substance. The obtained oily substance was purified by silica column chromatography. As a developing solvent, first, a mixed solvent of toluene and ethyl acetate in a ratio of 10:1 (v:v) was used, and the proportion of a high-polar solvent was gradually increased until the ratio of toluene to ethyl acetate became 2:1 (v:v). The obtained fraction was concentrated to give a solid. The solid was recrystallized from ethyl acetate to give 3.5 g of a white solid in a yield of 27%. The obtained white solid was identified as 4-(4-cyano-2,6-dimethylphenyl)-3-(2-methylphenyl)-5-phenyl-4H-1,2,4-triazole (abbreviation: Hmpptz-dmCNp) by nuclear magnetic resonance (NMR) spectroscopy. The synthesis scheme of Step 1 is shown in (a-3) below.

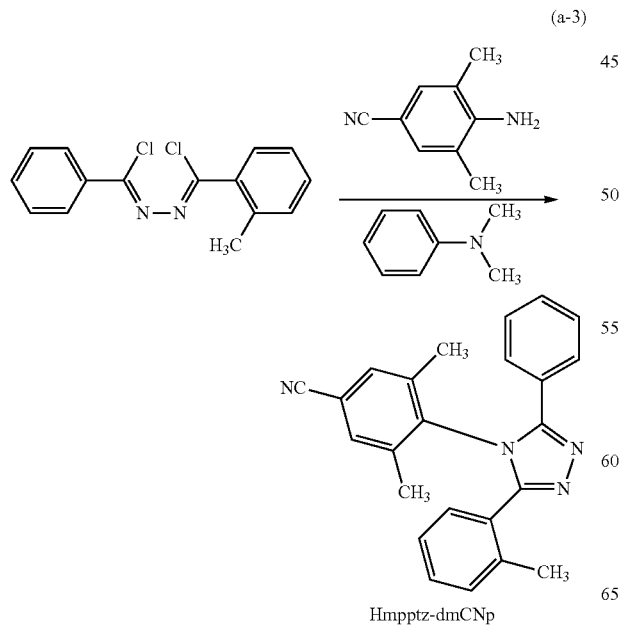

(a-3)

Step 2: Synthesis of Ir(mpptz-dmCNp)₃

Into a reaction container equipped with a three-way cock were put 3.0 g (8.2 mmol) of 4-(4-cyano-2,6-dimethylphenyl)-3-(2-methylphenyl)-5-phenyl-4H-1,2,4-triazole (abbreviation: Hmpptz-dmCNp) obtained in Step 1 and 0.81 g (1.6 mmol) of tris(acetylacetonato)iridium(III), and the mixture was heated at 250° C. for 37 hours to be reacted. The reaction mixture was purified by silica gel column chromatography. As a developing solvent, a mixed solvent of dichloromethane and ethyl acetate in a ratio of 20:1 (v:v) was used. The obtained fraction was concentrated to give a solid. The obtained solid was recrystallized from ethyl acetate, so that 150 mg of a yellow solid was obtained in a yield of 7.3%. The synthesis scheme of Step 3 is shown in (b-3) below.

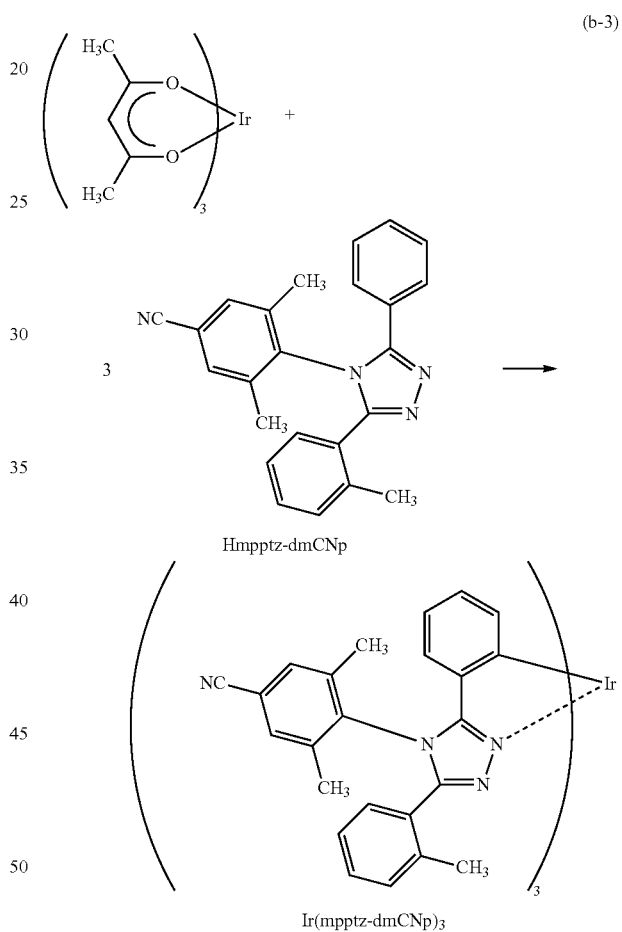

(b-3)

The protons (¹H) of the yellow solid that was obtained in Step 2 were measured by nuclear magnetic resonance (NMR) spectroscopy. The obtained values are shown below. These results reveal that Ir(mpptz-dmCNp)₃ was obtained in this synthesis example.

¹H-NMR δ (CDCl₃): 1.99 (s, 9H), 2.02 (s, 9H), 2.36 (s, 9H), 6.22 (d, 3H), 6.61 (t, 3H), 6.66 (d, 3H), 6.78 (t, 3H), 6.90-6.93 (m, 3H), 6.99 (d, 3H), 7.19-7.23 (m, 6H), 7.41 (s, 3H), 7.48 (s, 3H).

Reference Example 4

In Reference Example 4, a method for synthesizing tris{2-[4-(3-cyano-2,4,6-trimethylphenyl)-5-(2-methylphenyl)-

4H-1,2,4-triazol-3-yl-κN²]phenyl-κC}iridium(III) (abbreviation: Ir(mpptz-tm5CNp)₃), which is the organometallic complex used as the guest material in Example 3, is described.

Synthesis Example 4

Step 1: Synthesis of 3-Amino-2,4,6-Trimethylbenzonitrile

Into a 500 mL three-neck flask were put 13 g (61 mmol) of 3-bromo-2,4,6-trimethylaniline, 200 mL of dimethylformamide, and 8.2 g (91 mmol) of copper cyanide, and the mixture was heated and stirred at 150° C. under a nitrogen stream for 16 hours to be reacted. To the reacted solution were added 100 mL of ammonia water and 100 mL of water, and the mixture was stirred at room temperature. An organic layer and an aqueous layer of the obtained mixture were separated, the aqueous layer was subjected to extraction with dichloromethane, and the organic layer was washed with water and saturated brine. Anhydrous magnesium sulfate was added to the obtained organic layer for drying, and the resulting mixture was subjected to gravity filtration to give a filtrate. This filtrate was concentrated to give a brown solid. This brown solid was washed with ethanol to give 7.1 g of a pale red solid in a yield of 73%. The obtained pale red solid was identified as 3-amino-2,4,6-trimethylbenzonitrile by nuclear magnetic resonance (NMR) spectroscopy. The synthesis scheme of Step 2 is shown in (a-4) below.

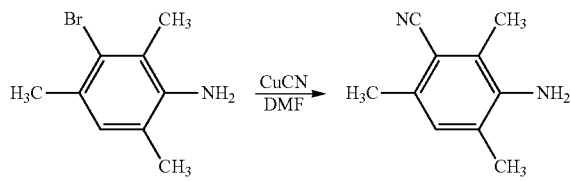

(a-4)

Step 2: Synthesis of 4-(3-cyano-2,4,6-trimethylphenyl)-3-(2-methylphenyl)-5-phenyl-4H-1,2,4-triazole (abbreviation: Hmpptz-tm5CNp)

Into a 300 mL three-neck flask were put 6.5 g (41 mmol) of 3-amino-2,4,6-trimethylbenzonitrile synthesized in Step 1, 9.4 g (34 mmol) of N-(2-methylphenyl)chloromethylidene-N-phenylchloromethylidenehydrazine, and 110 mL of N,N-dimethylaniline, and the mixture was stirred at 160° C. under a nitrogen stream for 19 hours to be reacted. After the reaction, the reacted solution was added to 300 mL of 1M hydrochloric acid and stirring was performed for 3 hours. An organic layer and an aqueous layer were separated and the aqueous layer was subjected to extraction with toluene. The organic layer and the obtained solution of the extract were combined, and washed with a saturated aqueous solution of sodium hydrogen carbonate and then with saturated brine, and anhydrous magnesium sulfate was added to the organic layer for drying. The obtained mixture was subjected to gravity filtration, and the filtrate was concentrated to give an oily substance. The obtained oily substance was purified by silica column chromatography. As a developing solvent, a mixed solvent of toluene and ethyl acetate in a ratio of 1:1 (v:v) was used. The resulting fraction was concentrated to give a white solid. The obtained white solid was recrystallized from ethyl acetate to give 5.2 g of a white solid in a yield of 40%. The obtained white solid was identified as 4-(3-cyano-2,4,6-trimethylphenyl)-3-(2-methylphenyl)-5-phenyl-4H-1,2,4-triazole (abbreviation: Hmpptz-tm5CNp) by nuclear magnetic resonance (NMR) spectroscopy. The synthesis scheme of Step 2 is shown in (b-4) below.

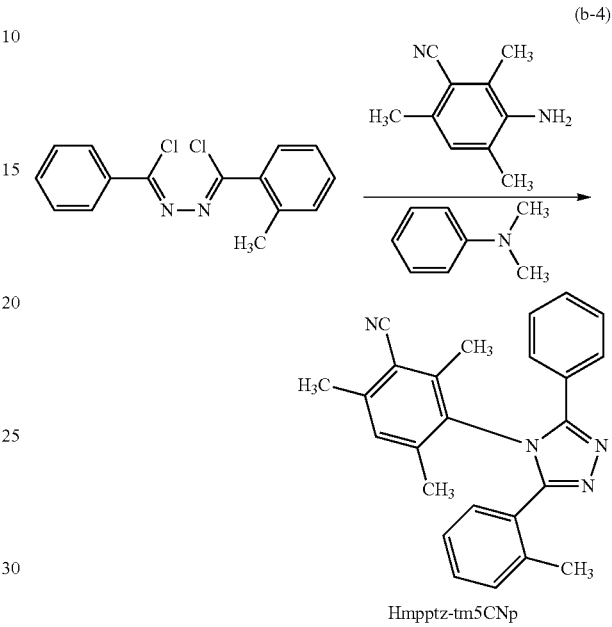

(b-4)

Hmpptz-tm5CNp

Step 3: Synthesis of Ir(mpptz-tm5CNp)₃

Next, into a reaction container equipped with a three-way cock were put 4.5 g (12 mmol) of 4-(3-cyano-2,4,6-trimethylphenyl)-3-(2-methylphenyl)-5-phenyl-4H-1,2,4-triazole obtained in Step 2 and 1.2 g (2.4 mmol) of tris(acetylacetonato)iridium(III), and the mixture was heated at 250° C. for 40 hours. The reaction mixture was purified by silica gel column chromatography. As a developing solvent, a mixed solvent of dichloromethane and ethyl acetate in a ratio of 20:1 (v:v) was used. The obtained fraction was concentrated to give a solid. The obtained solid was recrystallized from ethyl acetate/hexane, so that 0.80 g of a yellow solid was obtained in a yield of 25%. Then, 0.31 g of the obtained yellow solid was purified by a train sublimation method. The purification by sublimation was performed under a pressure of $4.7 \times 10^{-3}$ Pa by heating at 315° C. for 16 hours and then heating at 320° C. for 8.5 hours. After the purification by sublimation, 0.18 g of a yellow solid was obtained at a collection rate of 58%. The synthesis scheme of Step 3 is shown in (c-4) below.

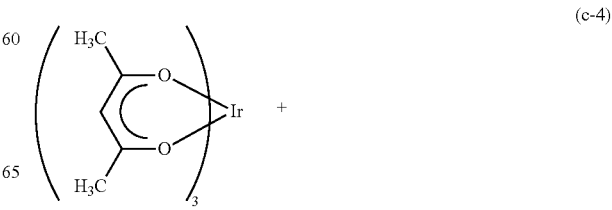

(c-4)

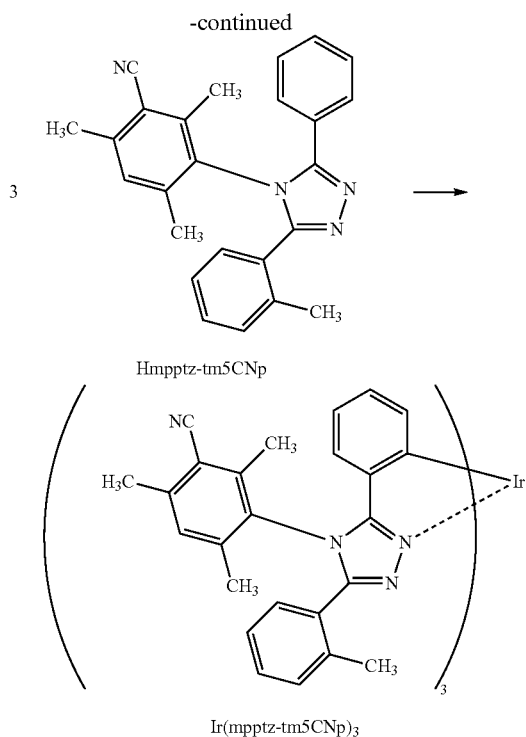

Hmpptz-tm5CNp

Ir(mpptz-tm5CNp)₃

The protons (¹H) of the yellow solid that was obtained in Step 3 were measured by nuclear magnetic resonance (NMR) spectroscopy. The obtained values are shown below. These results reveal that Ir(mpptz-tm5CNp)₃ was obtained in this synthesis example.

¹H-NMR δ (CDCl₃): 1.37-2.18 (m, 18H), 2.30-2.34 (m, 9H), 2.56 (s, 9H), 6.20-6.22 (m, 3H), 6.58-6.62 (m, 3H), 6.72 (d, 3H), 6.75-6.78 (m, 3H), 6.91-7.02 (m, 6H), 7.05-7.07 (m, 3H), 7.19-7.20 (in, 6H).

Reference Example 5

In this reference example, a method for synthesizing tris{2-[5-(5-cyano-2-methylphenyl)-4-(2,6-diisopropylphenyl)-4H-1,2,4-triazol-3-yl-κN²]phenyl-κC}iridium(III) (abbreviation: Ir(mCNpptz-diPrp)₃), which is the organometallic complex used as the guest material in Example 5, is described.

Synthesis Example 5

Step 1: Synthesis of N-5-Bromo-2-Methylbenzoyl-N'-Benzoylhydrazide

Into a 500 mL three-neck flask were put 15 g (107 mmol) of benzoylhydrazide and 75 mL of N-methyl-2-pyrrolidinone (NMP), and the mixture was stirred under a nitrogen stream in an ice bath. A mixed solution of 25 g (107 mmol) of 5-bromo-2-methylbenzoyl chloride and 32 mL of NMP was slowly dropped into this mixed solution, and stirring was performed for 23 hours to be reacted. After the reaction, this reacted solution was slowly added to 500 mL of water, so that a solid was precipitated. The precipitated solid was subjected to ultrasonic cleaning in which water and 1M hydrochloric acid were used alternately. Then, ultrasonic cleaning was performed using ethanol, whereby 33 g of a white solid was obtained in a yield of %. The obtained white solid was identified as N-5-bromo-2-methylbenzoyl-N-benzoylhydrazide by nuclear magnetic resonance (NMR) spectroscopy. The synthesis scheme of Step 1 is shown in (a-5) below.

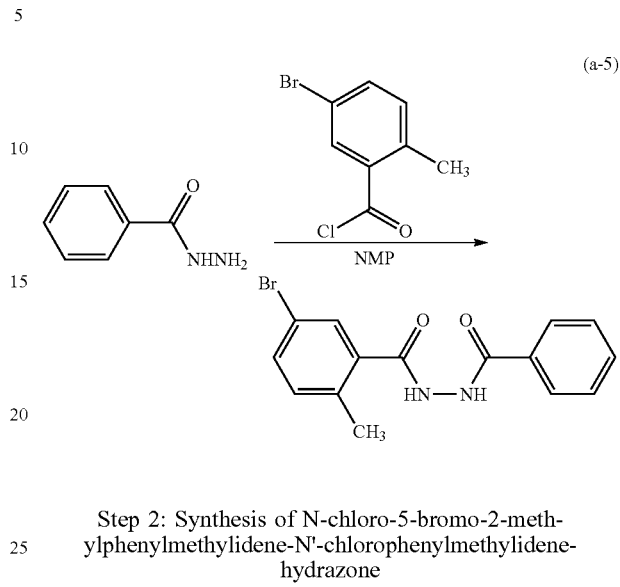

(a-5)

Step 2: Synthesis of N-chloro-5-bromo-2-methylphenylmethylidene-N'-chlorophenylmethylidene-hydrazone Into a 1000 mL three-neck flask were put 27 g (80 mmol) of N-5-bromo-2-methylbenzoyl-N-benzoylhydrazide synthesized in Step 1 and 500 mL of toluene. To this mixed solution, 50 g (240 mmol) of phosphorus pentachloride was added, and the mixture was heated and stirred at 120° C. for 8 hours to be reacted. After the reaction, the reacted solution was slowly added to 500 mL of water, and the mixture was stirred at room temperature for 30 minutes. An aqueous layer and an organic layer of this mixture were separated, and the aqueous layer was subjected to extraction with toluene. The obtained solution of the extract and the organic layer were collected, and the organic layer was slowly added to 400 mL of a 1M sodium hydroxide aqueous solution and the mixture was stirred at room temperature for 30 minutes. An aqueous layer and an organic layer of this mixture were separated, and the aqueous layer was subjected to extraction with toluene. The obtained solution of the extract was washed with a saturated aqueous solution of sodium hydrogen carbonate and then with saturated brine. After the washing, anhydrous magnesium sulfate was added to the solution for drying, and the resulting mixture was subjected to gravity filtration to give a filtrate. The obtained filtrate was concentrated to give a solid. Hexane was added to the obtained solid, and the mixture was irradiated with ultrasonic waves and then subjected to suction filtration to give 22 g of a yellow solid in a yield of 75%. The obtained yellow solid was identified as N-chloro-5-bromo-2-methylphenylmethylidene-N-chlorophenylmethylidenehydrazone by nuclear magnetic resonance (NMR) spectroscopy. The synthesis scheme of Step 2 is shown in (b-5) below.

(b-5)

-continued

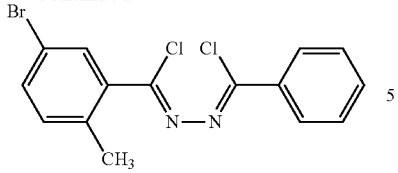

Step 3: Synthesis of 3-(5-bromo-2-methylphenyl)-4-(2,6-diisopropylphenyl)-5-phenyl-4H-1,2,4-triazole Into a 500 mL three-neck flask were put 22 g (66 mmol) of N-chloro-5-bromo-2-methylphenylmethylidene-N-chlorophenylmethylidenehydrazone synthesized in Step 2, 35 g (199 mmol) of 2,6-diisopropylaniline, and 200 mL of N,N-dimethylaniline, and the mixture was stirred at 160° C. under a nitrogen stream for 11.5 hours to be reacted. After the reaction, the reacted solution was added to 500 mL of 3M hydrochloric acid and stirring was performed for 1 hour. An organic layer and an aqueous layer were separated and the aqueous layer was subjected to extraction with ethyl acetate. The organic layer and the obtained solution of the extract were combined, and washed with a saturated aqueous solution of sodium hydrogen carbonate and then with saturated brine. Then, anhydrous magnesium sulfate was added to the resulting solution for drying. The obtained mixture was subjected to gravity filtration, and the filtrate was concentrated to give an oily substance. The obtained oily substance was purified by silica column chromatography. As a developing solvent, a 5:1 toluene-ethyl acetate mixed solvent was used. The obtained fraction was concentrated to give a solid. The obtained solid was recrystallized from ethyl acetate/hexane to give 13 g of a white solid in a yield of 42%. The obtained white solid was identified as 3-(5-bromo-2-methylphenyl)-4-(2,6-diisopropylphenyl)-5-phenyl-4H-1,2,4-triazole by nuclear magnetic resonance (NMR) spectroscopy. The synthesis scheme of Step 3 is shown in (c-5) below.

(c-5)

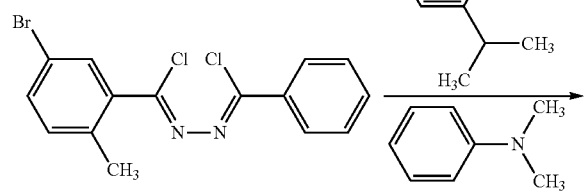

-continued

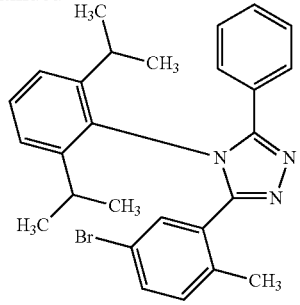

Step 4: Synthesis of 3-(5-cyano-2-methylphenyl)-4-(2,6-diisopropylphenyl)-5-phenyl-4H-1,2,4-triazole (abbreviation: HmCNpptz-diPrp)

Into a 300 mL three-neck flask were put 10 g (21 mmol) of 3-(5-bromo-2-methylphenyl)-4-(2,6-diisopropylphenyl)-5-phenyl-4H-1,2,4-triazole synthesized in Step 3 and 70 mL of N,N-dimethylformamide. To this mixed solution was added 2.8 g (32 mmol) of copper cyanide, and the mixture was heated and stirred at 150° C. for 43 hours to be reacted. After the reaction, 100 mL of ammonia water and 100 mL of water were added to this reacted solution and stirring was performed at room temperature for 30 minutes. Chloroform was added to this mixture to carry out extraction. The obtained solution of the extract was washed with saturated brine twice. After the washing, anhydrous magnesium sulfate was added to the solution for drying, and the resulting mixture was subjected to gravity filtration to give a filtrate. The obtained filtrate was concentrated to give an oily substance. The obtained oily substance was purified by silica column chromatography. As developing solvents, first, a 1:5 ethyl acetate-hexane mixed solvent was used, and then a 1:3 ethyl acetate-hexane mixed solvent was used. The obtained fraction was concentrated to give a solid. The obtained solid was recrystallized from ethyl acetate/hexane to give 1.9 g of a white solid in a yield of 21%. The obtained white solid was identified as 3-(5-cyano-2-methylphenyl)-4-(2,6-diisopropylphenyl)-5-phenyl-4H-1,2,4-triazole (abbreviation: HmCNpptz-diPrp) by nuclear magnetic resonance (NMR) spectroscopy. The synthesis scheme of Step 4 is shown in (d-5) below.

(d-5)

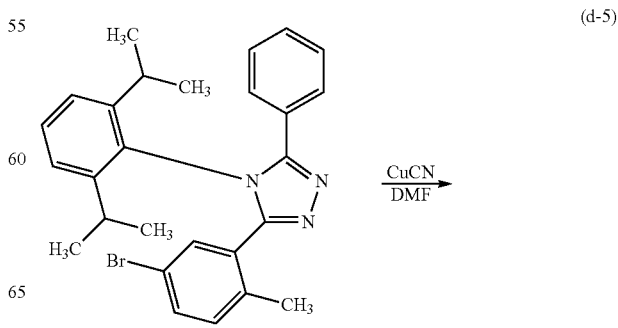

-continued

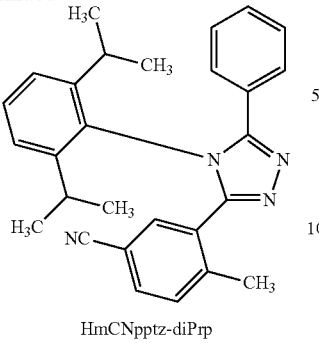

HmCNpptz-diPrp

Step 5: Synthesis of Ir(mCNpptz-diPrp)₃

Into a reaction container equipped with a three-way cock were put 1.9 g (4.4 mmol) of HmCNpptz-diPrp synthesized in Step 4 and 0.43 g (0.89 mmol) of tris(acetylacetonato)iridium(III), and the mixture was stirred at 250° C. under an argon stream for 40.5 hours to be reacted. The obtained reaction mixture was added to dichloromethane, and the mixture was subjected to filtration to remove an insoluble matter. The obtained filtrate was concentrated to give a solid. The obtained solid was purified by silica column chromatography. As a developing solvent, first, dichloromethane was used, and then, a 100:3 dichloromethane-ethyl acetate mixed solvent was used. The obtained fraction was concentrated to give a solid. The resulting solid was recrystallized from ethyl acetate/hexane to give 0.27 g of a yellow solid in a yield of 21%. Then, 0.27 g of the obtained yellow solid was purified by a train sublimation method. The purification by sublimation was performed by heating at 310° C. under a pressure of 8.6×10⁻³ Pa for 17 hours. After the purification by sublimation, 0.16 g of a yellow solid was obtained at a collection rate of 61%. The synthesis scheme of Step 5 is shown in (e-5) below.

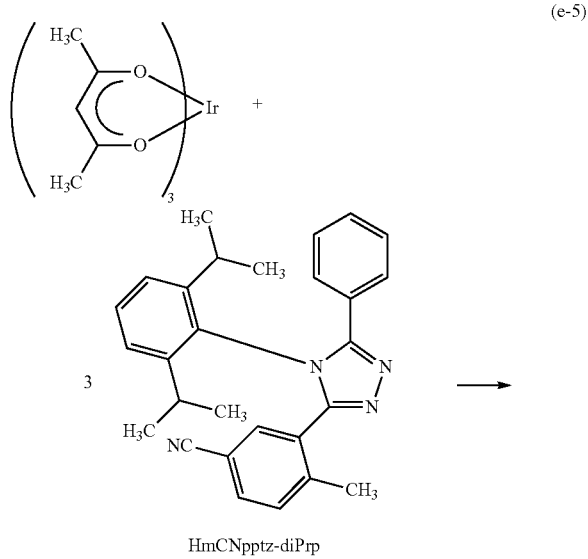

(e-5)

HmCNpptz-diPrp

-continued

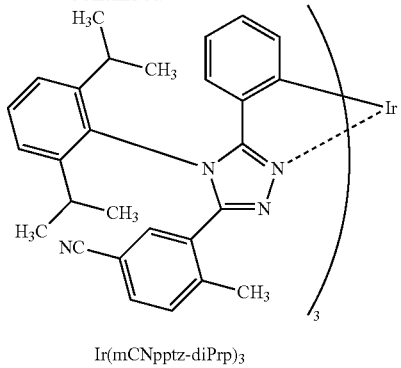

Ir(mCNpptz-diPrp)₃

The protons (¹H) of the yellow solid that was obtained in Step 5 were measured by nuclear magnetic resonance (NMR) spectroscopy. The obtained values are shown below. These results reveal that Ir(mCNpptz-diPrp)₃ was obtained in this synthesis example.

¹H-NMR. δ (CD₂Cl₂): 0.72 (d, 9H), 0.80-0.83 (m, 18H), 0.93 (d, 9H), 2.15-2.21 (m, 3H), 2.35 (s, 9H), 2.69-2.74 (m, 3H), 6.21 (d, 3H), 6.52 (t, 3H), 6.70 (t, 3H), 6.80 (d, 3H), 7.07 (d, 3H), 7.29-7.31 (m, 6H), 7.34 (d, 3H), 7.45 (d, 3H), 7.56 (t, 3H).

Reference Example 6

In this reference example, a method for synthesizing 4-(9'-phenyl-3,3'-b i-9H-carbazol-9-yl)benzofuro[3,2-d]pyrimidine (abbreviation: 4PCCzBfpm), which is the compound used as the host material in Example 7, is described.

Synthesis Example 6

Synthesis of 4PCCzBfpm

First, 0.15 g (3.6 mmol) of sodium hydride (60%) was put into a three-neck flask the air in which was replaced with nitrogen, and 10 mL of NN-dimethylformamide (abbreviation: DMF) was dropped thereinto while stirring was performed. The container was cooled down to 0° C., a mixed solution of 1.1 g (2.7 mmol) of 9-phenyl-3,3'-bi-9H-carbazole and 15 mL of DMF was dropped thereinto, and stirring was performed at room temperature for 30 minutes. Then, the container was cooled down to 0° C., a mixed solution of 0.50 g (2.4 mmol) of 4-chloro[1]benzofuro[3,2-d]pyrimidine and 15 mL of DMF was added, and stirring was performed at room temperature for 20 hours. The resulting reaction solution was put into ice water and toluene was added to the mixture. An organic layer was extracted from the resulting mixture with the use of ethyl acetate and washed with saturated brine. Magnesium sulfate was added and filtration was performed. The solvent of the obtained filtrate was distilled off and purification was conducted by silica gel column chromatography (developing solvent: toluene, and then a mixed solvent of toluene:ethyl acetate=1:20). Recrystallization using a mixed solvent of toluene and hexane was performed, so that 1.0 g of 4PCCzBfpm, which was the target substance, was obtained as a yellowish white solid in a yield of 72%. Then, 1.0 g of the yellowish white solid was purified using a train sublimation method. In the purification by sublimation, the yellowish white solid was heated at 270° C. to 280° C. with the pressure set at 2.6 Pa and the argon gas flow rate set at 5 mL/min After the purification by sublimation, 0.7 g of a yellowish white solid, which was the target substance, was obtained at a collection rate of 69%. The synthesis scheme of this step is shown in (a-6) below.

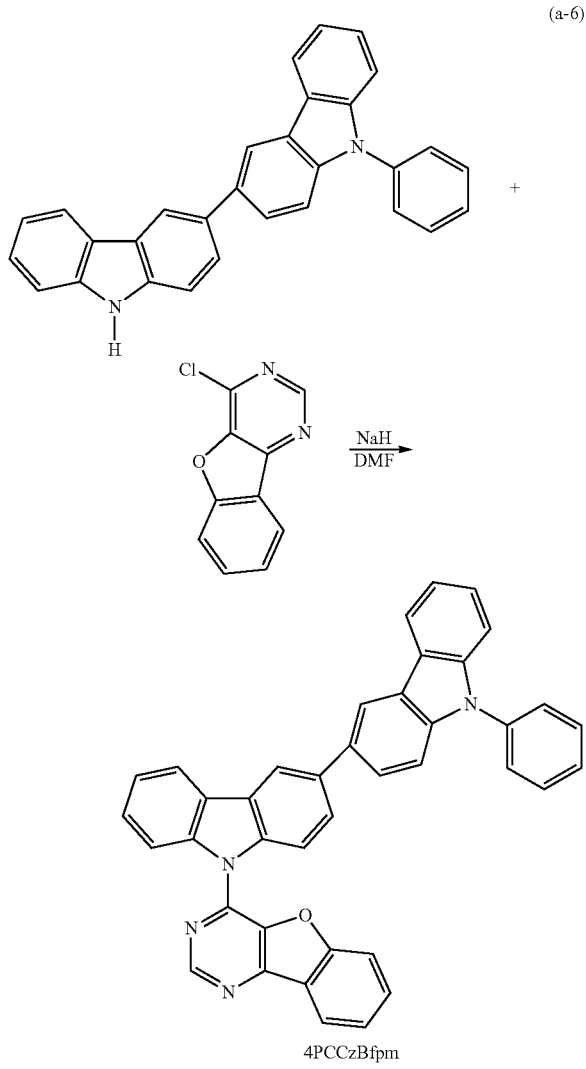

4PCCzBfpm

Analysis results by nuclear magnetic resonance ($^1$H-NMR) spectroscopy of the yellowish white solid obtained in the above step are described below. These results reveal that 4PCCzBfpm was obtained in this synthesis example.

$^1$H-NMR δ (CDCl$_3$): 7.31-7.34 (m, 1H), 7.43-7.46 (m, 3H), 7.48-7.54 (m, 3H), 7.57-7.60 (t, 1H), 7.62-7.66 (m, 4H), 7.70 (d, 1H), 7.74-7.77 (dt, 1H), 7.80 (dd, 1H), 7.85 (dd, 1H), 7.88-7.93 (m, 2H), 8.25 (d, 2H), 8.37 (d, 1H), 8.45 (ds, 1H), 8.49 (ds, 1H), 9.30 (s, 1H).

REFERENCE NUMERALS

100: EL layer, 101: electrode, 101*a*: conductive layer, 101*b*: conductive layer, 101*c*: conductive layer, 102: electrode, 103: electrode, 103*a*: conductive layer, 103*b*: conductive layer, 104: electrode, 104*a*: conductive layer, 104*b*: conductive layer, 106: light-emitting unit, 108: light-emitting unit, 110: EL layer, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 121: host material, 122: guest material, 123B: light-emitting layer, 123G: light-emitting layer, 123R: light-emitting layer, 130: light-emitting layer, 131: host material, 131_1: organic compound, 131_2: organic compound, 132: guest material, 145: partition wall, 150: light-emitting element, 160: light-emitting layer, 170: light-emitting layer, 171: host material, 171_1: organic compound, 171_2: organic compound, 172: guest material, 180: light-emitting layer, 190: light-emitting layer, 190*a*: light-emitting layer, 190*b*: light-emitting layer, 200: substrate, 220: substrate, 221B: region, 221G: region, 221R: region, 222B: region, 222G: region, 222R: region, 223: light-blocking layer, 224B: optical element, 224G: optical element, 224R: optical element, 250: light-emitting element, 252: light-emitting element, 260*a*: light-emitting element, 260*b*: light-emitting element, 262*a*: light-emitting element, 262*b*: light-emitting element, 301_1: wiring, 301_5: wiring, 301_6: wiring, 301_7: wiring, 302_1: wiring, 302_2: wiring, 303_1: transistor, 303_6: transistor, 303_7: transistor, 304: capacitor, 304_1: capacitor, 304_2: capacitor, 305: light-emitting element, 306_1: wiring, 306_3: wiring, 307_1: wiring, 307_3: wiring, 308_1: transistor, 308_6: transistor, 309_1: transistor, 309_2: transistor, 311_1: wiring, 311_3: wiring, 312_1: wiring, 312_2: wiring, 600: display device, 601: signal line driver circuit portion, 602: pixel portion, 603: scan line driver circuit portion, 604: sealing substrate, 605: sealant, 607: region, 607*a*: sealing layer, 607*b*: sealing layer, 607*c*: sealing layer, 608: wiring, 609: FPC, 610: element substrate, 611: transistor, 612: transistor, 613: lower electrode, 614: partition wall, 616: EL layer, 617: upper electrode, 618: light-emitting element, 621: optical element, 622: light-blocking layer, 623: transistor, 624: transistor, 801: pixel circuit, 802: pixel portion, 804: driver circuit portion, 804*a*: scan line driver circuit, 804*b*: signal line driver circuit, 806: protection circuit, 807: terminal portion, 852: transistor, 854: transistor, 862: capacitor, 872: light-emitting element, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: lower electrode, 1024G: lower electrode, 1024R: lower electrode, 1024Y: lower electrode, 1025: partition wall, 1026: upper electrode, 1028: EL layer, 1028B: light-emitting layer, 1028G: light-emitting layer, 1028R: light-emitting layer, 1028Y: light-emitting layer, 1029: sealing layer, 1031: sealing substrate, 1032: sealant, 1033: base material: 1034B: coloring layer, 1034G: coloring layer, 1034R: coloring layer, 1034Y: coloring layer, 1035: light-blocking layer, 1036: overcoat layer, 1037: interlayer insulating film, 1040: pixel portion, 1041: driver circuit portion, 1042: peripheral portion, 2000: touch panel, 2001: touch panel, 2501: display device, 2502R: pixel, 2502*t*: transistor, 2503*c*: capacitor, 2503*g*: scan line driver circuit, 2503*s*: signal line driver circuit, 2503*t*: transistor, 2509: FPC, 2510: substrate, 2510*a*: insulating layer, 2510*b*: flexible substrate, 2510*c*: adhesive layer, 2511: wiring, 2519: terminal, 2521: insulating layer, 2528: partition, 2550R: light-emitting element, 2560: sealing layer, 2567BM: light-blocking layer, 2567*p*: anti-reflective layer, 2567R: coloring layer, 2570: substrate, 2570*a*: insulating layer, 2570*b*: flexible substrate, 2570*c*: adhesive layer, 2580R: light-emitting module, 2590: substrate, 2591: electrode, 2592: electrode, 2593: insulating layer, 2594: wiring, 2595: touch sensor, 2597: adhesive layer, 2598: wiring, 2599: connection layer, 2601: pulse voltage output circuit, 2602: current sensing circuit, 2603: capacitor, 2611: transistor, 2612: transistor, 2613: transistor, 2621: electrode, 2622: electrode, 3000: light-emitting device, 3001: substrate, 3003: substrate, 3005: light-emitting element, 3007: sealing region, 3009: sealing region, 3011: region, 3013: region, 3014: region, 3015: substrate, 3016: substrate, 3018: desiccant, 3500: multifunction terminal, 3502: housing, 3504: display portion, 3506: camera, 3508: lighting, 3600: light, 3602: housing, 3608: lighting, 3610: speaker, 8000: display module, 8001: upper cover, 8002: lower cover, 8003: FPC, 8004: touch sensor, 8005: FPC, 8006: display device, 8009: frame, 8010: printed wiring board, 8011: battery, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal, 9300: television set, 9301: stand, 9311: remote controller, 9500: display device, 9501: display panel, 9502: display region, 9503: region, 9511: hinge, 9512: bearing, 9700: automobile, 9701: car body, 9702: wheels, 9703: dashboard, 9704: light, 9710: display portion, 9711: display portion, 9712: display portion, 9713: display portion, 9714: display portion, 9715: display portion, 9721: display portion, 9722: display portion, and 9723: display portion.

This application is based on Japanese Patent Application serial no. 2015-145443 filed with Japan Patent Office on Jul. 23, 2015, Japanese Patent Application serial no. 2015-233299 filed with Japan Patent Office on Nov. 30, 2015, and Japanese Patent Application serial no. 2016-051351 filed with Japan Patent Office on Mar. 15, 2016, the entire contents of which are hereby incorporated by reference.

The invention claimed is:

1. A light-emitting element comprising:
a first organic compound;
a second organic compound; and
a guest material,
wherein the first organic compound comprises a triazine skeleton,
wherein the guest material has a lower triplet excitation energy level than each of the first organic compound and the second organic compound,
wherein a lowest unoccupied molecular orbital level of the first organic compound is lower than a lowest unoccupied molecular orbital level of the second organic compound,
wherein a highest occupied molecular orbital level of the first organic compound is lower than a highest occupied molecular orbital level of the second organic compound,
wherein a highest occupied molecular orbital level of the guest material is higher than the highest occupied molecular orbital level of the second organic compound,
wherein an energy difference between a lowest unoccupied molecular orbital level of the guest material and the highest occupied molecular orbital level of the guest material is larger than an energy difference between the lowest unoccupied molecular orbital level of the first organic compound and the highest occupied molecular orbital level of the second organic compound,
wherein the guest material converts triplet excitation energy into light emission, and
wherein the first organic compound and the second organic compound form an exciplex.

2. The light-emitting element according to claim 1, wherein an energy difference between the lowest unoccupied molecular orbital level of the first organic compound and the highest occupied molecular orbital level of the guest material is larger than or equal to light emission energy of the guest material.

3. The light-emitting element according to claim 1, wherein the energy difference between the lowest unoccupied molecular orbital level of the guest material and the highest occupied molecular orbital level of the guest material is larger than transition energy calculated from an absorption edge of an absorption spectrum of the guest material by 0.3 eV or more.

4. The light-emitting element according to claim 1, wherein the energy difference between the lowest unoccupied molecular orbital level of the guest material and the highest occupied molecular orbital level of the guest material is larger than light emission energy of the guest material by 0.3 eV or more.

5. The light-emitting element according to claim 1, wherein excitation energy of the exciplex is transferred to the guest material.

6. The light-emitting element according to claim 1, wherein an emission spectrum of the exciplex comprises a region overlapping with an absorption band on a longest wavelength side of an absorption spectrum of the guest material.

7. The light-emitting element according to claim 1, wherein the guest material comprises iridium.

8. The light-emitting element according to claim 7,
wherein the guest material comprises a ligand coordinated to the iridium, and
wherein the ligand comprises a cyano group and a nitrogen-containing five-membered heterocyclic skeleton.

9. The light-emitting element according to claim 8, wherein the ligand comprises the cyano group and a triazole skeleton.

10. The light-emitting element according to claim 1,
wherein the first organic compound transports an electron, and
wherein the second organic compound transports a hole.

11. The light-emitting element according to claim 1, wherein the second organic compound comprises at least one of a π-electron rich heteroaromatic ring skeleton and an aromatic amine skeleton.

12. A display device comprising:
the light-emitting element according to claim 1; and
at least one of a color filter and a transistor.

13. An electronic device comprising:
the display device according to claim 12; and
at least one of a housing and a touch sensor.

14. A lighting device comprising:
the light-emitting element according to claim 1; and
at least one of a housing and a touch sensor.

15. A light-emitting element comprising:
a first organic compound;
a second organic compound; and
a guest material,
wherein the first organic compound comprises a triazine skeleton,
wherein the guest material has a lower triplet excitation energy level than each of the first organic compound and the second organic compound, wherein a lowest unoccupied molecular orbital level of the first organic compound is lower than a lowest unoccupied molecular orbital level of the second organic compound, wherein a highest occupied molecular orbital level of the first organic compound is lower than a highest occupied molecular orbital level of the second organic compound, wherein a highest occupied molecular orbital level of the guest material is higher than the highest occupied molecular orbital level of the second organic compound, wherein an energy difference between a lowest unoccupied molecular orbital level of the guest material and the highest occupied molecular orbital level of the guest material is larger than an energy difference between the lowest unoccupied molecular orbital level of the first organic compound and the highest occupied molecular orbital level of the second organic compound, wherein the guest material converts triplet excitation energy into light emission, wherein the first organic compound and the second organic compound form an exciplex, and wherein an energy difference between the lowest unoccupied molecular orbital level of the first organic compound and the highest occupied molecular orbital level of the guest material is larger than or equal to transition energy calculated from an absorption edge of an absorption spectrum of the guest material.

16. The light-emitting element according to claim 15, wherein the energy difference between the lowest unoccupied molecular orbital level of the guest material and the highest occupied molecular orbital level of the guest material is larger than the transition energy calculated from the absorption edge of the absorption spectrum of the guest material by 0.3 eV or more.

17. The light-emitting element according to claim 15, wherein the energy difference between the lowest unoccupied molecular orbital level of the guest material and the highest occupied molecular orbital level of the guest material is larger than light emission energy of the guest material by 0.3 eV or more.

18. The light-emitting element according to claim 15, wherein excitation energy of the exciplex is transferred to the guest material.

19. The light-emitting element according to claim 15, wherein an emission spectrum of the exciplex comprises a region overlapping with an absorption band on a longest wavelength side of the absorption spectrum of the guest material.

20. The light-emitting element according to claim 15, wherein the guest material comprises iridium.

21. The light-emitting element according to claim 20,
wherein the guest material comprises a ligand coordinated to the iridium, and
wherein the ligand comprises a cyano group and a nitrogen-containing five-membered heterocyclic skeleton.

22. The light-emitting element according to claim 21, wherein the ligand comprises the cyano group and a triazole skeleton.

23. The light-emitting element according to claim 15,
wherein the first organic compound transports an electron, and
wherein the second organic compound transports a hole.

24. The light-emitting element according to claim 15,
wherein the second organic compound comprises at least one of a π-electron rich heteroaromatic ring skeleton and an aromatic amine skeleton.

25. A display device comprising:
the light-emitting element according to claim 15; and
at least one of a color filter and a transistor.

26. An electronic device comprising:
the display device according to claim 25; and
at least one of a housing and a touch sensor.

27. A lighting device comprising:
the light-emitting element according to claim 15; and
at least one of a housing and a touch sensor.

* * * * *